US008653644B2

(12) United States Patent
Grinman et al.

(10) Patent No.: US 8,653,644 B2
(45) Date of Patent: Feb. 18, 2014

(54) PACKAGED SEMICONDUCTOR CHIPS WITH ARRAY

(75) Inventors: Andrey Grinman, Jerusalem (IL); David Ovrutsky, San Jose, CA (US); Charles Rosenstein, Ramat Beit Shemesh (IL); Vage Oganesian, Sunnyvale, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/407,085

(22) Filed: Feb. 28, 2012

(65) Prior Publication Data

US 2012/0153443 A1 Jun. 21, 2012

Related U.S. Application Data

(63) Continuation of application No. 11/603,935, filed on Nov. 22, 2006.

(51) Int. Cl.
*H01L 23/50* (2006.01)

(52) U.S. Cl.
USPC .... 257/690; 257/659; 257/698; 257/E23.011; 257/E23.021; 257/E23.115; 438/109; 438/113

(58) Field of Classification Search
USPC .................. 257/676–690, 659, 698, E23.021, 257/E21.508, E21.513, E21.599, E21.646, 257/E23.003, E23.011, E23.115; 438/109, 438/113
See application file for complete search history.

(56) References Cited

U.S. PATENT DOCUMENTS

| | | | | |
|---|---|---|---|---|
| 4,074,342 | A | 2/1978 | Honn et al. | |
| 4,682,074 | A | 7/1987 | Hoeberechts et al. | |
| 4,765,864 | A | 8/1988 | Holland et al. | |
| 5,229,647 | A * | 7/1993 | Gnadinger | 257/785 |
| 5,322,816 | A | 6/1994 | Pinter | |
| 5,481,133 | A | 1/1996 | Hsu | |
| 5,686,762 | A | 11/1997 | Langley | |
| 5,700,735 | A | 12/1997 | Shiue et al. | |
| 5,703,408 | A | 12/1997 | Ming-Tsung et al. | |
| 5,808,874 | A | 9/1998 | Smith | |
| 6,005,466 | A | 12/1999 | Pedder | |
| 6,013,948 | A | 1/2000 | Akram et al. | |
| 6,022,758 | A | 2/2000 | Badehi | |

(Continued)

FOREIGN PATENT DOCUMENTS

| | | |
|---|---|---|
| CN | 1490875 A | 4/2004 |
| CN | 1758430 A | 4/2006 |

(Continued)

OTHER PUBLICATIONS

International Search Report and Written Opinion for PCT/US2011/051556 dated Feb. 13, 2012.

(Continued)

*Primary Examiner* — Ermias Woldegeorgis
(74) *Attorney, Agent, or Firm* — Lerner, David. Littenberg, Krumholz & Mentlik, LLP

(57) ABSTRACT

A chip-sized, wafer level packaged device including a portion of a semiconductor wafer including a device, at least one packaging layer containing silicon and formed over the device, a first ball grid array formed over a surface of the at least one packaging layer and being electrically connected to the device and a second ball grid array formed over a surface of the portion of the semiconductor wafer and being electrically connected to the device.

60 Claims, 96 Drawing Sheets

(56) References Cited

U.S. PATENT DOCUMENTS 6,031,274 A 2/2000 Muramatsu et al.
6,103,552 A 8/2000 Lin
6,143,396 A 11/2000 Saran et al.
6,169,319 B1 1/2001 Malinovich et al.
6,181,016 B1 1/2001 Lin et al.
6,261,865 B1 7/2001 Akram
6,277,669 B1 8/2001 Kung et al.
6,284,563 B1 9/2001 Fjelstad
6,313,024 B1 11/2001 Cave et al.
6,313,540 B1 11/2001 Kida et al.
6,362,529 B1 * 3/2002 Sumikawa et al. ........... 257/777
6,368,410 B1 4/2002 Gorczyca et al.
6,399,892 B1 6/2002 Milkovich et al.
6,472,247 B1 10/2002 Andoh et al.
6,492,201 B1 12/2002 Haba
6,498,381 B2 12/2002 Halahan et al.
6,498,387 B1 12/2002 Yang
6,586,955 B2 7/2003 Fjelstad et al.
6,608,377 B2 8/2003 Chang et al.
6,693,358 B2 2/2004 Yamada et al.
6,716,737 B2 4/2004 Plas et al.
6,727,576 B2 4/2004 Hedler et al.
6,737,300 B2 5/2004 Ding et al.
6,743,660 B2 6/2004 Lee et al.
6,812,549 B2 11/2004 Umetsu et al.
6,828,175 B2 12/2004 Wood et al.
6,864,172 B2 3/2005 Noma et al.
6,867,123 B2 3/2005 Katagiri et al.
6,873,054 B2 3/2005 Miyazawa et al.
6,879,049 B1 4/2005 Yamamoto et al.
6,914,336 B2 7/2005 Matsuki et al.
6,982,475 B1 1/2006 MacIntyre
7,068,139 B2 6/2006 Harris et al.
7,091,062 B2 8/2006 Geyer
7,271,033 B2 9/2007 Lin et al.
7,329,563 B2 2/2008 Lo et al.
7,413,929 B2 8/2008 Lee et al.
7,420,257 B2 9/2008 Shibayama
7,436,069 B2 10/2008 Matsui
7,446,036 B1 11/2008 Bolom et al.
7,456,479 B2 11/2008 Lan
7,531,445 B2 5/2009 Shiv
7,531,453 B2 5/2009 Kirby et al.
7,719,121 B2 5/2010 Humpston et al.
7,750,487 B2 7/2010 Muthukumar et al.
7,754,531 B2 7/2010 Tay et al.
7,767,497 B2 8/2010 Haba
7,781,781 B2 8/2010 Adkisson et al.
7,791,199 B2 9/2010 Grinman et al.
8,008,192 B2 8/2011 Sulfridge
2001/0048591 A1 12/2001 Fjelstad et al.
2002/0061723 A1 5/2002 Duescher
2002/0096787 A1 7/2002 Fjelstad
2002/0109236 A1 8/2002 Kim et al.
2002/0151171 A1 10/2002 Furusawa
2003/0059976 A1 3/2003 Nathan et al.
2003/0071331 A1 4/2003 Yamaguchi et al.
2003/0178714 A1 9/2003 Sakoda et al.
2004/0016942 A1 1/2004 Miyazawa et al.
2004/0017012 A1 1/2004 Yamada et al.
2004/0043607 A1 3/2004 Farnworth et al.
2004/0061238 A1 4/2004 Sekine
2004/0104454 A1 6/2004 Takaoka et al.
2004/0155354 A1 8/2004 Hanaoka et al.
2004/0173891 A1 9/2004 Imai et al.
2004/0178495 A1 9/2004 Yean et al.
2004/0188819 A1 9/2004 Farnworth et al.
2004/0188822 A1 9/2004 Hara
2004/0217483 A1 11/2004 Hedler et al.
2004/0222508 A1 11/2004 Aoyagi
2004/0251525 A1 * 12/2004 Zilber et al. .................. 257/678
2004/0259292 A1 12/2004 Beyne et al.
2005/0012225 A1 1/2005 Choi et al.
2005/0046002 A1 3/2005 Lee et al.
2005/0051883 A1 3/2005 Fukazawa
2005/0056903 A1 3/2005 Yamamoto et al.
2005/0099259 A1 5/2005 Harris et al.
2005/0106845 A1 5/2005 Halahan et al.
2005/0148160 A1 7/2005 Farnworth et al.
2005/0156330 A1 7/2005 Harris
2005/0181540 A1 8/2005 Farnworth et al.
2005/0248002 A1 11/2005 Newman et al.
2005/0260794 A1 11/2005 Lo et al.
2005/0279916 A1 12/2005 Kang et al.
2005/0282374 A1 12/2005 Hwang et al.
2005/0287783 A1 12/2005 Kirby et al.
2006/0001174 A1 1/2006 Matsui
2006/0001179 A1 1/2006 Fukase et al.
2006/0017161 A1 1/2006 Chung et al.
2006/0043598 A1 3/2006 Kirby et al.
2006/0046348 A1 3/2006 Kang
2006/0046463 A1 3/2006 Watkins et al.
2006/0046471 A1 3/2006 Kirby et al.
2006/0055050 A1 3/2006 Numata et al.
2006/0068580 A1 3/2006 Dotta
2006/0071347 A1 4/2006 Dotta
2006/0076019 A1 4/2006 Ho
2006/0079019 A1 4/2006 Kim
2006/0094231 A1 5/2006 Lane et al.
2006/0115932 A1 6/2006 Farnworth et al.
2006/0154446 A1 7/2006 Wood et al.
2006/0175697 A1 8/2006 Kurosawa et al.
2006/0197216 A1 9/2006 Yee
2006/0197217 A1 9/2006 Yee
2006/0264029 A1 11/2006 Heck et al.
2006/0278898 A1 12/2006 Shibayama
2006/0278997 A1 12/2006 Gibson et al.
2006/0292866 A1 12/2006 Borwick et al.
2007/0035020 A1 2/2007 Umemoto
2007/0045779 A1 3/2007 Hiatt
2007/0052050 A1 3/2007 Dierickx
2007/0096295 A1 5/2007 Burtzlaff et al.
2007/0126085 A1 6/2007 Kawano et al.
2007/0194427 A1 * 8/2007 Choi et al. .................... 257/686
2007/0249095 A1 10/2007 Song et al.
2007/0269931 A1 11/2007 Chung et al.
2007/0290300 A1 12/2007 Kawakami
2008/0002460 A1 1/2008 Tuckerman et al.
2008/0020898 A1 1/2008 Pyles et al.
2008/0032448 A1 2/2008 Simon et al.
2008/0076195 A1 3/2008 Shiv
2008/0079779 A1 4/2008 Cornell et al.
2008/0090333 A1 4/2008 Haba et al.
2008/0099900 A1 5/2008 Oganesian et al.
2008/0099907 A1 5/2008 Oganesian et al.
2008/0116544 A1 5/2008 Grinman et al.
2008/0136038 A1 6/2008 Savastiouk et al.
2008/0150089 A1 6/2008 Kwon et al.
2008/0157273 A1 7/2008 Giraudin et al.
2008/0164574 A1 7/2008 Savastiouk et al.
2008/0246136 A1 10/2008 Haba et al.
2008/0284041 A1 11/2008 Jang et al.
2009/0014843 A1 1/2009 Kawashita et al.
2009/0026566 A1 1/2009 Oliver et al.
2009/0032951 A1 2/2009 Andry et al.
2009/0032966 A1 2/2009 Lee et al.
2009/0039491 A1 2/2009 Kim et al.
2009/0065907 A1 3/2009 Haba et al.
2009/0133254 A1 5/2009 Kubota et al.
2009/0148591 A1 6/2009 Wang et al.
2009/0212381 A1 8/2009 Crisp et al.
2009/0224372 A1 9/2009 Johnson
2009/0263214 A1 10/2009 Lee et al.
2009/0267183 A1 10/2009 Temple et al.
2009/0294983 A1 12/2009 Cobbley et al.
2009/0309235 A1 12/2009 Suthiwongsunthorn et al.
2010/0013060 A1 1/2010 Lamy et al.
2010/0127346 A1 5/2010 DeNatale et al.
2010/0148371 A1 6/2010 Kaskoun et al.
2010/0155940 A1 6/2010 Kawashita et al.
2010/0159699 A1 6/2010 Takahashi
2010/0164062 A1 7/2010 Wang et al.

(56) References Cited

U.S. PATENT DOCUMENTS

| | | | |
|---|---|---|---|
| 2010/0167534 A1 | 7/2010 | Iwata | |
| 2010/0230795 A1 | 9/2010 | Kriman et al. | |
| 2011/0266674 A1 | 11/2011 | Hsia et al. | |

FOREIGN PATENT DOCUMENTS

| | | | | |
|---|---|---|---|---|
| EP | 0316799 | A1 | | 5/1989 |
| EP | 0926723 | A1 | | 6/1999 |
| EP | 1482553 | A2 | | 12/2004 |
| EP | 1519410 | A1 | | 3/2005 |
| EP | 1551060 | A1 | | 7/2005 |
| EP | 1619722 | A1 | | 1/2006 |
| EP | 1653510 | A2 | | 5/2006 |
| EP | 1653521 | A1 | | 5/2006 |
| EP | 1686627 | A1 | | 8/2006 |
| JP | 60160645 | A | | 8/1985 |
| JP | 4365558 | A | | 12/1992 |
| JP | 11016949 | A | * | 1/1999 |
| JP | 11195706 | A | | 7/1999 |
| JP | 2001-217386 | A | | 8/2001 |
| JP | 2002217331 | A | | 8/2002 |
| JP | 2002373957 | A | | 12/2002 |
| JP | 2004165602 | A | | 6/2004 |
| JP | 2004200547 | A | | 7/2004 |
| JP | 2005026405 | A | | 1/2005 |
| JP | 2005093486 | A | | 4/2005 |
| JP | 2005101268 | A | | 4/2005 |
| JP | 2007053149 | A | | 3/2007 |
| JP | 2007157844 | A | | 6/2007 |
| JP | 2007317887 | A | | 12/2007 |
| JP | 2008-091632 | A | | 4/2008 |
| JP | 2008-177249 | A | | 7/2008 |
| JP | 2008-258258 | A | | 10/2008 |
| JP | 2010-028601 | A | | 2/2010 |
| KR | 19990088037 | | | 12/1999 |
| KR | 20040066018 | A | | 7/2004 |
| KR | 20060009407 | A | | 1/2006 |
| KR | 2006-0020822 | A | | 3/2006 |
| KR | 20070065241 | A | | 6/2007 |
| KR | 100750741 | B1 | | 8/2007 |
| KR | 20100087566 | A | | 8/2010 |
| WO | 2004114397 | | | 12/2004 |
| WO | 2008/054660 | A2 | | 5/2008 |
| WO | 2009023462 | A1 | | 2/2009 |

OTHER PUBLICATIONS

Japanese Office Action for Application No. 2010-519953 dated Oct. 19, 2012.
International Search Report and Written Opinion for Application No. PCT/US2011/060553 dated Oct. 26, 2012.
Japanese Office Action for Application No. 2009-552696 dated Aug. 14, 2012.
David R. Lide et al: 'Handbook of Chemistry and Physics, 77th Edition, 1996-1997', Jan. 1, 1997, CRC Press, Boca Raton, New York, London, Tokyo, XP002670569, pp. 12-90-12-91.
Partial International Search Report, PCT/US2008/002659.
International Search Report, PCT/US2008/002659, Oct. 17, 2008.
U.S. Appl. No. 12/143,743, "Recontituted Wafer Level Stacking", filed Jun. 20, 2008.
U.S. Appl. No. 11/590,616, filed Oct. 31, 2006.
U.S. Appl. No. 11/789,694, filed Apr. 25, 2007.
PCT/US08/09207, "Reconstituted Wafer Stack Packaging With After Applied Pad Extensions," filed Jul. 25, 2008.
International Search Report and Written Opinion, PCT/US2008/009356 dated Feb. 19, 2009.
U.S. Appl. No. 12/784,841, filed May 21, 2010.
U.S. Appl. No. 12/842,717, filed Jul. 23, 2010.
U.S. Appl. No. 12/842,612, filed Jul. 23, 2010.
U.S. Appl. No. 12/842,651, filed Jul. 23, 2010.
U.S. Appl. No. 12/723,039, filed Mar. 12, 2010.
International Search Report and Written Opinion, PCT/US2010/002318, dated Nov. 22, 2010.
International Search Report and Written Opinion, PCT/US2010/052458, dated Jan. 31, 2011.
Supplementary European Search Report, EP 08795005 dated Jul. 5, 2010.
International Search Report, PCT/US10/52783, Dated Dec. 10, 2010.
International Search Report and Written Opinion, PCT/US2010/052785, Dated Dec. 20, 2010.
International Search Report and Written Opinion for PCT/US2011/051552 dated Apr. 11, 2012.

* cited by examiner

4072
A
A
4000
4072
4068
150
4000
4074
4070
4074
4076
4070
4068
150

PACKAGED SEMICONDUCTOR CHIPS WITH ARRAY

CROSS-REFERENCE TO RELATED APPLICATIONS

The present application is a continuation of U.S. patent application Ser. No. 11/603,935, filed Nov. 22, 2006, the disclosure of which is hereby incorporated herein by reference.

FIELD OF THE INVENTION

The present invention relates to packaged semiconductor chips and to methods of manufacture thereof.

BACKGROUND OF THE INVENTION

The following published patent documents are believed to represent the current state of the art:

U.S. Pat. Nos. 6,737,300; 6,828,175; 6,608,377; 6,103,552; 6,277,669; 6,492,201; 6,498,387; 6,727,576; 6,743,660 and 6,867,123; and US Patent Application Publication Numbers: 2005/0260794, which issued as U.S. Pat. No. 7,329,563; 2006/0017161; 2005/0046002, which issued as U.S. Pat. No. 7,276,799; 2005/0012225; 2002/0109236, which issued as U.S. Pat. No. 6,448,661; 2005/0056903, which issued as U.S. Pat. No. 7,180,149; 2004/0222508; 2006/0115932 and 2006/0079019, which issued as U.S. Pat. No. 7,264,995.

SUMMARY OF THE INVENTION

The present invention seeks to provide improved packaged semiconductor chips and methods of manufacture thereof.

There is thus provided in accordance with a preferred embodiment of the present invention, a chip-sized wafer level packaged device including a portion of a semiconductor wafer including a device, a packaging layer formed over the portion of the semiconductor wafer, the packaging layer including a material having thermal expansion characteristics similar to those of the semiconductor wafer and a ball grid array formed over a surface of the packaging layer and being electrically connected to the device.

In accordance with a preferred embodiment of the present invention, the semiconductor wafer contains at least one of silicon and Gallium Arsenide. Preferably, the packaging layer is adhered to the portion of the semiconductor wafer by an adhesive, the adhesive having thermal expansion characteristics similar to those of the packaging layer. Additionally or alternatively, the packaging layer includes silicon.

In accordance with another preferred embodiment of the present invention, the chip-sized wafer level packaged device also includes at least one compliant layer formed over the packaging layer and underlying the ball grid array. Preferably, the chip-sized wafer level packaged device also includes metal connections formed over the compliant layer and underlying the ball grid array, the metal connections providing electrical contact between the ball grid array and the device.

In accordance with yet another preferred embodiment of the present invention the device includes a memory device. Preferably, alpha-particle shielding is provided between the ball grid array and the device. More preferably, the alpha-particle shielding is provided by at least one compliant layer formed over the packaging layer and underlying the ball grid array. Additionally or alternatively, the chip-sized wafer level packaged device also includes metal connections formed over the packaging layer and underlying the ball grid array, the metal connections providing electrical contact between the ball grid array and the device.

There is also provided in accordance with another preferred embodiment of the present invention a method of manufacture of chip-sized wafer level packaged devices including providing a semiconductor wafer including a multiplicity of devices, forming a packaging layer over the semiconductor wafer, the packaging layer including a material having thermal expansion characteristics similar to those of the semiconductor wafer, forming ball grid arrays over a surface of the packaging layer, the ball grid arrays being electrically connected to ones of the multiplicity of devices and dicing the semiconductor wafer and the packaging layer.

In accordance with a preferred embodiment of the present invention the providing a semiconductor wafer includes providing a semiconductor wafer containing at least one of silicon and Gallium Arsenide. Preferably, the method also includes adhering the packaging layer to the portion of the semiconductor wafer by an adhesive, the adhesive having thermal expansion characteristics similar to those of the packaging layer. Additionally or alternatively, the forming a packaging layer includes forming a silicon packaging layer.

In accordance with another preferred embodiment of the present invention the method also includes forming at least one compliant layer over the packaging layer prior to forming the ball grid arrays. Preferably, the forming at least one compliant layer includes forming at least one electrophoretic layer. Additionally or alternatively, the forming at least one compliant layer includes providing alpha-particle shielding between the ball grid array and the surface.

In accordance with still another preferred embodiment of the present invention the multiplicity of devices include a memory device. Preferably, the method also includes providing alpha-particle shielding between the ball grid array and the surface. Additionally or alternatively, the method also includes forming metal connections over the packaging layer and underlying the ball grid array, the metal connections providing electrical contact between the ball grid array and the device.

There is additionally provided in accordance with yet another preferred embodiment of the present invention a chip-sized wafer level packaged device including a portion of a semiconductor wafer including a device, a packaging layer formed over the portion of the semiconductor wafer, a compliant layer formed over the packaging layer at least some locations thereon and a ball grid array formed over a surface of the packaging layer and over the compliant layer and being electrically connected to the device.

In accordance with a preferred embodiment of the present invention the packaging layer includes a material having thermal expansion characteristics similar to those of the semiconductor wafer. Preferably, the compliant layer is provided at locations underlying individual balls of the ball grid array. Additionally or alternatively, the compliant layer may include silicone.

In accordance with another preferred embodiment of the present invention the device is a DRAM device. Preferably, the compliant layer includes platforms formed of compliant material, each of the platforms having formed thereon a ball of the ball grid array. Additionally or alternatively, the chip-sized wafer level packaged device also includes metal connections formed over the compliant layer and underlying the ball grid array, the metal connections providing electrical contact between the ball grid array and the device. Preferably, alpha-particle shielding is provided between the ball grid array and the device.

There is further provided in accordance with a further preferred embodiment of the present invention a method of manufacture of chip-sized wafer level packaged integrated circuit devices including providing a semiconductor wafer including a multiplicity of integrated circuit devices, forming a packaging layer over the semiconductor wafer, forming recesses in a replication silicon wafer in a planar arrangement corresponding to that of a desired ball grid array, placing compliant material in the recesses thereby to define an array of regions of the compliant material, planarizing the array of regions of the compliant material, attaching the silicon wafer over the packaging layer, such that planarized surfaces of the array of regions of the compliant material lie over and facing the packaging layer, removing the replication silicon wafer such that the array of regions of the compliant material remain, forming ball grid arrays over the array of regions of the compliant material, the ball grid arrays being electrically connected to the ones of the multiplicity of integrated circuit devices and dicing the semiconductor wafer and the packaging layer.

In accordance with a preferred embodiment of the present invention the forming a packaging layer includes a forming a packaging layer of a material having thermal expansion characteristics similar to those of the semiconductor wafer. Preferably, the forming a packaging layer includes forming a packaging layer of silicon. Additionally or alternatively, the placing compliant material includes placing silicone.

In accordance with another preferred embodiment of the present invention the multiplicity of integrated circuit devices includes at least one DRAM device. Preferably, the method also includes forming metal connections the compliant material prior to the forming ball grid arrays, the metal connections providing electrical contact between the ball grid arrays and ones of the multiplicity of integrated circuit devices.

In accordance with yet another preferred embodiment of the present invention the method also includes forming a compliant electrophoretic coating layer over the packaging layer prior to the attaching the replication silicon wafer. Preferably, the forming a compliant electrophoretic coating layer includes providing alpha-particle shielding between the ball grid arrays and the integrated circuit devices.

There is yet further provided in accordance with a yet further preferred embodiment of the present invention a chip-sized wafer level packaged device including a portion of a semiconductor wafer including a device, a passivation layer formed over the portion of the semiconductor wafer, a compliant layer formed over the passivation layer at least some locations thereon and a ball grid array formed over a surface of the passivation layer and over the compliant layer and being electrically connected to the device.

In accordance with a preferred embodiment of the present invention the compliant layer includes silicone. Additionally or alternatively, the passivation layer includes a polymer. Preferably, the passivation layer includes a polyimide.

In accordance with another preferred embodiment of the present invention the passivation layer provides alpha-particle shielding between the ball grid array and the device. Preferably, the device is a DRAM device. Additionally or alternatively, the chip-sized wafer level packaged device also includes metal connections formed over the compliant layer and underlying the ball grid array, the metal connections providing electrical contact between the ball grid array and the device.

There is still further provided in accordance with a still further preferred embodiment of the present invention a method of manufacture of chip-sized wafer level packaged devices including providing a semiconductor wafer including a multiplicity of devices, forming a passivation layer over the semiconductor wafer, forming a compliant layer over the passivation layer, forming ball grid arrays over a surface of the compliant layer, the ball grid arrays being electrically connected to ones of the multiplicity of devices and dicing the semiconductor wafer and the packaging layer.

In accordance with a preferred embodiment of the present invention the forming a passivation layer includes forming the passivation layer from a polymer. Preferably, the forming a passivation layer includes forming the passivation layer from a polyimide. Additionally or alternatively, the forming a compliant layer includes forming the compliant layer from silicone.

In accordance with another preferred embodiment of the present invention the forming a passivation layer includes providing alpha-particle shielding between the ball grid arrays and the device. Preferably, the multiplicity of devices includes at least one DRAM device. Additionally or alternatively, the method also includes forming metal connections over the compliant layer and underlying the ball grid array, the metal connections providing electrical contact between the ball grid array and the device.

There is additionally provided in accordance with an additional preferred embodiment of the present invention a chip-sized, wafer level packaged device including a portion of a semiconductor wafer including a device, at least one packaging layer containing silicon and formed over the device, a first ball grid array formed over a surface of the at least one packaging layer and being electrically coupled to the device and a second ball grid array formed over a surface of the portion of the semiconductor wafer and being electrically connected to the device.

In accordance with a preferred embodiment of the present invention the at least one packaging layer includes a plurality of packaging layers. Preferably, the plurality of packaging layers are disposed on the same side of the portion of the semiconductor wafer. Additionally or alternatively, the device is a DRAM device.

In accordance with another preferred embodiment of the present invention the chip-sized wafer level packaged device also includes at least one compliant layer, formed over the packaging layer and underlying at least one of the first and second ball grid arrays. Preferably, the chip-sized wafer level packaged device also includes metal connections formed over the at least one compliant layer and underlying at least one of the first and second ball grid arrays, the metal connections providing electrical contact between at least one of the first and second ball grid arrays and the device. Additionally or alternatively, the at least one compliant layer includes at least one of silicone and a polymeric dielectric material. Preferably, the polymeric material is a polyimide.

In accordance with yet another preferred embodiment of the present invention alpha-particle shielding is provided between at least one of the first and second ball grid arrays and the device.

There is also provided in accordance with another preferred embodiment of the present invention a chip-sized, wafer level packaged device including a portion of a semiconductor wafer including a device, a least one packaging layer formed over the device, a first ball grid array formed over a surface of the at least one packaging layer and being electrically connected to the device, a second ball grid array formed over a surface of the portion of the semiconductor wafer and being electrically connected to the device and a compliant electrophoretic coating layer underlying at least one of the first and second ball grid arrays.

In accordance with a preferred embodiment of the present invention the at least one packaging layer contains silicon. Preferably, the compliant electrophoretic coating layer provides alpha-particle shielding between at least one of the first and second ball grid arrays and the device. Additionally or alternatively, the device is a DRAM device.

In accordance with another preferred embodiment of the present invention the at least one packaging layer includes a plurality of packaging layers. Preferably, the plurality of packaging layers are disposed on the same side of the portion of the semiconductor wafer. Additionally or alternatively, the chip-sized wafer level packaged device also includes metal connections formed over the compliant electrophoretic coating layer and underlying at least one of the first and second ball grid arrays, the metal connections providing electrical contact between at least one of the first and second ball grid arrays and the device.

In accordance with yet another preferred embodiment of the present invention the compliant electrophoretic coating layer comprises a sufficiently conductive inorganic packaging layer which is electrophoretically coated by an organic layer employing appropriate modulus which provides under-ball compliancy.

There is additionally provided in accordance with yet another preferred embodiment of the present invention a method of manufacture of chip-sized wafer level packaged devices including providing a semiconductor wafer including a multiplicity of devices, forming at least one packaging layer including a silicon packaging layer over the semiconductor wafer, forming a first ball grid array over a surface of the at least one packaging layer and being electrically connected to ones of the multiplicity of devices, forming a second ball grid array over a surface of the portion of the semiconductor wafer and being electrically connected to ones of the multiplicity of devices and dicing the semiconductor wafer and the at least one packaging layer.

In accordance with a preferred embodiment of the present invention the forming at least one packaging layer includes forming a plurality of packaging layers. Preferably, the forming a plurality of packaging layers includes disposing the plurality of packaging layers on the same side of the semiconductor wafer. Additionally or alternatively the multiplicity of devices includes at least one DRAM device.

In accordance with another preferred embodiment of the present invention the method also includes forming at least one compliant layer over the packaging layer and underlying at least one of the first and second ball grid arrays. Preferably, the method also includes forming metal connections over the at least one compliant layer and underlying at least one of the first and second ball grid arrays, the metal connections providing electrical contact between at least one of the first and second ball grid arrays and the device. Additionally or alternatively, the method also includes providing alpha-particle shielding between at least one of the first and second ball grid arrays and the device.

There is also provided in accordance with yet another preferred embodiment of the present invention a method of manufacture of chip-sized wafer level packaged devices including providing a semiconductor wafer including a multiplicity of devices, forming at least one packaging layer over the semiconductor wafer, forming a first ball grid array over a surface of the at least one packaging layer and being electrically connected to ones of the multiplicity of devices, forming a second ball grid array over a surface of the portion of the semiconductor wafer and being electrically connected to ones of the multiplicity of devices, forming a compliant electrophoretic coating layer underlying at least one of the first and second ball grid arrays and dicing the semiconductor wafer and the at least one packaging layer.

In accordance with a preferred embodiment of the present invention the forming at least one packaging layer includes forming at least one packaging layer which contains silicon. Preferably, the forming a compliant electrophoretic coating layer includes providing alpha-particle shielding between the ball grid arrays and the device. Additionally or alternatively, the multiplicity of devices includes at least one DRAM device.

In accordance with another preferred embodiment of the present invention the forming at least one packaging layer includes forming a plurality of packaging layers. Preferably, the forming a plurality of packaging layers includes disposing the plurality of packaging layers on the same side of the semiconductor wafer. Additionally or alternatively, the method also includes forming metal connections over the compliant electrophoretic coating layer and underlying at least one of the first and second ball grid arrays, the metal connections providing electrical contact between at least one of the first and second ball grid arrays and ones of the multiplicity of devices.

There is additionally provided in accordance with still another preferred embodiment of the present invention a chip-sized wafer level packaged device including a portion of a semiconductor wafer including a device, a packaging layer formed over the portion of the semiconductor wafer, a ball grid array formed over a surface of the packaging layer and being electrically connected to the device and metal connections interconnecting the ball grid array with the device, the metal connections including first metal connections, each extending from a bond pad of the device at a first location over the portion of the semiconductor wafer to a second location over the portion of the semiconductor wafer, transversely displaced from the first location and second metal connections, each extending from one of the first metal connections at the second location to a ball forming part of the ball grid array.

In accordance with a preferred embodiment of the present invention the packaging layer includes silicon. Preferably, the chip-sized wafer level packaged device also includes a compliant layer formed over the packaging layer and underlying the ball grid array. Additionally or alternatively, the device includes a memory device.

In accordance with another preferred embodiment of the present invention alpha-particle shielding is provided between the ball grid array and the device. Preferably, the compliant layer provides alpha-particle shielding between the ball grid array and the device. Additionally or alternatively, the chip-sized wafer level packaged device also includes an encapsulant layer formed between the portion of the semiconductor wafer and the packaging layer.

There is further provided in accordance with a further preferred embodiment of the present invention a method of manufacture of chip-sized wafer level packaged devices including providing a semiconductor wafer including a multiplicity of devices, providing a packaging layer over the semiconductor wafer, forming a ball grid array over a surface of the packaging layer and electrically connecting it to ones of the multiplicity of devices by metal connections including forming first metal connections, each extending from a bond pad of the device at a first location over the portion of the semiconductor wafer to a second location over the portion of the semiconductor wafer, transversely displaced from the first location and forming second metal connections, each extending from one of the first metal connections at the second location to a ball forming part of the ball grid array and dicing the semiconductor wafer and the packaging layer.

In accordance with a preferred embodiment of the present invention the providing a packaging layer includes providing a packaging layer formed of silicon. Preferably, the method also includes forming a compliant layer over the packaging layer and underlying the ball grid array. Additionally or alternatively, the multiplicity of devices includes a memory device.

In accordance with another preferred embodiment of the present invention the method also includes providing alpha-particle shielding between the ball grid array and the device. Preferably, the forming a compliant layer includes providing alpha-particle shielding between the ball grid array and the device. Additionally or alternatively, the method also includes forming an encapsulant layer between the portion of the semiconductor wafer and the packaging layer.

There is yet further provided in accordance with yet a further preferred embodiment of the present invention a chip-sized wafer level packaged device including a first portion of a first semiconductor wafer including a first active surface, a second portion of a second semiconductor wafer including a second active surface, the second portion of the second semiconductor wafer being arranged with respect to the first portion of the first semiconductor wafer such that the first and second active surfaces are in a mutually facing spatial relationship, at least one ball grid array formed over a non-active surface of at least one of the first and second portions and metal connections interconnecting the at least one ball grid array with the first and second active surfaces, the metal connections including first metal connections, each extending from a bond pad on one of the first and second active surfaces at a first location over a corresponding one of the first and second portions to a second location over the corresponding one of the first and second portions, transversely displaced from the first location and second metal connections, each extending from one of the first metal connections at the second location to a ball forming part of the at least one ball grid array.

In accordance with a preferred embodiment of the present invention the chip-sized wafer level packaged device also includes a compliant layer underlying the at least one ball grid array. Preferably, the packaged device includes a memory device.

In accordance with another preferred embodiment of the present invention alpha-particle shielding is provided between the at least one ball grid array and the first and second active surfaces. Preferably, the compliant layer provides alpha-particle shielding between the at least one ball grid array and the first and second active surfaces. Additionally or alternatively, the packaging layer includes silicon.

There is still further provided in accordance with a still further preferred embodiment of the present invention a method of manufacture of chip-sized wafer level packaged devices including providing a first portion of a first semiconductor wafer including a first active surface, providing a second portion of a second semiconductor wafer including a second active surface, arranging the second portion of the second semiconductor wafer with respect to the first portion of the first semiconductor wafer such that the first and second active surfaces are in a mutually facing spatial relationship, forming at least one ball grid array over a non-active surface of at least one of the first and second portions and forming metal connections interconnecting the at least one ball grid array with the first and second active surfaces, including forming first metal connections, each extending from a bond pad on one of the first and second active surfaces at a first location over a corresponding one of the first and second portions to a second location over the corresponding one of the first and second portions, transversely displaced from the first location and forming second metal connections, each extending from one of the first metal connections at the second location to a ball forming part of the at least one ball grid array and dicing the first and second semiconductor wafers.

In accordance with a preferred embodiment of the present invention the method also includes forming a compliant layer prior to forming the at least one ball grid array. Preferably, the method also includes providing alpha-particle shielding between the at least one ball grid array and the first and second active surfaces. More preferably, the forming a compliant layer includes providing alpha-particle shielding between the at least one ball grid array and the first and second active surfaces.

There is additionally provided in accordance with an additional preferred embodiment of the present invention stacked chip-sized, wafer level packaged devices including at least first and second chip-sized wafer level packaged devices each including a portion of a semiconductor wafer including a device, at least one packaging layer containing silicon and formed over the device, a first ball grid array formed over a surface of the at least one packaging layer and being electrically connected to the device and a second ball grid array formed over a surface of the portion of the semiconductor wafer and being electrically connected to the device, the first ball grid array of the first device being electrically connected to the second ball grid array of the second device.

In accordance with a preferred embodiment of the present invention the at least one packaging layer includes a plurality of packaging layers. Preferably, the plurality of packaging layers are disposed on the same side of the portion of the semiconductor wafer. Additionally or alternatively, the device is a DRAM device.

There is also provided in accordance with another preferred embodiment of the present invention stacked chip-sized, wafer level packaged devices including at least first and second chip-sized wafer level packaged devices each including a portion of a semiconductor wafer including a device, at least one packaging layer formed over the device, a first ball grid array formed over a surface of the at least one packaging layer and being electrically connected to the device, a second ball grid array formed over a surface of the portion of the semiconductor wafer and being electrically connected to the device and a compliant electrophoretic coating layer underlying at least one of the first and second ball grid arrays, the first ball grid array of the first device being electrically connected to the second ball grid array of the second device.

In accordance with a preferred embodiment of the present invention the at least one packaging layer contains silicon. Preferably, the compliant electrophoretic coating layer provides alpha-particle shielding between the first and second ball grid arrays and the device. Additionally or alternatively, the device is a DRAM device.

There is additionally provided in accordance with yet another preferred embodiment of the present invention a method of manufacture of stacked chip-sized wafer level packaged devices including providing at least first and second chip-sized wafer level packaged devices including, for each of the first and second chip-sized wafer level packaged devices providing a semiconductor wafer including a multiplicity of devices, forming at least one packaging layer including a silicon packaging layer over the semiconductor wafer, forming a first ball grid array over a surface of the at least one packaging layer and being electrically connected to ones of the multiplicity of devices, forming a second ball grid array over a surface of the semiconductor wafer and being electrically connected to ones of the multiplicity of devices and dicing the semiconductor wafer and the at least one packaging layer and soldering the first ball grid array of the first device to the second ball grid array of the second device.

In accordance with a preferred embodiment of the present invention the forming at least one packaging layer includes forming a plurality of packaging layers. Preferably, the forming a plurality of packaging layers includes disposing the plurality of packaging layers on the same side of the portion of the semiconductor wafer. Additionally or alternatively, the multiplicity of devices includes at least one DRAM device.

There is also provided in accordance with still another preferred embodiment of the present invention a method of manufacture of chip-sized wafer level packaged devices including providing at least first and second chip-sized wafer level packaged devices including, for each of the first and second chip-sized wafer level packaged devices, providing a semiconductor wafer including an active surface defining a multiplicity of devices, forming at least one packaging layer over the semiconductor wafer, forming a first ball grid array over a surface of the at least one packaging layer and being electrically connected to ones of the multiplicity of devices, forming a second ball grid array over a surface of the semiconductor wafer and being electrically connected to ones of the multiplicity of devices, forming a compliant electrophoretic coating layer underlying at least one of the first and second ball grid arrays and dicing the semiconductor wafer and the at least one packaging layer and soldering the first ball grid array of the first device to the second ball grid array of the second device.

In accordance with a preferred embodiment of the present invention the forming at least one packaging layer includes forming a plurality of packaging layers. Preferably, the forming a plurality of packaging layers includes disposing the plurality of packaging layers on the same side of the portion of the semiconductor wafer. Additionally or alternatively, the multiplicity of devices includes at least one DRAM device.

There is further provided in accordance with a further preferred embodiment of the present invention a chip-sized wafer level packaged device including a portion of a semiconductor wafer including a device, a packaging layer formed over the portion of the semiconductor wafer, the packaging layer including a material having thermal expansion characteristics similar to those of the semiconductor wafer and a plurality of interconnects formed over a surface of the packaging layer and being electrically connected to the device.

In accordance with a preferred embodiment of the present invention the plurality of interconnects includes Anisotropic Conductive Film (ACF) attachable interconnects. Preferably, the ACF attachable interconnects are formed of copper. Additionally or alternatively, the chip-sized wafer level packaged device also includes a printed circuit board including interconnects and a conductive film bonding the interconnects of the printed circuit board to the interconnects of the packaging layer.

In accordance with another preferred embodiment of the present invention the conductive film includes an Anisotropic Conductive Film (ACF). Preferably, the semiconductor wafer contains at least one of silicon and Gallium Arsenide. Additionally or alternatively, the packaging layer is adhered to the portion of the semiconductor wafer by an adhesive, the adhesive having thermal expansion characteristics similar to those of the packaging layer.

In accordance with yet another preferred embodiment of the present invention the packaging layer includes silicon. Preferably, the device includes a memory device.

There is yet further provided in accordance with yet a further preferred embodiment of the present invention a method of manufacture of chip-sized wafer level packaged devices including providing a semiconductor wafer including a multiplicity of devices, forming a packaging layer over the semiconductor wafer, the packaging layer including a material having thermal expansion characteristics similar to those of the semiconductor wafer, forming a plurality of interconnects over a surface of the packaging layer which are electrically connected to ones of the multiplicity of devices and dicing the semiconductor wafer and the packaging layer.

In accordance with a preferred embodiment of the present invention the forming a plurality of interconnects includes forming ACF attachable interconnects. Preferably, the forming ACF attachable interconnects of copper. Additionally or alternatively, the method also includes providing a printed circuit board including interconnects and bonding the interconnects of the printed circuit board to the attachable interconnects of the packaging layer by a conductive film.

In accordance with another preferred embodiment of the present invention the bonding includes bonding by an anisotropic conductive film. Preferably, the providing a semiconductor wafer includes providing a semiconductor wafer containing at least one of silicon and Gallium Arsenide. Additionally or alternatively, the method also includes adhering the packaging layer to the semiconductor wafer by an adhesive, the adhesive having thermal expansion characteristics similar to those of the packaging layer.

There is still further provided in accordance with still a further preferred embodiment of the present invention a chip-sized wafer level packaged device including a portion of a semiconductor wafer including a device, a packaging layer formed over an active surface of the portion of the semiconductor wafer, the packaging layer including a material having thermal expansion characteristics similar to those of the semiconductor wafer, metal connections formed onto the packaging layer, the metal connections being electrically connected to the device and including portions which are gold plated and a printed circuit board including metal pins, the metal pins being coated with an Indium layer, the pins being mounted onto the portions of the metal connections which are gold plated by eutectic Au/In intermetallic bonding.

In accordance with a preferred embodiment of the present invention the semiconductor wafer contains at least one of silicon and Gallium Arsenide. Preferably, the packaging layer is adhered to the portion of the semiconductor wafer by an adhesive, the adhesive having thermal expansion characteristics similar to those of the packaging layer. Additionally or alternatively, the packaging layer includes silicon.

In accordance with another preferred embodiment of the present invention the chip-sized wafer level packaged device also includes at least one compliant layer formed over the packaging layer and underlying the metal connections. Preferably, the device includes a memory device.

There is also provided in accordance with another preferred embodiment of the present invention a chip-sized wafer level packaged device including a portion of a semiconductor wafer including a device, a packaging layer formed over an active surface of the portion of the semiconductor wafer, the packaging layer including a material having thermal expansion characteristics similar to those of the semiconductor wafer, metal connections formed onto the packaging layer, the metal connections being electrically connected to the device and including portions which are gold plated and a wafer level die including a portion of a semiconductor wafer including a device, a packaging layer formed over an active surface of the portion of the semiconductor wafer, the packaging layer including a material having thermal expansion characteristics similar to those of the semiconductor wafer and metal pins coated with an Indium layer, the pins being mounted onto the portions of the metal connections which are gold plated by eutectic Au/In intermetallic bonding.

In accordance with a preferred embodiment of the present invention at least one of the semiconductor wafers contains at least one of silicon and Gallium Arsenide. Preferably, the packaging layer is adhered to the portion of the semiconductor wafer by an adhesive, the adhesive having thermal expansion characteristics similar to those of the packaging layer. Additionally or alternatively, the packaging layer includes silicon.

In accordance with another preferred embodiment of the present invention the chip-sized wafer level packaged device also includes at least one compliant layer formed over the packaging layer and underlying the metal connections. Preferably, the device includes a memory device.

There is additionally provided in accordance with an additional preferred embodiment of the present invention a method of manufacture of chip-sized wafer level packaged devices including providing a portion of a semiconductor wafer including a multiplicity of devices, forming a packaging layer over an active surface of the portion of the semiconductor wafer, the packaging layer including a material having thermal expansion characteristics similar to those of the semiconductor wafer, forming metal connections mounted onto the packaging wafer, the metal connections being electrically connected to the device and including portions which are gold plated, providing a printed circuit board including metal pins which are coated with an Indium layer and employing eutectic Au/In intermetallic bonding to bond the metal pins to the portions of the metal connections which are gold plated, thereby mounting the printed circuit board to the packaging layer.

In accordance with a preferred embodiment of the present invention the method also includes adhering the packaging layer to the portion of the semiconductor wafer by an adhesive, the adhesive having thermal expansion characteristics similar to those of the packaging layer. Preferably, the method also includes forming at least one compliant layer over the packaging layer and underlying the metal connections.

There is further provided in accordance with a further preferred embodiment of the present invention a method of manufacture of chip-sized wafer level packaged devices including providing a portion of a semiconductor wafer including a multiplicity of devices, forming a packaging layer over an active surface of the portion of the semiconductor wafer, the packaging layer including a material having thermal expansion characteristics similar to those of the semiconductor wafer, forming metal connections mounted onto the packaging layer, the metal connections being electrically connected to the device and including portions which are gold plated, providing a wafer level die including a portion of a semiconductor wafer including a device, a packaging layer formed over an active surface of the portion of the semiconductor wafer, the packaging layer including a material having thermal expansion characteristics similar to those of the semiconductor wafer and metal pins coated with an Indium layer and employing eutectic Au/In intermetallic bonding to bond the metal pins to the portions of the metal connections which are gold plated, thereby mounting the wafer level die onto the packaging layer.

In accordance with a preferred embodiment of the present invention the method also includes adhering the packaging layer to the portion of the semiconductor wafer by an adhesive, the adhesive having thermal expansion characteristics similar to those of the packaging layer. Preferably the method also includes forming at least one compliant layer over the packaging layer and underlying the metal connections.

BRIEF DESCRIPTION OF THE DRAWINGS

The present invention will be understood and appreciated more fully from the following detailed description, taken in conjunction with the drawings in which:

FIGS. 3A-3I are simplified sectional illustrations of a method for manufacturing packaged semiconductor chips in accordance with yet another preferred embodiment of the present invention;

DETAILED DESCRIPTION OF PREFERRED EMBODIMENTS

Reference is now made to FIGS. 1A-1L, which are simplified sectional illustrations of a method for manufacturing packaged semiconductor chips in accordance with a preferred embodiment of the present invention.

Figures 1A, 1B:
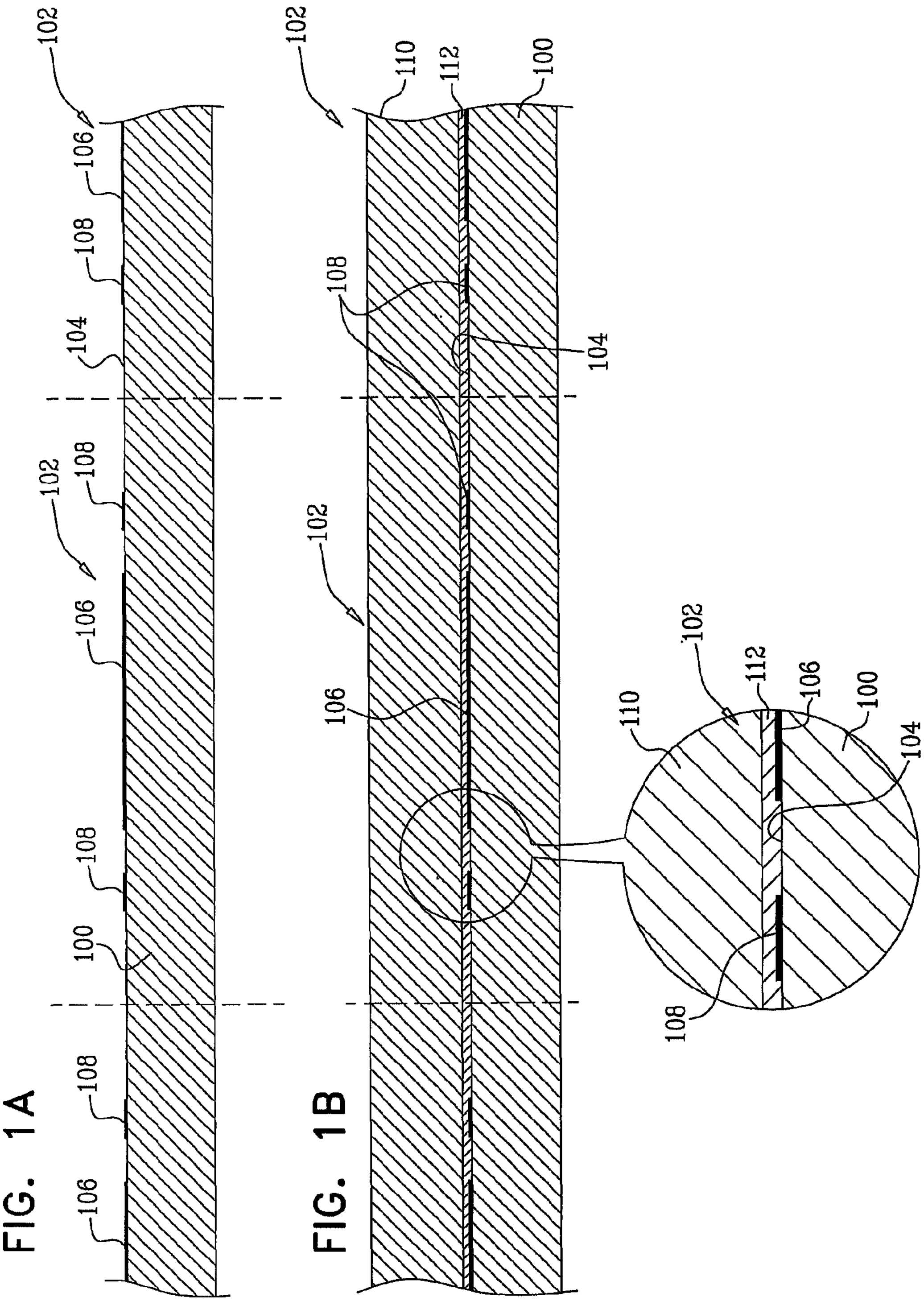
FIGS. 1A-1L are simplified sectional illustrations of a method for manufacturing packaged semiconductor chips in accordance with a preferred embodiment of the present invention.

Turning to FIG. 1A, there is seen part of a semiconductor wafer 100 including dies 102, each typically having an active surface 104 including electrical circuitry 106 having bond pads 108. The wafer 100 is typically silicon of thickness 730 microns. The electrical circuitry 106 may be provided by any suitable conventional technique. Alternatively, the wafer 100 may be any other suitable material, such as, for example, Gallium Arsenide and may be of any suitable thickness.

FIG. 1B shows a wafer-scale packaging layer 110 attached to wafer 100 by an adhesive 112, such as epoxy. As seen in FIG. 1B, the adhesive 112 covers the active surfaces 104 of dies 102. Preferably, the adhesive is homogeneously applied to the packaging layer by spin bonding, as described in U.S. Pat. Nos. 5,980,663 and 6,646,289, the contents of which is hereby incorporated by reference. Alternatively, any other suitable technique may be employed.

It is a particular feature of the present invention that the thermal expansion characteristics of the packaging layer 110 are closely matched to those of the semiconductor wafer 100. For example, if the semiconductor wafer 100 is made of silicon, which has a coefficient of thermal expansion of 2.6 $\mu m \cdot m^{-1} \cdot K^{-1}$ at 25° C., the coefficient of thermal expansion of the packaging layer 110 should be similar. Furthermore, the adhesive 112 preferably has a coefficient of thermal expansion which is closely matched to the coefficients of thermal expansion of the semiconductor wafer 100 and of the packaging layer 110. Preferably, when the semiconductor wafer 100 comprises silicon, the protective layer 110 also comprises silicon having sufficient conductivity to permit electrophoretic coating thereof.

Figure 1C:
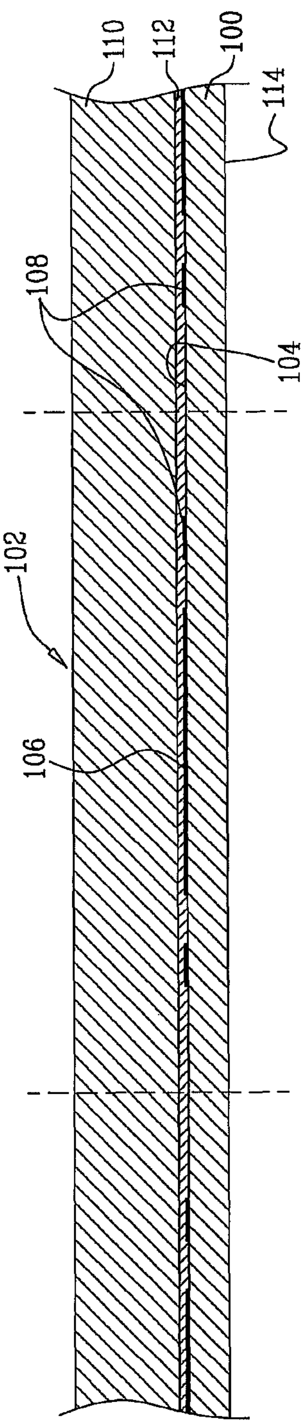

Turning to FIG. 1C, it is seen that the semiconductor wafer 100 is thinned as by machining its non-active surface 114. Preferably, the thickness of the semiconductor wafer 100 at this stage, following thinning thereof, is 300 microns.

Figure 1D:
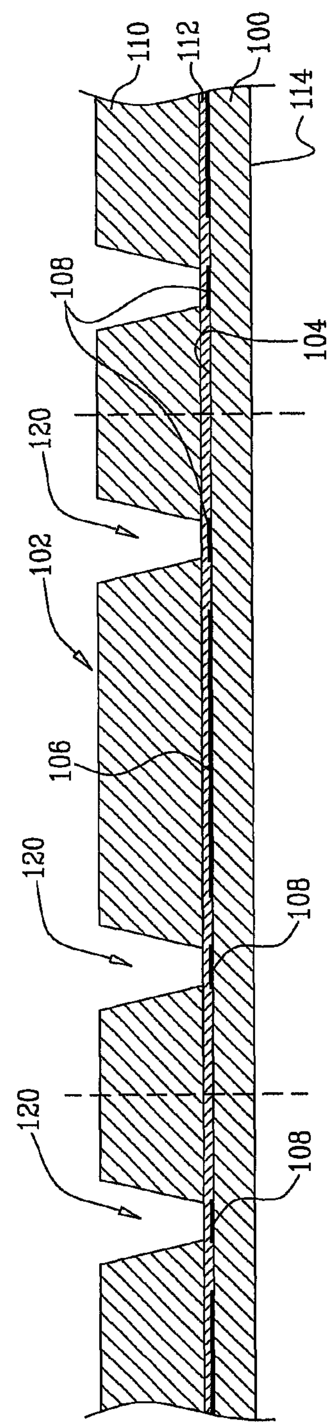

FIG. 1D shows notches 120, preferably formed by photolithography employing plasma etching or wet etching techniques, at locations which overlie bond pads 108. The notches 120 preferably do not extend through adhesive 112.

Figures 1E, 1F:
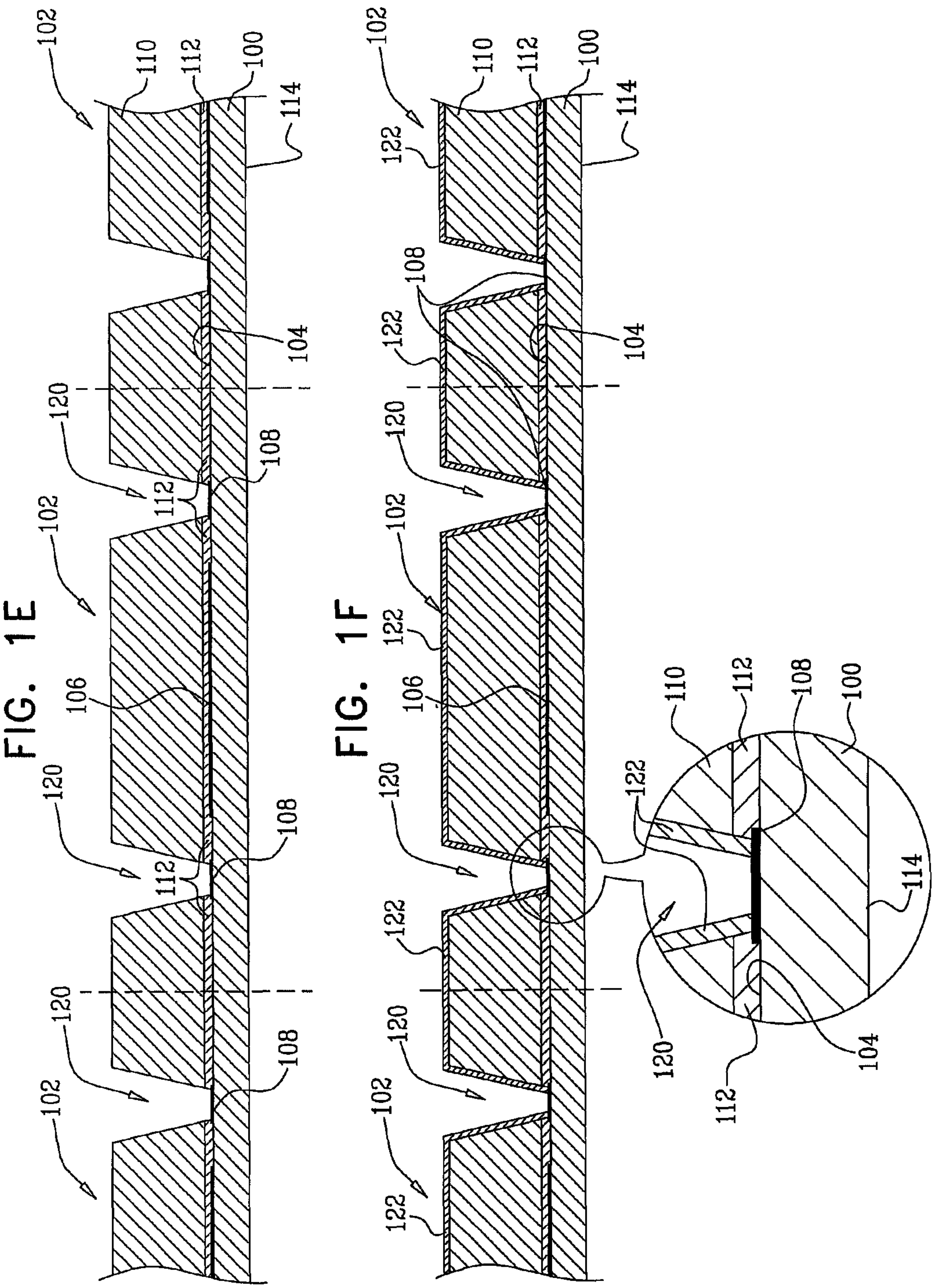

Turning to FIG. 1E, it is seen that the adhesive 112 overlying bond pads 108 and underlying notches 120 is removed, preferably by dry etching.

FIG. 1F shows the formation of an electrophoretic, electrically insulative compliant layer 122 over the packaging layer 110. Examples of suitable compliant layers include Powercron 645 and Powercron 648, both commercially available from PPG of Pittsburgh, Pa., USA; Cathoguard 325, commercially available from BASF of Southfield, Mass., USA; Electrolac, commercially available from Macdermid of Waterbury, Conn., USA and Lectraseal DV494 and Lectrobase 101, both commercially available from LVH Coatings of Birmingham, UK. Once cured, compliant layer 122 encapsulates all exposed surfaces of the packaging layer 110. Compliant layer 122 preferably provides protection to the device from alpha particles emitted by BGA solder balls.

Figure 1G:
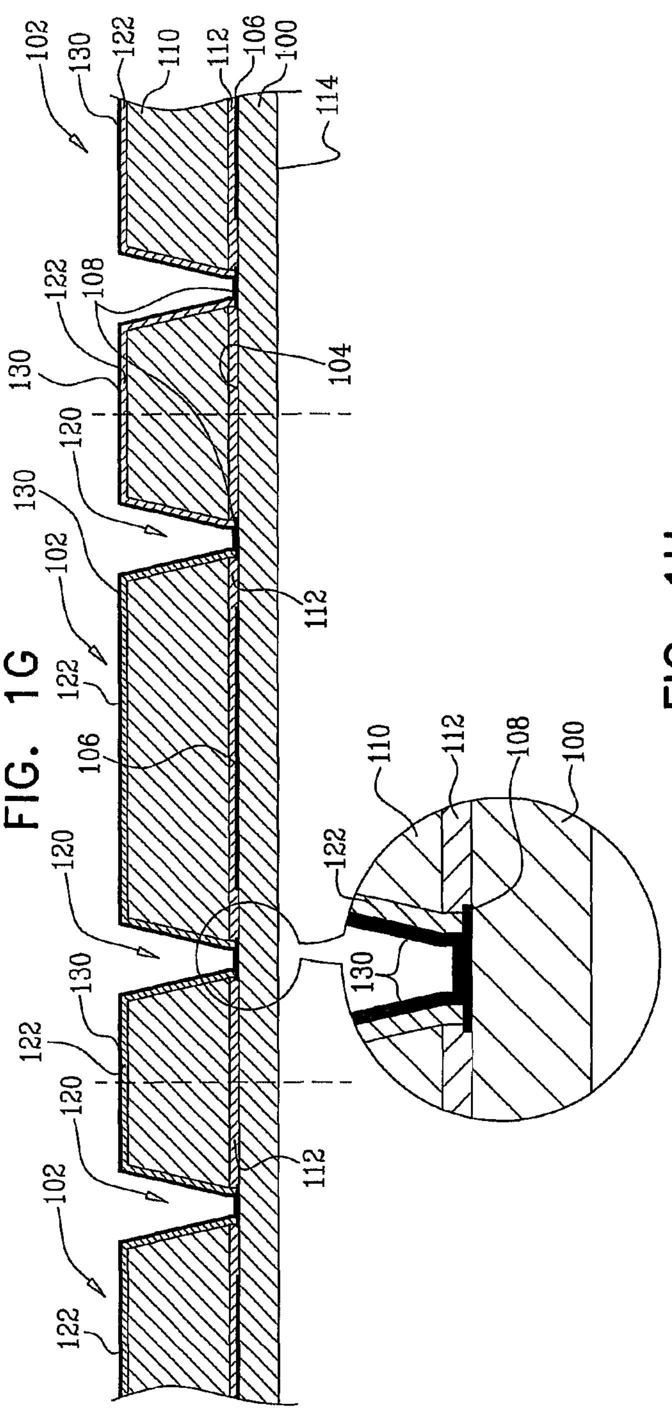

FIG. 1G illustrates the formation of a metal layer 130, by sputtering chrome, aluminum or copper. Metal layer 130 extends from the bond pads 108, over the compliant layer 122 and along the inclined surfaces of the packaging layer 110, defined by notches 120, onto outer, generally planar surfaces of the compliant layer 122 at dies 102.

Figure 1H:
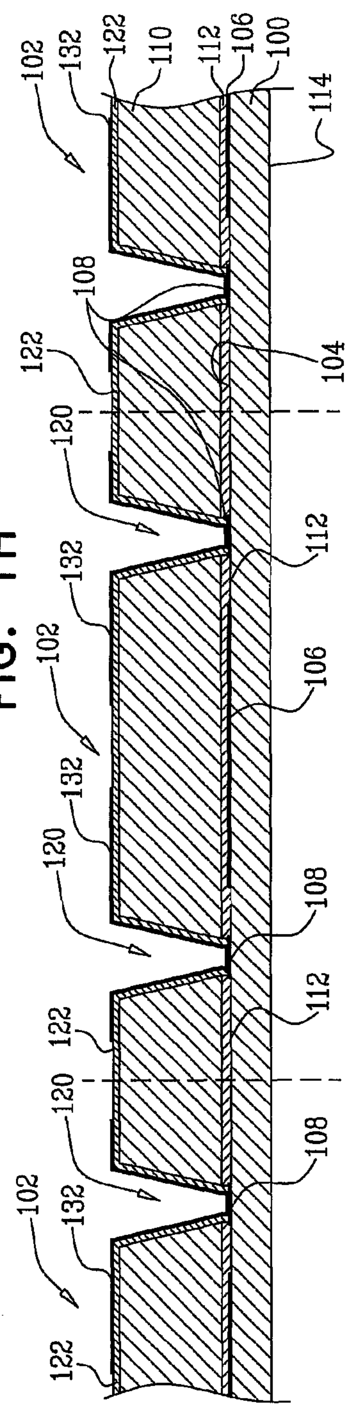

As shown in FIG. 1H, metal connections 132 are preferably formed by patterning the metal layer 130, preferably by 3D photolithography employing a suitable photoresist, preferably Eagle 2100, commercially available from Rohm and Haas Shipley Division of Marlborough, Mass., U.S.A. Optionally, the metal connections 132 may be plated with nickel, as by electroless techniques, in order to provide enhanced corrosion resistance.

Figures 1I, 1J:
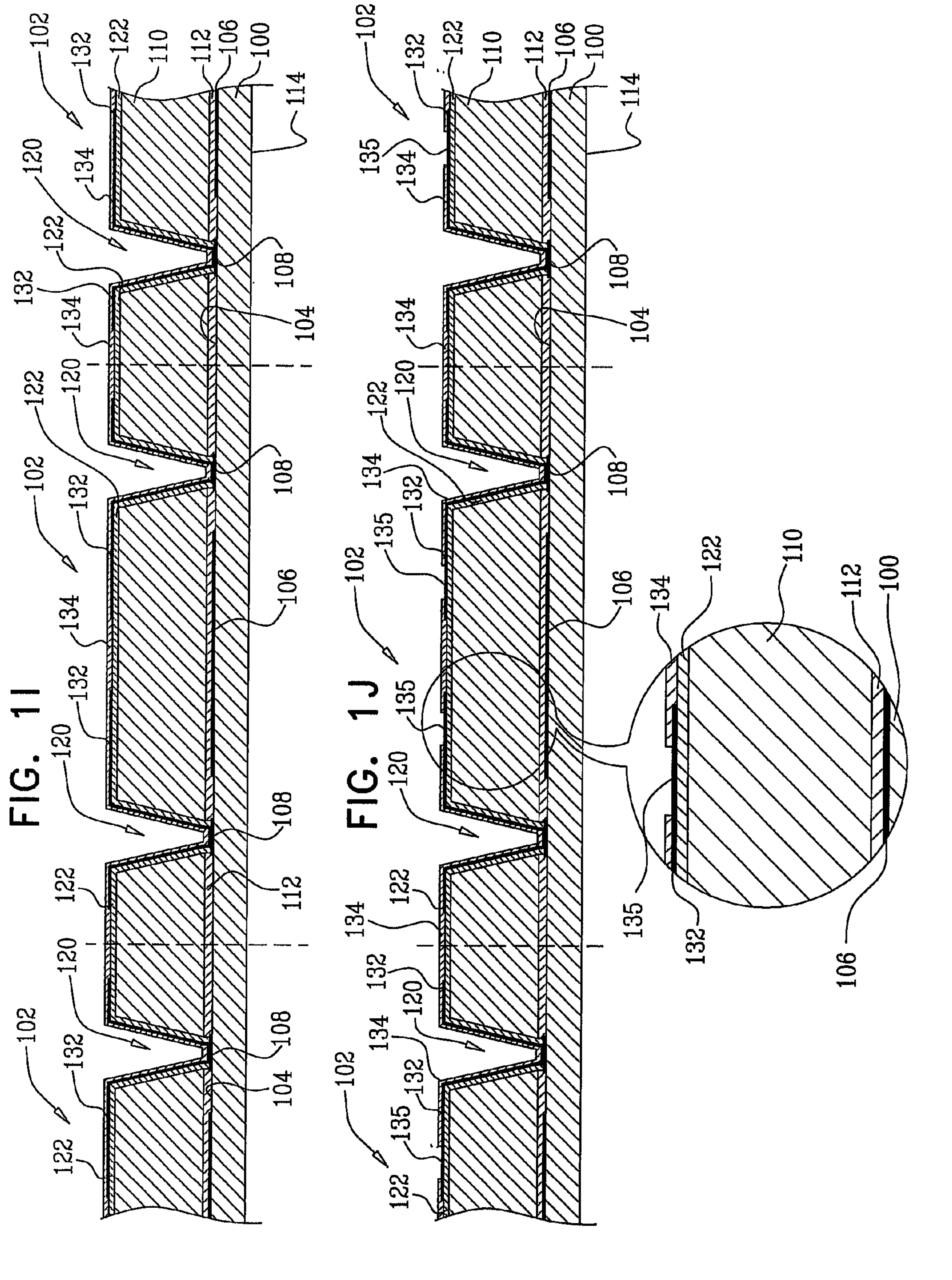

FIG. 1I illustrates the application, preferably by spray coating, of a second, electrically insulative, encapsulant passivation layer 134 over the metal connections 132 and over the compliant layer 122. Preferably, encapsulant passivation layer 134 comprises solder mask. FIG. 1J shows patterning of the encapsulant passivation layer 134, preferably by photolithography, to define solder bump locations 135.

Figure 1K:
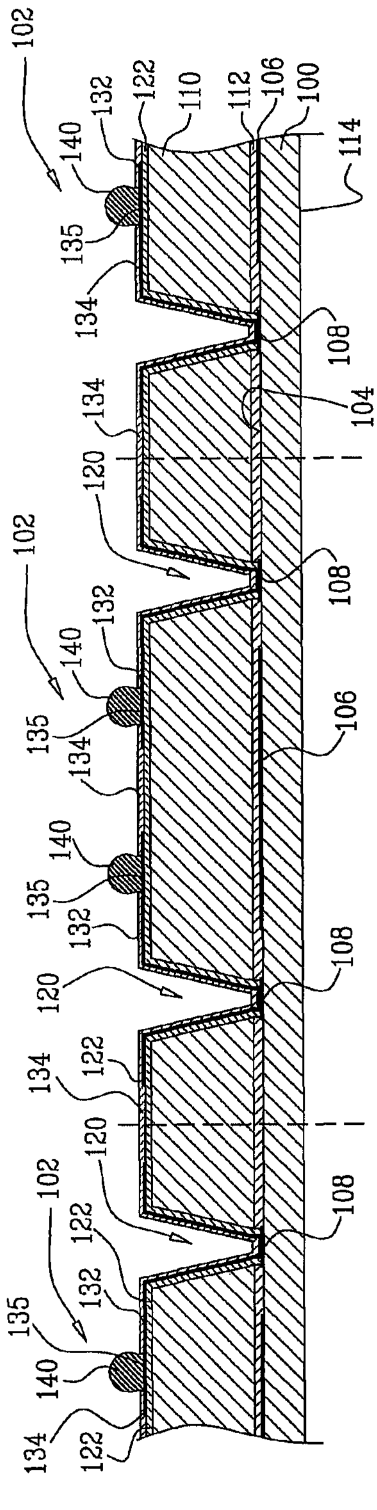

FIG. 1K illustrates the formation of solder bumps 140 at locations 135 on the metal connections 132, at which the encapsulant passivation layer 134 is not present.

Figure 1L:
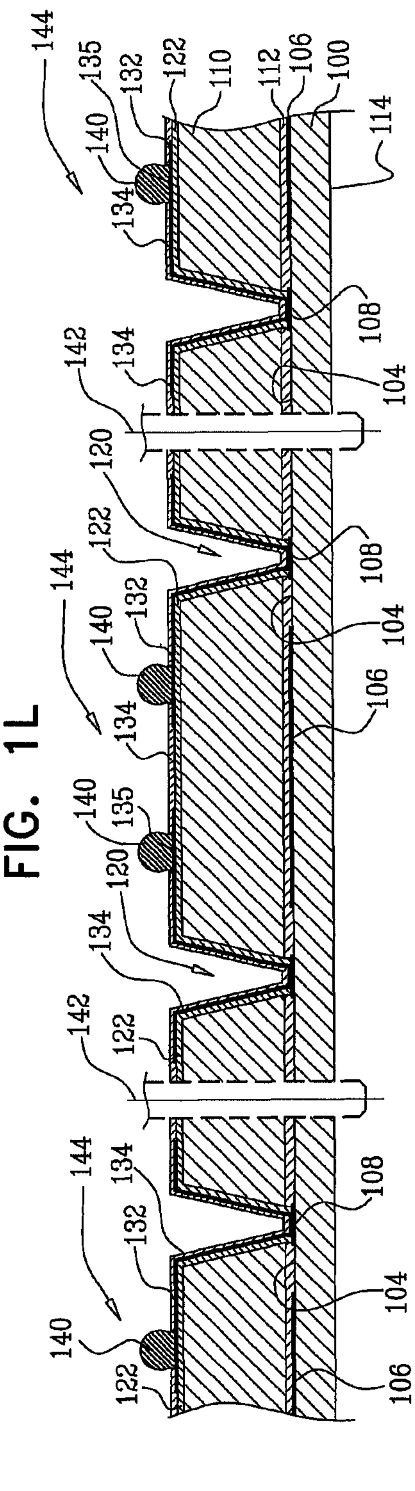

FIG. 1L shows dicing of the wafer 100 and packaging layer 110 of FIG. 1K along scribe lines 142 to produce a multiplicity of individually packaged dies 144.

Figure 1M:
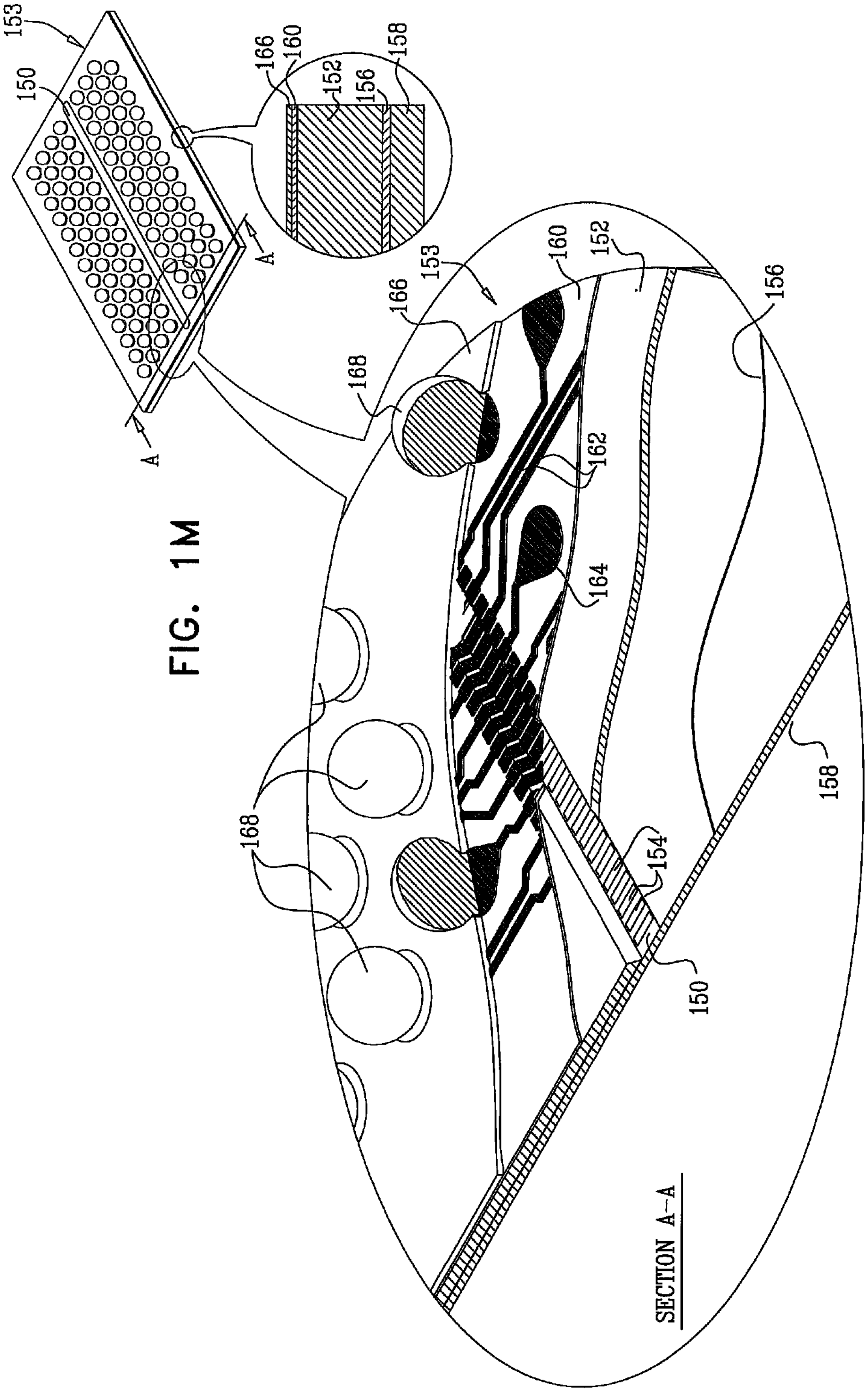
FIG. 1M is a simplified, partially cut away pictorial illustration of part of a packaged semiconductor chip manufactured in accordance with the method of FIGS. 1A-1L.

Reference is now made to FIG. 1M, which is a simplified, partially cut away pictorial illustration of part of a packaged semiconductor DRAM chip manufactured in accordance with the method of FIGS. 1A-1L. As seen in FIG. 1M, a notch 150, corresponding to notch 120 (FIGS. 1D-1L), is formed in a packaging layer 152, corresponding to packaging layer 110 (FIGS. 1B-1L), which forms part of a die 153, corresponding to die 144 (FIG. 1L).

The notch 150 exposes a row of bond pads 154, corresponding to bond pads 108 (FIGS. 1A-1L). A layer 156 of adhesive, corresponding to layer 112 (FIGS. 1B-1L), covers a silicon layer 158, corresponding to semiconductor wafer 100, of the silicon wafer die 153 other than at notch 150, and packaging layer 152 covers the adhesive 156. An electrophoretic, electrically insulative compliant layer 160, corresponding to electrophoretic, electrically insulative compliant layer 122 (FIGS. 1E-1L), covers the packaging layer 152 and extends along inclined surfaces of notch 150, but does not cover the bond pads 154.

Patterned metal connections 162, corresponding to metal connections 132 (FIGS. 1H-1L), extend from bond pads 154 along the inclined surfaces of notch 150 and over generally planar surfaces of compliant layer 160 to solder bump locations 164, corresponding to solder bump locations 135 (FIGS. 1J-1L). An encapsulant passivation layer 166, corresponding to encapsulant passivation layer 134 (FIGS. 1I-1L), is formed over compliant layer 160 and metal connections 162 other than at locations 164. Solder bumps 168, corresponding to solder bumps 140 (FIGS. 1K and 1L), are formed onto metal connections 162 at locations 164.

Reference is now made to FIGS. 2A-2I, which illustrate an alternative methodology, useful for some of the bond pads 108. For such bond pads, the methodology of FIGS. 2A-2I takes place following the steps of FIGS. 1A-1G, and replaces steps 1H, 1I, 1J, 1K and 1L. The methodology of FIGS. 1A-1G and 2A-2I is particularly useful for devices having a high density of bond pads 108, such as DRAMs.

Figure 2A:
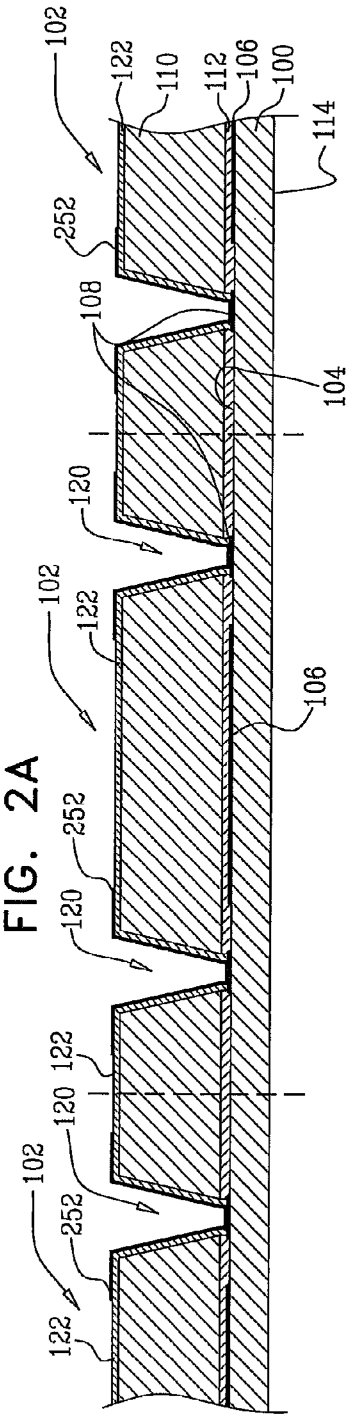
FIGS. 2A-2I are simplified illustrations of a method for manufacturing packaged semiconductor chips in accordance with another preferred embodiment of the present invention.

FIG. 2A illustrates patterning of metal layer 130 (FIG. 1G) to define metal connections 252, preferably by 3D photolithography employing a suitable photoresist, preferably Eagle 2100, commercially available from Rohm and Haas Shipley Division of Marlborough, Mass., U.S.A. Optionally, the metal connections 252 may be plated with nickel, as by electroless techniques, in order to provide enhanced corrosion resistance.

Figure 2B:
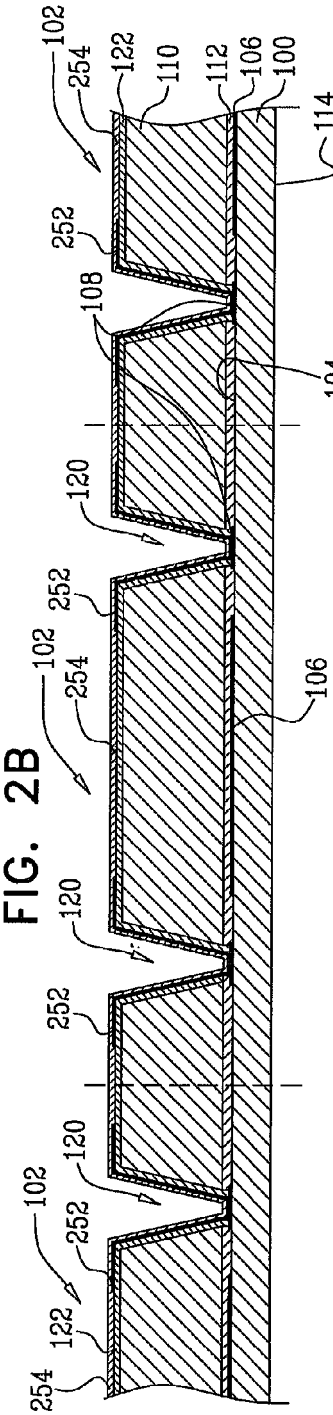
Figure 2C:
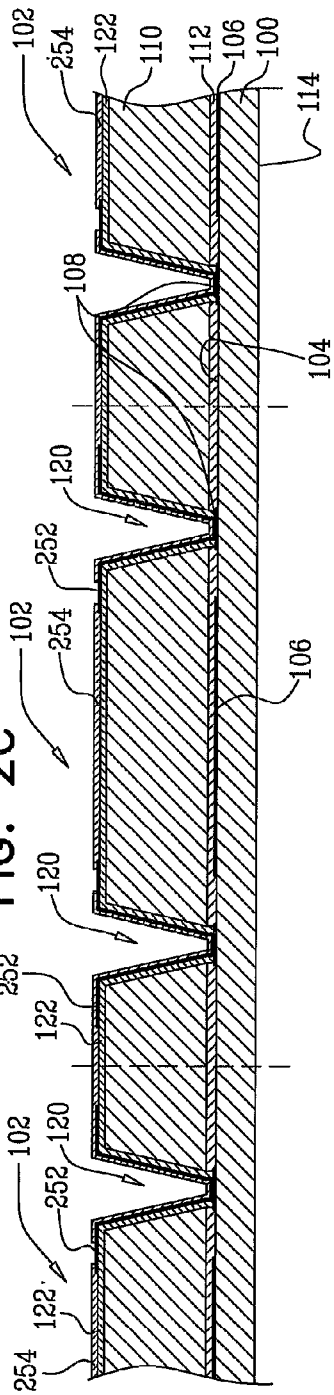

FIG. 2B shows the application, preferably by spray coating, of a second, electrically insulative, encapsulant passivation layer 254 over the metal connections 252 and over the compliant layer 122. Preferably, the encapsulant passivation layer 254 comprises solder mask. FIG. 2C shows patterning of the encapsulant passivation layer 254, preferably by photolithography.

Figure 2D:
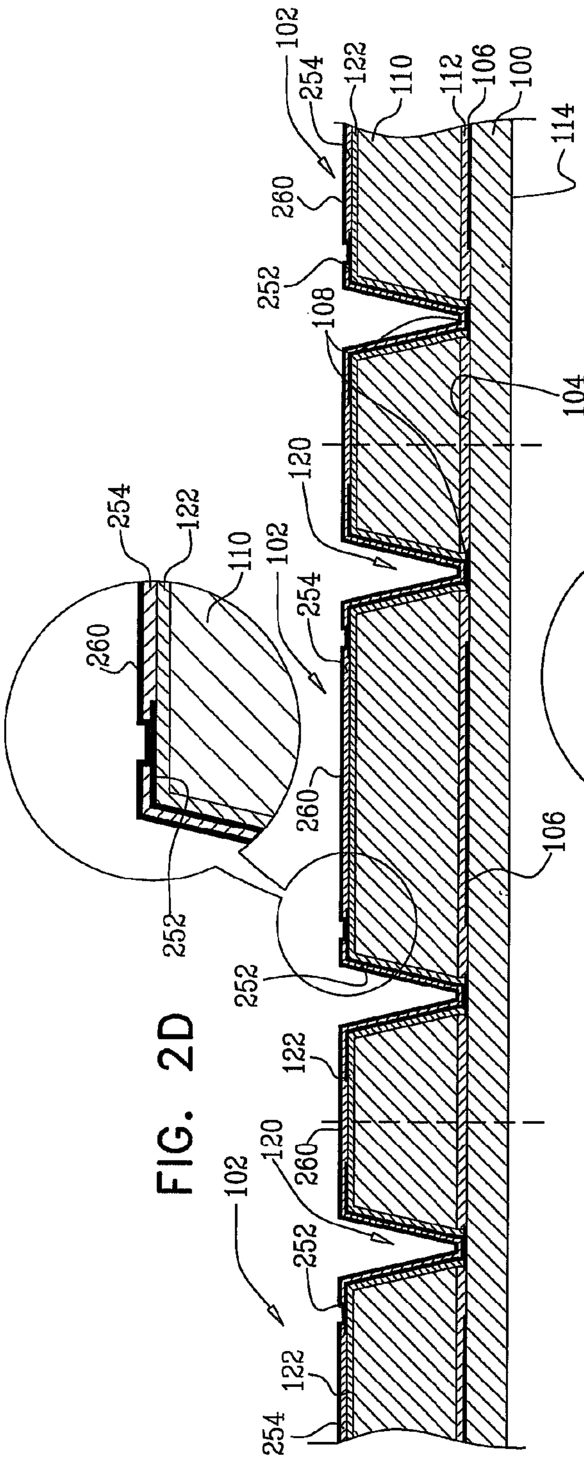

FIG. 2D illustrates the formation of a second metal layer 260 by sputtering chrome, aluminum or copper. Metal layer 260 extends from the metal connections 252 over the encapsulant passivation layer 254.

Figure 2E:
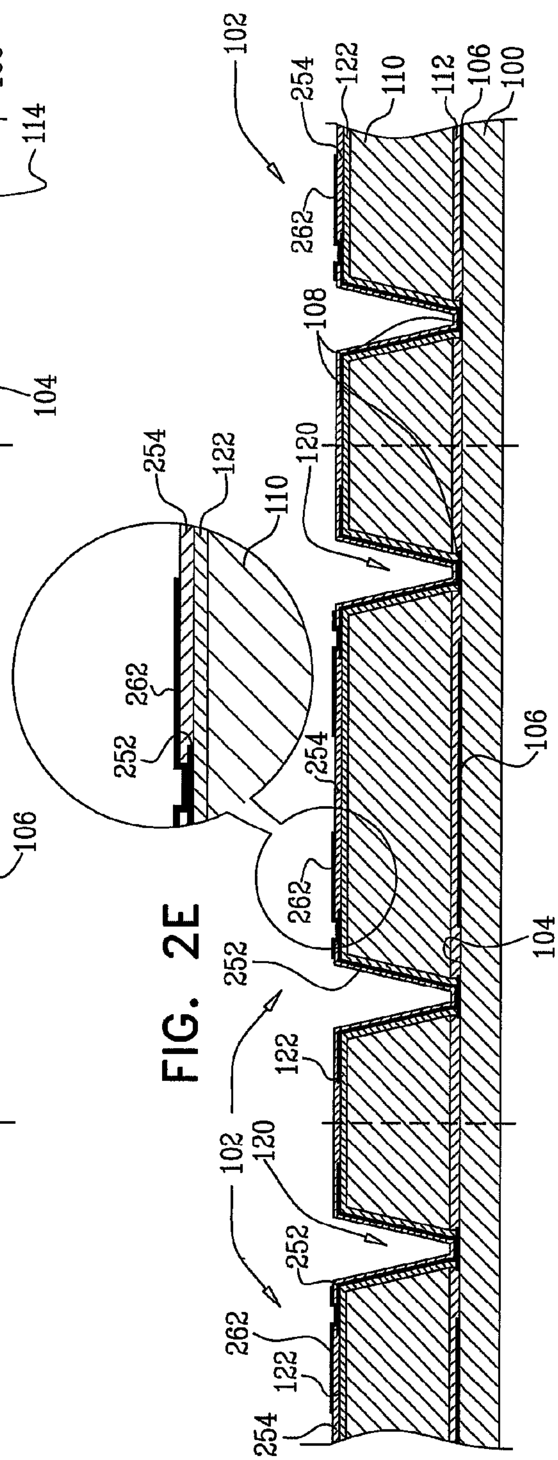

As shown in FIG. 2E, metal connections 262 are preferably formed by patterning metal layer 260, preferably by 3D photolithography employing a suitable photoresist, preferably Eagle 2100, commercially available from Rohm and Haas Shipley Division of Marlborough, Mass., U.S.A. Optionally, the metal connections 262 may be plated with nickel, as by electroless techniques, in order to provide enhanced corrosion resistance.

Figure 2F:
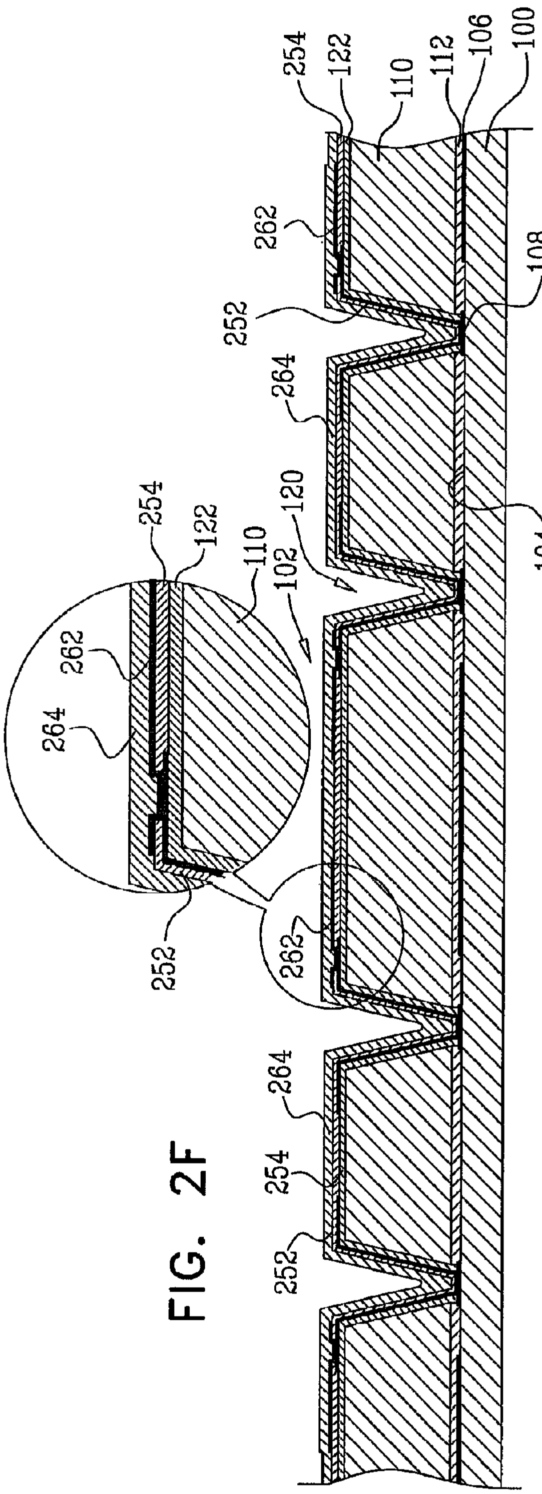
Figure 2G:
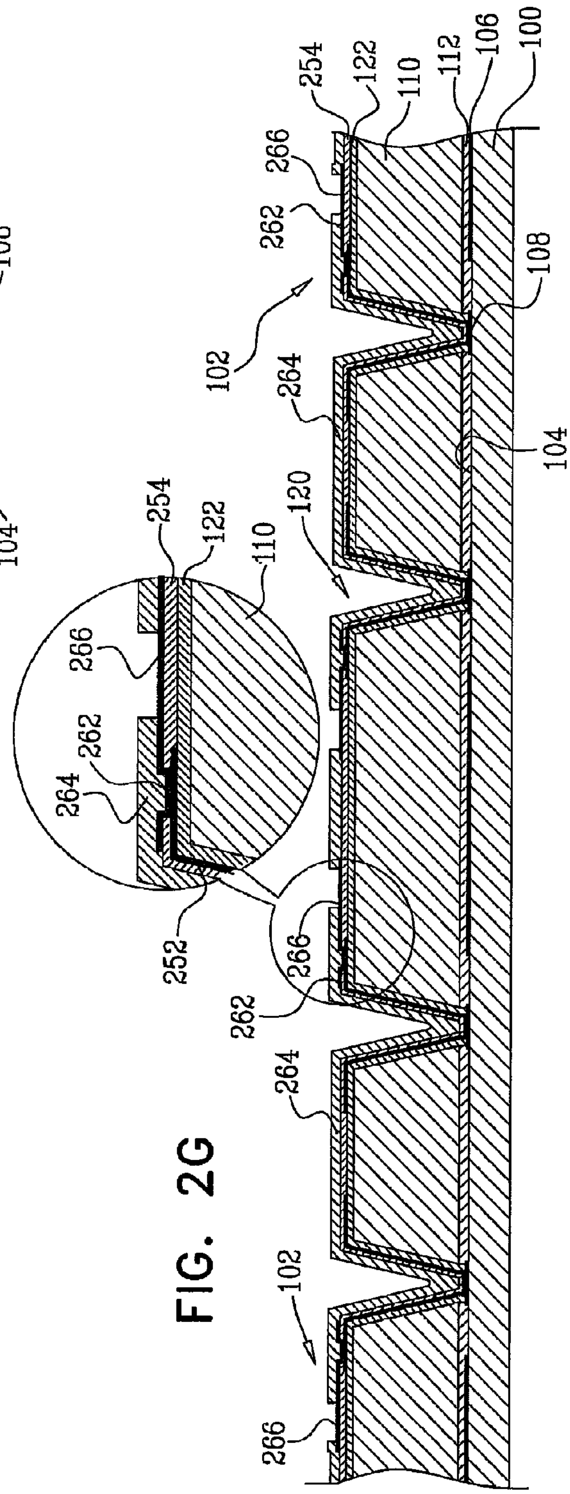

FIG. 2F shows the application, preferably by spray coating, of a third, electrically insulative, encapsulant passivation layer 264 over the metal connections 262 and over the encapsulant passivation layer 254 and the compliant layer 122. Preferably, the encapsulant passivation layer 264 comprises solder mask. FIG. 2G shows patterning of the encapsulant passivation layer 264, preferably by photolithography, to define solder bump locations 266.

Figure 2H:
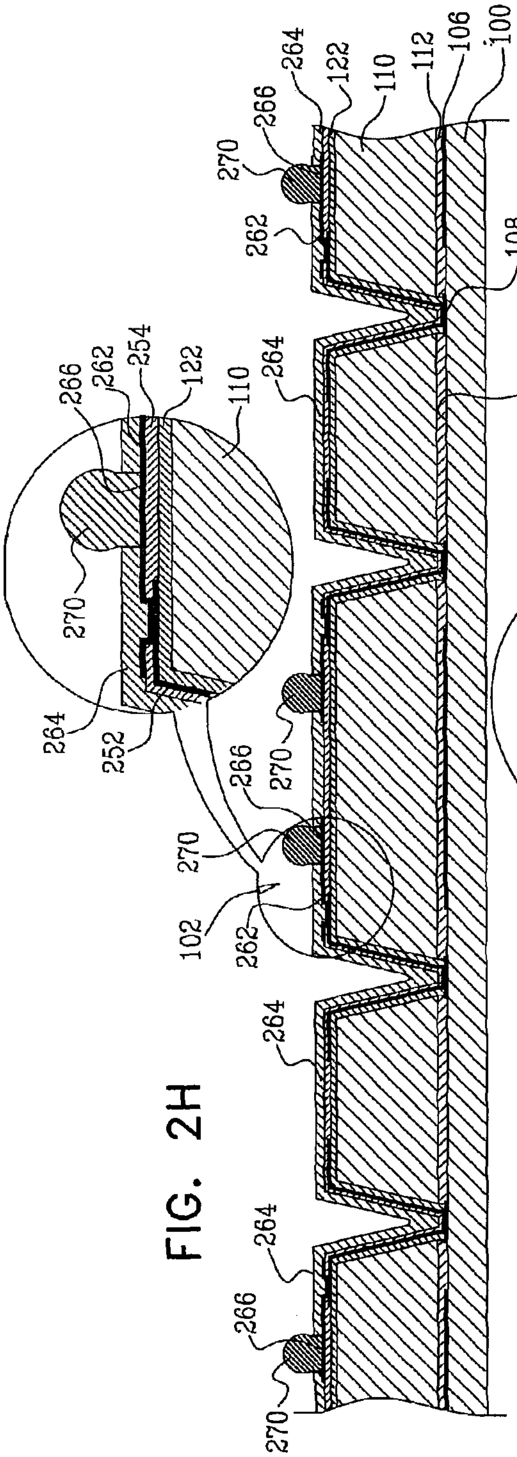

FIG. 2H illustrates the formation of solder bumps 270 at solder bump locations 266, at which the encapsulant passivation layer 264 is not present.

Figure 2I:
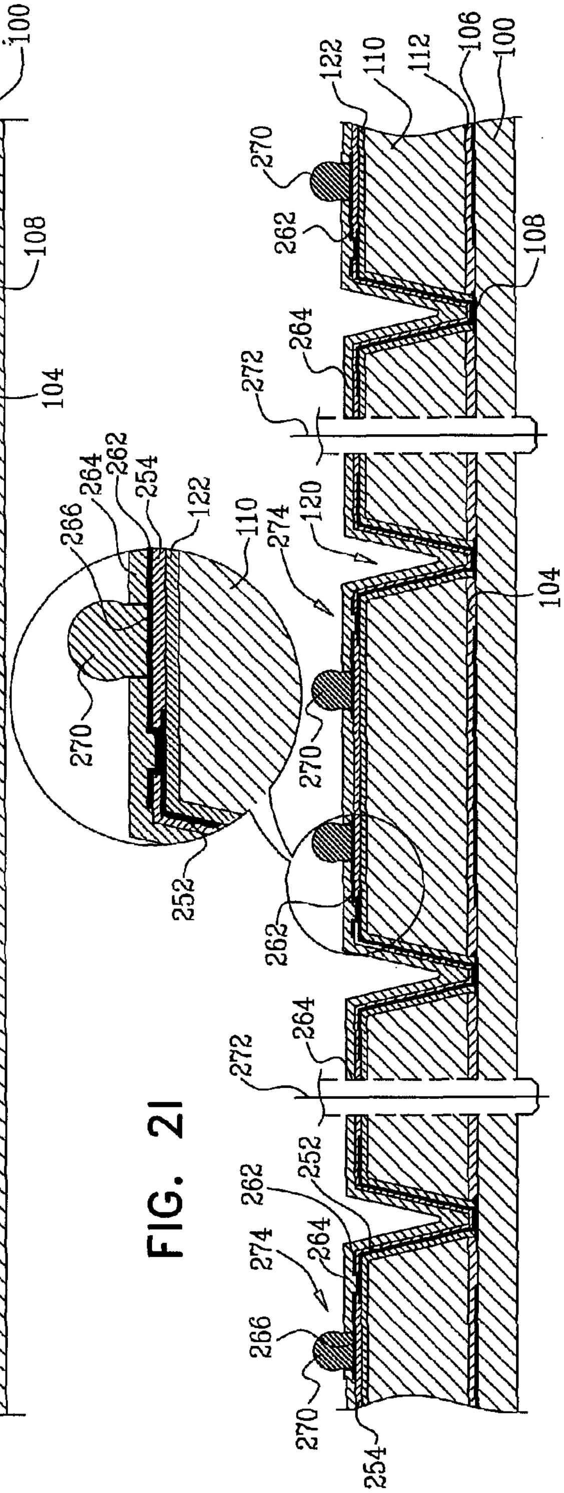

FIG. 2I shows dicing of the wafer 100 and packaging layer 110 of FIG. 2H along scribe lines 272 to produce a multiplicity of individually packaged dies 274.

Figure 2J:
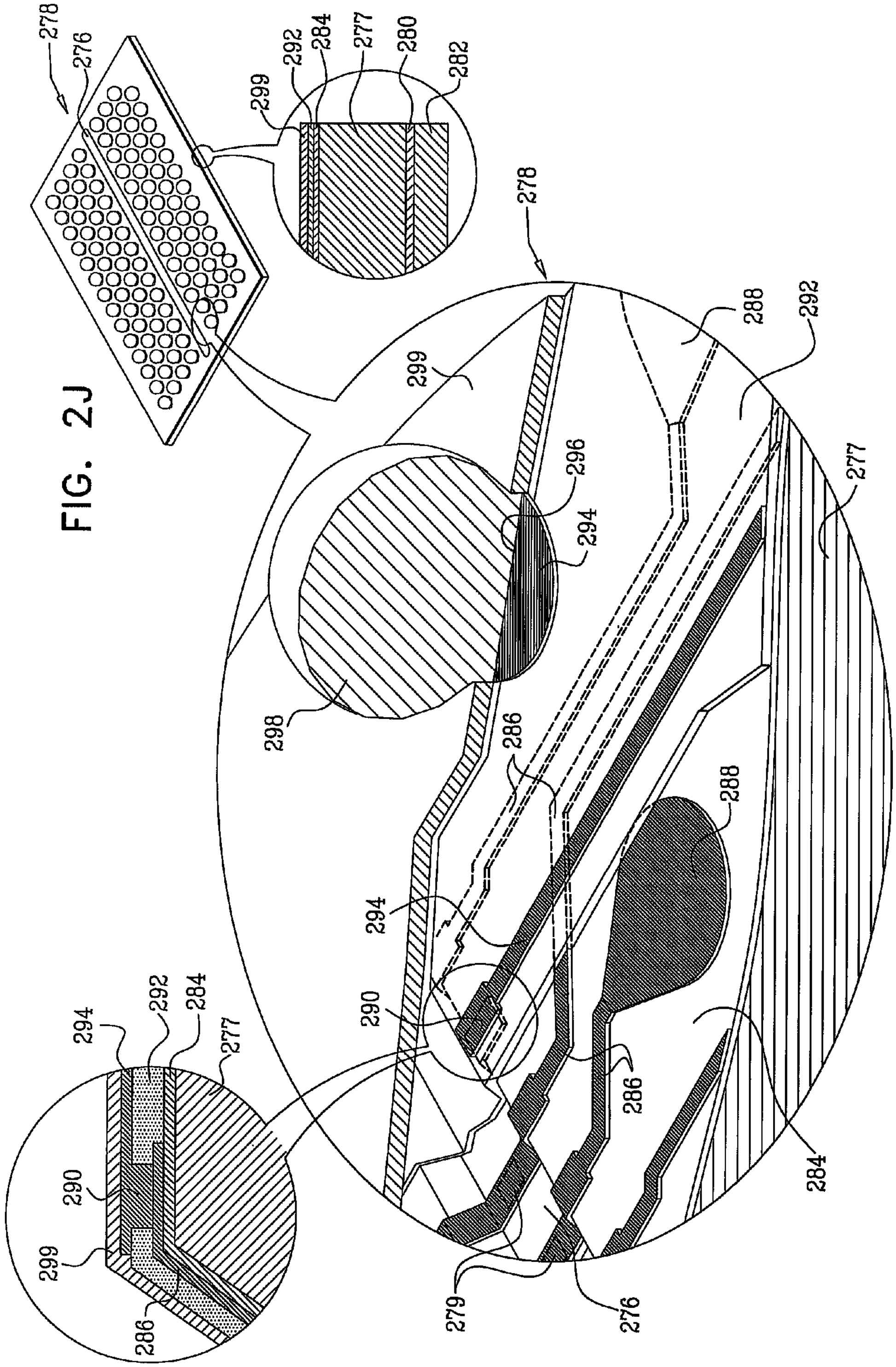
FIG. 2J is a simplified partially cut away pictorial illustration of part of a packaged semiconductor chip manufactured in accordance with the method of FIGS. 1A-1G and 2A-2I.

Reference is now made to FIG. 2J, which is a simplified partially cut away pictorial illustration of part of a packaged semiconductor DRAM chip manufactured in accordance with the method of FIGS. 1A-1G and 2A-2I. As seen in FIG. 2J, a notch 276, corresponding to notch 120 (FIGS. 2A-2I), is formed in packaging layer 277, corresponding to packaging layer 110 (FIGS. 2A-2H), which forms part of a silicon wafer die 278, corresponding to die 274 (FIG. 2I).

The notch 276 exposes a row of bond pads 279, corresponding to bond pads 108 (FIGS. 2A-2I). A layer 280 of adhesive, corresponding to layer 112 (FIGS. 2A-2I), covers a silicon layer 282, corresponding to semiconductor wafer 100, of silicon wafer die 278 other than at notch 276 and packaging layer 277 covers the adhesive 280. An electrophoretic, electrically insulative compliant layer 284, corresponding to electrophoretic, electrically insulative compliant layer 122 (FIGS. 2A-2I), covers the packaging layer 277 and extends along inclined surfaces of notch 276, but does not cover the bond pads 279.

Patterned metal connections 286, corresponding to metal connections 132 (FIGS. 1H-1L), extend from some of bond pads 279 along the inclined surfaces of notch 276 and over generally planar surfaces of compliant layer 284 to solder bump locations 288, corresponding to some of solder bump locations 135 (FIGS. 1J-1L). Other patterned metal connections 286, corresponding to metal connections 252 (FIGS. 2A-2I), extend from other bond pads 279 along the inclined surfaces of notch 276 to additional locations 290.

An encapsulant passivation layer 292, corresponding to encapsulant passivation layer 254 (FIGS. 2B-2I), is formed over compliant layer 284 and metal connections 286 other than at solder bump locations 288 and additional locations 290.

Additional metal connections 294, corresponding to metal connections 262 (FIGS. 2E-2I), extend from additional locations 290 over generally planar surfaces of compliant layer 284 to solder bump locations 296, corresponding to solder bump locations 266 (FIGS. 2G-2I). Solder bumps 298, corresponding to solder bumps 270 (FIGS. 2H and 2I) are formed onto metal connections 294 at locations 296.

An encapsulant passivation layer 299, corresponding to encapsulant passivation layer 264 (FIGS. 2G-2I), is formed over encapsulant passivation layer 292 and metal connections 294 other than at solder bump locations 296.

Reference is now made to FIGS. 3A-3I, which are simplified sectional illustrations of a method for manufacturing packaged semiconductor chips in accordance with yet another preferred embodiment of the present invention wherein the packaging layer 110 is electrically conductive. The method of FIGS. 3A-3I employs the steps described hereinabove with reference to FIGS. 1A-1C, which are followed by the steps shown in FIGS. 3A-3I.

Figure 3A:
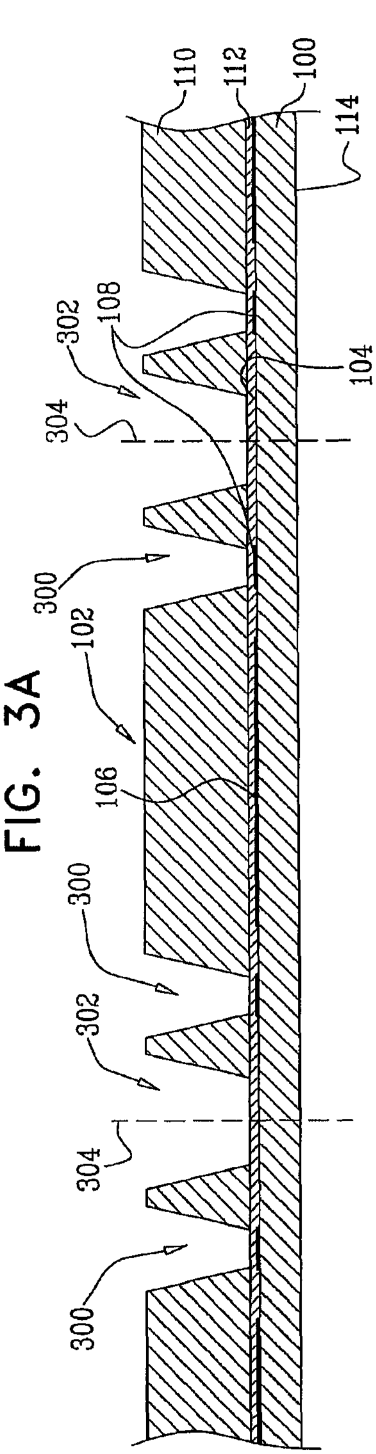

FIG. 3A shows notches 300 and 302 formed in the structure of FIG. 1C, described hereinabove. Notches 300 and 302 are preferably formed by photolithography, employing plasma etching or wet etching techniques, and preferably do not extend through adhesive 112. Notches 300 are formed at locations which overlie bond pads 108 and are similar to notches 120 of FIGS. 1D-1L and 2A-2I.

Preferably, notches 302 are wider than notches 300 and are symmetrically formed on both sides of scribe lines 304. Notches 302 are of varying width and depth, such that at corners of dies at which adjacent dies meet, there is provided electrically conductive continuity of the packaging layer 110 across adjacent dies 102 prior to dicing. This is achieved by decreasing the depth and corresponding width of the notches 302 at junctions of adjacent dies 102.

Figure 3B:
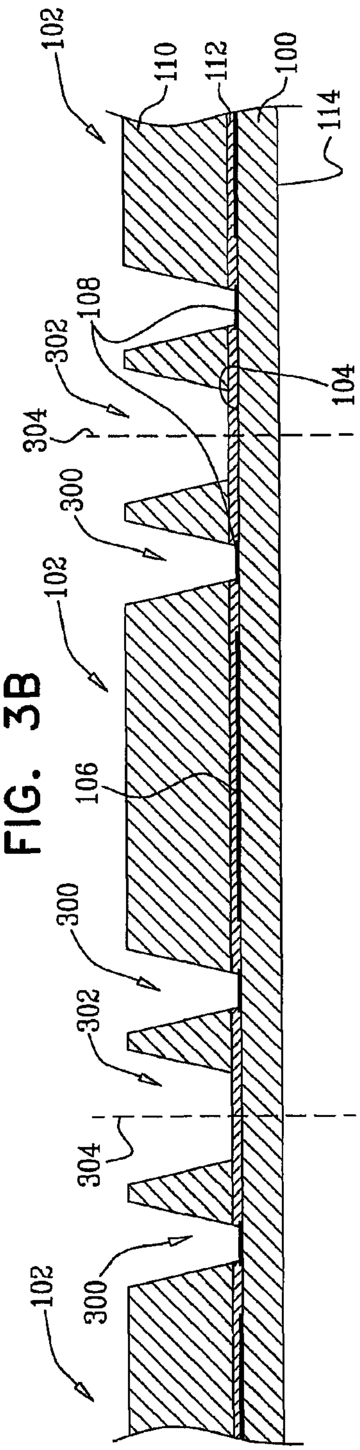

Turning to FIG. 3B, it is seen that the adhesive 112 overlying bond pads 108 and underlying notches 300 is removed, preferably by dry etching.

Figures 3C, 3D:
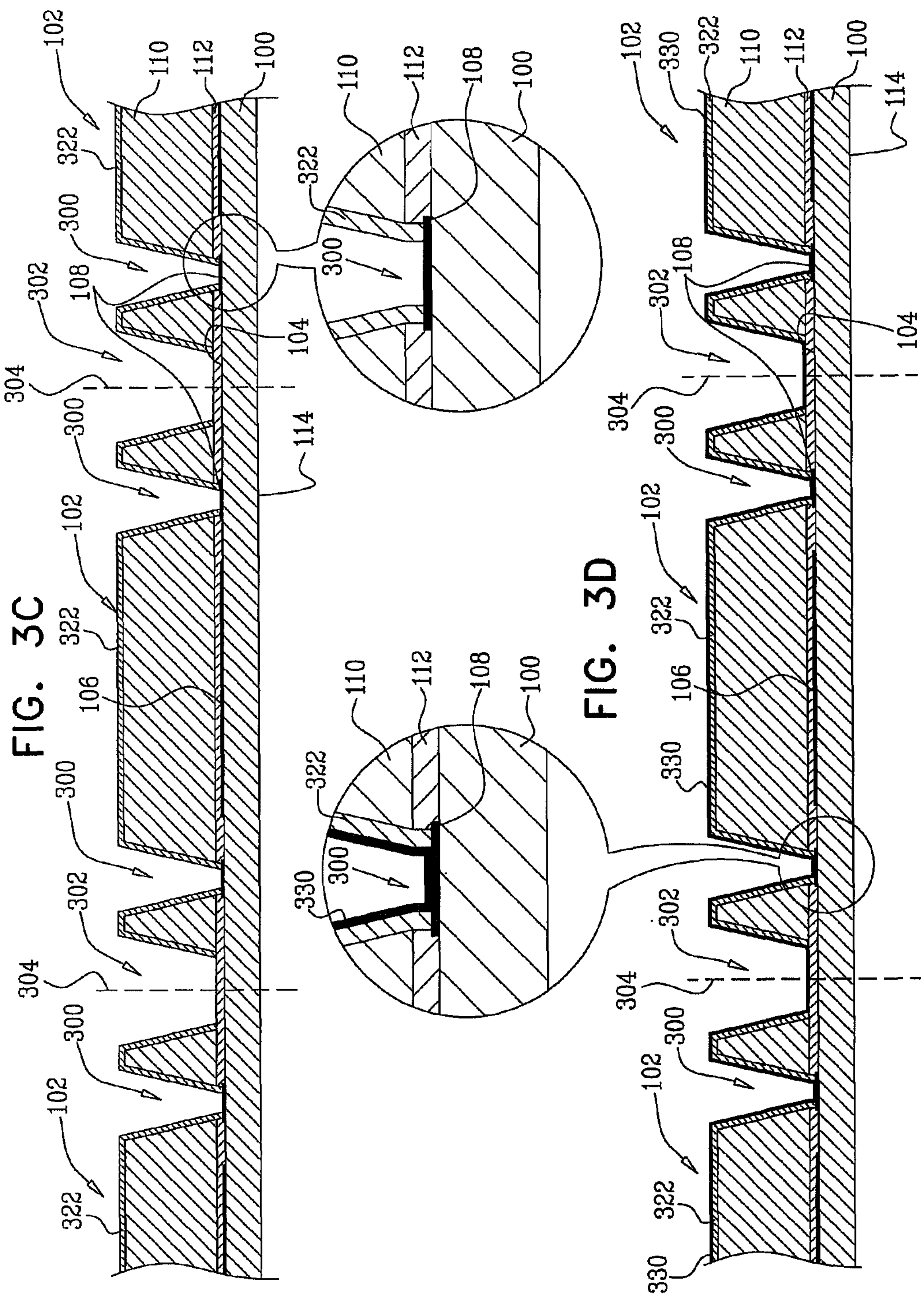

FIG. 3C shows the formation of an electrophoretic, electrically insulative compliant layer 322 over the packaging layer 110. Examples of suitable materials for compliant layer 322 are those described hereinabove with reference to FIG. 1F. Once cured, compliant layer 322 encapsulates all exposed surfaces of the packaging layer 110. Compliant layer 322 preferably provides protection to the device from alpha particles emitted by BGA solder balls.

FIG. 3D illustrates the formation of a metal layer 330, by sputtering chrome, aluminum or copper. Metal layer 330 extends from the bond pads 108, over the compliant layer 322 and along the inclined surfaces of the packaging layer 110, defined by notches 300 and 302, onto outer, generally planar surfaces of the compliant layer 322 at dies 102.

Figure 3E:
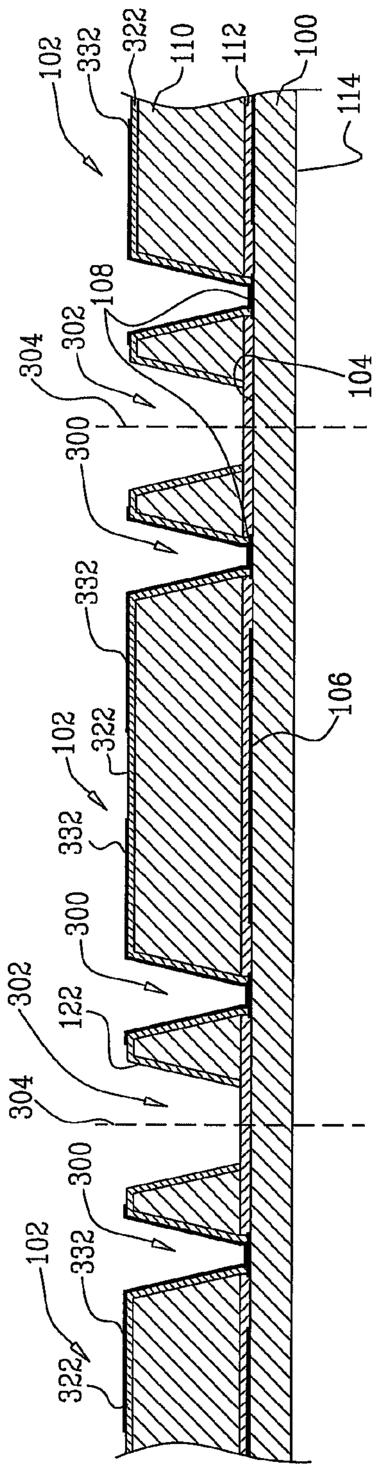

As shown in FIG. 3E, metal connections 332 are preferably formed by patterning the metal layer 330, preferably by 3D photolithography employing a suitable photoresist, preferably Eagle 2100, commercially available from Rohm and Haas Shipley Division of Marlborough, Mass., U.S.A. Optionally, the metal connections 332 may be plated with nickel, as by electroless techniques, in order to provide enhanced corrosion resistance.

Figure 3F:
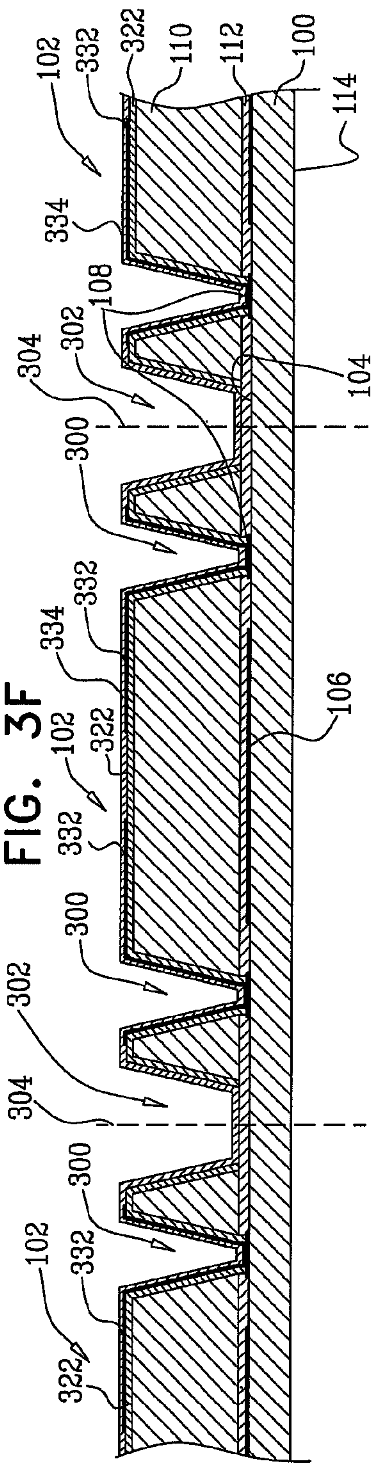
Figure 3G:
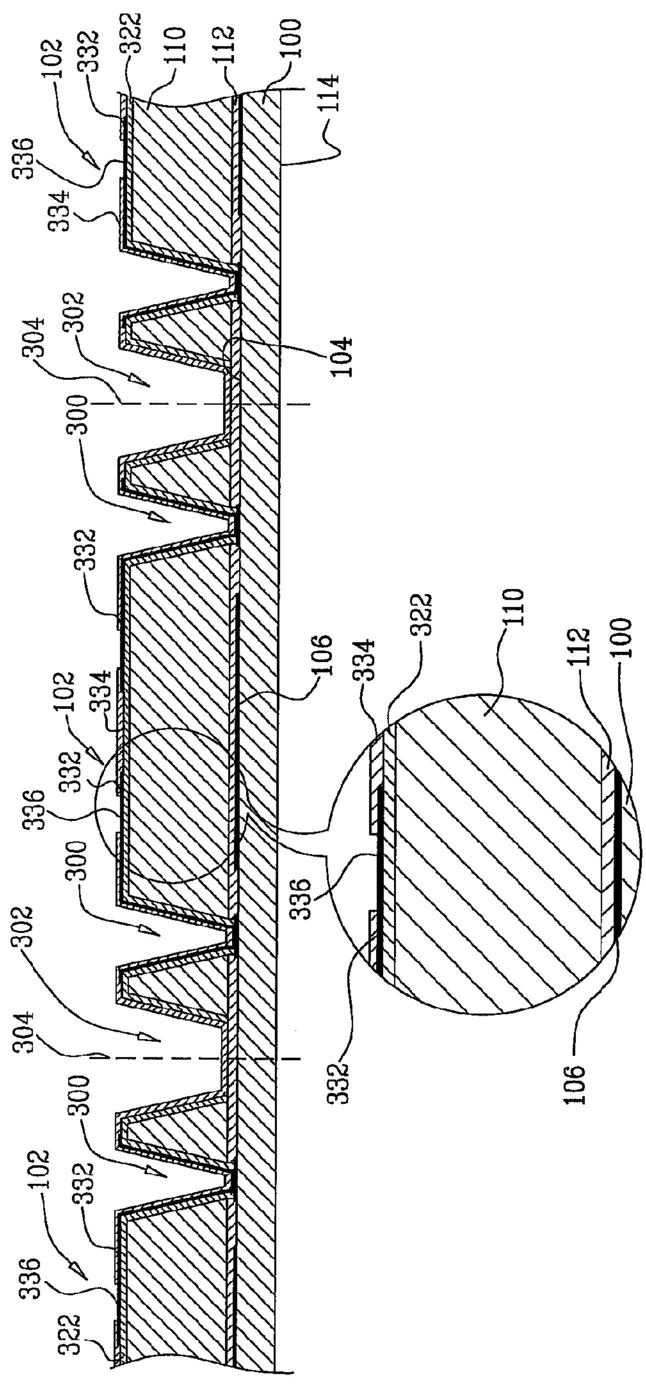

FIG. 3F illustrates the application, preferably by spray coating, of a second, electrically insulative, encapsulant passivation layer 334 over the metal connections 332 and over the compliant layer 322. Preferably, the encapsulant passivation layer 334 comprises solder mask. FIG. 3G shows patterning of the encapsulant passivation layer 334, preferably by photolithography, to define solder bump locations 336.

Figure 3H:
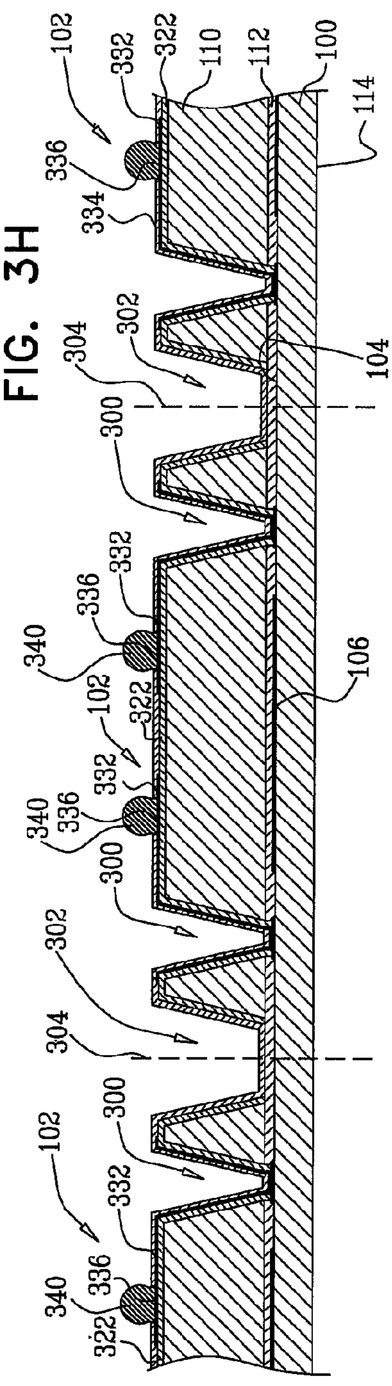
Figure 31:
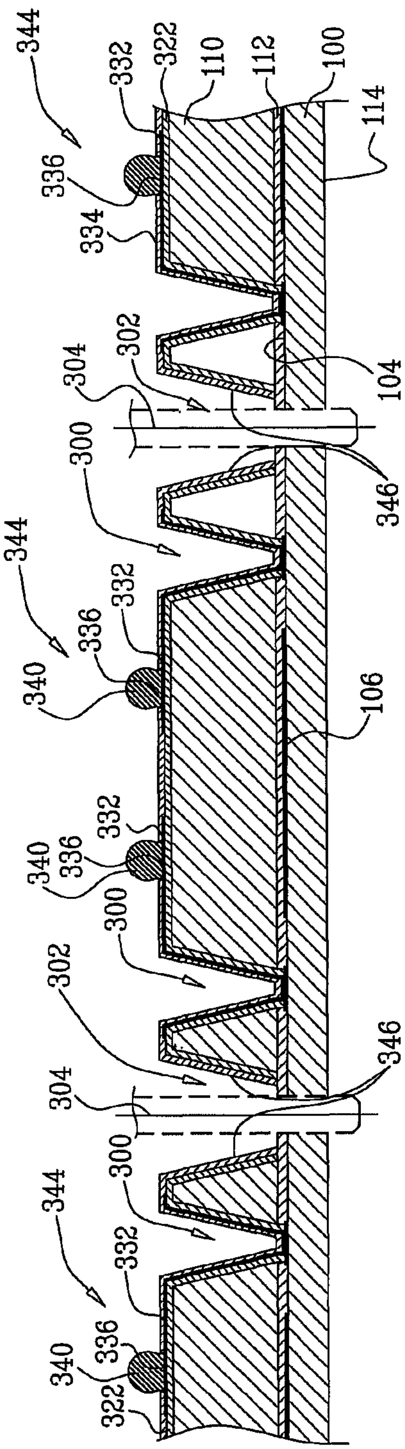

FIG. 3H illustrates the formation of solder bumps 340 at locations 336 on the metal connections 332, at which the encapsulant passivation layer 334 is not present.

FIG. 3I shows dicing of the wafer 100 and packaging layer 110 of FIG. 3H along scribe lines 304 to produce a multiplicity of individually packaged dies 344 having inclined surfaces 346 adjacent the scribe lines 304.

Figure 3J:
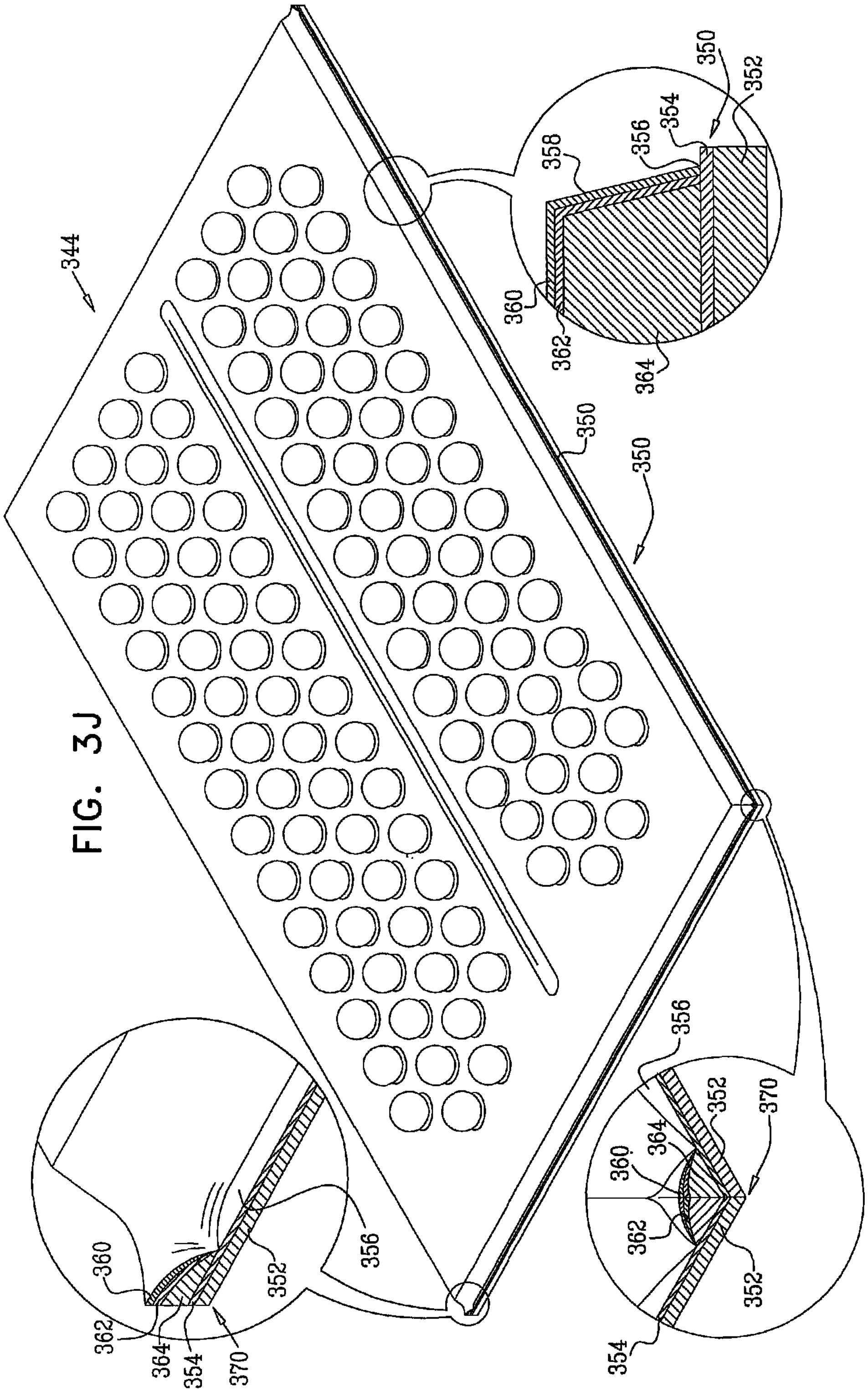
FIG. 3J is a simplified partially pictorial, partially sectional illustration of part of a packaged semiconductor chip manufactured in accordance with the method of FIGS. 3A-3I.

Reference is now made to FIG. 3J, which is a simplified partially pictorial, partially sectional illustration of part of a packaged semiconductor DRAM chip manufactured in accordance with the method of FIGS. 3A-3I. As seen in FIG. 3J, the edge structure of each individually package die 344 includes a straight-edged base portion 350 including an edge defined by a silicon layer 352, corresponding to a portion of semiconductor wafer 100 (FIGS. 3A-3I) overlaid with a layer 354 of adhesive, corresponding to adhesive layer 112 (FIGS. 3A-3I).

Disposed over straight-edged base portion 350 and set back slightly therefrom, other than at the corners of the packaged semiconductor DRAM chip, thereby defining a shoulder 356, is an inclined edge portion 358 corresponding to inclined surface 346 (FIG. 3I). Since the depth and corresponding width of the notches 302 are decreased at junctions of adjacent dies 102, shoulders 356 do not extend to the corners.

The inclined edge portion 358 is defined by an encapsulant passivation layer 360, corresponding to encapsulant passivation layer 334 (FIGS. 3F-3I) which overlies an electrophoretic, electrically insulative compliant layer 362, corresponding to electrophoretic, electrically insulative compliant layer 322 (FIG. 3B-3I), which in turn overlies a packaging layer 364, corresponding to packaging layer 110 (FIGS. 3A-3I).

As also seen in FIG. 3J, the corner structure of each individually package die 344 includes a straight-edged corner portion 370 including a corner defined by silicon layer 352, overlaid with layer 354 of adhesive, above which is a portion of packaging layer 364, electrophoretic, electrically insulative compliant layer 362 and encapsulant passivation layer 360.

Figure 4A:
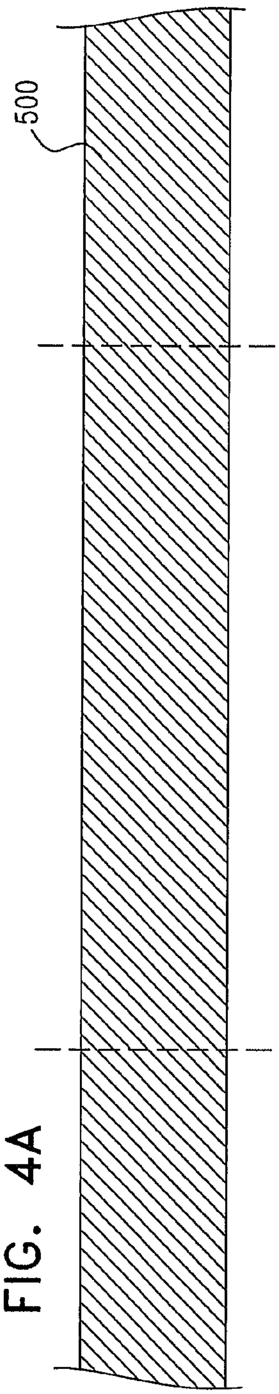
FIGS. 4A-4N are simplified sectional illustrations of a method for manufacturing packaged semiconductor chips in accordance with still another preferred embodiment of the present invention.
Figure 4B:
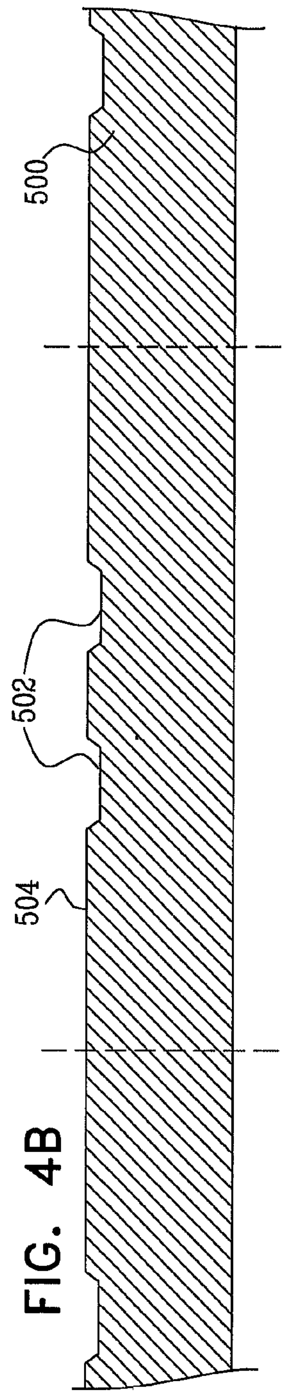
FIG. 4O is a simplified partially cut away pictorial illustration of part of a packaged semiconductor chip manufactured in accordance with the method of FIGS. 4A-4N.
Figure 4C:
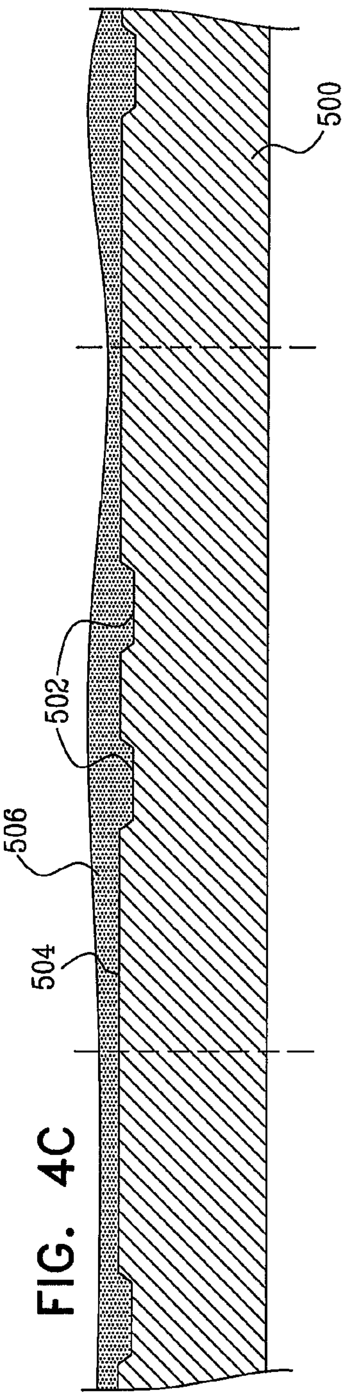
Figure 4D:
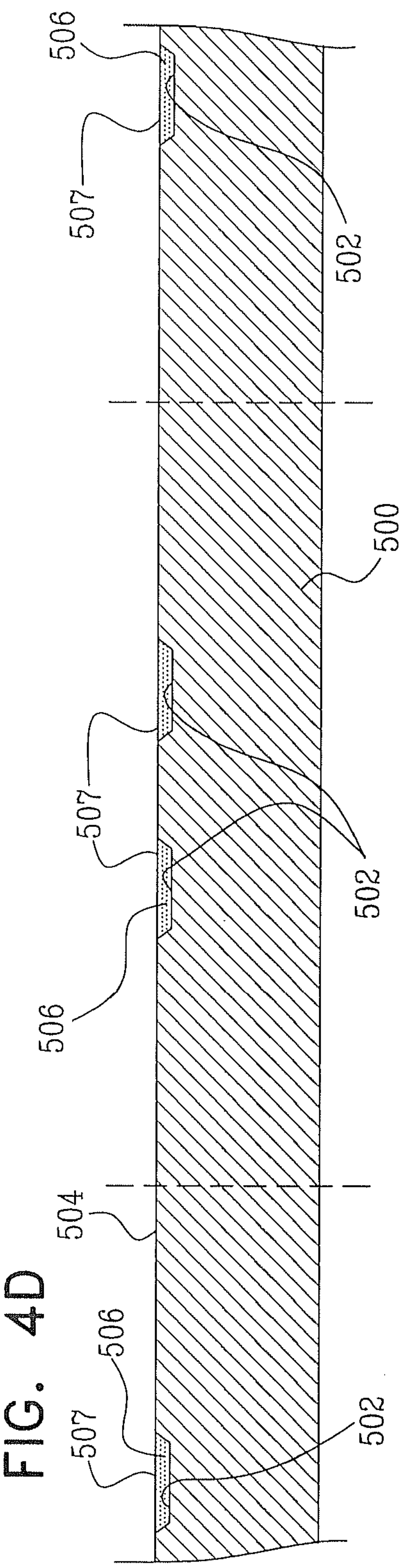
Figure 4E:
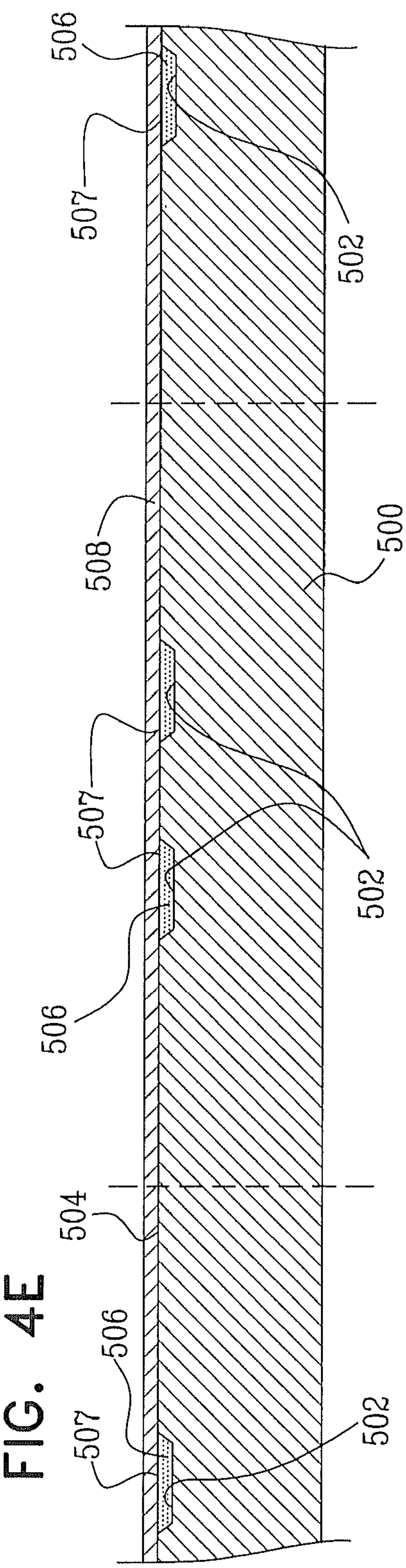
Figure 4F:
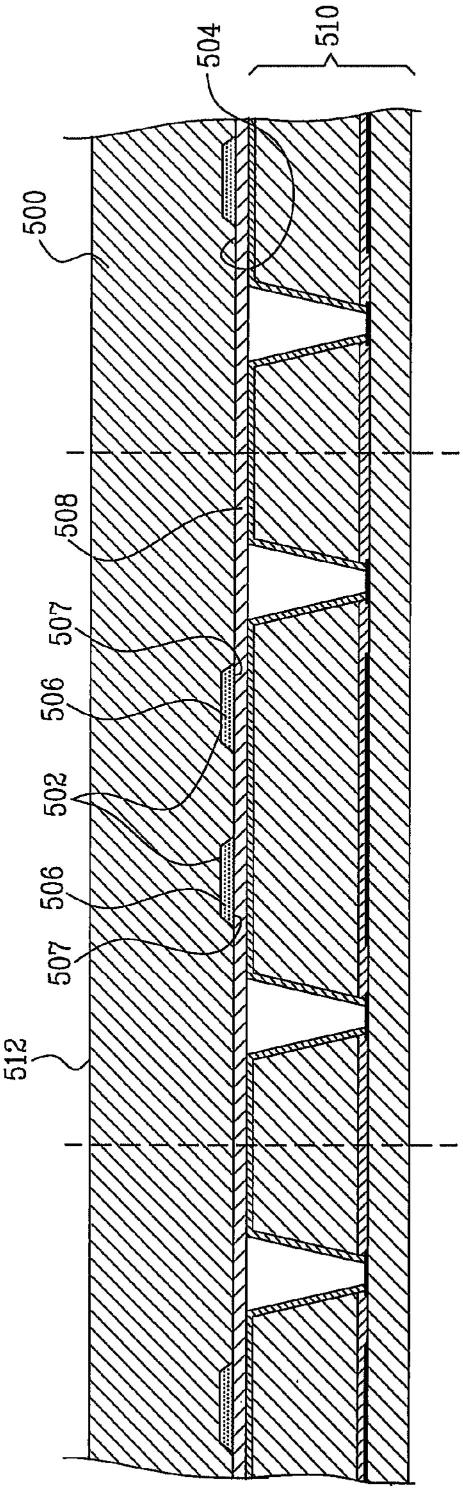
Figure 4G:
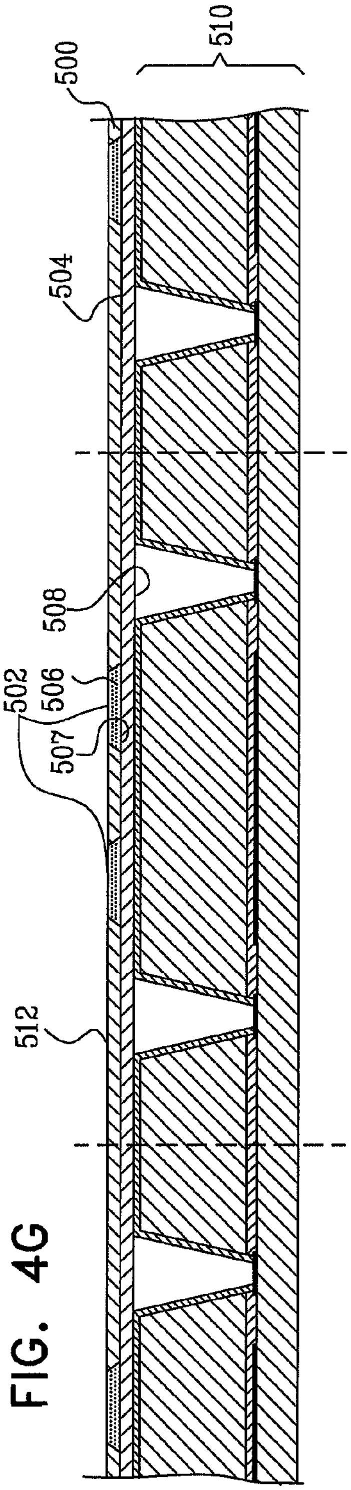
Figure 4H:
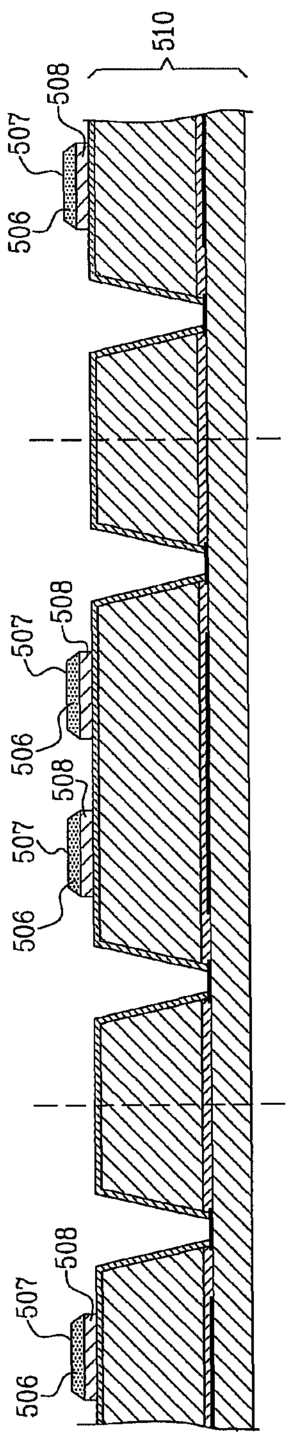
Figure 4I:
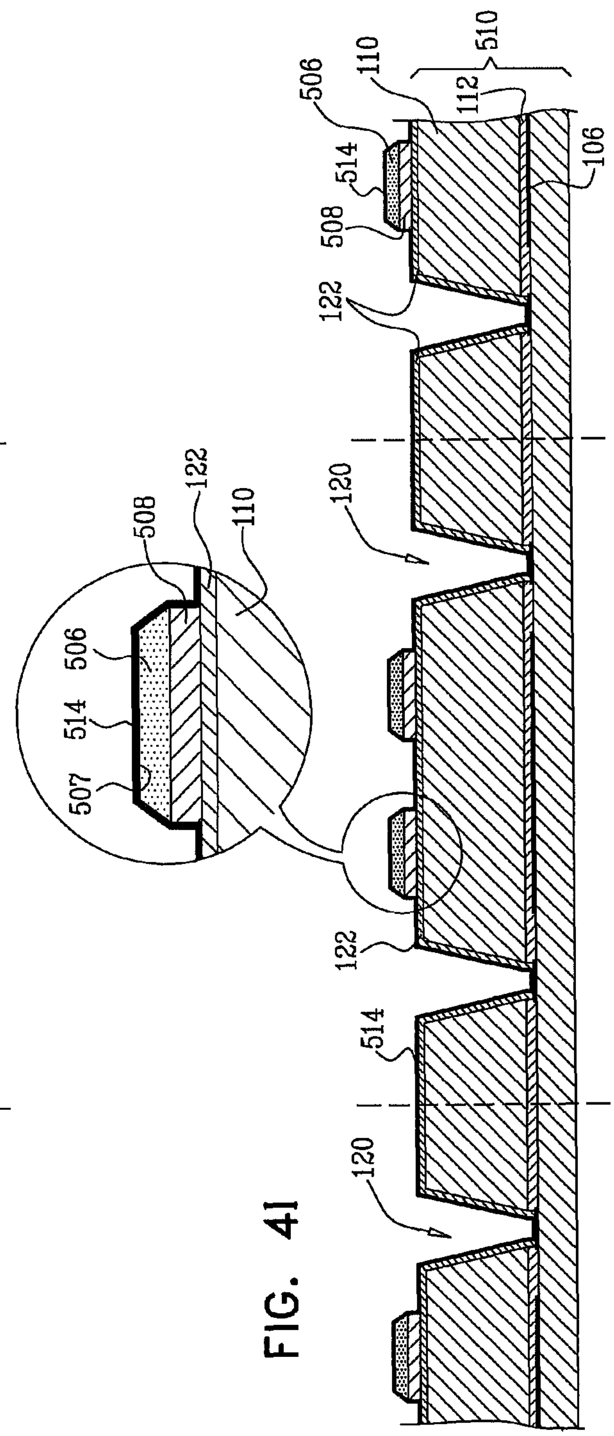
Figure 4J:
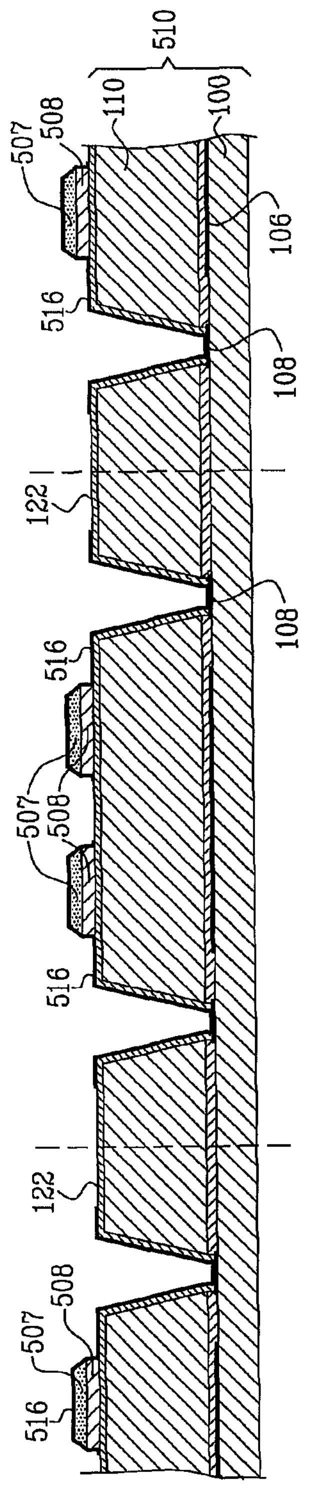
Figure 4K:
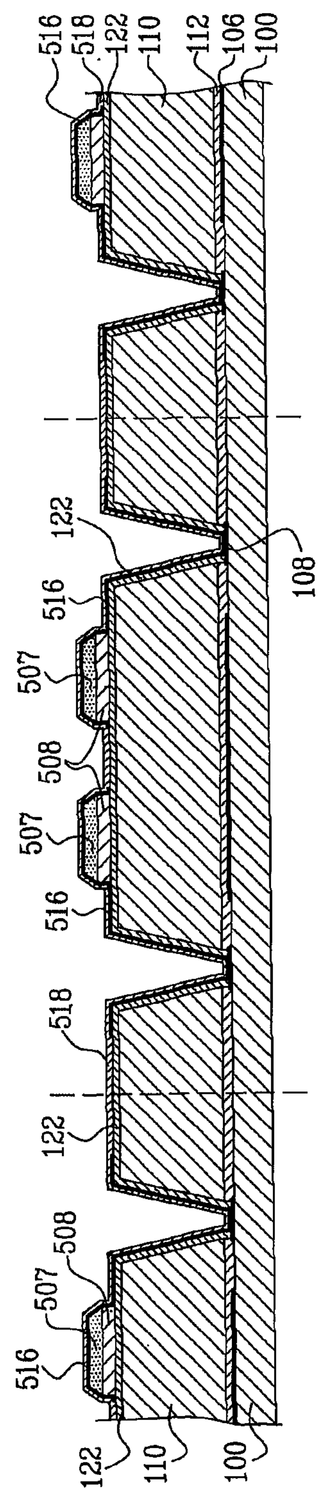
Figure 4L:
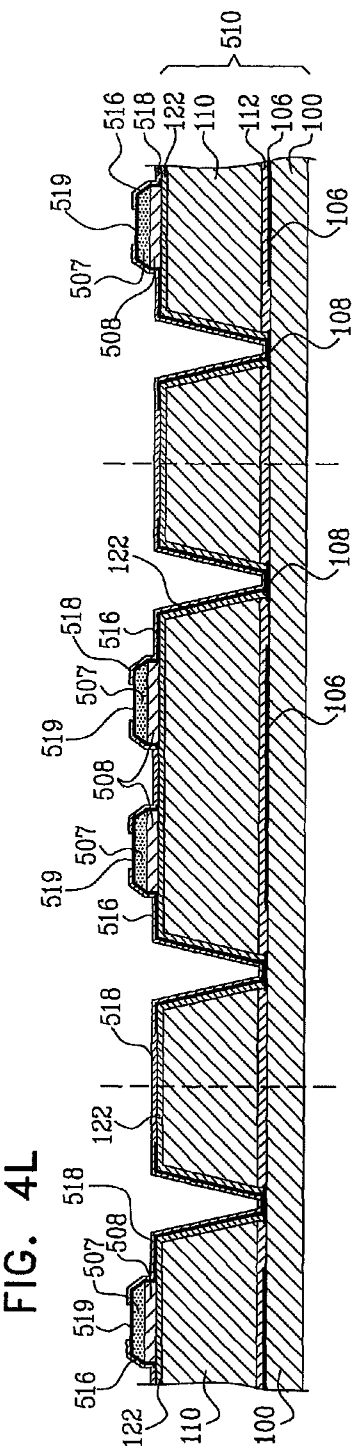
Figure 4M:
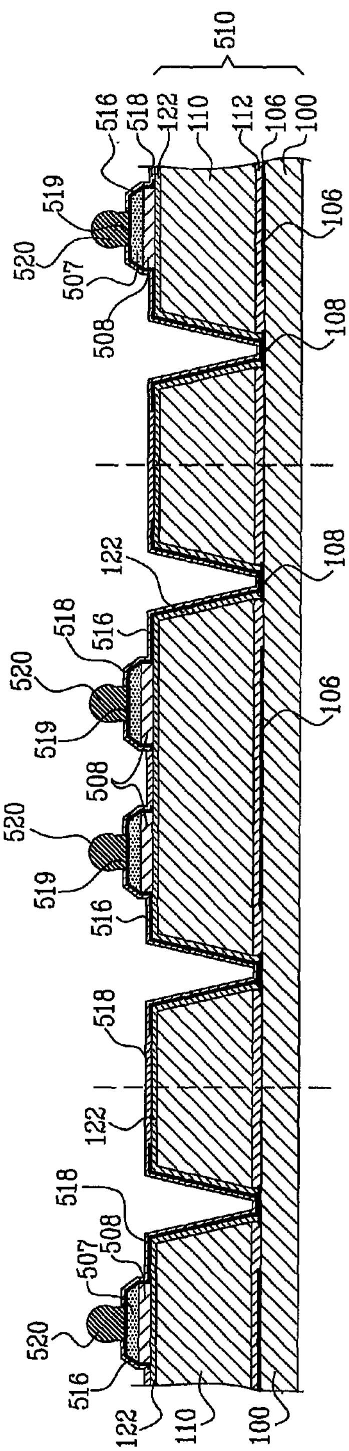
Figure 4N:
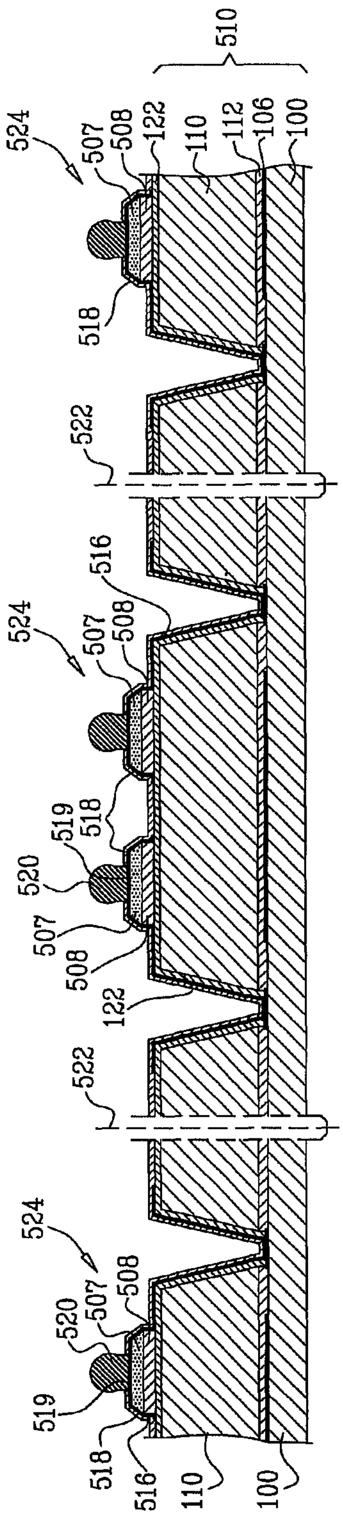
Figure 40:
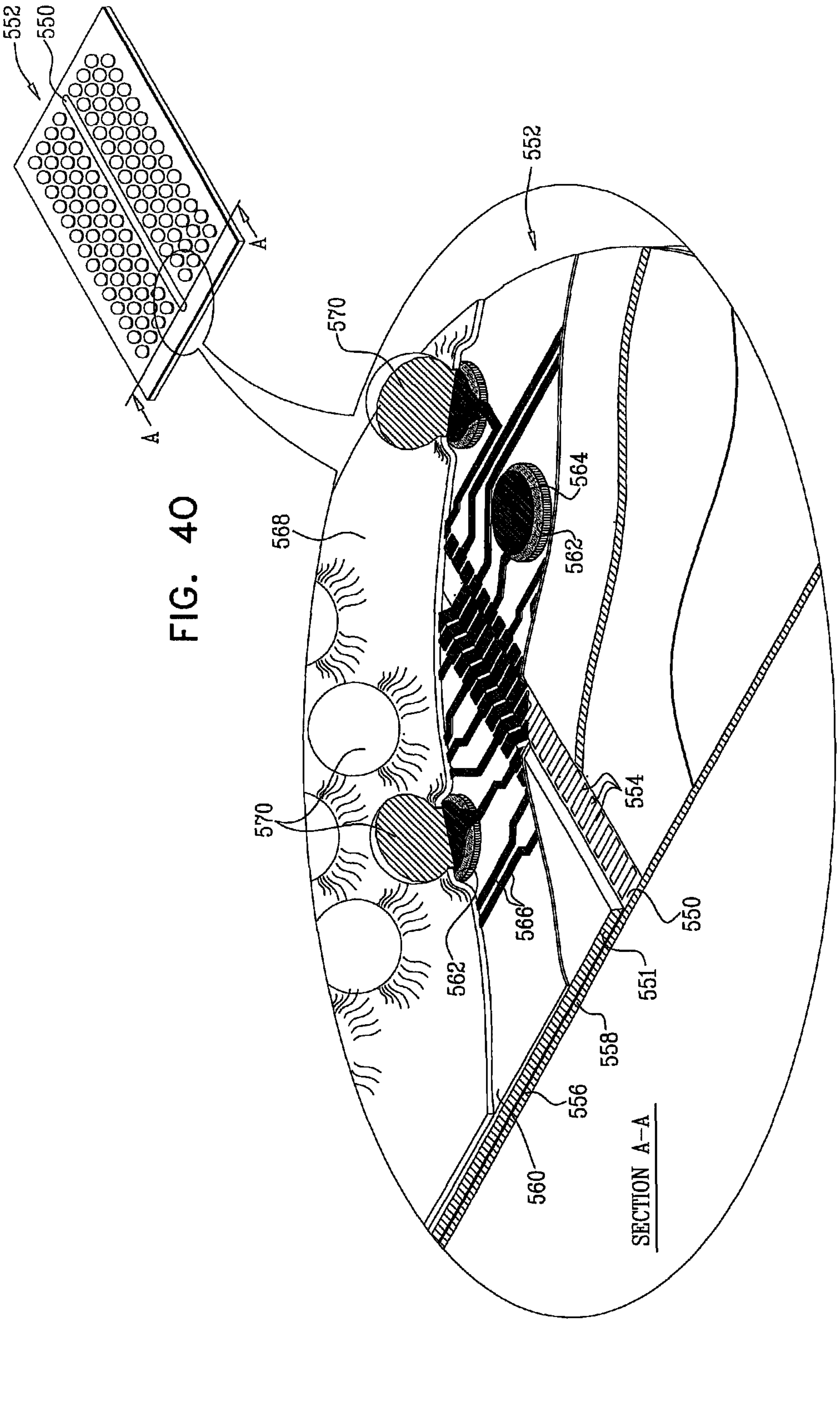

Reference is now made to FIGS. 4A-4N, which are simplified sectional illustrations of a method for manufacturing packaged semiconductor chips in accordance with still another preferred embodiment of the present invention. Turning to FIG. 4A, there is seen part of a semiconductor wafer 500. The wafer 500 is typically formed of silicon and has a thickness of 730 microns. Alternatively, the wafer 500 may be formed of any other suitable material and may be of any suitable thickness.

FIG. 4B shows the formation of a plurality of recesses 502 in a surface 504 of wafer 500 as by a conventional etching technique. FIG. 4C shows filling of the recesses 502 with a compliant material 506, preferably a silicone-based material such as Dow WL-5150, commercially available from Dow Corning, Inc., typically by use of a squeegee. The compliant material 506 is then cured in a conventional manner.

FIG. 4D shows removal of excess compliant material 506 and planarization of surface 504, as by grinding, thereby leaving platforms 507 of compliant material 506 in recesses 502. FIG. 4E shows the application of an adhesive 508 onto surface 504, overlying recesses 502 filled with compliant material 506 defining platforms 507, as by spin coating. Adhesive 508 is preferably a suitable epoxy.

Reference is now made to FIG. 4F, which shows the wafer 500 of FIG. 4E, turned upside down and bonded onto the structure of FIG. 1F, described hereinabove, and here designated by reference numeral 510, with a surface 512, opposite surface 504 being exposed.

FIG. 4G shows thinning of wafer 500, preferably by grinding surface 512, down to a thickness equal to the depth of recesses 502, typically 100 microns.

FIG. 4H shows removal of the remainder of wafer 500, and those portions of adhesive 508 not underlying platforms 507 of compliant material 506, as by silicon etching and ultrasonic cleaning.

FIG. 4I illustrates the formation of a metal layer 514, by sputtering chrome, aluminum or copper. Metal layer 514 extends from the bond pads 108, over the compliant layer 122 and along the inclined surfaces of the packaging layer 110, defined by notches 120, onto outer, generally planar surfaces of the compliant layer 122 and over platforms 507 at dies 102.

As shown in FIG. 4J, metal connections 516 are preferably formed by patterning the metal layer 514, preferably by 3D photolithography employing a suitable photoresist, preferably Eagle 2100, commercially available from Rohm and Haas Shipley Division of Marlborough, Mass., U.S.A. Optionally, the metal connections 516 may be plated with nickel, as by electroless techniques, in order to provide enhanced corrosion resistance.

FIG. 4K illustrates the application, preferably by spray coating, of a second, electrically insulative, encapsulant passivation layer 518 over the metal connections 516, over the compliant layer 122 and over platforms 507. Preferably, the encapsulant passivation layer 518 comprises solder mask. FIG. 4L shows patterning of the encapsulant passivation layer 518, preferably by photolithography, to define solder bump locations 519.

FIG. 4M illustrates the formation of solder bumps 520 onto platforms 507 at locations on the metal connections 516 at which the encapsulant passivation layer 518 is not present.

FIG. 4N shows dicing of the wafer 100 and packaging layer 110 of FIG. 4M along scribe lines 522 to produce a multiplicity of individually packaged dies 524.

Reference is now made to FIG. 4O, which is a simplified partially cut away pictorial illustration of part of a packaged semiconductor DRAM chip manufactured in accordance with the method of FIGS. 4A-4N. As seen in FIG. 4O, a notch 550, corresponding to notch 120 (FIGS. 4F-4N), is formed in a packaging layer 551 of a silicon wafer die 552, corresponding to die 524 (FIG. 4N).

The notch 550 exposes a row of bond pads 554, corresponding to bond pads 108 (FIGS. 4F-4N). A layer 556 of adhesive, corresponding to layer 112 (FIGS. 4F-4N), covers a silicon layer 558, corresponding to semiconductor wafer 100, the silicon wafer die 552 other than at notch 550 and packaging layer 551 covers the adhesive 556. An electrophoretic, electrically insulative compliant layer 560, corresponding to electrophoretic, electrically insulative compliant layer 122 (FIGS. 4F-4N), covers the packaging layer 551 and extends along inclined surfaces of notch 550, but does not cover the bond pads 554. Platforms 562, corresponding to platforms 507 (FIGS. 4D-4N) are formed over compliant layer 560 at solder bump locations 564, corresponding to solder bump locations 519 (FIGS. 4L-4N).

Patterned metal connections 566, corresponding to metal connections 516 (FIGS. 4J-4N), extend from bond pads 554 along the inclined surfaces of notch 550 and over generally planar surfaces of compliant layer 560 and terminate over platforms 562. An encapsulant passivation layer 568, corresponding to encapsulant passivation layer 518 (FIGS. 4K-4N), is formed over compliant layer 560 and metal connections 562 other than at locations 564. Solder bumps 570, corresponding to solder bumps 520 (FIGS. 4M and 4N), are formed onto metal connections 566 at locations 564.

Figure 5A:
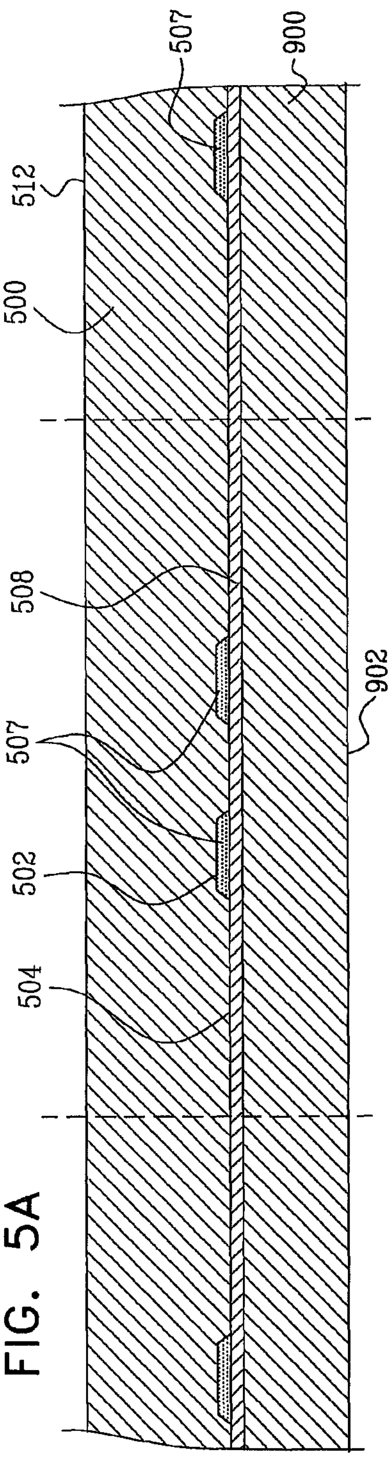
FIGS. 5A-5N are simplified sectional illustrations of a further method for manufacturing packaged semiconductor chips in accordance with a further preferred embodiment of the present invention.
Figure 5B:
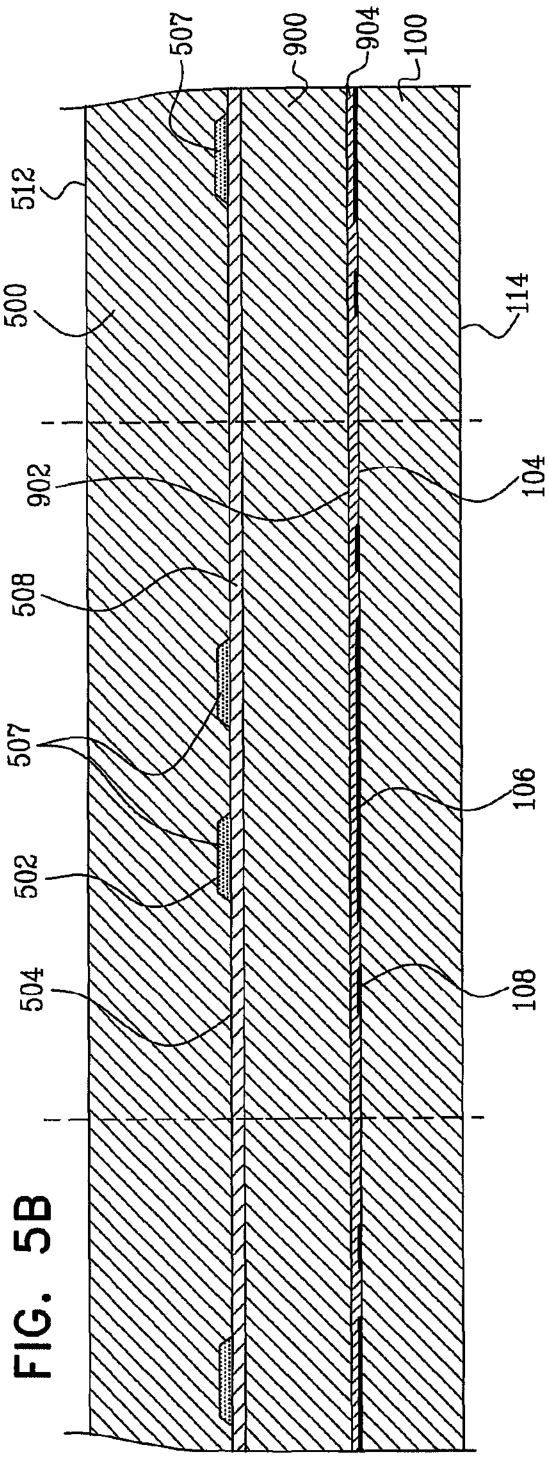
FIG. 5O is a simplified partially cut away pictorial illustration of part of a packaged semiconductor chip manufactured in accordance with the method of FIGS. 5A-5N.
Figure 5C:
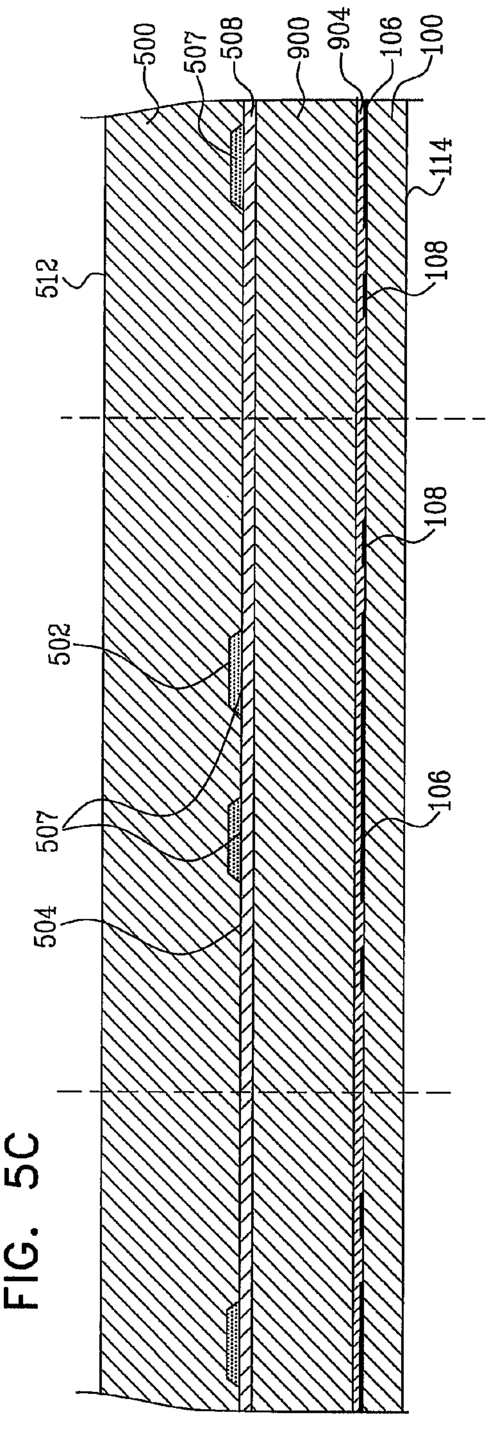
Figure 5D:
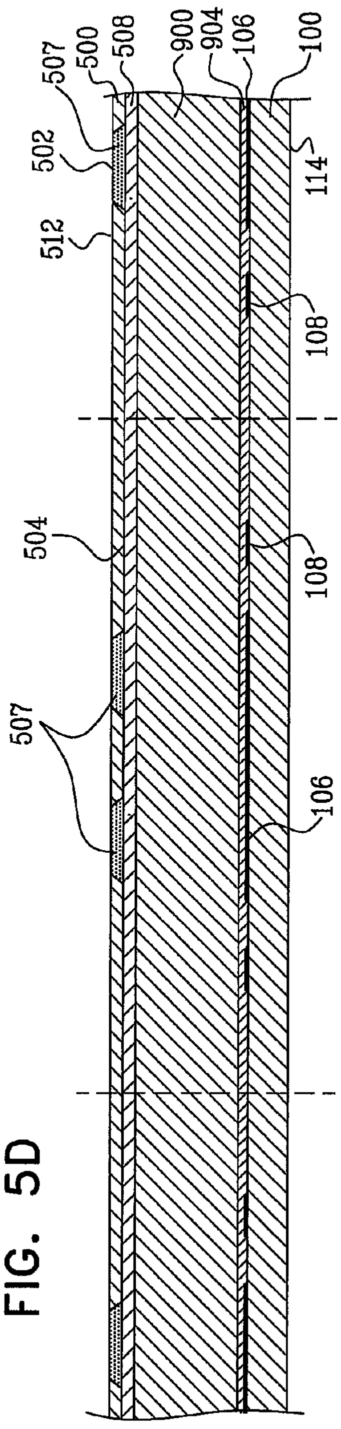
Figure 5E:
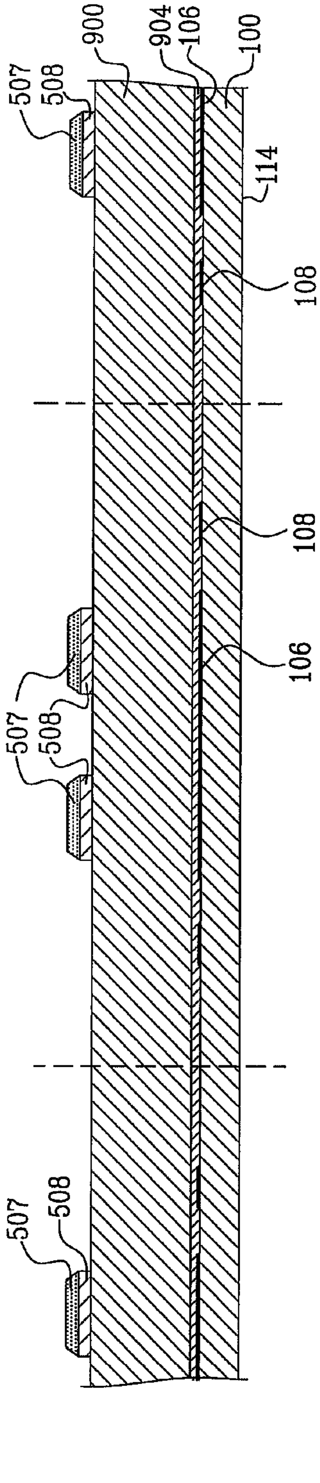
Figure 5F:
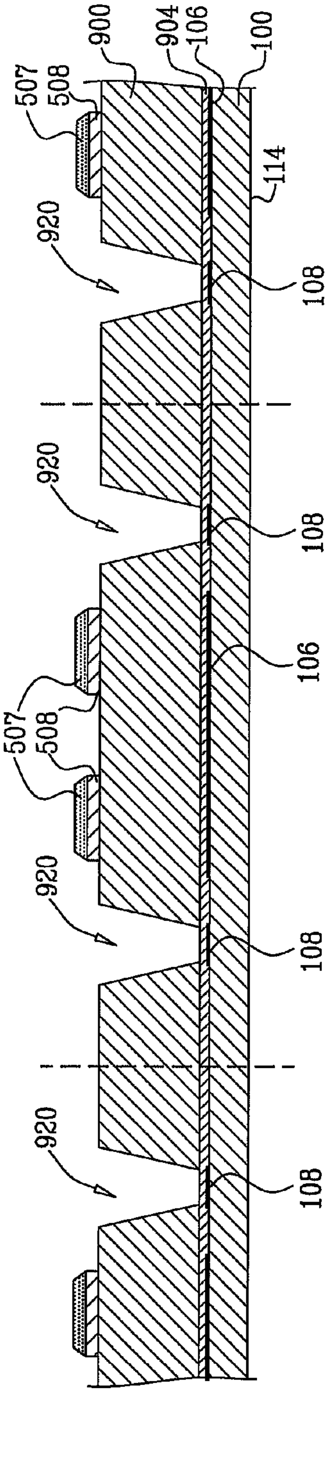
Figure 5G:
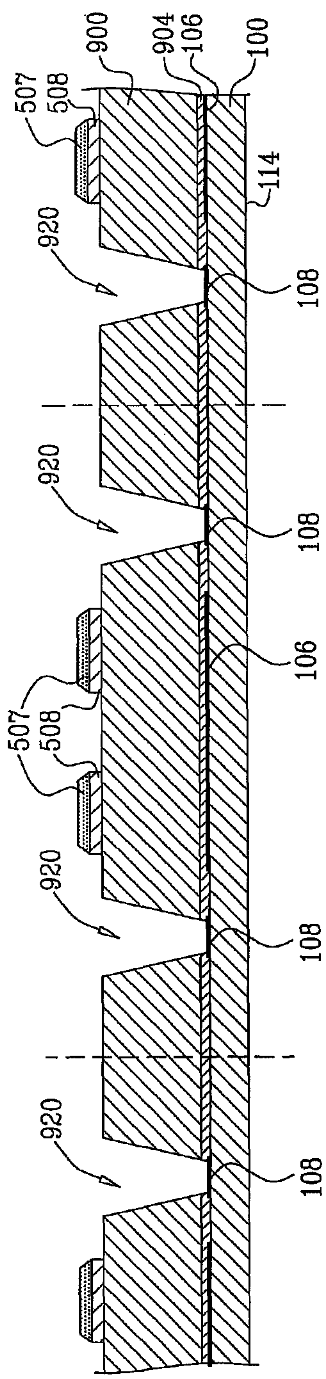
Figure 5H:
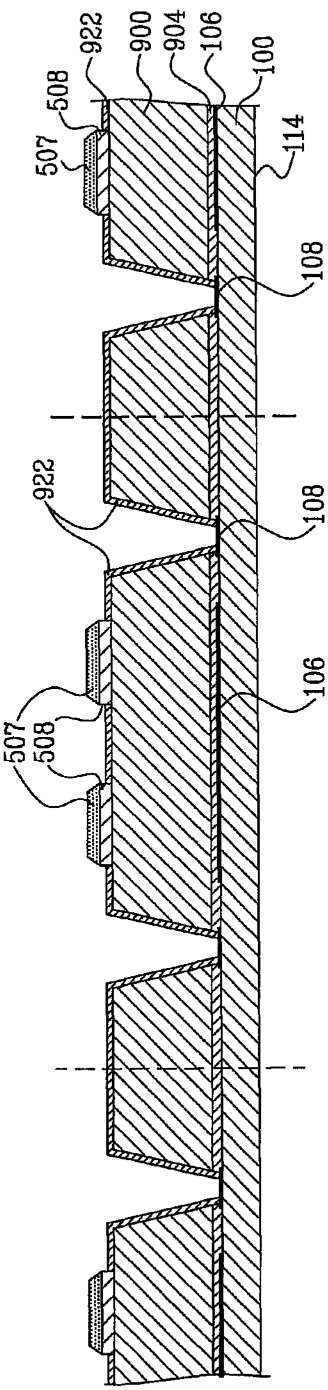
Figure 5I:
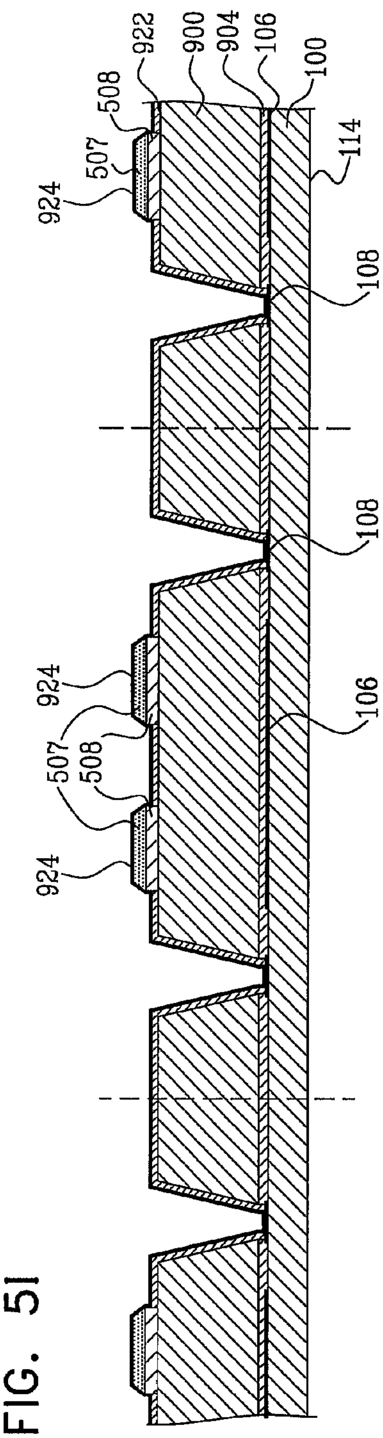
Figure 5J:
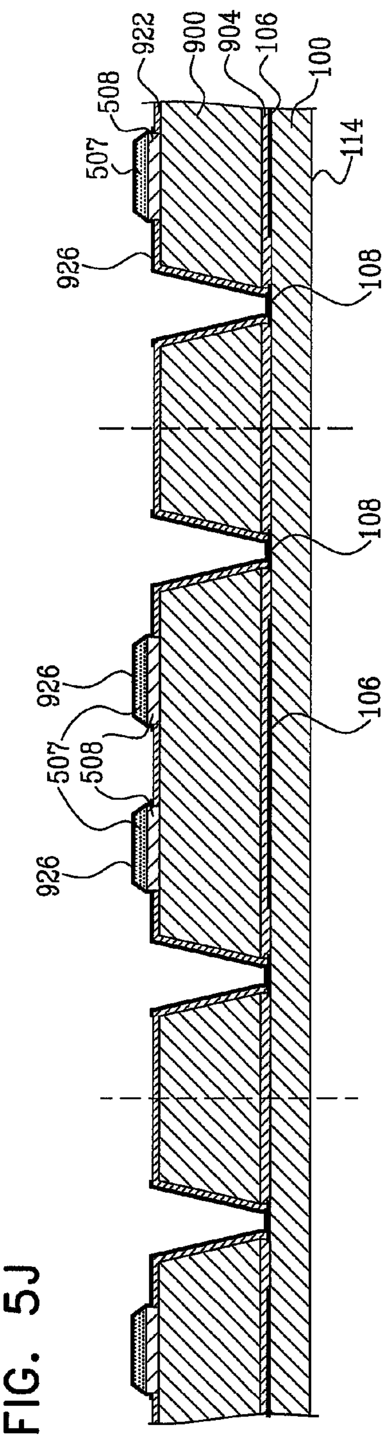
Figure 5K:
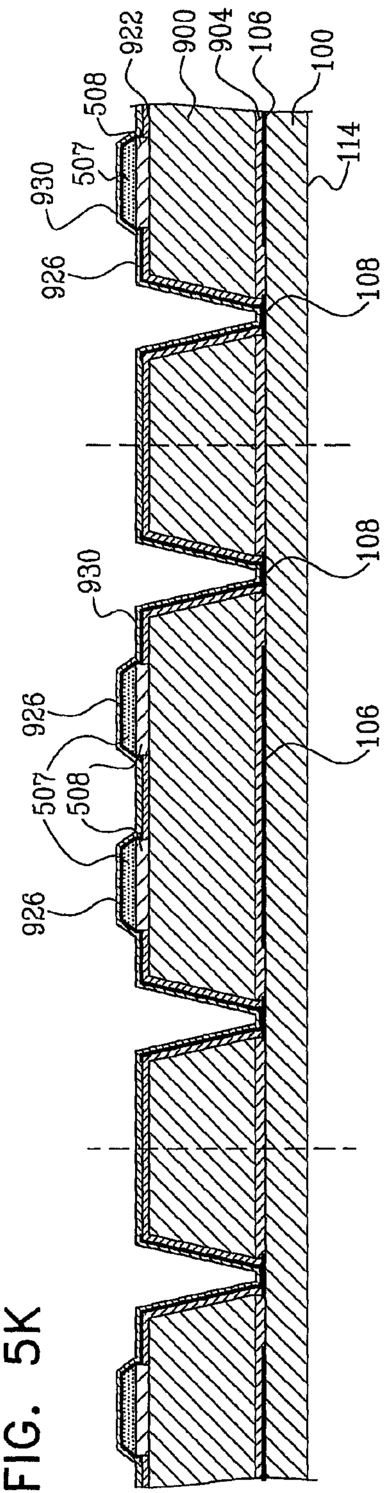
Figure 5L:
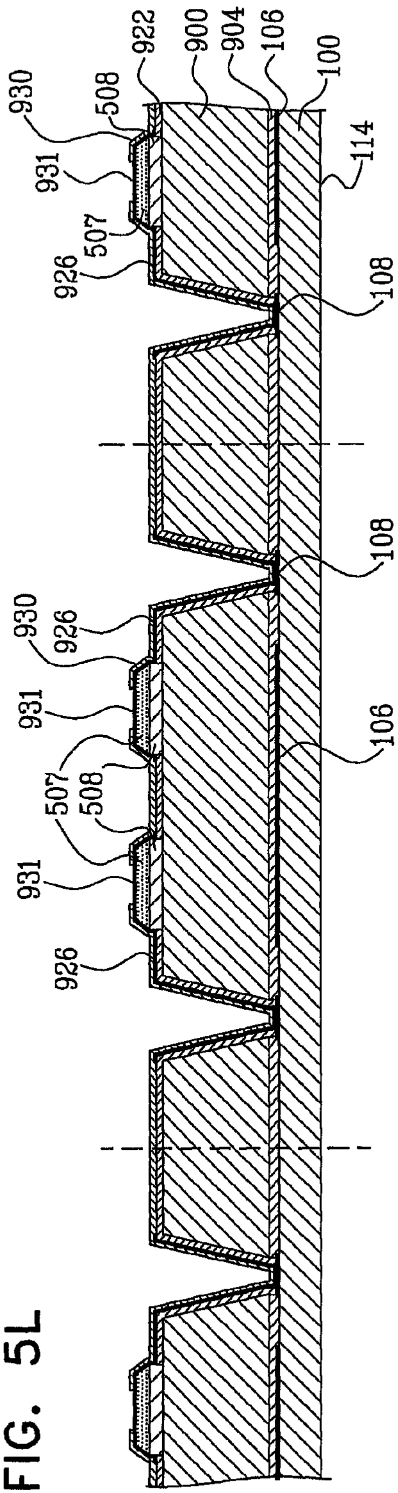
Figure 5M:
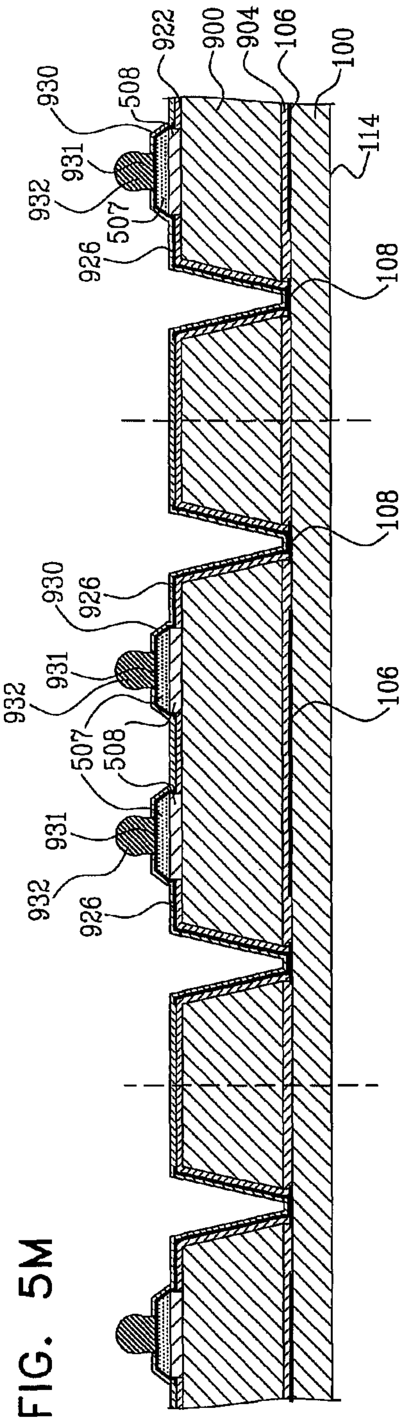
Figure 5N:
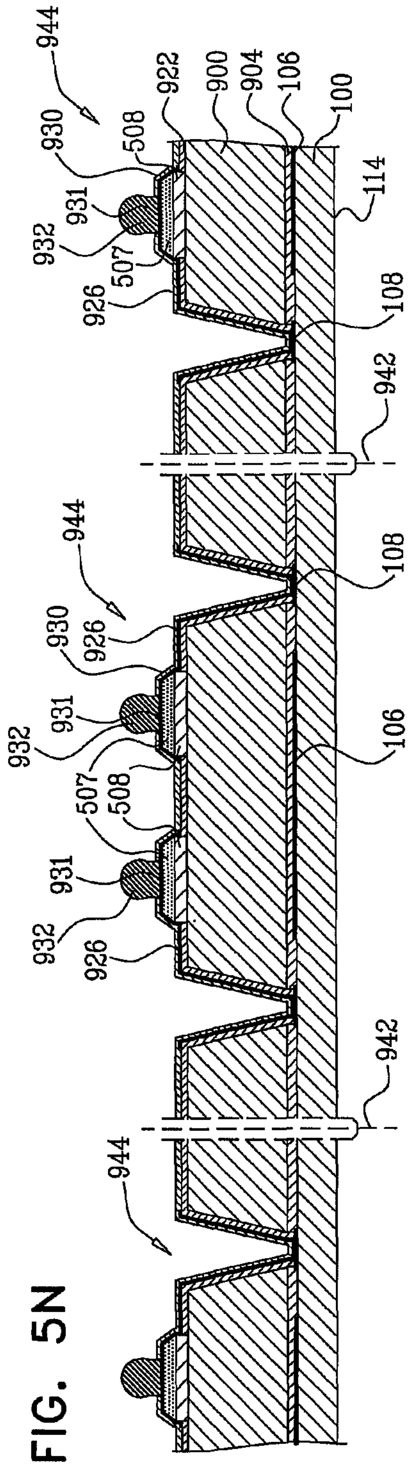
Figure 50:
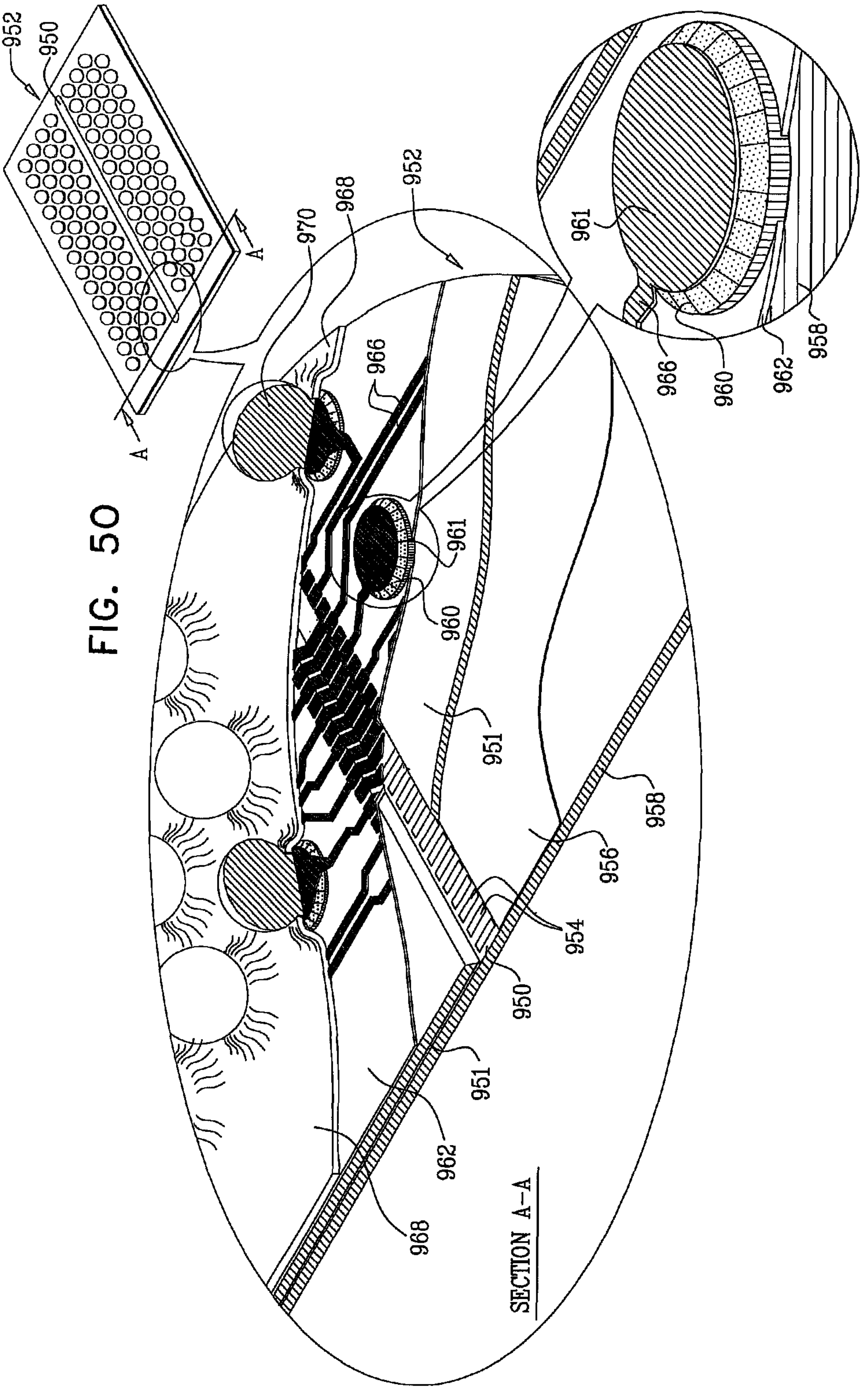

Reference is now made to FIGS. 5A-5N, which are simplified sectional illustrations of a further method for manufacturing packaged semiconductor chips in accordance with a further preferred embodiment of the present invention.

The method of FIGS. 5A-5N employs the steps described hereinabove with reference to FIGS. 4A-4E, which are followed by the steps shown in FIGS. 5A-5N.

Reference is now made to FIG. 5A, which shows the wafer 500 of FIG. 4E, turned upside down and bonded onto a wafer scale packaging layer 900, preferably a silicon wafer, with a surface 902 of packaging layer 900 being exposed.

FIG. 5B shows the structure of FIG. 5A bonded at surface 902 to the structure of FIG. 1A at surface 104 thereof, preferably by means of an adhesive 904, such as epoxy.

FIG. 5C shows thinning of wafer 100, preferably by machining its non-active surface 114. Preferably the thickness of the semiconductor wafer 100 at this stage, following thinning thereof, is 300 microns.

FIG. 5D shows thinning of wafer 500, preferably by grinding surface 512, down to a thickness equal to the depth of recesses 502, typically 100 microns.

FIG. 5E shows removal of the remainder of wafer 500, and those portions of adhesive 508 not underlying platforms 507 of compliant material 506, as by silicon etching and ultrasonic cleaning.

FIG. 5F shows notches 920, preferably formed by photolithography employing plasma etching or wet etching techniques, at locations which overlie bond pads 108. The notches preferably do not extend through adhesive 904.

Turning to FIG. 5G, it is seen that the adhesive 904 overlying bond pads 108 and underlying notches 920 is removed, preferably by dry etching.

FIG. 5H shows the formation of an electrophoretic, electrically insulative compliant layer 922 over those portions of packaging layer 900 not underlying platforms 507. Examples of suitable materials for compliant layer 922 are those described hereinabove with reference to FIG. 1F. Once cured, compliant layer 922 encapsulates all exposed surfaces of the packaging layer 900. Compliant layer 922 preferably provides protection to the device from alpha particles emitted by BGA solder balls.

FIG. 5I illustrates the formation of a metal layer 924, by sputtering chrome, aluminum or copper. Metal layer 924 extends from the bond pads 108, over the compliant layer 922 and along the inclined surfaces of the packaging layer 900, defined by notches 920, onto outer, generally planar surfaces of the compliant layer 922 and over platforms 507 at dies 102.

As shown in FIG. 5J, metal connections 926 are preferably formed by patterning the metal layer 924, preferably by 3D photolithography employing a suitable photoresist, preferably Eagle 2100, commercially available from Rohm and Haas Shipley Division of Marlborough, Mass., U.S.A. Optionally, the metal connections 926 may be plated with nickel, as by electroless techniques, in order to provide enhanced corrosion resistance.

FIG. 5K illustrates the application, preferably by spray coating, of a second, electrically insulative, encapsulant passivation layer 930 over the metal connections 926, over the compliant layer 922 and over platforms 507. Preferably, the encapsulant passivation layer 930 comprises solder mask. FIG. 5L shows patterning of the encapsulant passivation layer 930, preferably by photolithography, to define solder bump locations 931.

FIG. 5M illustrates the formation of solder bumps 932 onto platforms 507 at locations 931 on the metal connections 926, at which the encapsulant passivation layer 930 is not present.

FIG. 5N shows dicing of the wafer 100 and packaging layer 110 of FIG. 5M along scribe lines 942 to produce a multiplicity of individually packaged dies 944.

Reference is now made to FIG. 5O, which is a simplified partially cut away pictorial illustration of part of a packaged semiconductor DRAM chip manufactured in accordance with the method of FIGS. 5A-5N. As seen in FIG. 5O, a notch 950, corresponding to notch 920 (FIGS. 5F-5N), is formed in a packaging layer 951, corresponding to packaging layer 900 (FIGS. 5A-5N), of silicon wafer die 952, corresponding to die 944 (FIG. 5N).

The notch 950 exposes a row of bond pads 954, corresponding to bond pads 108 (FIGS. 5B-5N). A layer 956 of adhesive, corresponding to layer 904 (FIGS. 5B-5N), covers a silicon layer 958, corresponding to semiconductor wafer 100, of the silicon wafer die 952 other than at notch 950 and packaging layer 951 covers the adhesive 956. Platforms 960, corresponding to platforms 507 (FIGS. 5A-5N) are formed over packaging layer 951 at solder bump locations 961, corresponding to solder bump locations 931 (FIGS. 5L-5N). An electrophoretic, electrically insulative compliant layer 962, corresponding to electrophoretic, electrically insulative compliant layer 922 (FIGS. 5G-5N), covers the packaging layer 951, surrounds platforms 960 and extends along inclined surfaces of notch 950, but does not cover the bond pads 954.

Patterned metal connections 966, corresponding to metal connections 926 (FIGS. 5J-5N), extend from bond pads 954 along the inclined surfaces of notch 950 and over generally planar surfaces of compliant layer 962 and terminate over platforms 960. An encapsulant passivation layer 968, corresponding to encapsulant passivation layer 930 (FIGS. 5K-5N), is formed over compliant layer 962 and metal connections 966 other than at locations 961. Solder bumps 970, corresponding to solder bumps 932 (FIGS. 5M and 5N), are formed onto metal connections 966 at locations 961.

Figure 6A:
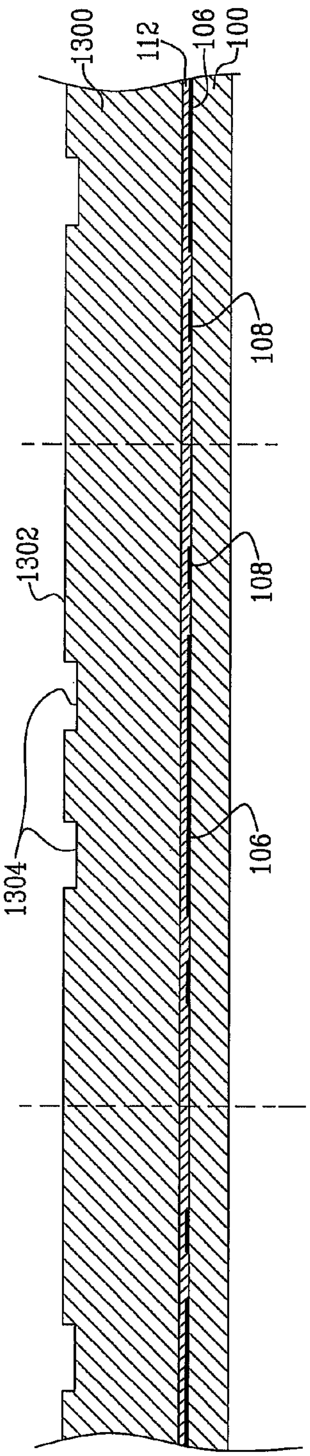
FIGS. 6A-6P are simplified sectional illustrations of yet a further method for manufacturing packaged semiconductor chips in accordance with yet a further preferred embodiment of the present invention.
Figure 6B:
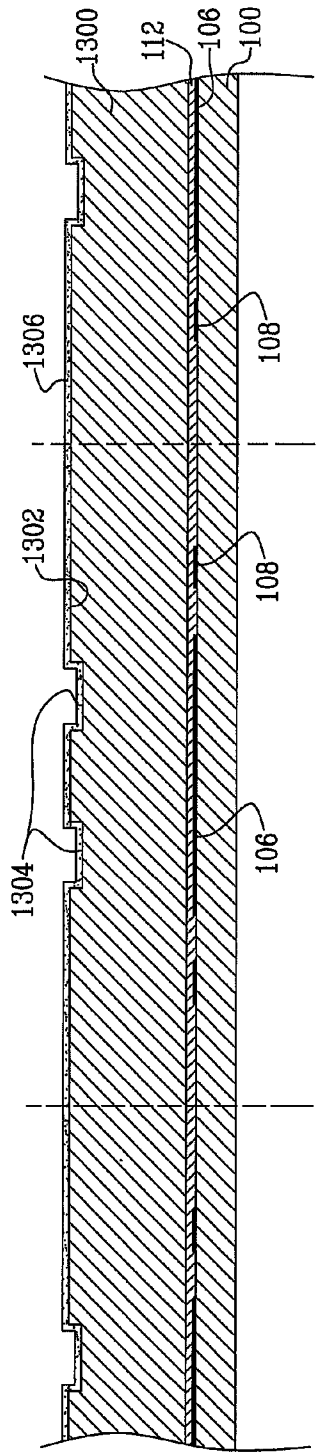
FIG. 6Q is a simplified partially cut away pictorial illustration of part of a packaged semiconductor chip manufactured in accordance with the method of FIGS. 6A-6P.
Figure 6C:
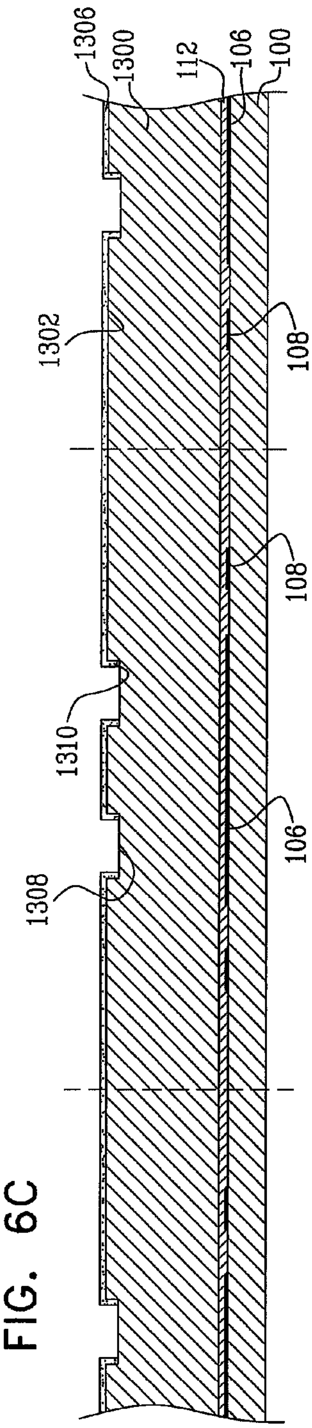
Figure 6D:
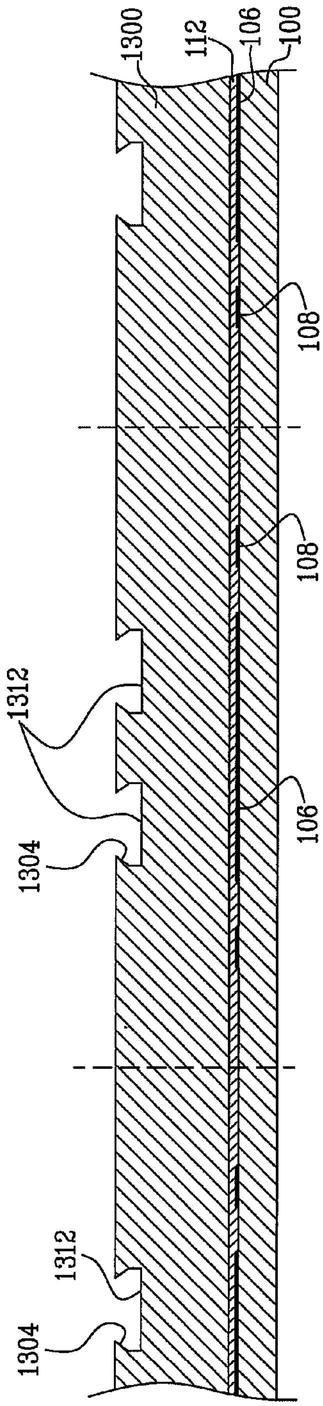
Figure 6E:
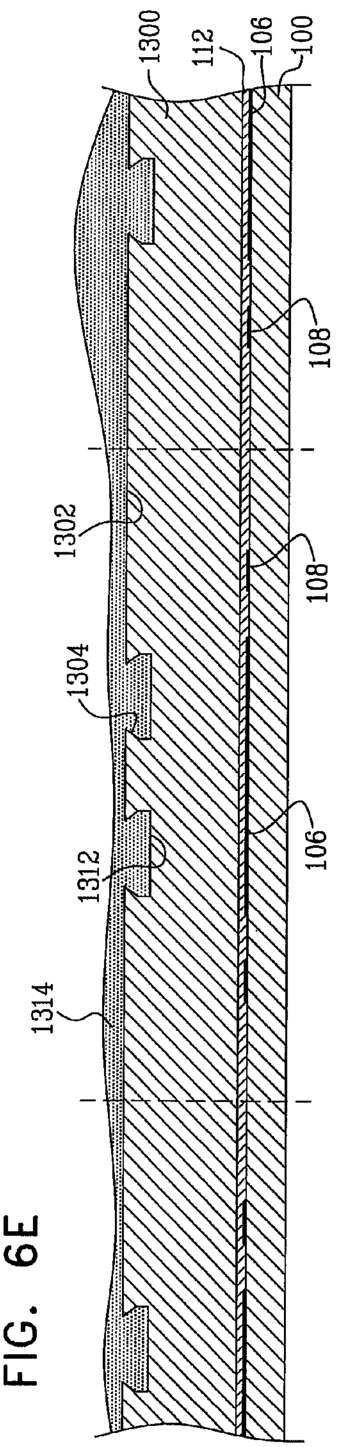
Figure 6F:
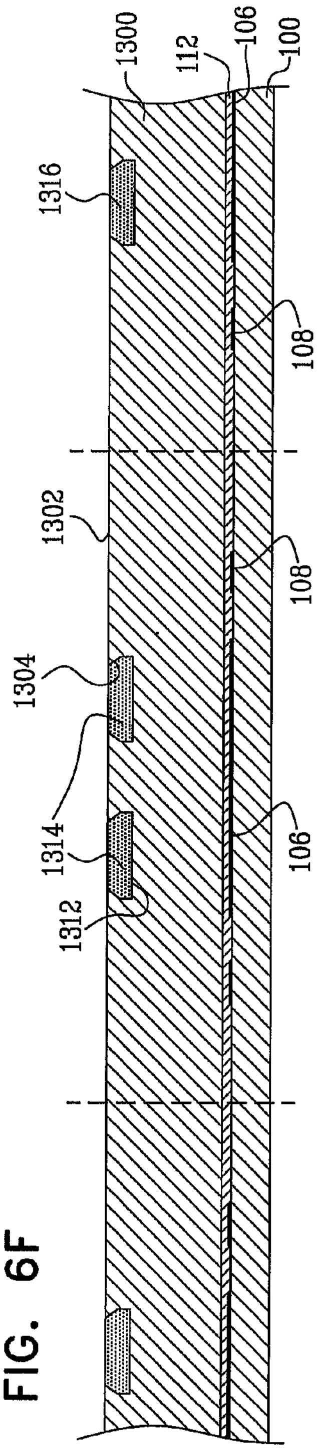
Figure 6G:
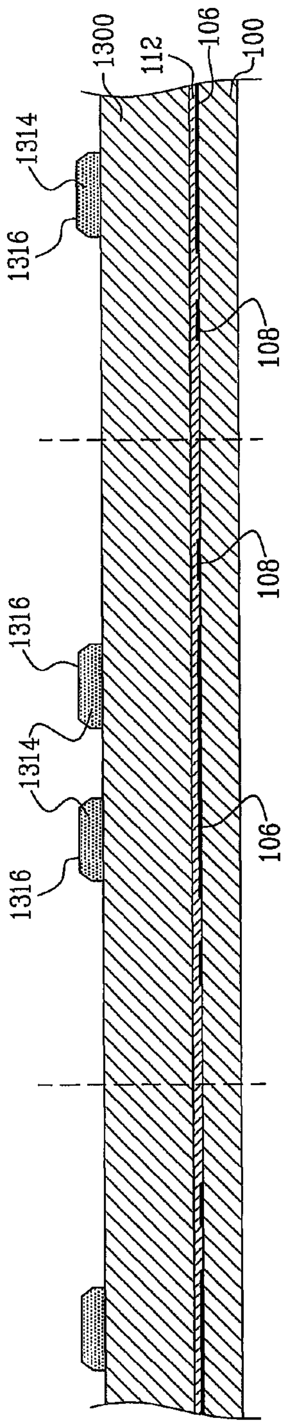
Figure 6H:
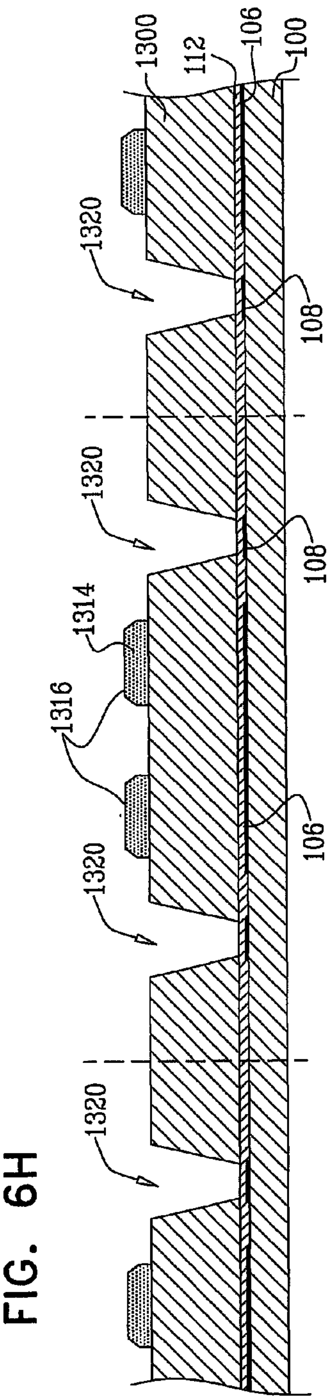
Figure 6I:
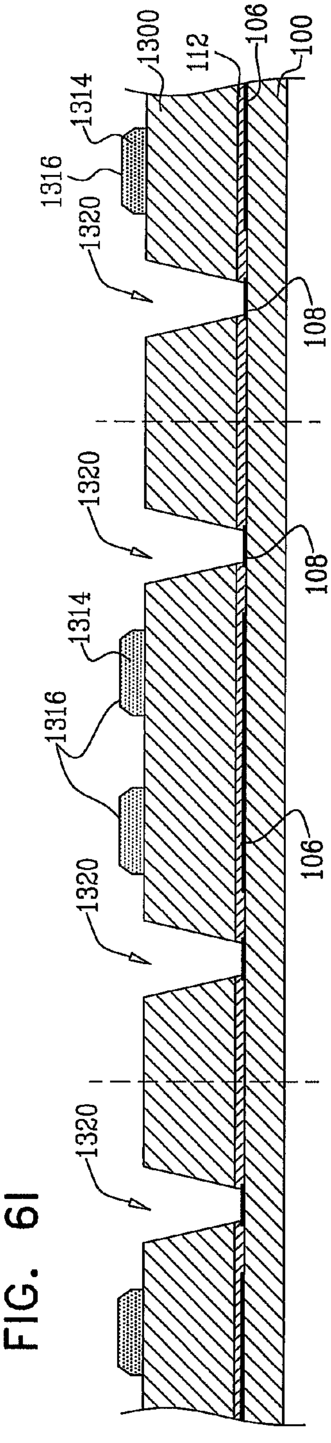
Figure 6J:
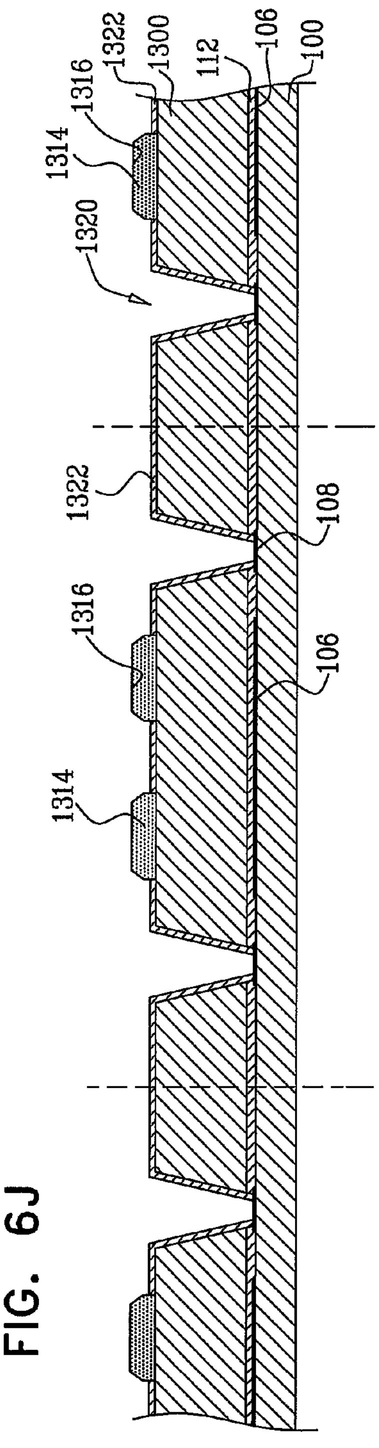
Figure 6K:
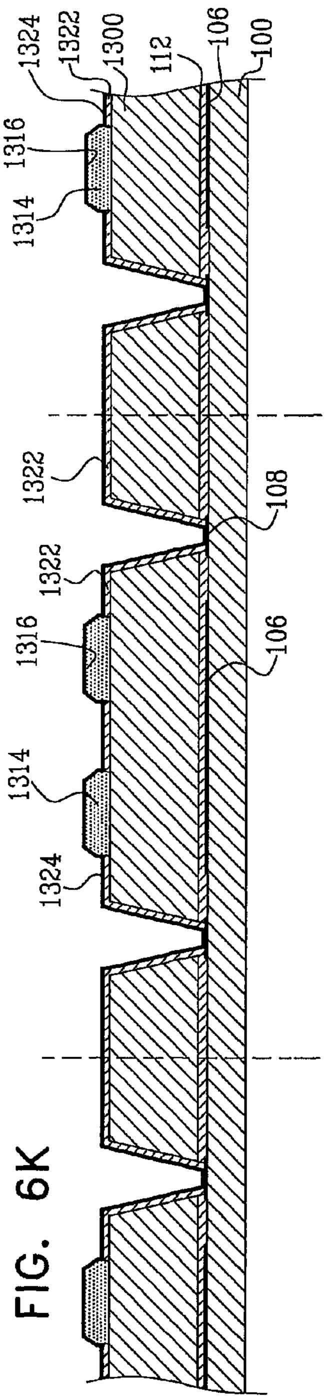
Figure 6L:
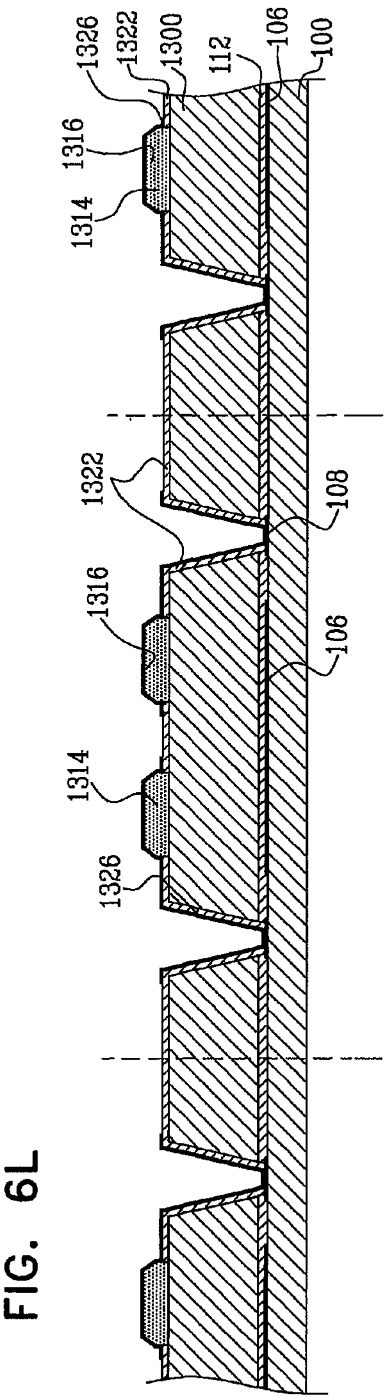
Figure 6M:
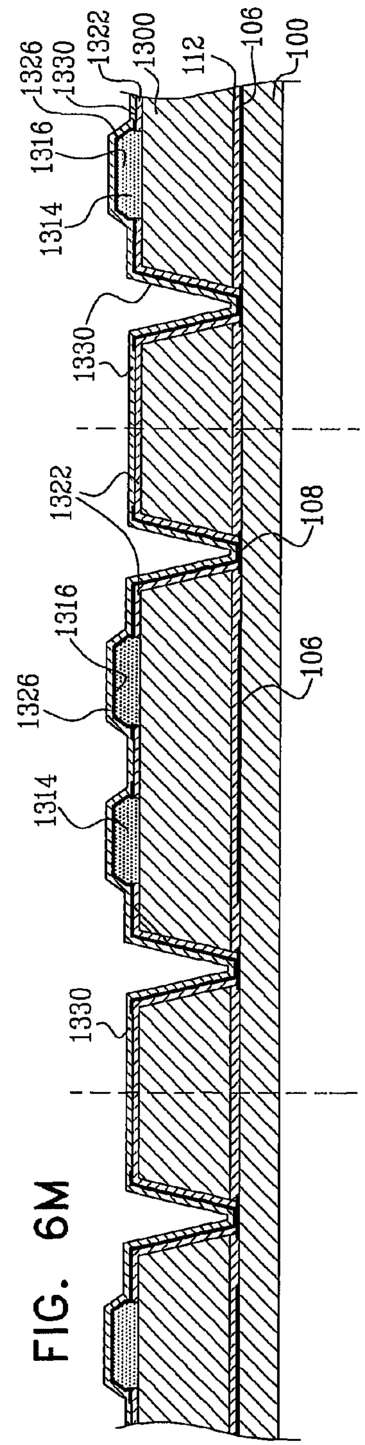
Figure 6N:
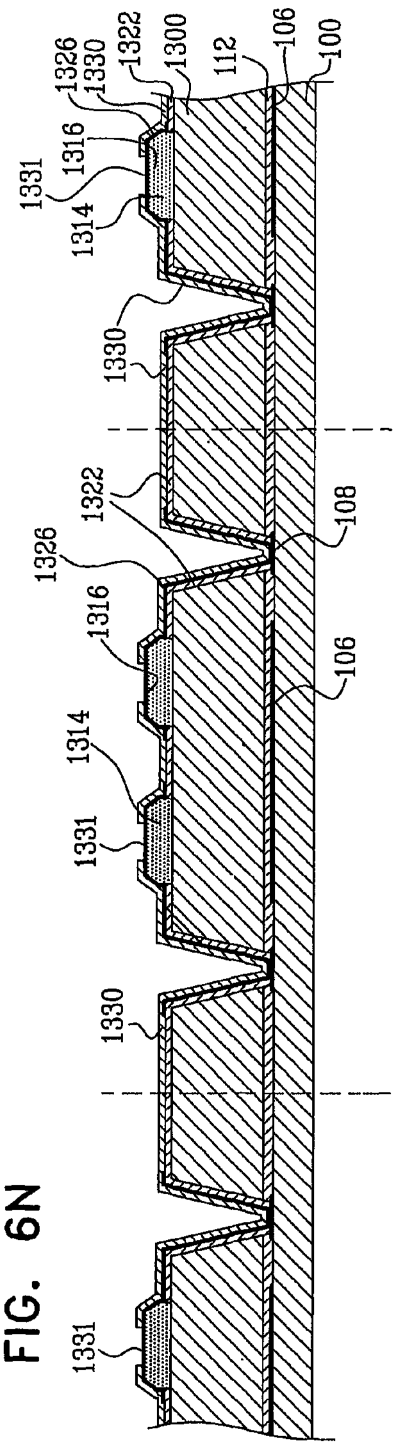
Figure 6O:
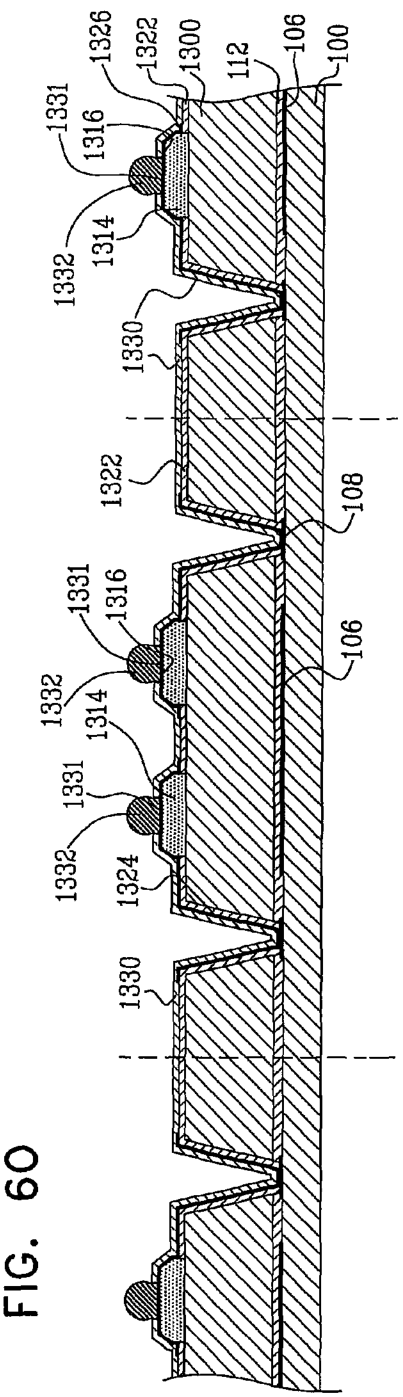
Figure 6P:
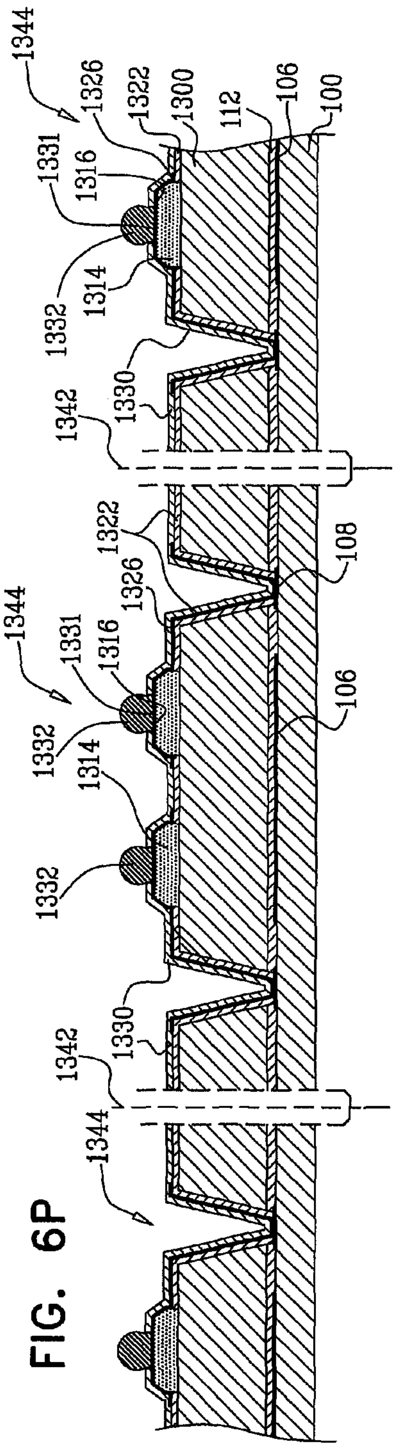

Reference is now made to FIGS. 6A-6P, which are simplified sectional illustrations of yet a further method for manufacturing packaged semiconductor chips in accordance with yet a further preferred embodiment of the present invention.

The method of FIGS. 6A-6P employs the steps described hereinabove with reference to FIGS. 1A-1C, which are followed by the steps shown in FIGS. 6A-6P.

Reference is now made to FIG. 6A, which shows a structure similar to the structure of FIG. 1C, but having a packaging layer 1300 which is thicker than packaging layer 110 (FIG. 1C). On a top surface 1302 of packaging layer 1300 there are formed a plurality of recesses 1304, preferably by a conventional etching technique employing spin-coated photoresist.

As seen in FIG. 6B, surface 1302 undergoes electrophoretic deposition of a layer of photoresist 1306, followed by lithography, which leaves portions 1308 of the bottom surfaces 1310 of recesses 1304 exposed to etching, as seen in FIG. 6C. Subsequent silicon etching produces an undercut recess 1312 at each recess 1304, as seen in FIG. 6D.

FIG. 6E shows filling of the recesses 1312 and 1304 with a compliant material 1314, preferably a silicone-based material such as Dow WL-5150, commercially available from Dow Corning, Inc., typically by use of a squeegee. The compliant material 1314 is then cured in a conventional manner.

FIG. 6F shows removal of excess compliant material 1314 and planarization of surface 1302, as by grinding, thereby leaving platforms 1316 of compliant material 1314 in recesses 1312 and 1304.

FIG. 6G shows removal of the portions of packaging layer 1300 surrounding but not underlying platforms 1316 of compliant material 1314, as by silicon etching and ultrasonic cleaning.

FIG. 6H shows notches 1320, preferably formed by photolithography employing plasma etching or wet etching techniques, at locations which overlie bond pads 108. The notches preferably do not extend through adhesive 112.

Turning to FIG. 6I, it is seen that the adhesive 112 overlying bond pads 108 and underlying notches 1320 is removed, preferably by dry etching.

FIG. 6J shows the formation of an electrophoretic, electrically insulative compliant layer 1322 over those portions of packaging layer 1300 not underlying platforms 1316. Examples of suitable materials for compliant layer 1322 are those described hereinabove with reference to FIG. 1F. Once cured, compliant layer 1322 encapsulates all exposed surfaces of the packaging layer 1300. Compliant layer 1322 preferably provides protection to the device from alpha particles emitted by BGA solder balls.

FIG. 6K illustrates the formation of a metal layer 1324, by sputtering chrome, aluminum or copper. Metal layer 1324 extends from the bond pads 108, over the compliant layer 1322 and along the inclined surfaces of the packaging layer 1300, defined by notches 1320, onto outer, generally planar surfaces of the compliant layer 1322 and over platforms 1316 at dies 102.

As shown in FIG. 6L, metal connections 1326 are preferably formed by patterning the metal layer 1324, preferably by 3D photolithography employing a suitable photoresist, preferably Eagle 2100, commercially available from Rohm and Haas Shipley Division of Marlborough, Mass., U.S.A. Optionally, the metal connections 1326 may be plated with nickel, as by electroless techniques, in order to provide enhanced corrosion resistance.

FIG. 6M illustrates the application, preferably by spray coating, of a second, electrically insulative, encapsulant passivation layer 1330 over the metal connections 1326, over the compliant layer 1322 and over platforms 1316. Preferably, the encapsulant passivation layer 1330 comprises solder mask. FIG. 6N shows patterning of the encapsulant passivation layer 1330, preferably by photolithography, to define solder bump locations 1331.

FIG. 6O illustrates the formation of solder bumps 1332 onto platforms 1316 at locations 1331 on the metal connections 1326 at which the encapsulant passivation layer 1330 is not present.

FIG. 6P shows dicing of the wafer 100 and packaging layer 1300 of FIG. 6O along scribe lines 1342 to produce a multiplicity of individually packaged dies 1344.

Figure 6Q:
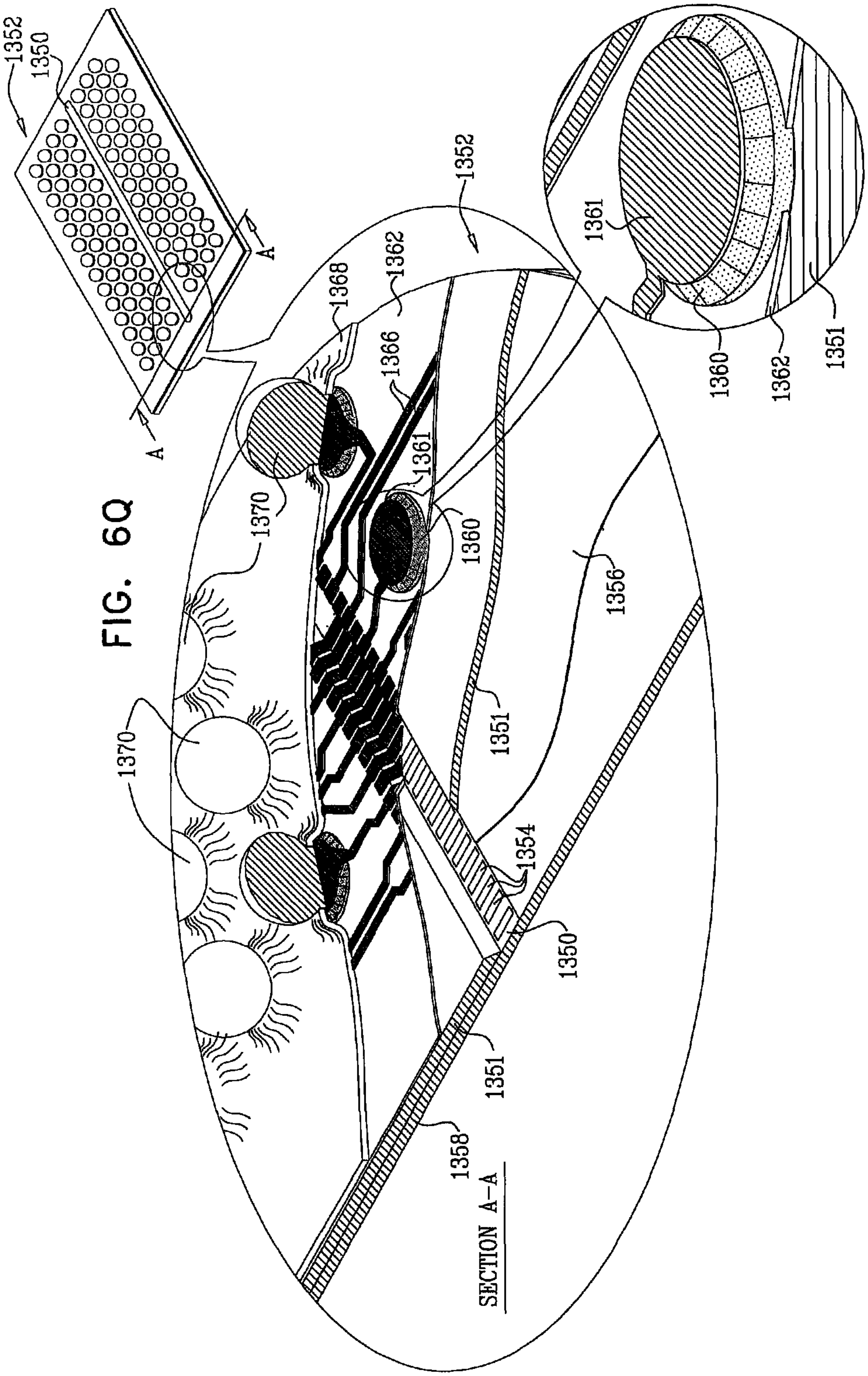

Reference is now made to FIG. 6Q, which is a simplified partially cut away pictorial illustration of part of a packaged semiconductor DRAM chip manufactured in accordance with the method of FIGS. 6A-6P. As seen in FIG. 6Q, a notch 1350, corresponding to notch 1320 (FIGS. 6H-6P), is formed in a packaging layer 1351, corresponding to packaging layer 1300 (FIGS. 6A-6P), of a silicon wafer die 1352, corresponding to die 1344 (FIG. 6P).

The notch 1350 exposes a row of bond pads 1354, corresponding to bond pads 108 (FIGS. 6A-6P). A layer 1356 of adhesive, corresponding to layer 112 (FIGS. 6A-6P), covers a silicon layer 1358, corresponding to semiconductor wafer 100 (FIGS. 6A-6P), of the silicon wafer die 1352 other than at notch 1350 and packaging layer 1351 covers the adhesive 1356. Platforms 1360, corresponding to platforms 1316 (FIGS. 6F-6P) are formed over packaging layer 1351 at solder bump locations 1361, corresponding to solder bump locations 1331 (FIGS. 6N-6P). It is a particular feature of the embodiment of FIGS. 6A-6Q that platforms 1360 are formed directly onto the packaging layer 1351 and not, as in the embodiment of FIGS. 5A-5O, formed over a layer of adhesive.

An electrophoretic, electrically insulative compliant layer 1362, corresponding to electrophoretic, electrically insulative compliant layer 1322 (FIGS. 6I-6P), covers the packaging layer 1351, surrounds platforms 1360 and extends along inclined surfaces of notch 1350, but does not cover the bond pads 1354.

Patterned metal connections 1366, corresponding to metal connections 1326 (FIGS. 6L-6P), extend from bond pads 1354 along the inclined surfaces of notch 1350 and over generally planar surfaces of compliant layer 1362 and terminate over platforms 1360. An encapsulant passivation layer 1368, corresponding to encapsulant passivation layer 1330 (FIGS. 6M-6P), is formed over compliant layer 1362 and metal connections 1366 other than at locations 1361. Solder bumps 1370, corresponding to solder bumps 1332 (FIGS. 6O and 6P), are formed onto metal connections 1366 at locations 1361.

Reference is now made to FIGS. 7A-7L, which are simplified sectional illustrations of still a further method for manufacturing packaged semiconductor chips in accordance with still a further preferred embodiment of the present invention.

The method of FIGS. 7A-7L employs the steps described hereinabove with reference to FIGS. 4A-4E, which are preceded by the steps shown in FIGS. 7A-7C and followed by the steps shown in FIGS. 7D-7L.

Figures 7A, 7B, 7C:
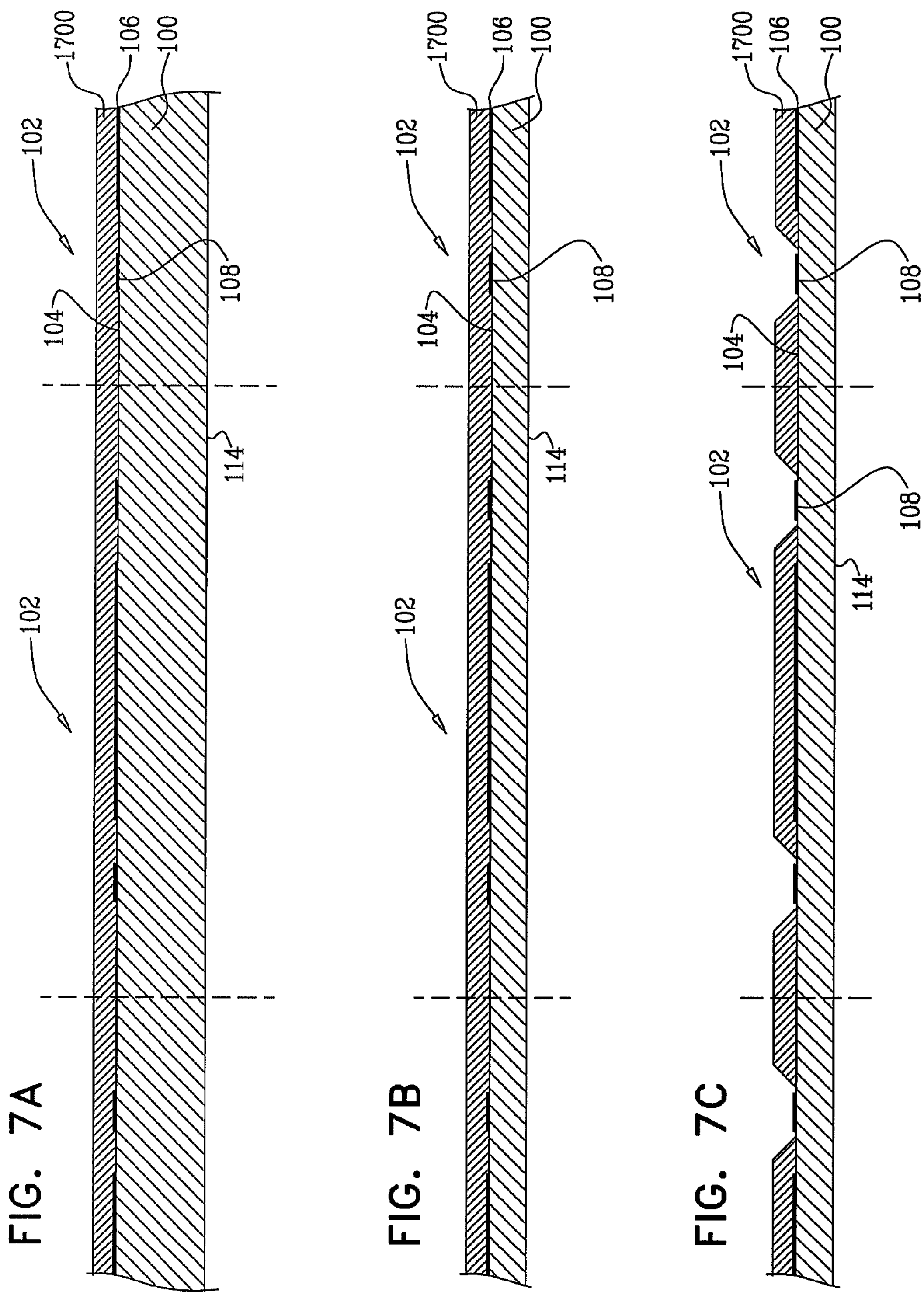
FIGS. 7A-7L are simplified sectional illustrations of still a further method for manufacturing packaged semiconductor chips in accordance with still a further preferred embodiment of the present invention.

Reference is now made to FIG. 7A, which shows the structure of FIG. 1A having formed thereover an encapsulant passivation layer 1700, typically comprising a suitable polymer, such as, for example a polyimide, which provides protection to the device from alpha particles emitted by BGA solder balls.

FIG. 7B shows thinning of wafer 100, preferably by machining its non-active surface 114. Preferably the thickness of the semiconductor wafer 100 at this stage, following thinning thereof, is 300 microns. FIG. 7C shows the structure of FIG. 7B following patterning of the encapsulant passivation layer 1700, by conventional etching methodology, to expose bond pads 108 on the active surface 104 of semiconductor wafer 100.

Figure 7D:
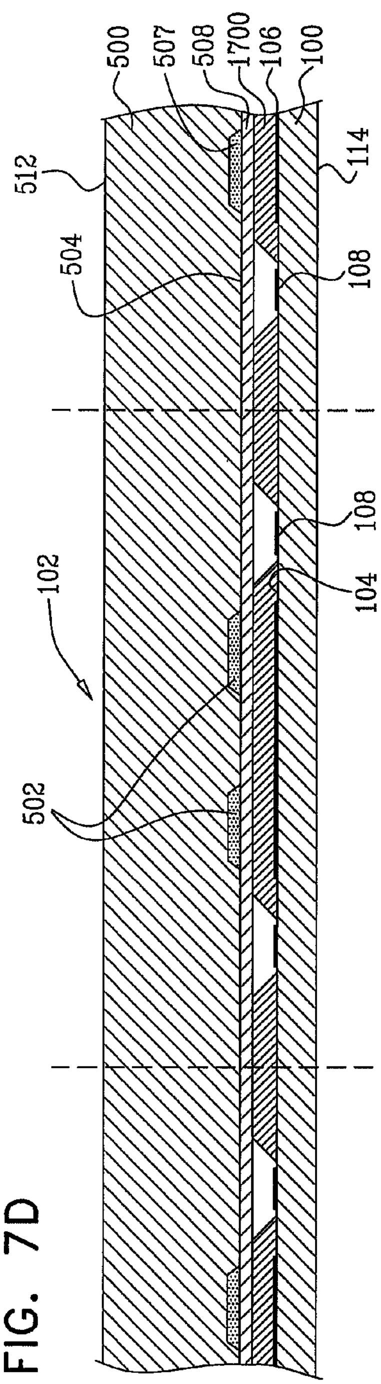

FIG. 7D shows the wafer 500 of FIG. 4E, turned upside down and bonded onto the structure of FIG. 7C, with a surface 512, opposite surface 504 being exposed.

Figure 7E:
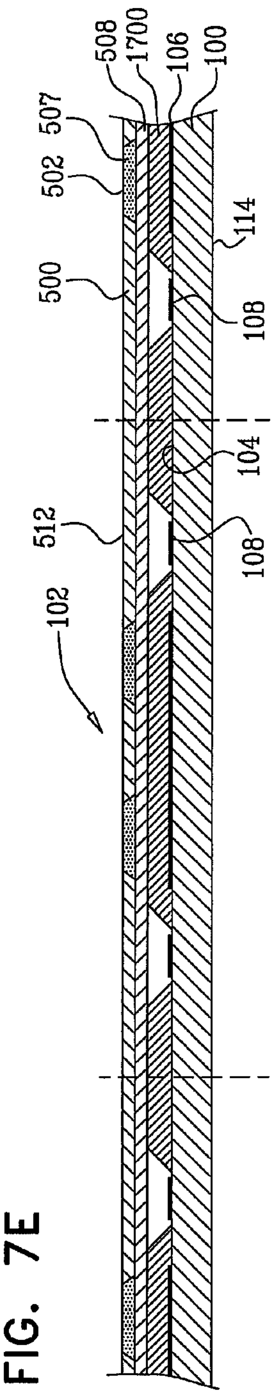

FIG. 7E shows thinning of wafer 500, preferably by grinding surface 512, down to a thickness equal to the depth of recesses 502, typically 100 microns.

Figure 7F:
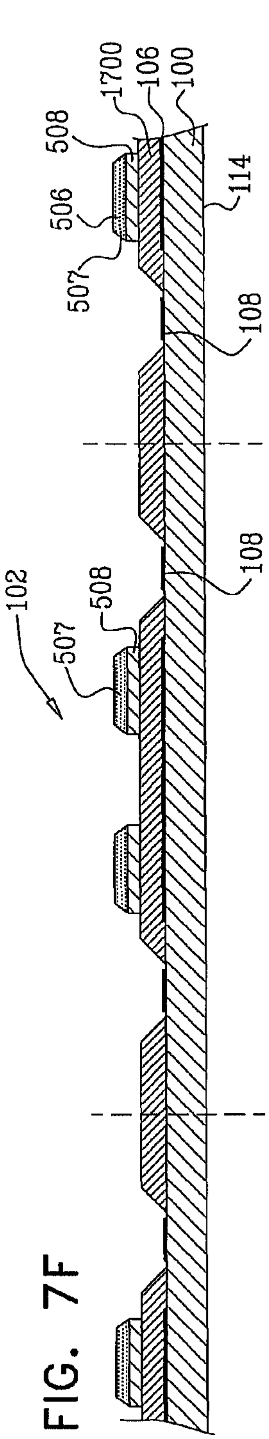

FIG. 7F shows removal of the remainder of wafer 500 and those portions of adhesive 508 not underlying platforms 507 of compliant material 506, as by silicon etching and ultrasonic cleaning.

Figure 7G:
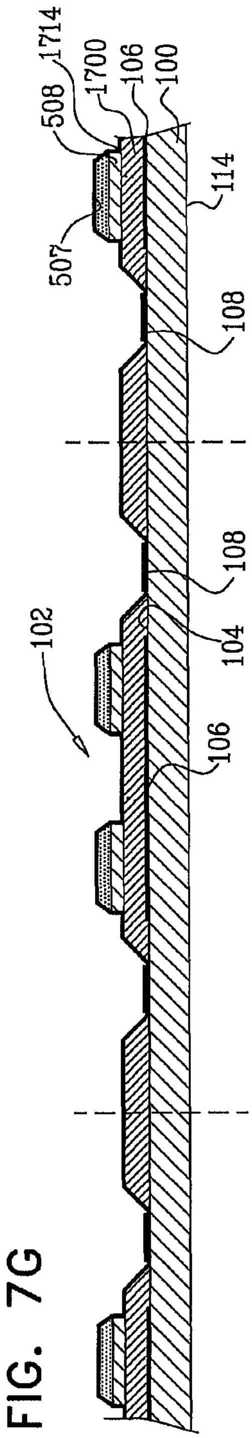

FIG. 7G illustrates the formation of a metal layer 1714, by sputtering chrome, aluminum or copper. Metal layer 1714 extends from the bond pads 108, along the inclined surfaces of encapsulant passivation layer 1700, onto outer, generally planar surfaces of the encapsulant passivation layer 1700 and over platforms 507 at dies 102.

Figure 7H:
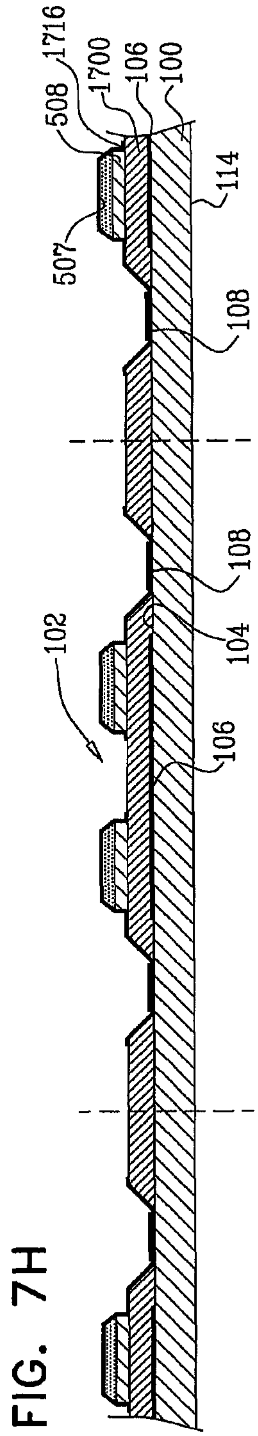

As shown in FIG. 7H, metal connections 1716 are preferably formed by patterning the metal layer 1714, preferably by 3D photolithography employing a suitable photoresist, preferably Eagle 2100, commercially available from Rohm and Haas Shipley Division of Marlborough, Mass., U.S.A. Optionally, the metal connections 1716 may be plated with nickel, as by electroless techniques, in order to provide enhanced corrosion resistance.

Figure 7I:
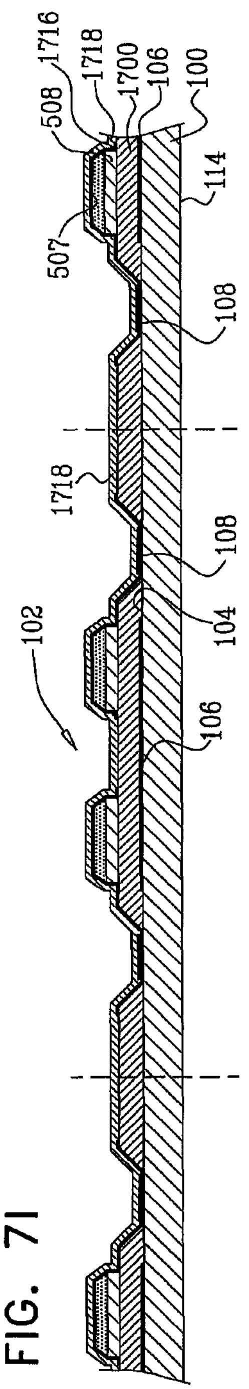
Figure 7J:
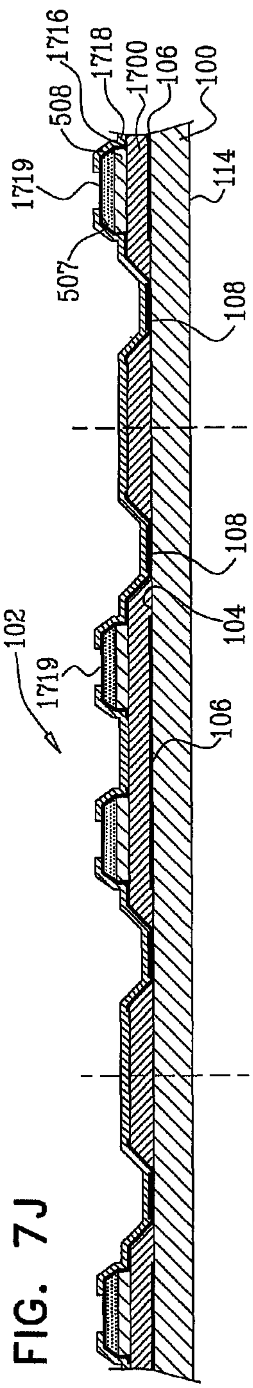

FIG. 7I illustrates the application, preferably by spray coating, of an electrically insulative, encapsulant passivation layer 1718 over the metal connections 1716, over the encapsulant passivation layer 1700 and over platforms 507. Preferably, the encapsulant passivation layer 1718 comprises solder mask. FIG. 7J shows patterning of the encapsulant passivation layer 1718, preferably by photolithography, to define solder bump locations 1719.

Figure 7K:
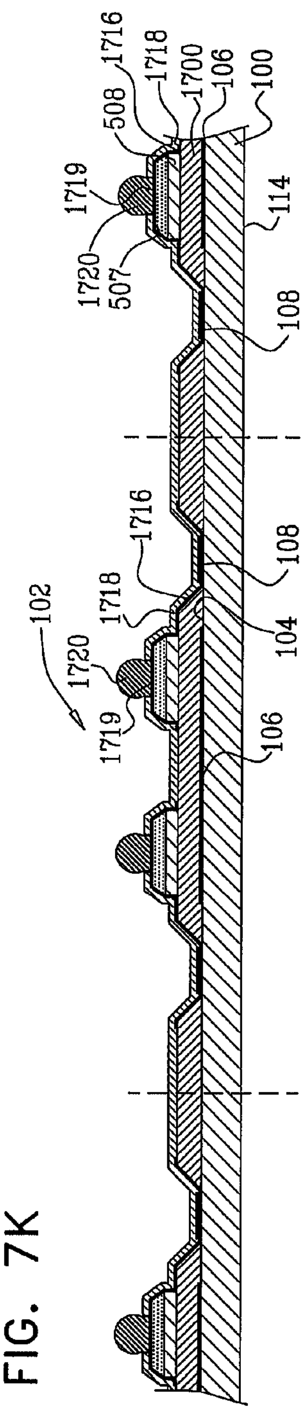

FIG. 7K illustrates the formation of solder bumps 1720 onto platforms 507 at locations 1719 on the metal connections 1716 at which the encapsulant passivation layer 1718 is not present.

Figure 7L:
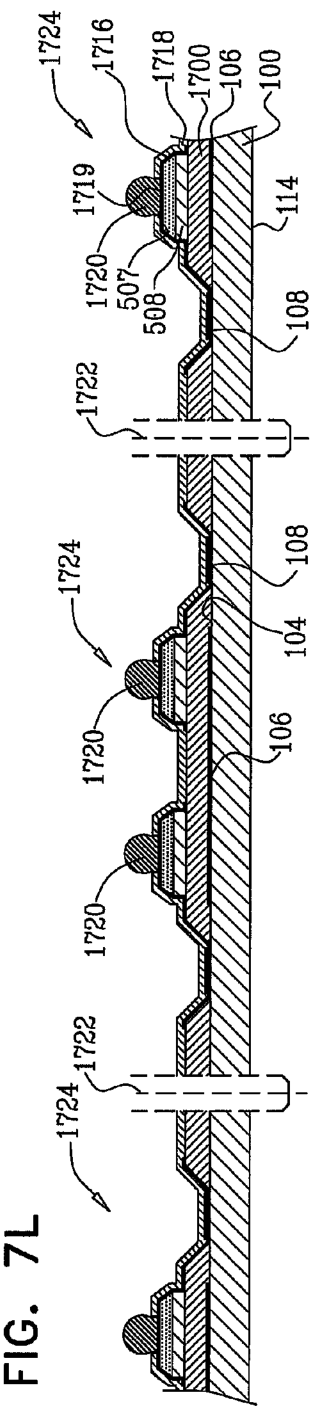

FIG. 7L shows dicing of the wafer 100 and packaging layer of FIG. 7K along scribe lines 1722 to produce a multiplicity of individually packaged dies 1724.

Figure 7M:
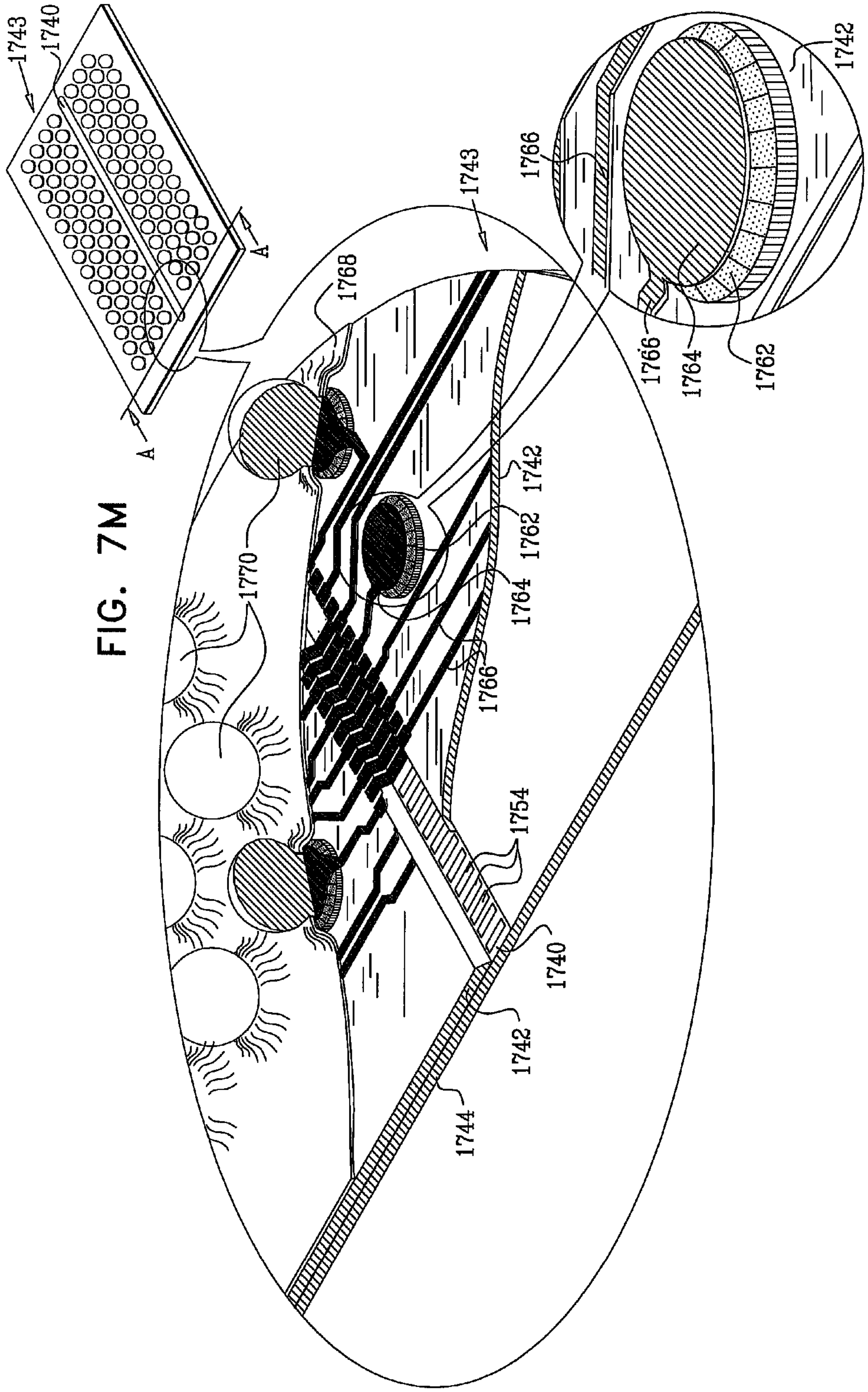
FIG. 7M is a simplified partially cut away pictorial illustration of part of a packaged semiconductor chip manufactured in accordance with the method of FIGS. 7A-7L.

Reference is now made to FIG. 7M, which is a simplified partially cut away pictorial illustration of part of a packaged semiconductor DRAM chip manufactured in accordance with the method of FIGS. 7A-7L. As seen in FIG. 7M, a notch 1740, produced by patterning of an encapsulant passivation layer 1742, corresponding to encapsulant passivation layer 1700 (FIG. 7C), of a silicon wafer die 1743, corresponding to silicon wafer die 1724 (FIG. 7L), exposes a row of bond pads 1754, corresponding to bond pads 108 (FIGS. 7A-7L). Platforms 1762, corresponding to platforms 507 (FIGS. 7F-7L) are formed over encapsulant passivation layer 1742 at solder bump locations 1764, corresponding to solder bump locations 1719 (FIGS. 7J-7L).

Patterned metal connections 1766, corresponding to metal connections 1716 (FIGS. 7H-7L), extend from bond pads 1754 along the inclined surfaces of notch 1740 and over generally planar surfaces of encapsulant passivation layer 1742 and terminate over platforms 1762. An encapsulant passivation layer 1768, corresponding to encapsulant passivation layer 1718 (FIGS. 7I-7L), is formed over encapsulant passivation layer 1742 and metal connections 1766 other than at locations 1764. Solder bumps 1770, corresponding to solder bumps 1720 (FIGS. 7K and 7L), are formed onto metal connections 1766 at locations 1764.

Figures 8A, 8B, 8C:
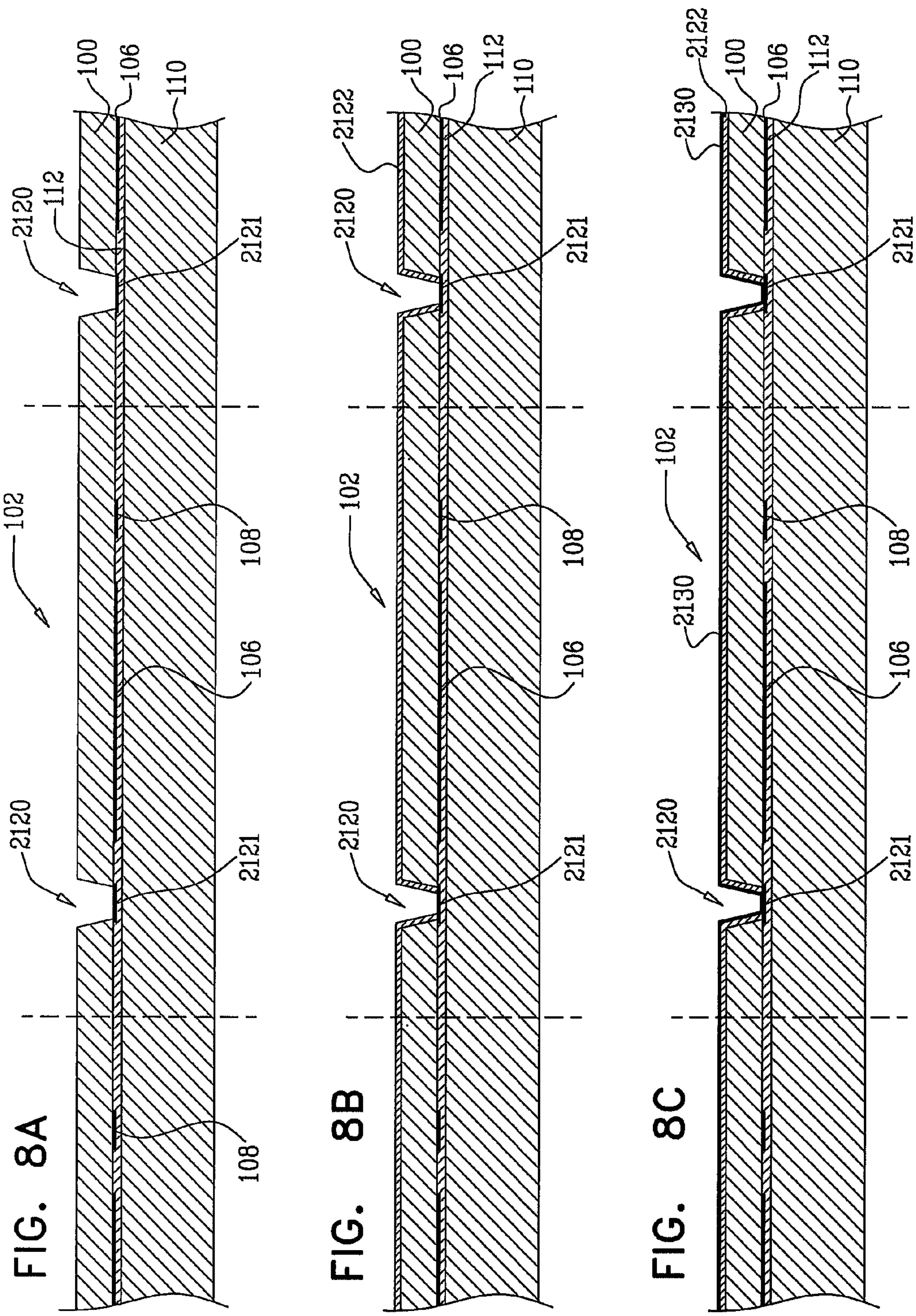
FIGS. 8A-8P are simplified sectional illustrations of another method for manufacturing packaged semiconductor chips in accordance with another preferred embodiment of the present invention.
Figure 8D:
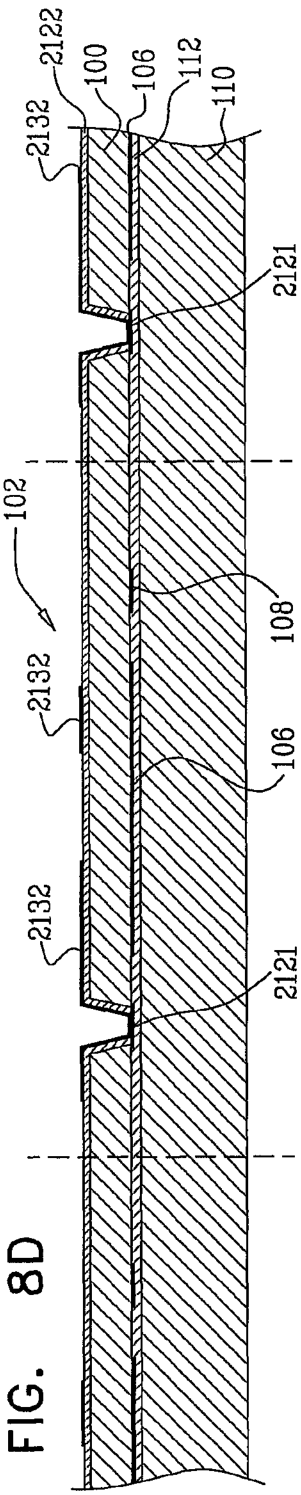
FIG. 8Q is a simplified, partially cut away part-pictorial and part-sectional illustration of part of a packaged semiconductor chip manufactured in accordance with the method of FIGS. 8A-8P.
Figure 8E:
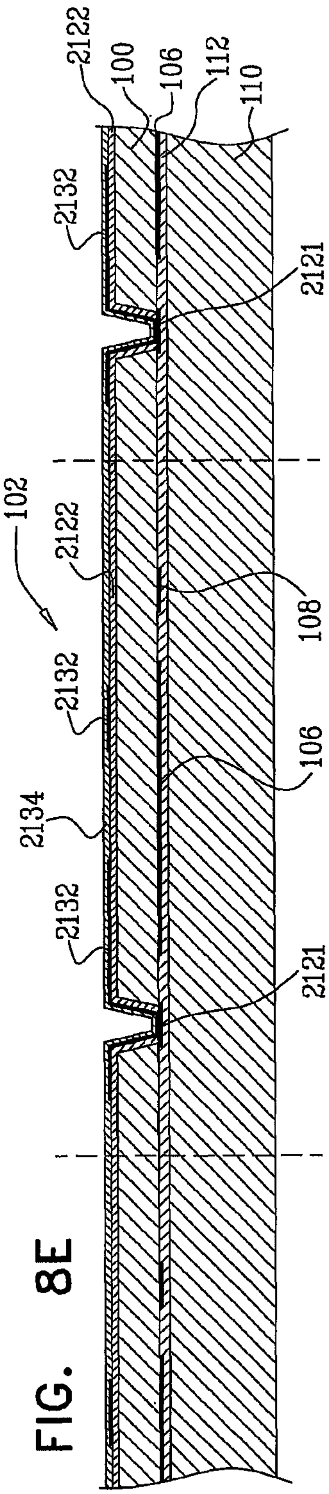
Figure 8F:
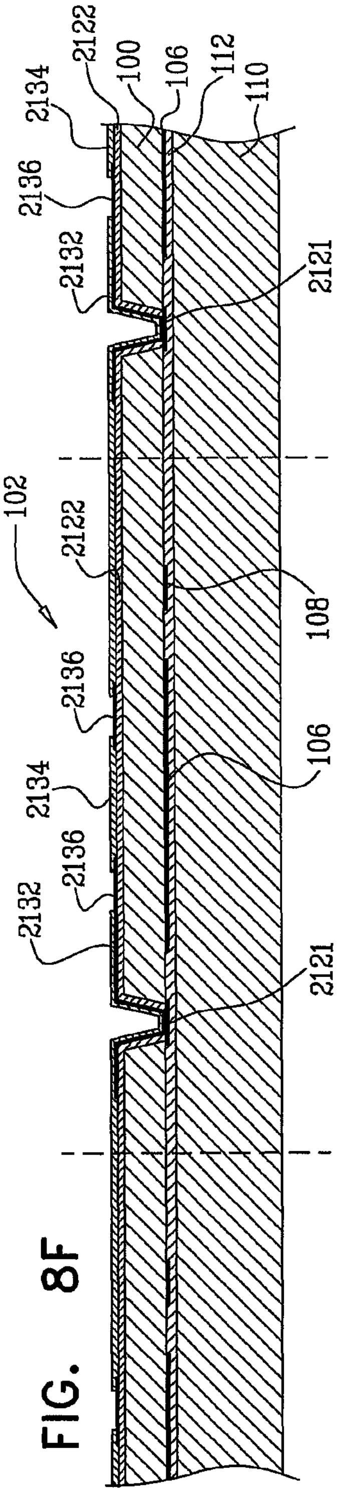
Figure 8G:
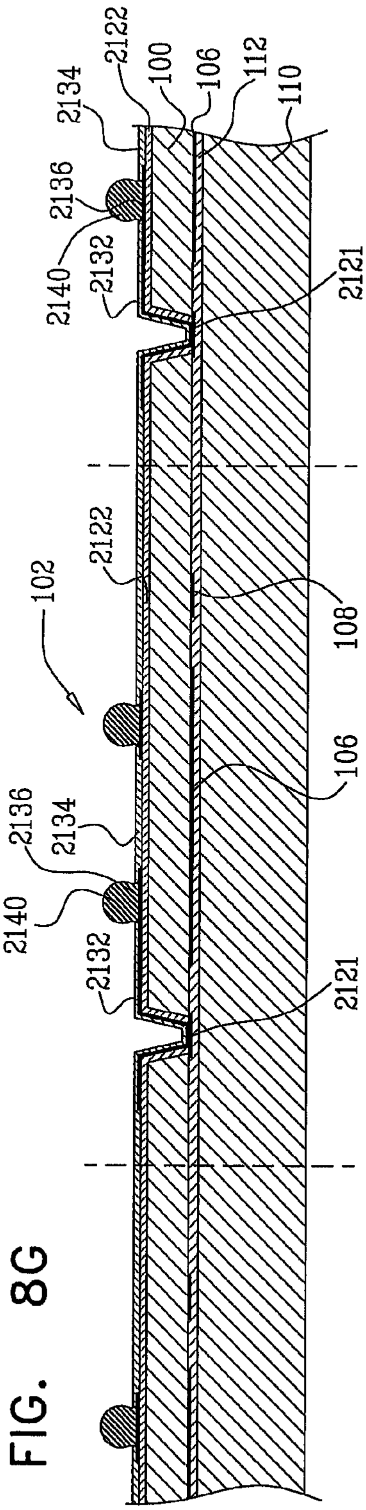
Figure 8H:
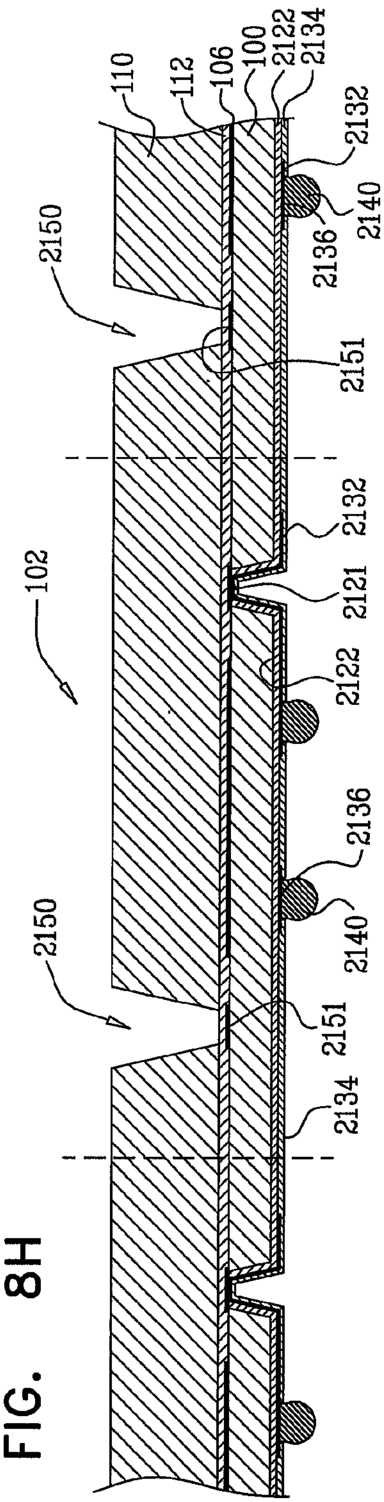
Figure 8I:
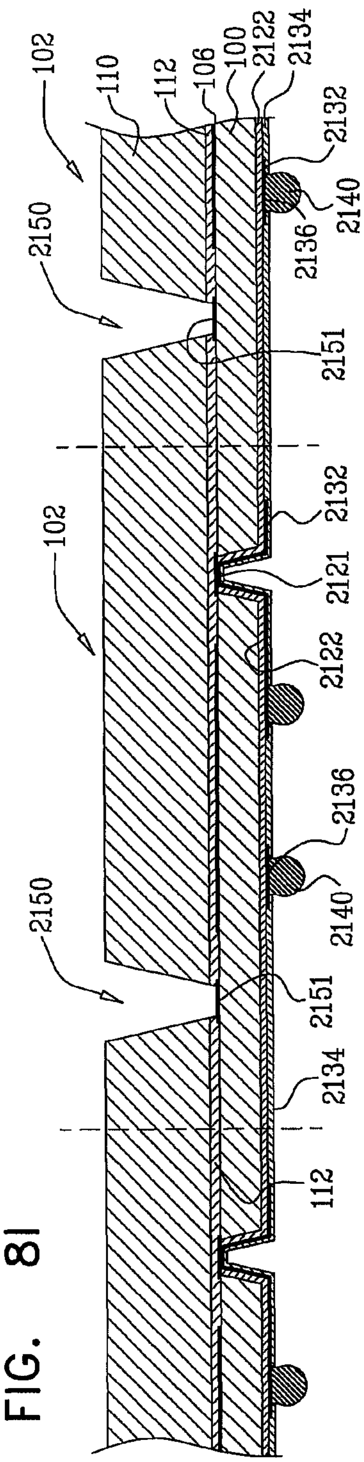
Figure 8J:
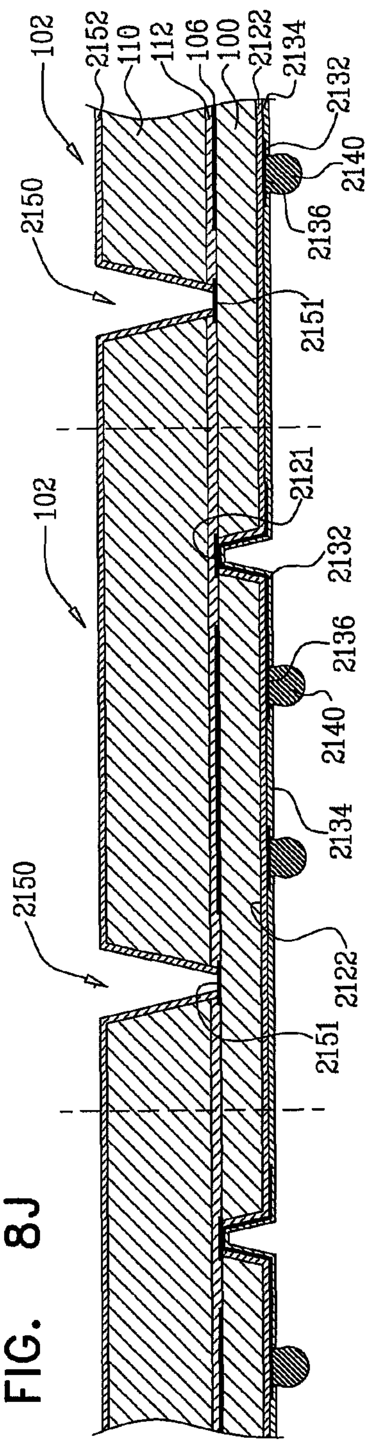
Figure 8K:
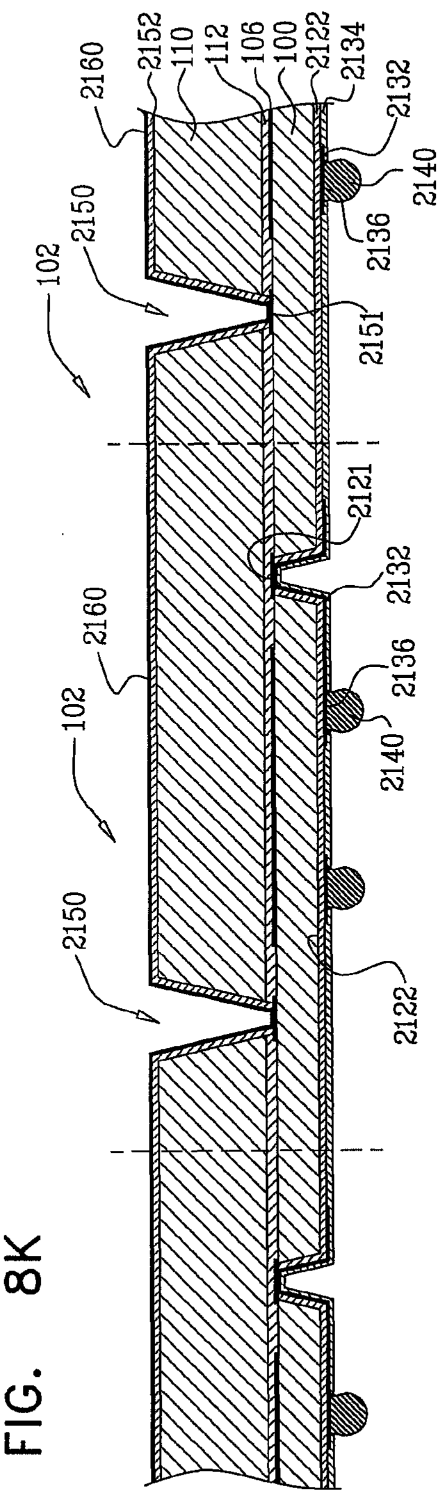
Figure 8L:
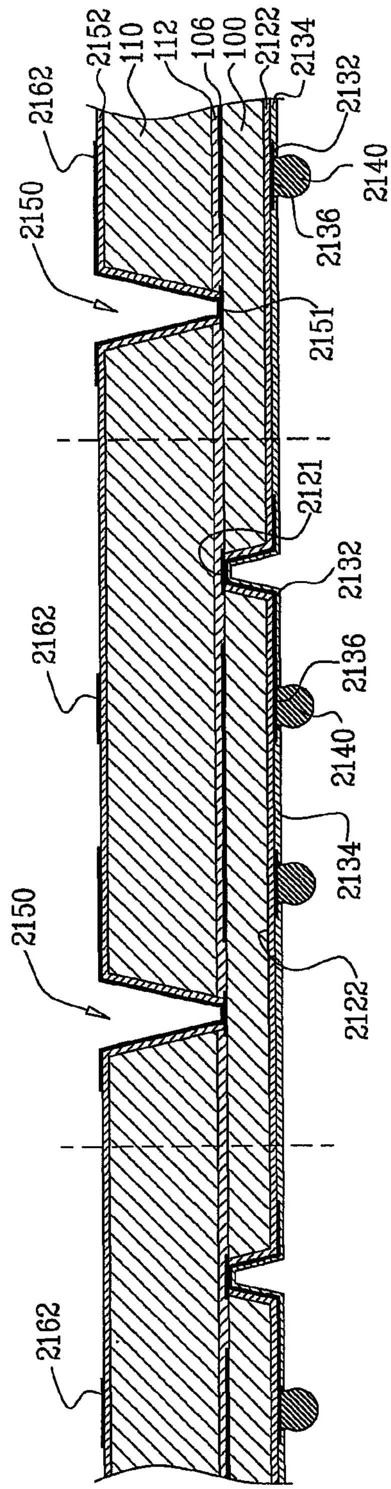
Figure 8M:
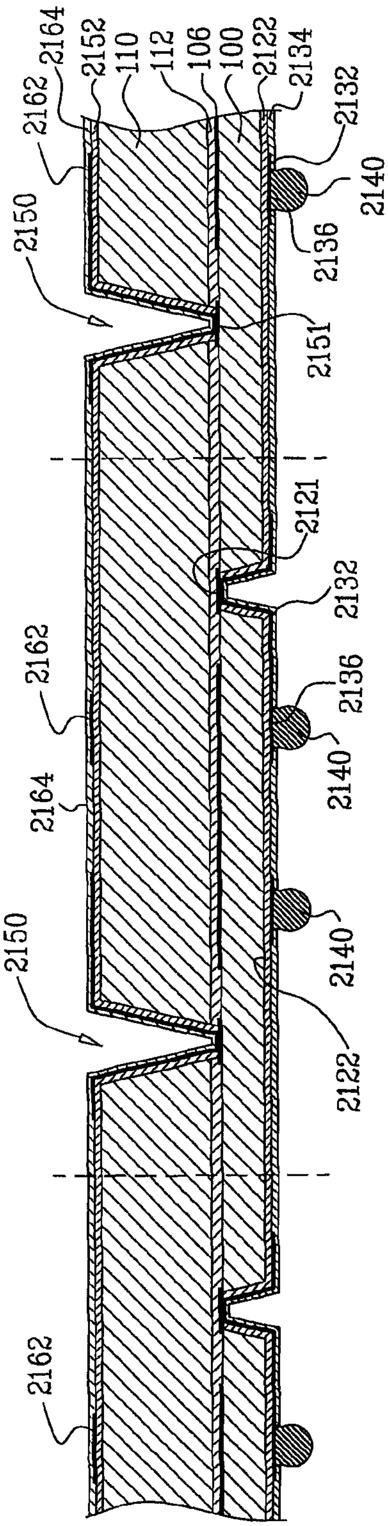
Figure 8N:
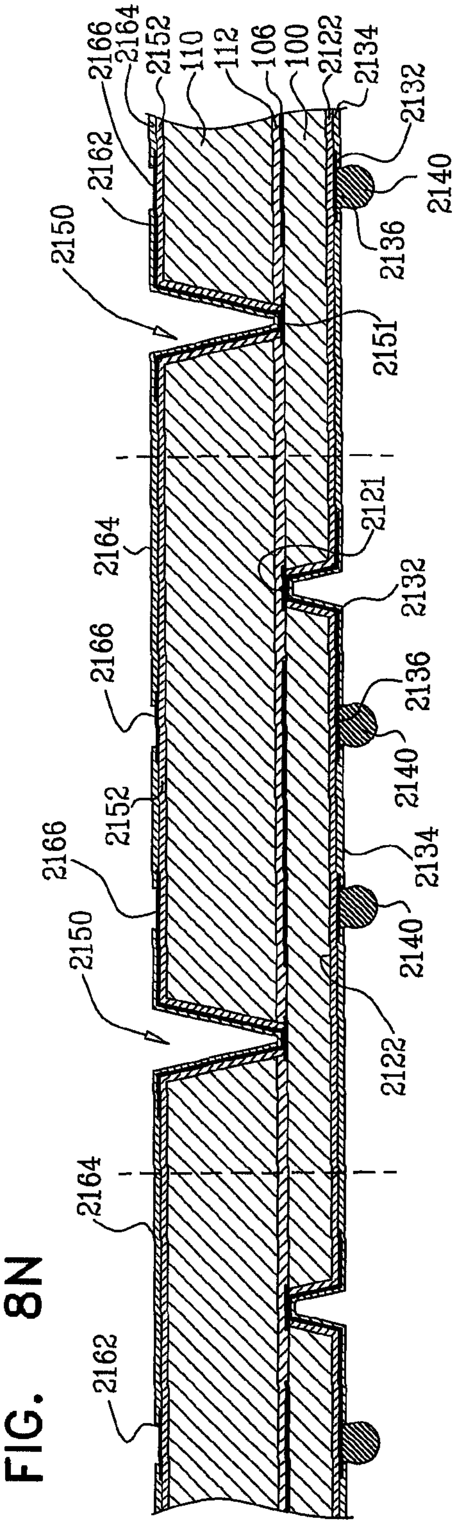
Figure 8O:
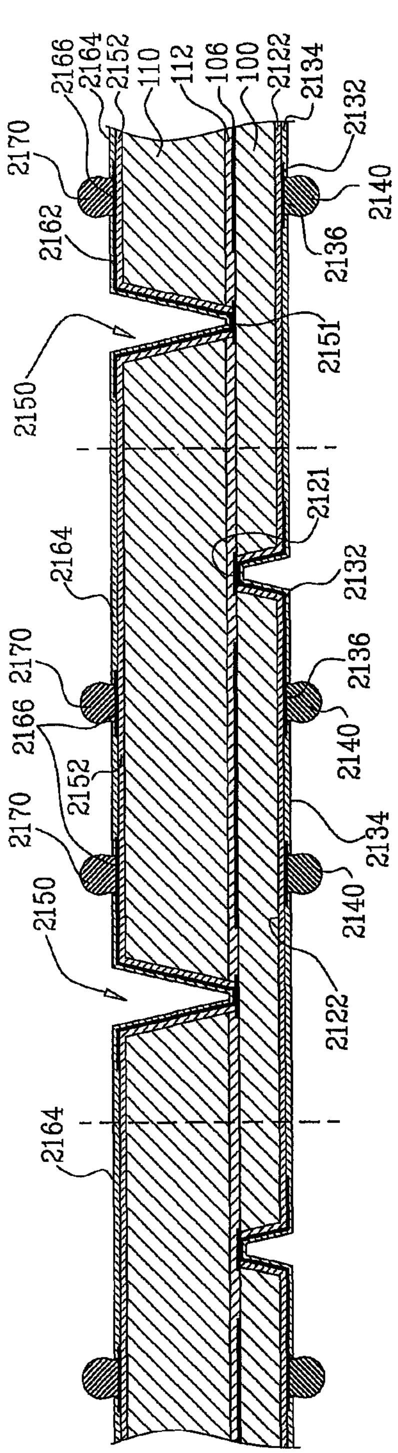
Figure 8P:
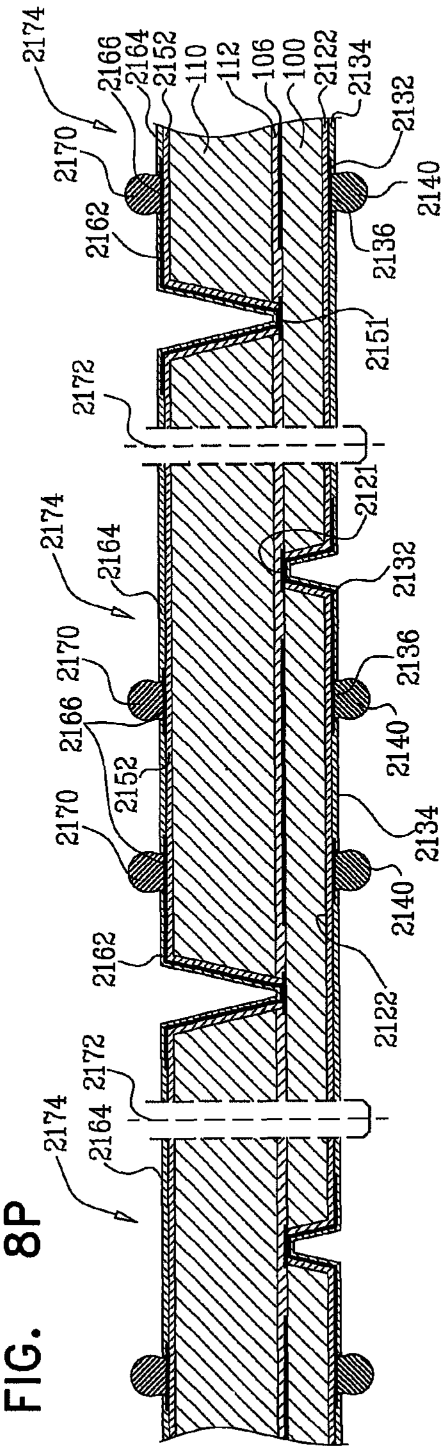

Reference is now made to FIGS. 8A-8P, which are simplified sectional illustrations of another method for manufacturing packaged semiconductor chips in accordance with another preferred embodiment of the present invention. The method of FIGS. 8A-8P employs the steps described hereinabove with reference to FIGS. 1A-1C, which are followed by the steps shown in FIGS. 8A-8P.

Reference is now made to FIG. 8A, which shows the structure of FIG. 1C turned upside-down. Notches 2120, preferably formed by photolithography employing plasma etching or wet etching techniques, are formed in semiconductor wafer 100 at locations which overlie, in the sense of FIG. 8A, some of bond pads 108, here designated by reference numeral 2121.

FIG. 8B shows the formation of an electrophoretic, electrically insulative compliant layer 2122 over the semiconductor wafer 100. Examples of suitable materials for compliant layer 2122 are those described hereinabove with reference to FIG. 1F. Once cured, compliant layer 2122 encapsulates all exposed surfaces of the semiconductor wafer 100. Compliant layer 2122 preferably provides protection to the device from alpha particles emitted by BGA solder balls.

FIG. 8C illustrates the formation of a metal layer 2130, by sputtering chrome, aluminum or copper. Metal layer 2130 extends from the bond pads 2121, over the compliant layer 2122 and along the inclined surfaces of the semiconductor wafer 100, defined by notches 2120 onto outer, generally planar surfaces of the compliant layer 2122.

As shown in FIG. 8D, metal connections 2132 are preferably formed by patterning the metal layer 2130, preferably by 3D photolithography employing a suitable photoresist, preferably Eagle 2100, commercially available from Rohm and Haas Shipley Division of Marlborough, Mass., U.S.A. Optionally, the metal connections 2132 may be plated with nickel, as by electroless techniques, in order to provide enhanced corrosion resistance.

FIG. 8E illustrates the application, preferably by spray coating, of a second, electrically insulative, encapsulant passivation layer 2134 over the metal connections 2132 and over the compliant layer 2122. Preferably, the encapsulant passivation layer 2134 comprises solder mask. FIG. 8F shows patterning of the encapsulant passivation layer 2134, preferably by photolithography, to define solder bump locations 2136.

FIG. 8G illustrates the formation of solder bumps 2140 at locations 2136 on the metal connections 2132, at which the encapsulant passivation layer 2134 is not present.

Reference is now made to FIG. 8H, which shows the structure of FIG. 8G turned upside-down. Notches 2150, preferably formed by photolithography employing plasma etching or wet etching techniques, are formed at locations which overlie bond pads 2151, which are some of bond pads 108. The notches preferably do not extend through adhesive 112.

Turning to FIG. 8I, it is seen that the adhesive 112 overlying bond pads 2151 and underlying notches 2150 is removed, preferably by dry etching.

FIG. 8J shows the formation of an electrophoretic, electrically insulative compliant layer 2152 over the packaging layer 110, which is typically formed of a sufficiently conductive inorganic substrate. Compliant layer 2152 preferably provides protection to the device from alpha particles emitted by BGA solder balls. Examples of suitable materials for compliant layer 2152 are those described hereinabove with reference to FIG. 1F. Once cured, compliant layer 2152 encapsulates all exposed surfaces of the packaging layer 110.

FIG. 8K illustrates the formation of a metal layer 2160, by sputtering chrome, aluminum or copper. Metal layer 2160 extends from the bond pads 2151, over the compliant layer 2152 and along the inclined surfaces of the packaging layer 110, defined by notches 2150 onto outer, generally planar surfaces of the compliant layer 2152.

As shown in FIG. 8L, metal connections 2162 are preferably formed by patterning the metal layer 2160, preferably by 3D photolithography employing a suitable photoresist, preferably Eagle 2100, commercially available from Rohm and Haas Shipley Division of Marlborough, Mass., U.S.A. Optionally, the metal connections 2162 may be plated with nickel, as by electroless techniques, in order to provide enhanced corrosion resistance.

FIG. 8M illustrates the application, preferably by spray coating, of a second, electrically insulative, encapsulant passivation layer 2164 over the metal connections 2162 and over the compliant layer 2152. Preferably, the encapsulant passivation layer 2164 comprises solder mask. FIG. 8N shows patterning of the encapsulant passivation layer 2164, preferably by photolithography, to define solder bump locations 2166.

FIG. 8O illustrates the formation of solder bumps 2170 at locations 2166 on the metal connections 2162 at which the encapsulant passivation layer 2164 is not present.

FIG. 8P shows dicing of the wafer 100 and packaging layer 110 of FIG. 8O along scribe lines 2172 to produce a multiplicity of individually packaged stackable dies 2174.

Figure 8Q:
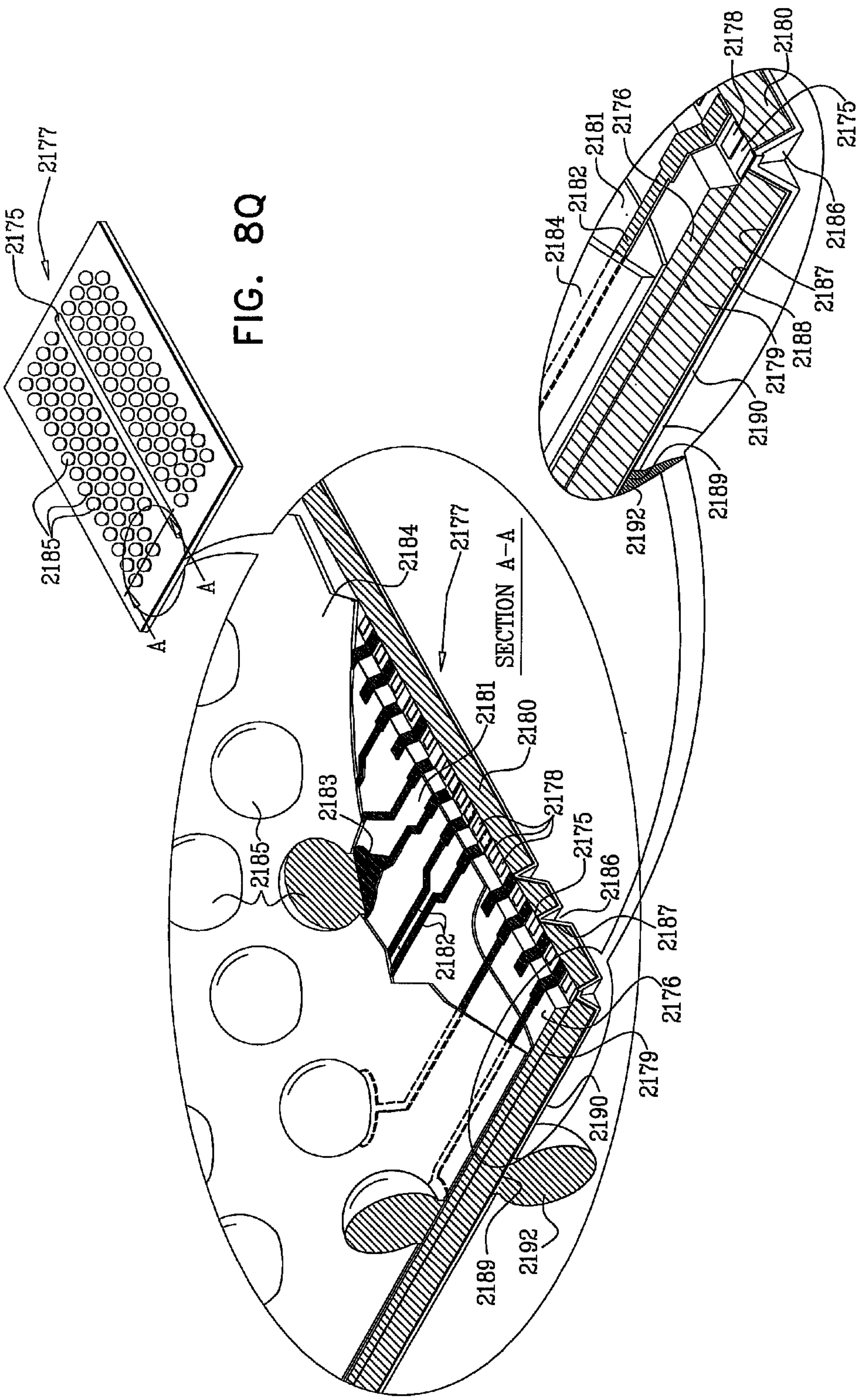

Reference is now made to FIG. 8Q, which is a simplified, partially cut away part-pictorial and part-sectional illustration of part of a packaged semiconductor DRAM chip manufactured in accordance with the method of FIGS. 8A-8P. As seen in FIG. 8Q, a notch 2175, corresponding to notch 2150 (FIGS. 8H-8P), is formed in a packaging layer 2176, corresponding to packaging layer 110 (FIG. 8A-8P) over a first surface of a silicon wafer die 2177, corresponding to die 2174 (FIG. 8P).

The notch 2175 exposes a row of bond pads 2178, corresponding to bond pads 108 (FIGS. 8A-8P). A layer 2179 of adhesive, corresponding to layer 112 (FIGS. 8A-8P), covers a silicon layer 2180, corresponding to semiconductor wafer 100 of the silicon wafer die 2177, other than at notch 2175 and packaging layer 2176 covers the adhesive 2179. An electrophoretic, electrically insulative compliant layer 2181, corresponding to electrophoretic, electrically insulative compliant layer 2152 (FIGS. 8I-8P), covers the packaging layer 2176 and extends along inclined surfaces of notch 2175, but does not cover the bond pads 2178.

Patterned metal connections 2182, corresponding to metal connections 2162 (FIGS. 8L-8P) extend from bond pads 2178 along the inclined surfaces of notch 2175 and over generally planar surfaces of compliant layer 2181 to solder bump locations 2183, corresponding to solder bump locations 2166 (FIGS. 8N-8P). An encapsulant passivation layer 2184, corresponding to encapsulant passivation layer 2164 (FIGS. 8M-8P), is formed over compliant layer 2181 and metal connections 2182 other than at locations 2183. Solder bumps 2185, corresponding to solder bumps 2170 (FIGS. 8O and 8P), are formed onto metal connections 2182 at locations 2183.

At a second surface of silicon wafer die 2177 facing oppositely from the first surface, a plurality of bond pad specific notches 2186, corresponding to notches 2120 (FIGS. 8A-8P), are shown, formed in silicon layer 2180.

The notches 2186 each expose one of bond pads 2178. An electrophoretic, electrically insulative compliant layer 2187, corresponding to electrophoretic, electrically insulative compliant layer 2122 (FIGS. 8B-8P), covers the second surface and extends along inclined surfaces of notches 2186, but does not cover the bond pads 2178 which are exposed by notches 2186.

Patterned metal connections 2188, corresponding to metal connections 2132 (FIGS. 8D-8P) extend from bond pads 2178 along the inclined surfaces of notches 2186 and over generally planar surfaces of compliant layer 2187 to solder bump locations 2189, corresponding to solder bump locations 2136 (FIGS. 8F-8P). An encapsulant passivation layer 2190, corresponding to encapsulant passivation layer 2134 (FIGS. 8E-8P), is formed over compliant layer 2187 and metal connections 2188 other than at locations 2189. Solder bumps 2192, corresponding to solder bumps 2140 (FIGS. 8G-8P), are formed onto metal connections 2188 at locations 2189.

Figure 9A:
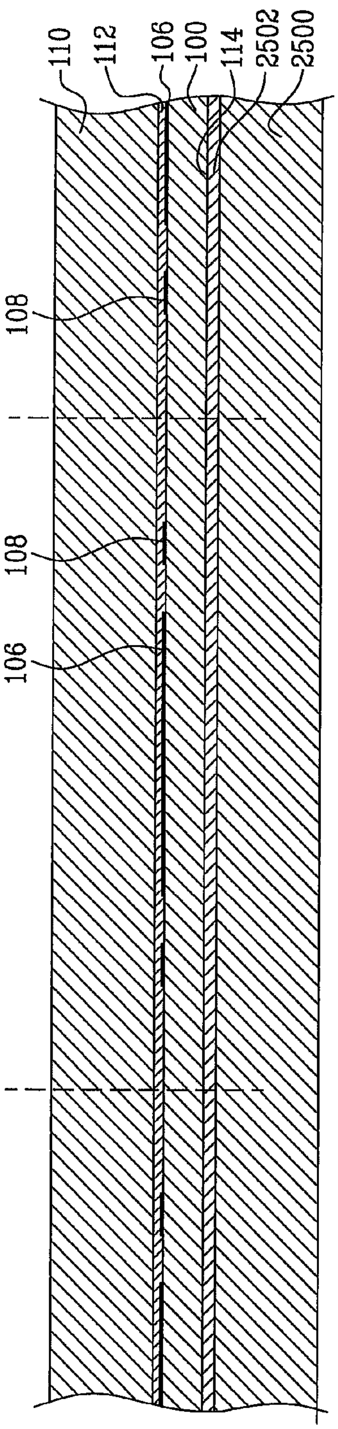
FIGS. 9A-9Q are simplified sectional illustrations of yet another method for manufacturing packaged semiconductor chips in accordance with another preferred embodiment of the present invention.
Figure 9B:
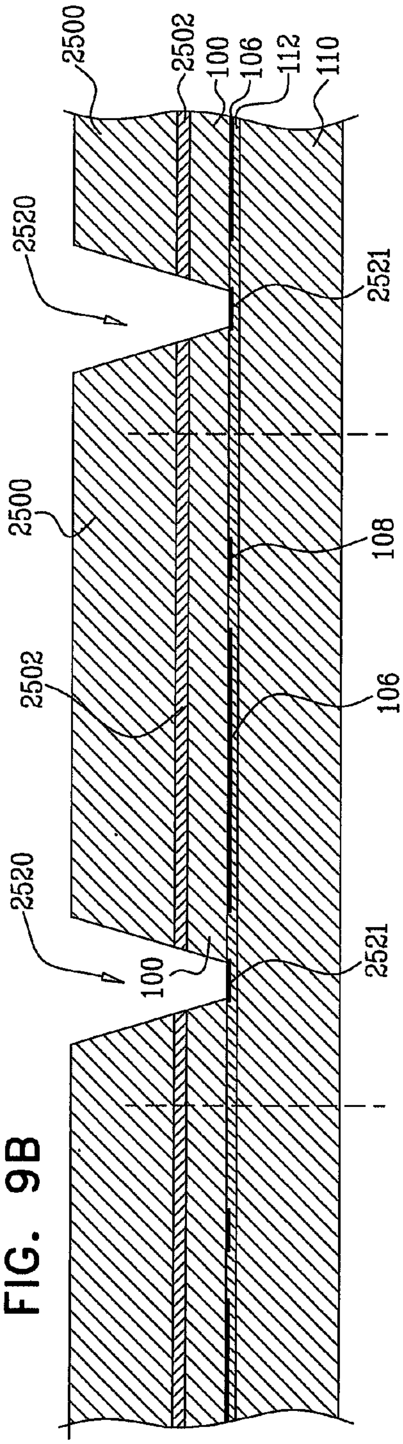
FIG. 9R is a simplified partially cut away part-pictorial and part-sectional illustration of part of a packaged semiconductor chip manufactured in accordance with the method of FIGS. 9A-9Q.
Figure 9C:
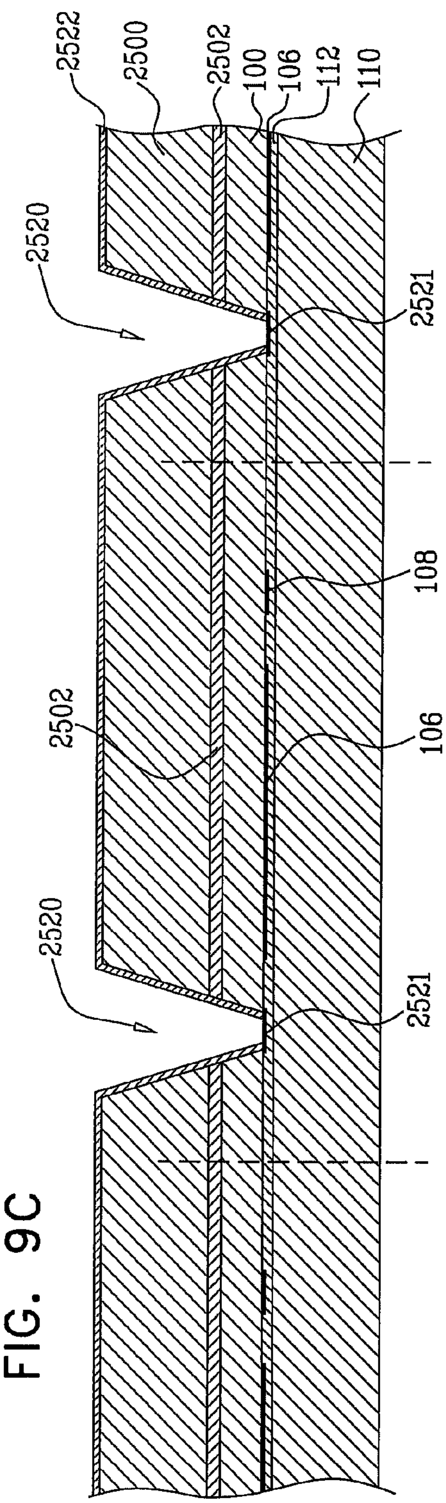
Figure 9D:
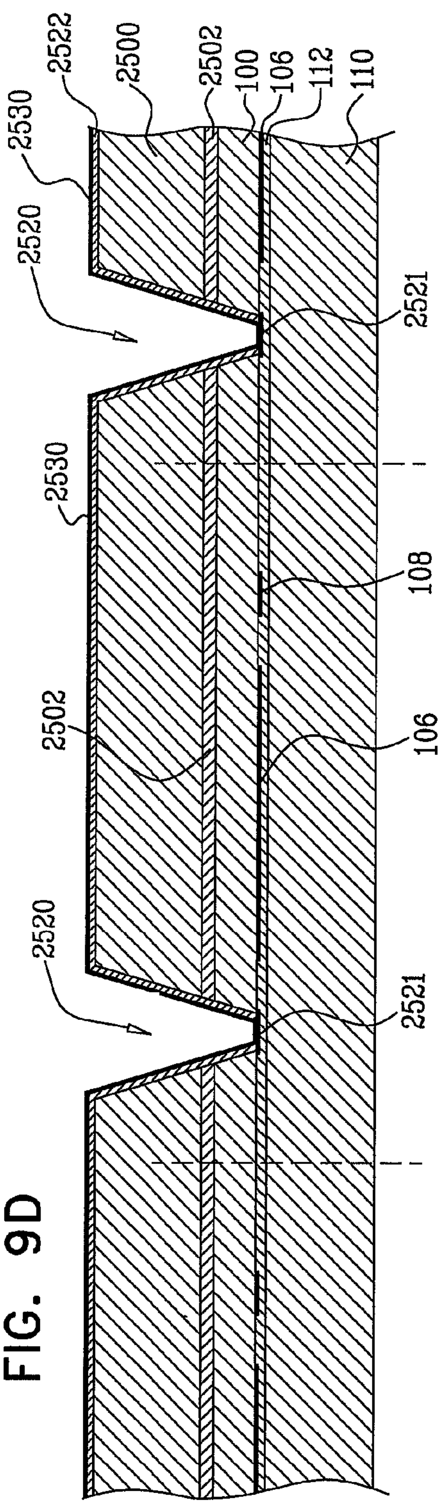
Figure 9E:
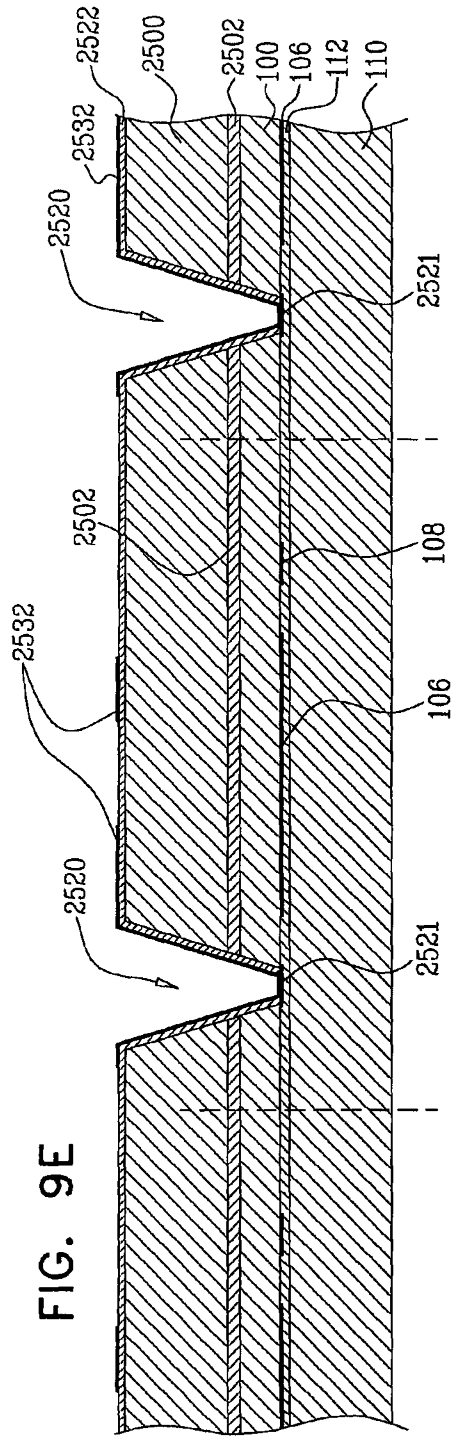
Figure 9F:
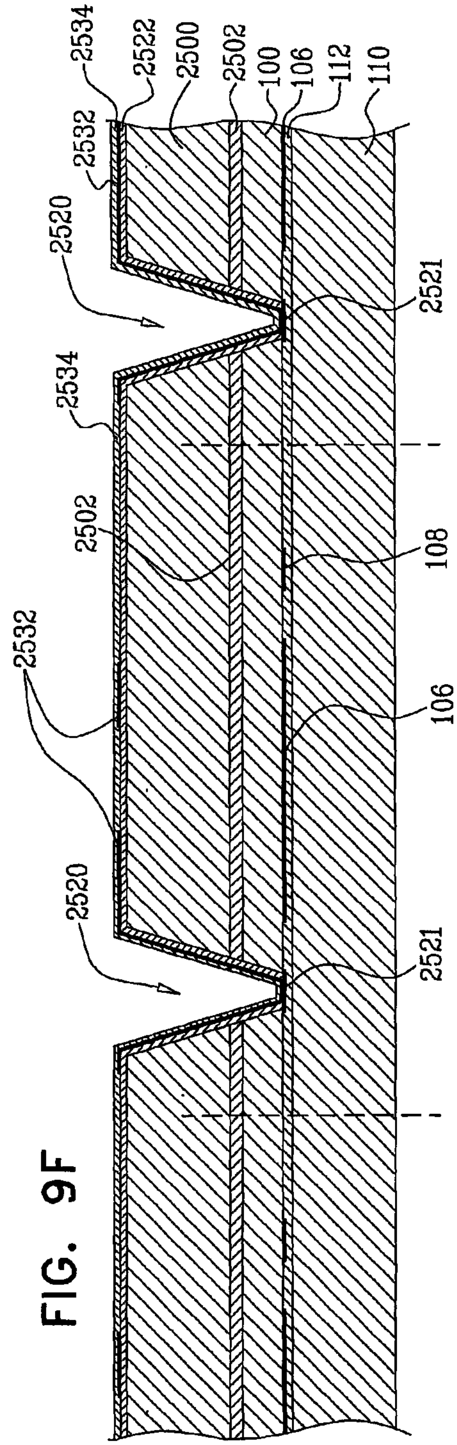
Figure 9G:
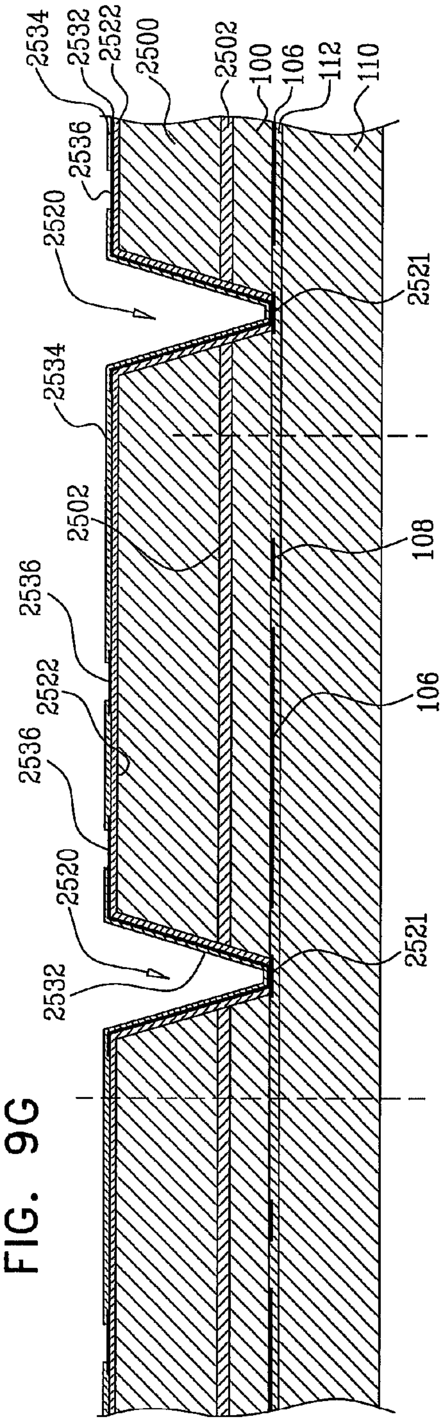
Figure 9H:
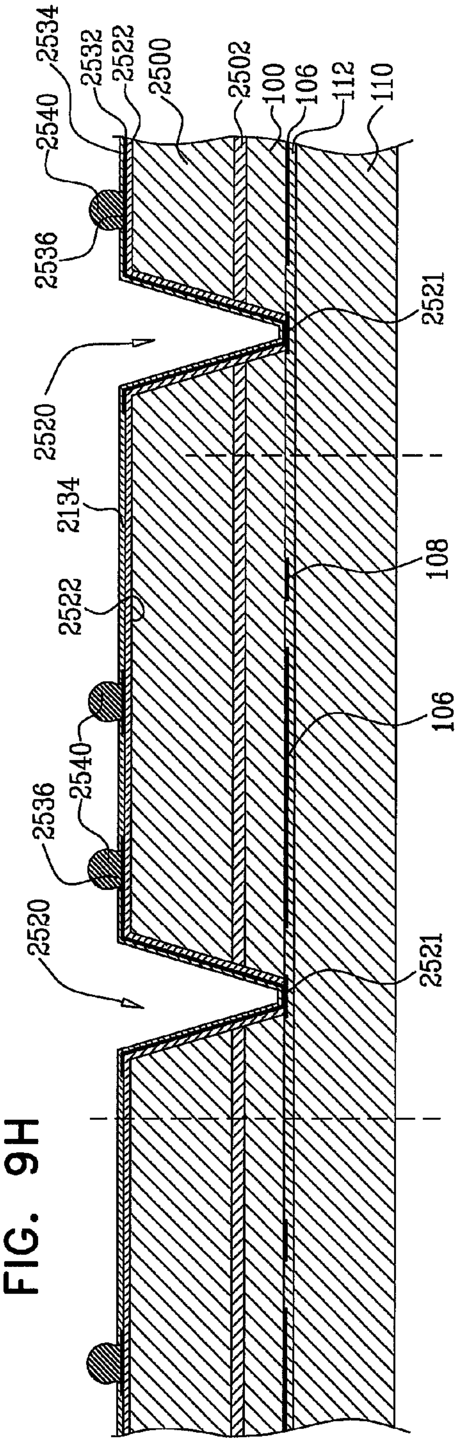
Figure 9I:
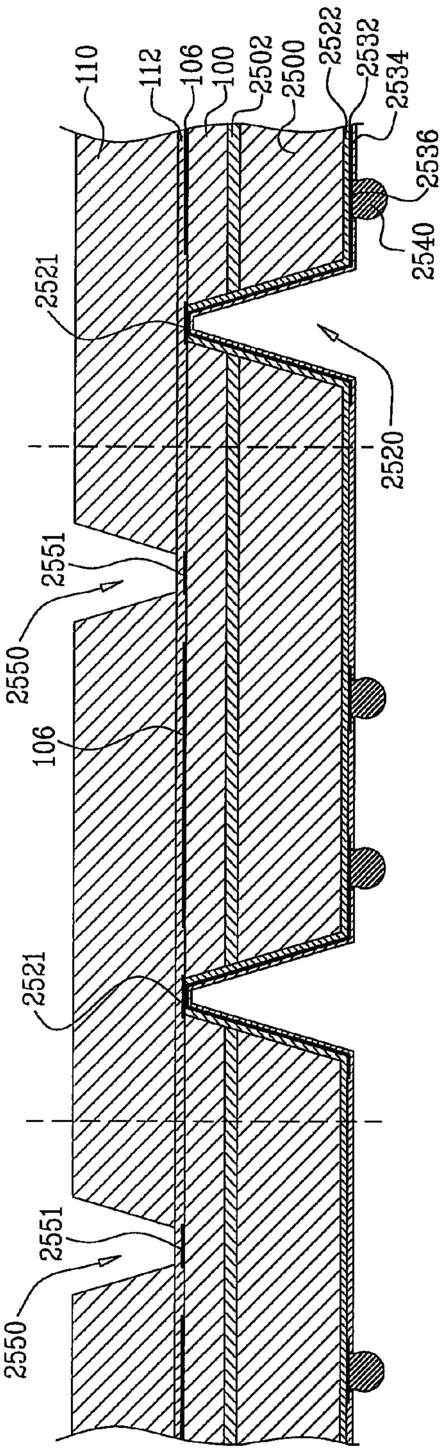
Figure 9J:
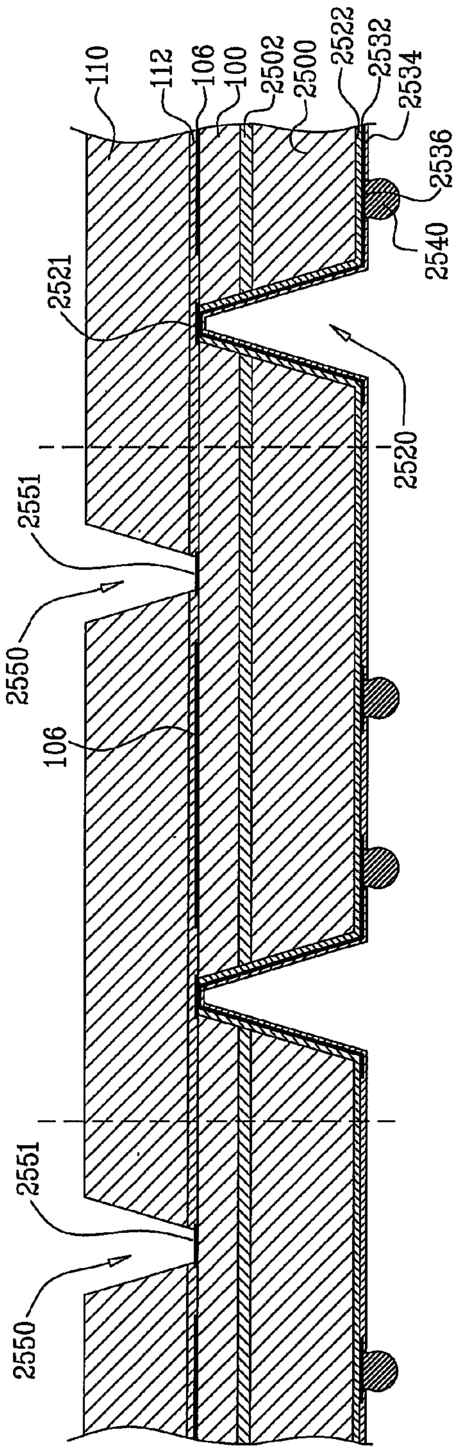
Figure 9K:
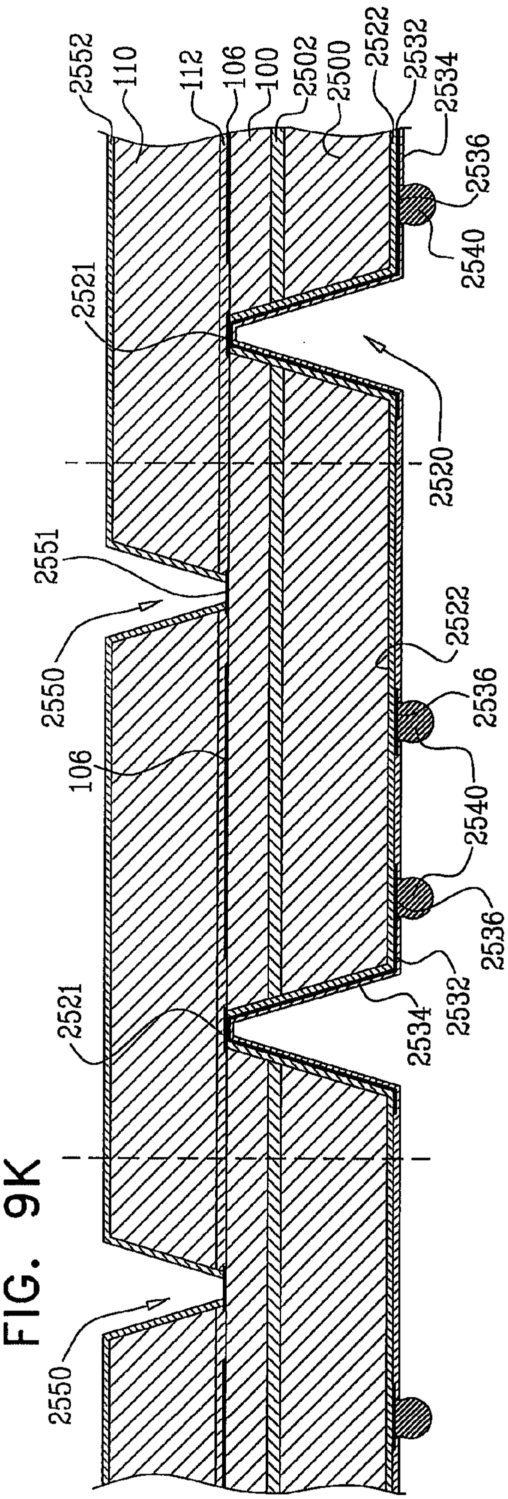
Figure 9L:
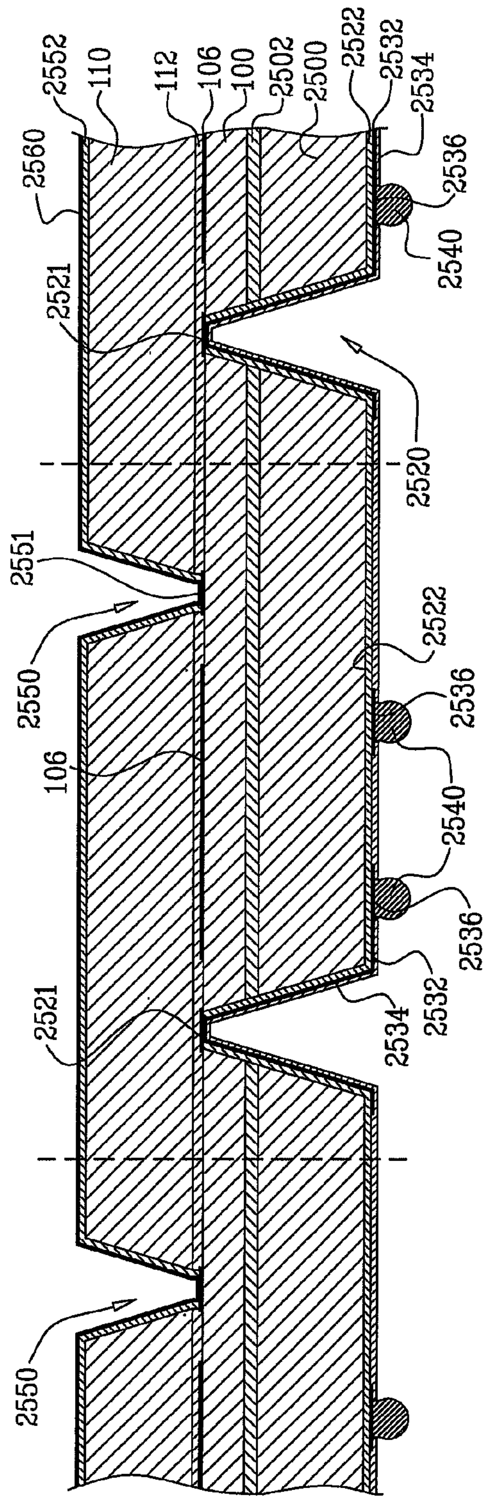
Figure 9M:
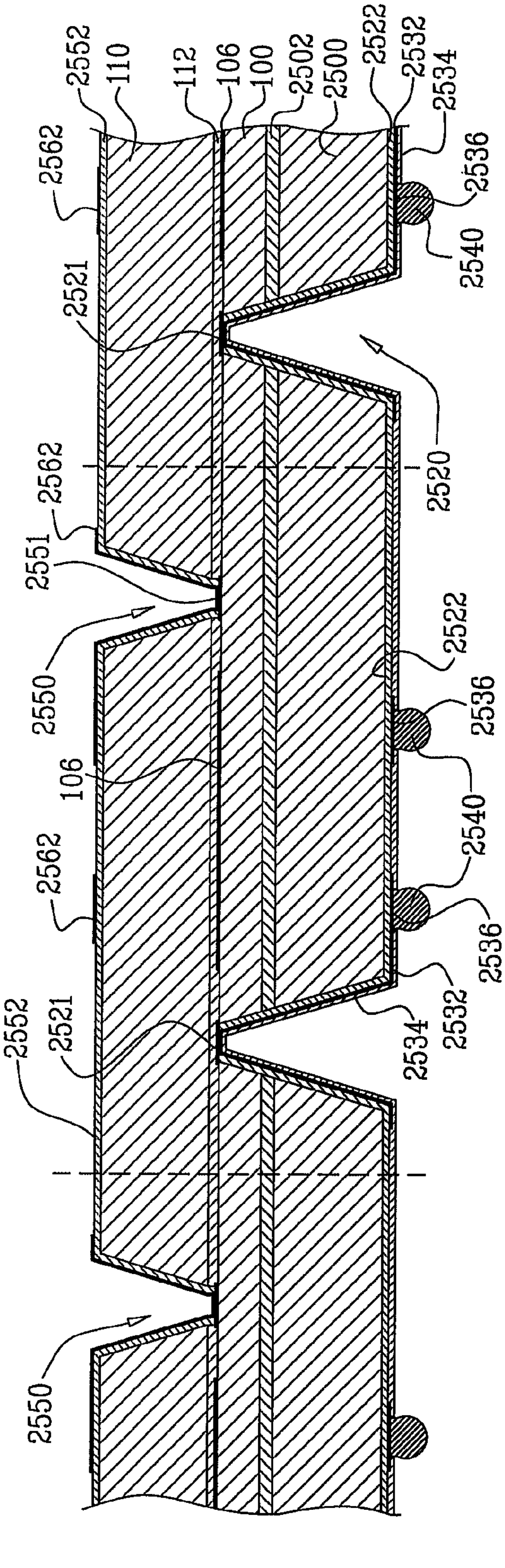
Figure 9N:
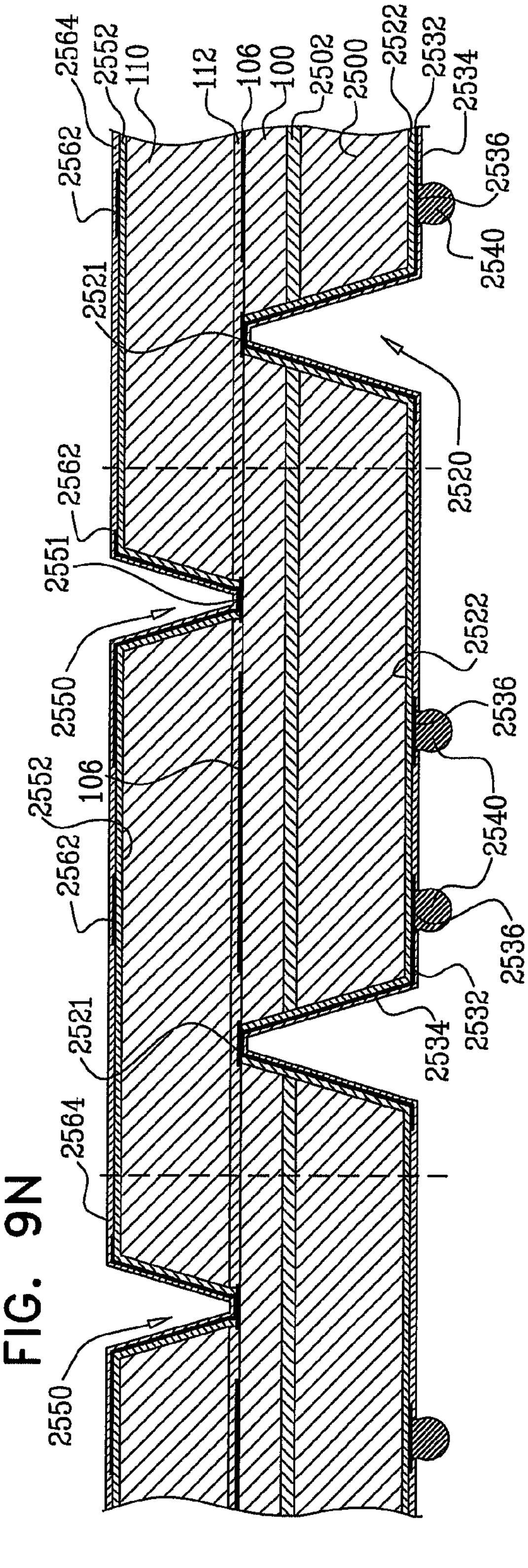
Figure 9O:
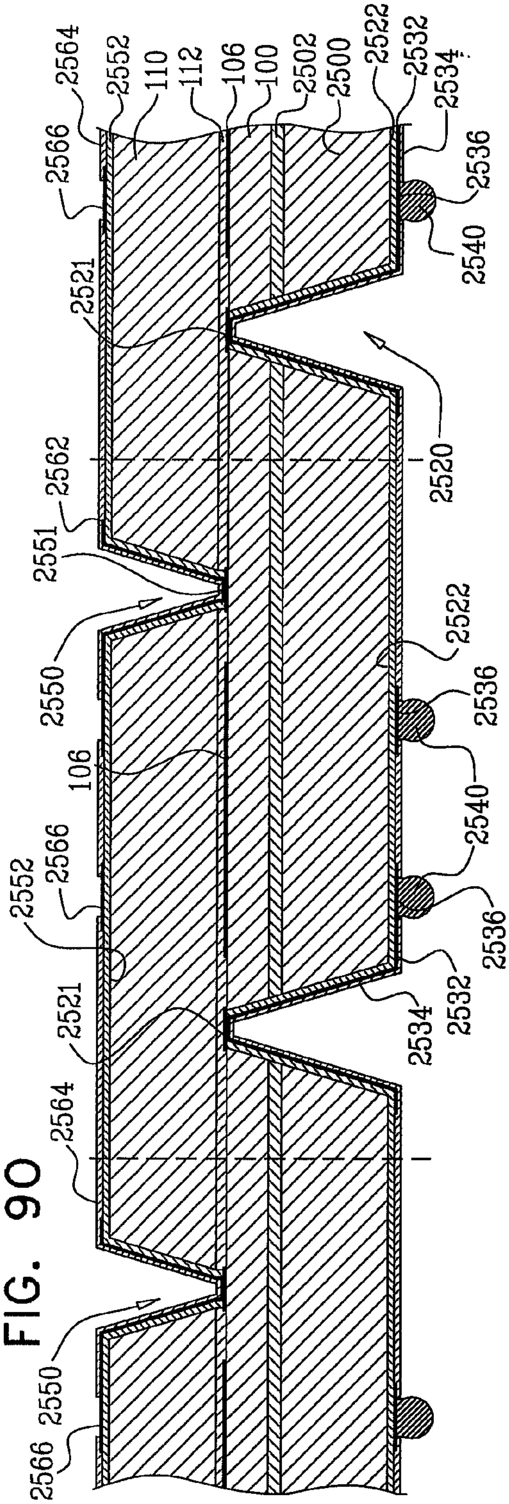
Figure 9P:
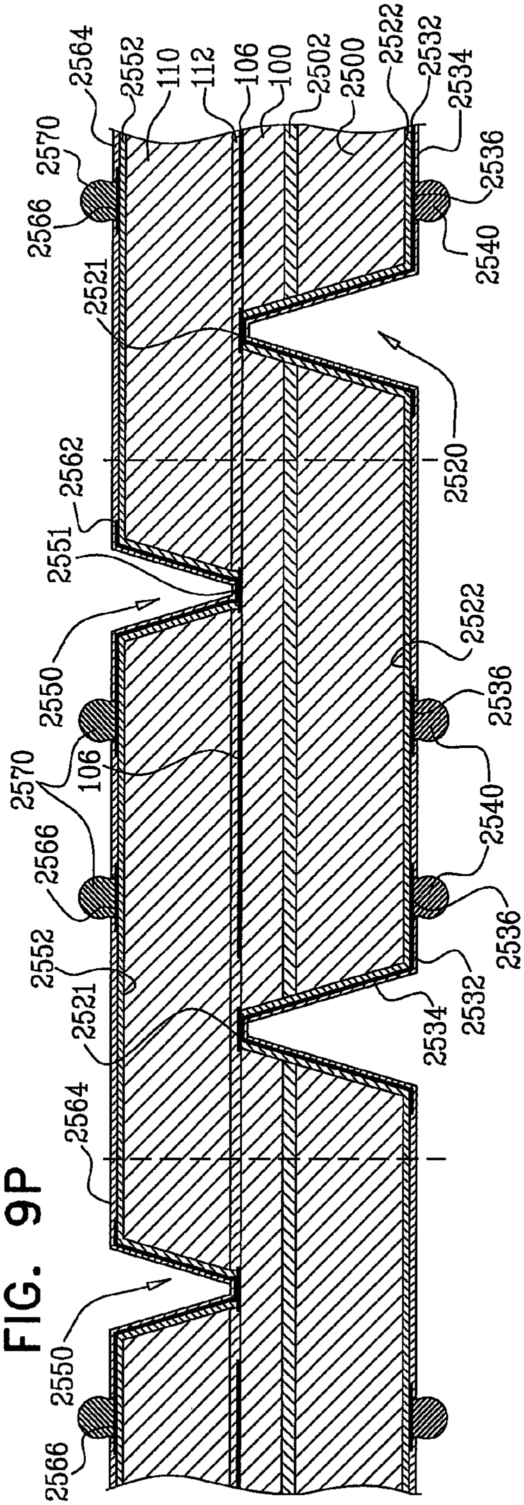
Figure 9Q:
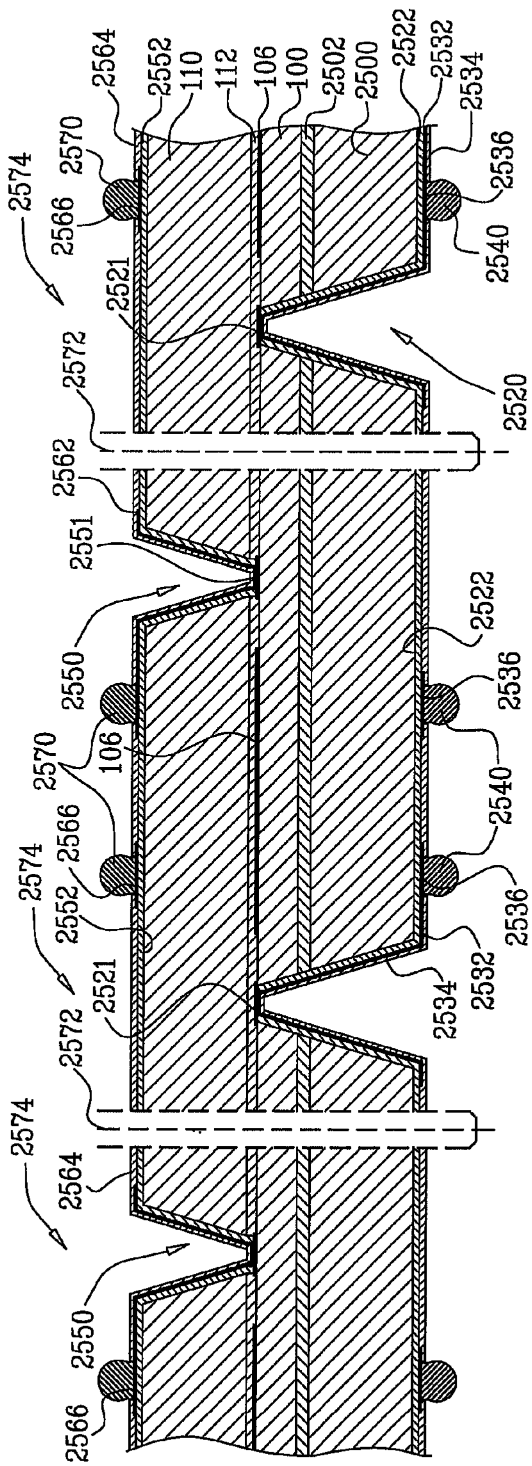

Reference is now made to FIGS. 9A-9Q, which are simplified sectional illustrations of another method for manufacturing packaged semiconductor chips in accordance with another preferred embodiment of the present invention.

The method of FIGS. 9A-9Q employs the steps described hereinabove with reference to FIGS. 1A-1C, which are followed by the steps shown in FIGS. 9A-9Q.

Reference is now made to FIG. 9A, which shows the structure of FIG. 1C having bonded to surface 114 thereof an additional packaging layer 2500, typically by means of a suitable adhesive 2502, such as epoxy.

FIG. 9B shows the structure of FIG. 9A turned upside-down. Notches 2520, preferably formed by photolithography employing plasma etching or wet etching techniques, are formed so as to extend through additional packaging layer 2500, adhesive 2502 and semiconductor wafer 100 at locations which overlie, in the sense of FIG. 9B, some of bond pads 108, here designated by reference numeral 2521.

FIG. 9C shows the formation of an electrophoretic, electrically insulative compliant layer 2522 over the additional packaging layer 2500. Examples of suitable materials for compliant layer 2522 are those described hereinabove with reference to FIG. 1F. Once cured, compliant layer 2522 encapsulates all exposed surfaces of the packaging layer 2500 and semiconductor wafer 100 other than bond pads 2521. Compliant layer 2522 preferably provides protection to the device from alpha particles emitted by BGA solder balls.

FIG. 9D illustrates the formation of a metal layer 2530, by sputtering chrome, aluminum or copper. Metal layer 2530 extends from the bond pads 2521, over the compliant layer 2522 and along the inclined surfaces of the additional packaging layer 2500, adhesive 2502 and semiconductor wafer 100, defined by notches 2520 onto outer, generally planar surfaces of the compliant layer 2522.

As shown in FIG. 9E, metal connections 2532 are preferably formed by patterning the metal layer 2530, preferably by 3D photolithography employing a suitable photoresist, preferably Eagle 2100, commercially available from Rohm and Haas Shipley Division of Marlborough, Mass., U.S.A. Optionally, the metal connections 2532 may be plated with nickel, as by electroless techniques, in order to provide enhanced corrosion resistance.

FIG. 9F illustrates the application, preferably by spray coating, of a second, electrically insulative, encapsulant passivation layer 2534 over the metal connections 2532 and over the compliant layer 2522. Preferably, the encapsulant forming the encapsulant passivation layer 2534 comprises solder mask. FIG. 9G shows patterning of the encapsulant passivation layer 2534, preferably by photolithography, to define solder bump locations 2536.

FIG. 9H illustrates the formation of solder bumps 2540 at locations 2536 on the metal connections 2532, at which the encapsulant passivation layer 2534 is not present.

Reference is now made to FIG. 9I, which shows the structure of FIG. 9H turned upside-down. Notches 2550, preferably formed by photolithography employing plasma etching or wet etching techniques, are formed at locations which overlie bond pads 2551, which are bond pads 108 other than bond pads 2521. The notches preferably do not extend through adhesive 112.

Turning to FIG. 9J, it is seen that the adhesive 112 overlying bond pads 2551 and underlying notches 2550 is removed, preferably by dry etching.

FIG. 9K shows the formation of an electrophoretic, electrically insulative compliant layer 2552 over the packaging layer 110, which is typically formed of silicon, glass or a suitable polymeric material such as, for example a polyimide. Compliant layer 2552 preferably provides protection to the device from alpha particles emitted by BGA solder balls. Examples of suitable materials for compliant layer 2552 are those described hereinabove with reference to FIG. 1F. Once cured, compliant layer 2552 encapsulates all exposed surfaces of the packaging layer 110.

FIG. 9L illustrates the formation of a metal layer 2560, by sputtering chrome, aluminum or copper. Metal layer 2560 extends from the bond pads 2551, over the compliant layer 2552 and along the inclined surfaces of the packaging layer 110, defined by notches 2550 onto outer, generally planar surfaces of the compliant layer 2552.

As shown in FIG. 9M, metal connections 2562 are preferably formed by patterning the metal layer 2560, preferably by 3D photolithography employing a suitable photoresist, preferably Eagle 2100, commercially available from Rohm and Haas Shipley Division of Marlborough, Mass., U.S.A. Optionally, the metal connections 2562 may be plated with nickel, as by electroless techniques, in order to provide enhanced corrosion resistance.

FIG. 9N illustrates the application, preferably by spray coating, of a second, electrically insulative, encapsulant passivation layer 2564 over the metal connections 2562 and over the compliant layer 2552. Preferably, the encapsulant passivation layer 2564 comprises solder mask. FIG. 9O shows patterning of the encapsulant passivation layer 2564, preferably by photolithography, to define solder bump locations 2566.

FIG. 9P illustrates the formation of solder bumps 2570 at locations 2566 on the metal connections 2562 at which the encapsulant passivation layer 2564 is not present.

FIG. 9Q shows dicing of the wafer 100, packaging layer 110 and packaging layer 2500 of FIG. 9P along scribe lines 2572 to produce a multiplicity of individually packaged stackable dies 2574.

Figure 9R:
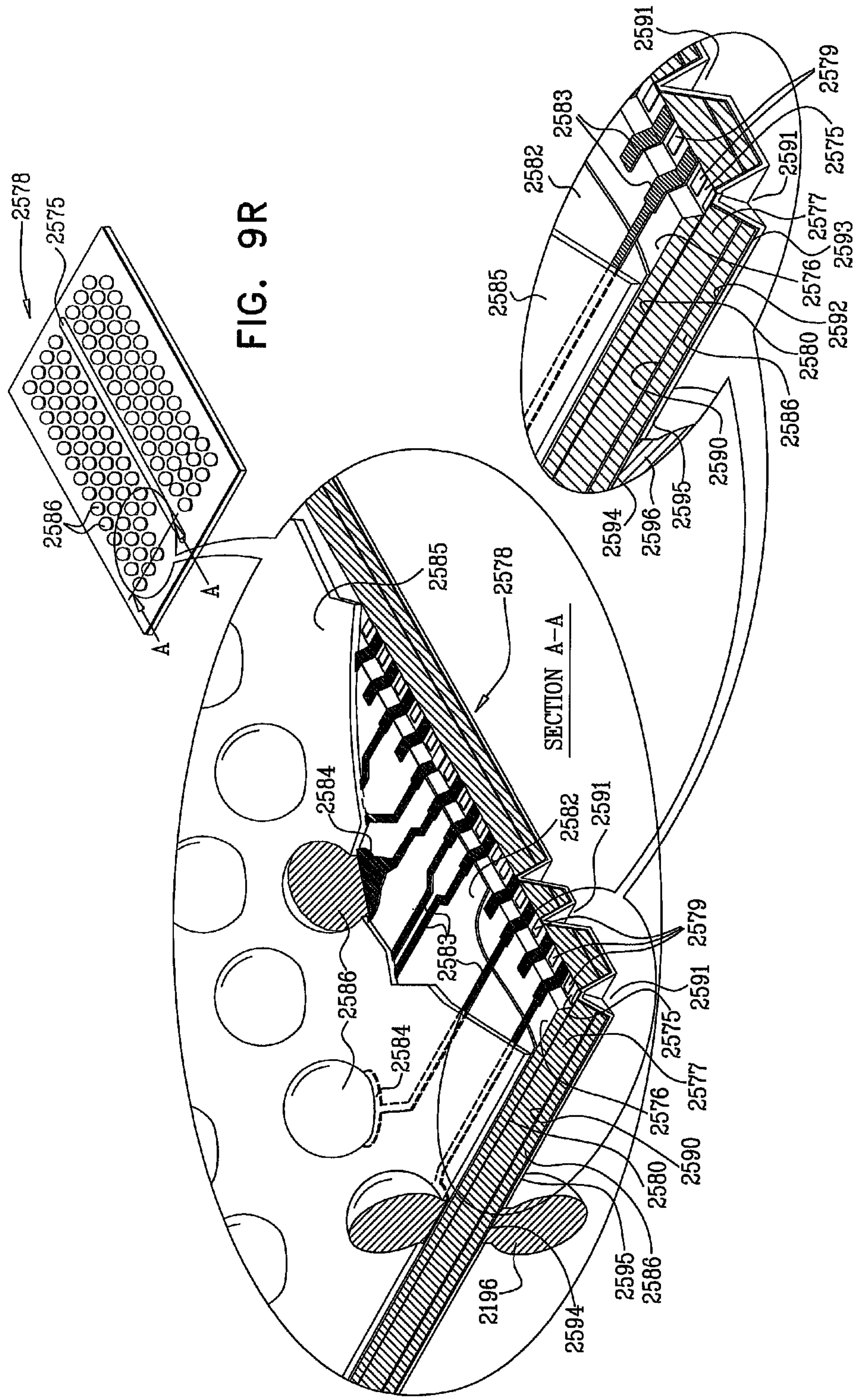

Reference is now made to FIG. 9R, which is a simplified partially cut away part-pictorial and part-sectional illustration of part of a packaged semiconductor DRAM chip manufactured in accordance with the method of FIGS. 9A-9Q. As seen in FIG. 9Q, a notch 2575, corresponding to notches 2550 (FIGS. 9I-9Q), is formed in a packaging layer 2576, corresponding to packaging layer 110 (FIG. 9A-9Q) over a first surface of a silicon layer 2577, corresponding to semiconductor wafer 100, of silicon wafer die 2578, corresponding to die 2574 (FIG. 9Q).

The notch 2575 exposes a row of bond pads 2579, corresponding to bond pads 108 (FIGS. 9A-9Q). A layer 2580 of adhesive, corresponding to layer 112 (FIGS. 9A-9Q), covers the first surface of the silicon layer 2577 other than at notch 2575 and packaging layer 2576 covers the adhesive 2580. An electrophoretic, electrically insulative compliant layer 2582, corresponding to electrophoretic, electrically insulative compliant layer 2552 (FIGS. 9J-9Q), covers the packaging layer 2576 and extends along inclined surfaces of notch 2575, but does not cover the bond pads 2579.

Patterned metal connections 2583, corresponding to metal connections 2562 (FIGS. 9L-9Q) extend from bond pads 2579 along the inclined surfaces of notch 2575 and over generally planar surfaces of compliant layer 2582 to solder bump locations 2584, corresponding to solder bump locations 2566 (FIGS. 9O-9Q). An encapsulant passivation layer 2585, corresponding to encapsulant passivation layer 2564 (FIGS. 9N-9Q), is formed over compliant layer 2582 and metal connections 2583 other than at locations 2584. Solder bumps 2586, corresponding to solder bumps 2570 (FIGS. 9P and 9Q), are formed onto metal connections 2583 at locations 2584.

At a second surface of silicon layer 2577, facing oppositely from the first surface, a packaging layer 2586, corresponding to packaging layer 2500 (FIGS. 9A-9Q) is bonded by an adhesive layer 2590, corresponding to adhesive 2502 (FIGS. 9A-9Q).

A plurality of bond pad specific notches 2591, corresponding to notches 2520 (FIGS. 9B-9Q), are shown, extending through packaging layer 2586, adhesive layer 2590 and silicon layer 2577.

The notches 2591 each expose one of bond pads 2579. An electrophoretic, electrically insulative compliant layer 2592, corresponding to electrophoretic, electrically insulative compliant layer 2522 (FIGS. 9C-9Q), covers the packaging layer 2586 and extends along inclined surfaces of notches 2591, but does not cover the bond pads 2579 which are exposed by notches 2591.

Patterned metal connections 2593, corresponding to metal connections 2532 (FIGS. 9D-9Q) extend from bond pads 2579 along the inclined surfaces of notches 2591 and over generally planar surfaces of compliant layer 2592 to solder bump locations 2594, corresponding to solder bump locations 2536 (FIGS. 9G-9Q). An encapsulant passivation layer 2595, corresponding to encapsulant passivation layer 2534 (FIGS. 9F-9Q), is formed over compliant layer 2592 and metal connections 2593 other than at locations 2594. Solder bumps 2596, corresponding to solder bumps 2540 (FIGS. 9H-9Q), are formed onto metal connections 2593 at locations 2594.

Reference is now made to FIGS. 10A-10I which illustrate additional alternative methodologies which may be used for some or all of the bond pads 108 (FIG. 1A). These methodologies are particularly useful for devices, such as DRAMs, having a high density of bond pads 108.

Figures 10A, 10B, 10C:
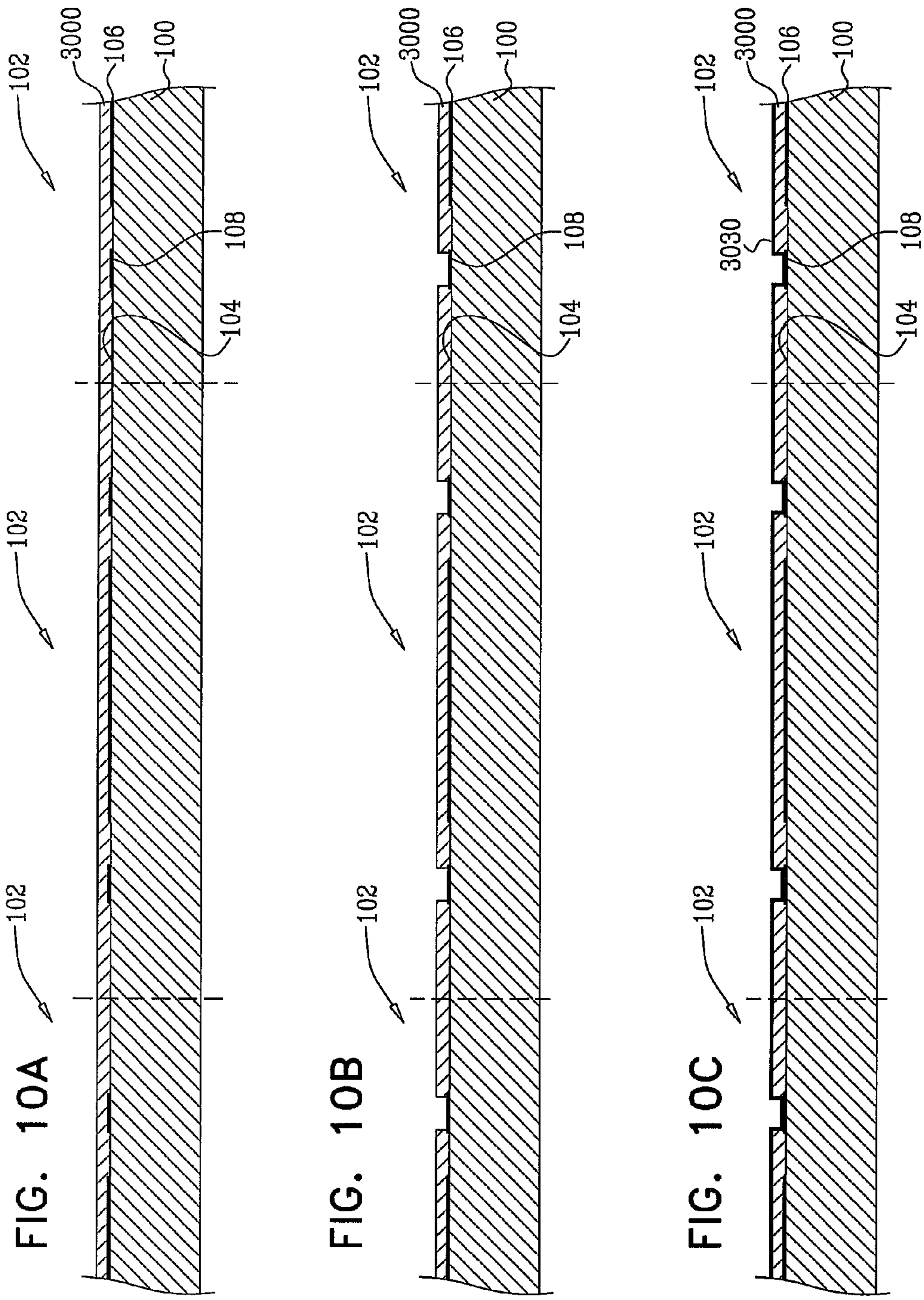
FIGS. 10A-10N are simplified sectional illustrations of still another method for manufacturing packaged semiconductor chips in accordance with another preferred embodiment of the present invention.

FIG. 10A shows the formation of an encapsulant passivation layer 3000 over surface 104 of the structure of FIG. 1A.

FIG. 10B shows patterning of the encapsulant passivation layer 3000, preferably by photolithography, to expose bond pads 108. FIG. 10C illustrates the formation of a metal layer 3030, by sputtering chrome, aluminum or copper over the encapsulant passivation layer 3000.

Figure 10D:
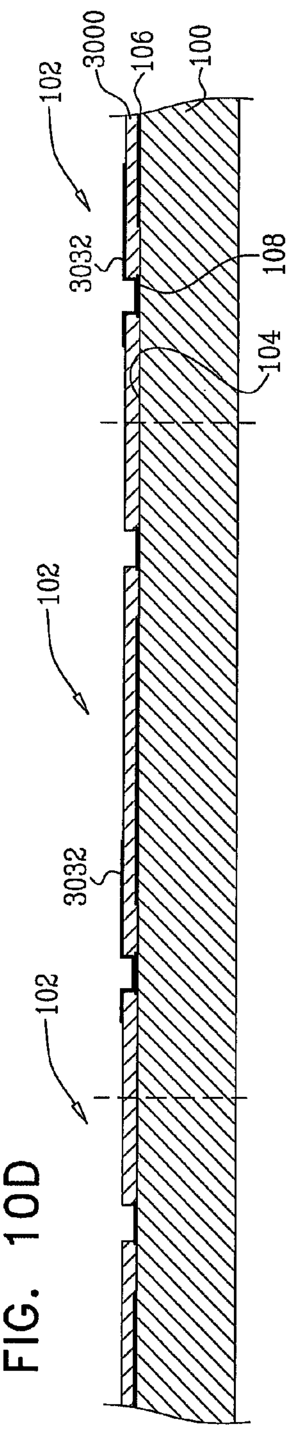
FIG. 10O is a simplified pictorial illustration of part of a packaged semiconductor chip manufactured in accordance with the method of FIGS. 10A-10N.

As shown in FIG. 10D, metal connections 3032 are preferably formed by patterning the metal layer 3030, to extend from some of the bond pads 108 and over generally planar encapsulant passivation layer 3000. Metal connections 3032 preferably are formed by 3D photolithography employing a suitable photoresist, preferably Eagle 2100, commercially available from Rohm and Haas Shipley Division of Marlborough, Mass., U.S.A. Optionally, the metal connections 3032 may be plated with nickel, as by electroless techniques, in order to provide enhanced corrosion resistance.

Figure 10E:
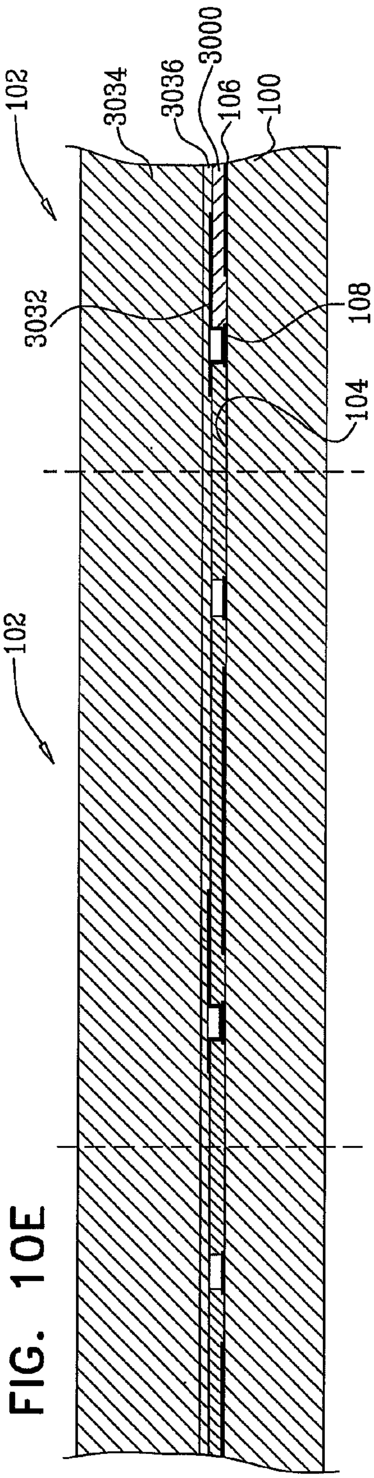

FIG. 10E shows a wafer-scale packaging layer 3034 attached to encapsulant passivation layer 3000 by an adhesive 3036 such as epoxy.

Figure 10F:
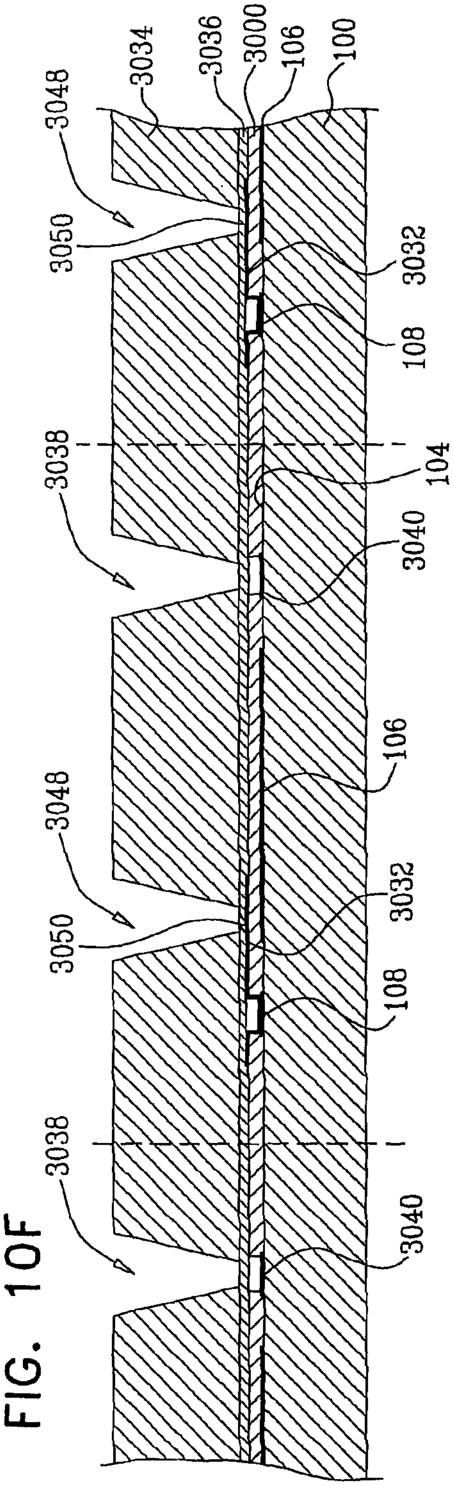

FIG. 10F shows notches 3038, preferably formed by photolithography employing plasma etching or wet etching techniques, at locations which overlie some of bond pads 108, here designated by reference numeral 3040. FIG. 10F also shows notches 3048, preferably formed by photolithography employing plasma etching or wet etching techniques, at locations which overlie corresponding portions of metal connections 3032 at locations designated by reference numeral 3050. The notches 3038 and 3048 preferably do not extend through adhesive 3036.

Figure 10G:
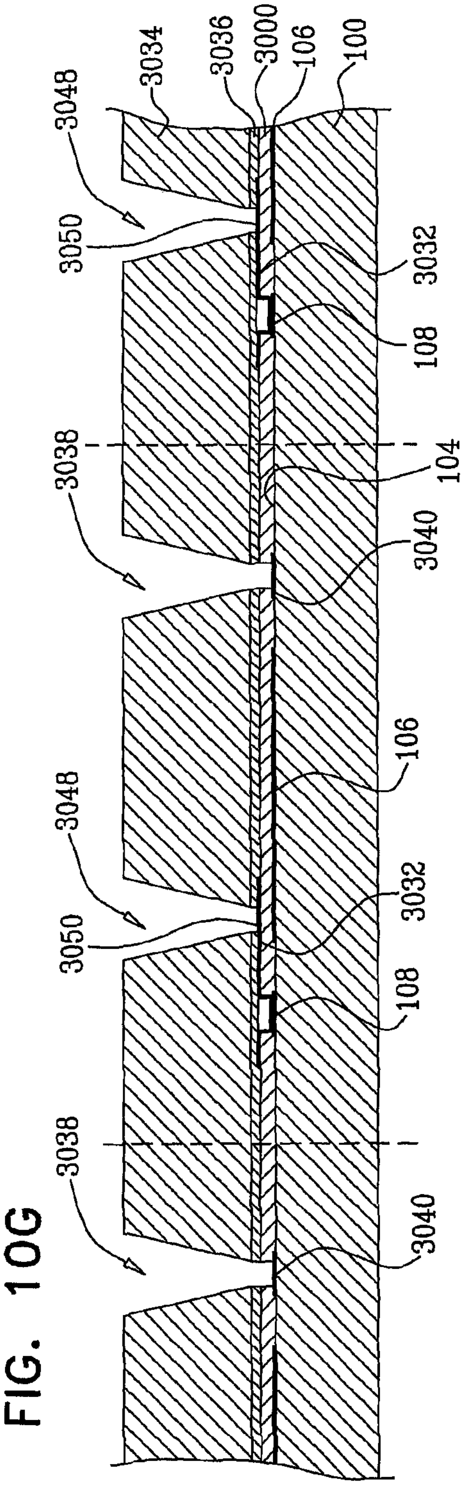

Turning to FIG. 10G, it is seen that the adhesive 3036, overlying bond pads 3040 and locations 3050 of metal connections 3032, is removed, preferably by dry etching.

Figure 10H:
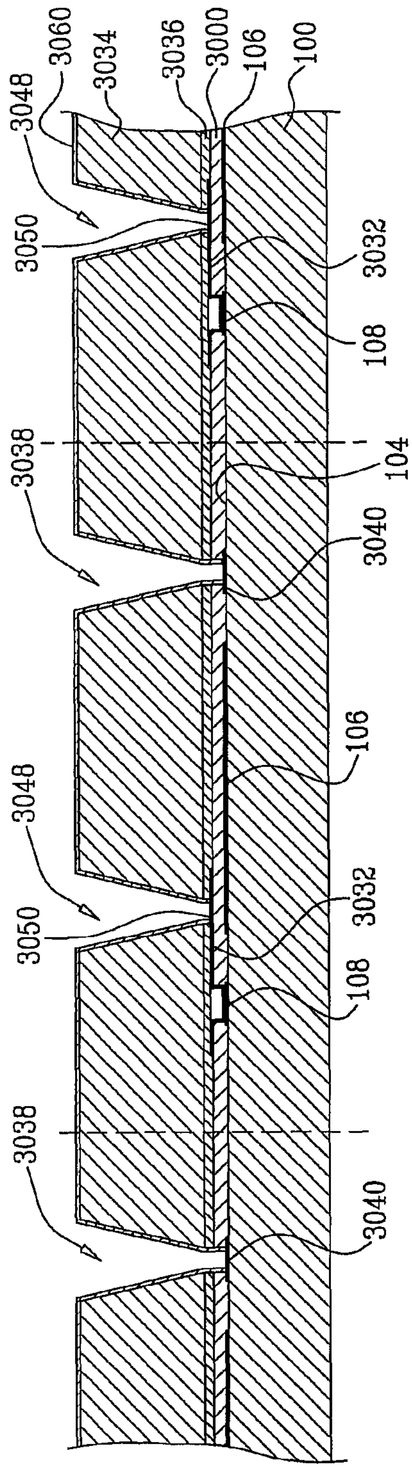

FIG. 10H shows the formation of an electrophoretic, electrically insulative compliant layer 3060 over the packaging layer 3034. Examples of suitable materials for compliant layer 3060 are those described hereinabove with reference to FIG. 1F. Once cured, compliant layer 3060 encapsulates all exposed surfaces of the packaging layer 3034. Compliant layer 3060 preferably provides protection to the device from alpha particles emitted by BGA solder balls.

Figure 10I:
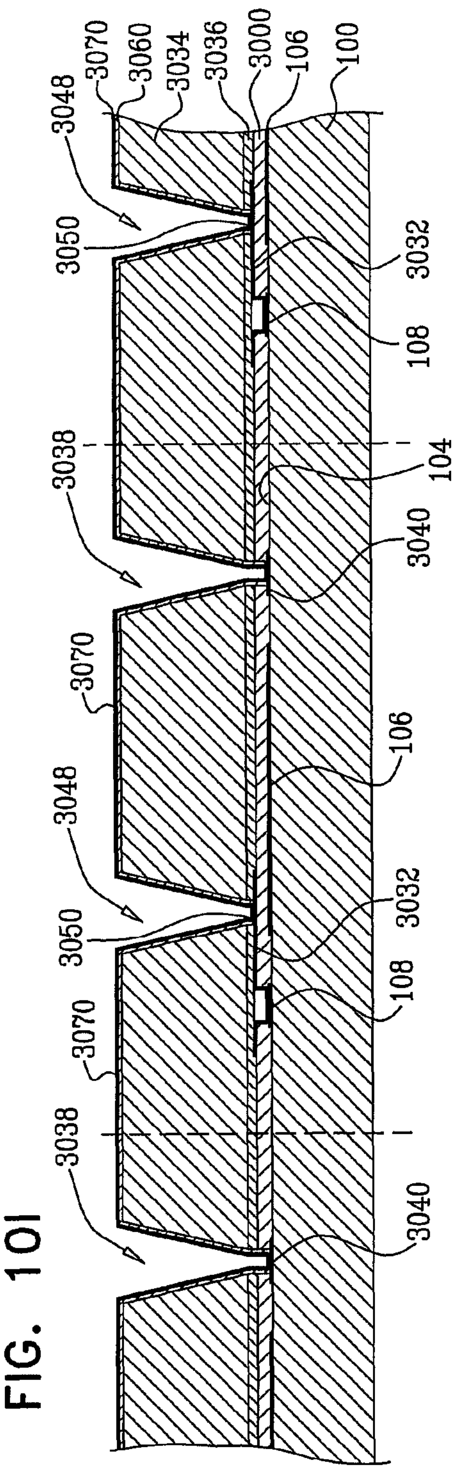

FIG. 10I illustrates the formation of a second metal layer 3070 by sputtering chrome, aluminum or copper. Metal layer 3070 extends from the metal connections 3032 and the bond pads 3040 over the compliant layer 3060.

Figure 10J:
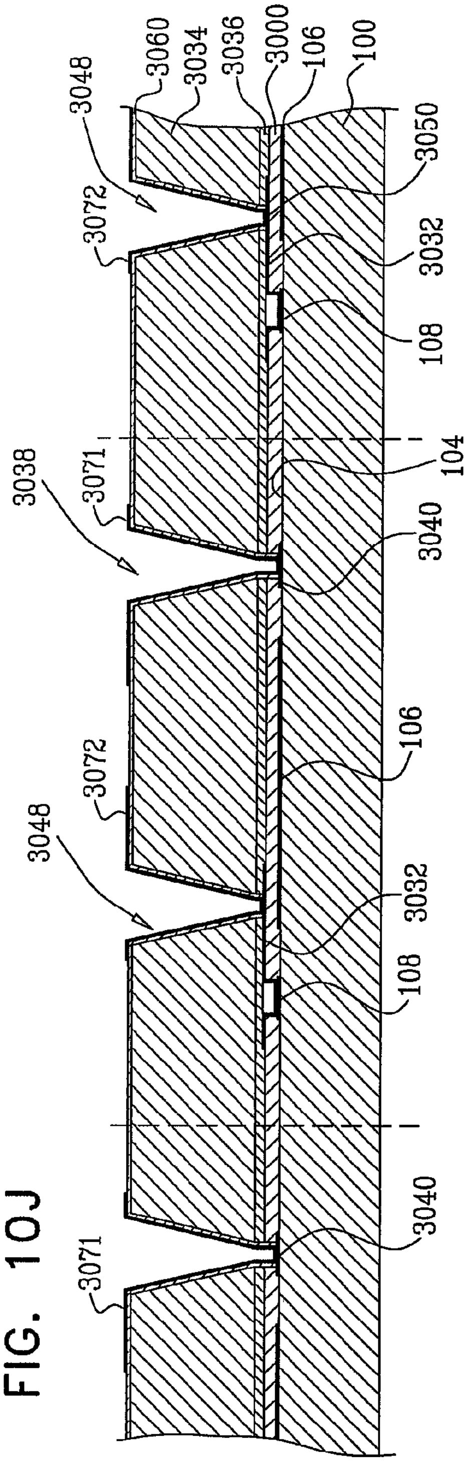

As shown in FIG. 10J, metal connections 3071 and 3072 are preferably formed by patterning metal layer 3070, preferably by 3D photolithography employing a suitable photoresist, preferably Eagle 2100, commercially available from Rohm and Haas Shipley Division of Marlborough, Mass., U.S.A. Optionally, the metal connections 3071 and 3072 may be plated with nickel, as by electroless techniques, in order to provide enhanced corrosion resistance. It is noted that metal connections 3071 extend from bond pads 3040 and metal connections 3072 extend from metal connections 3032 at locations 3050.

Figure 10K:
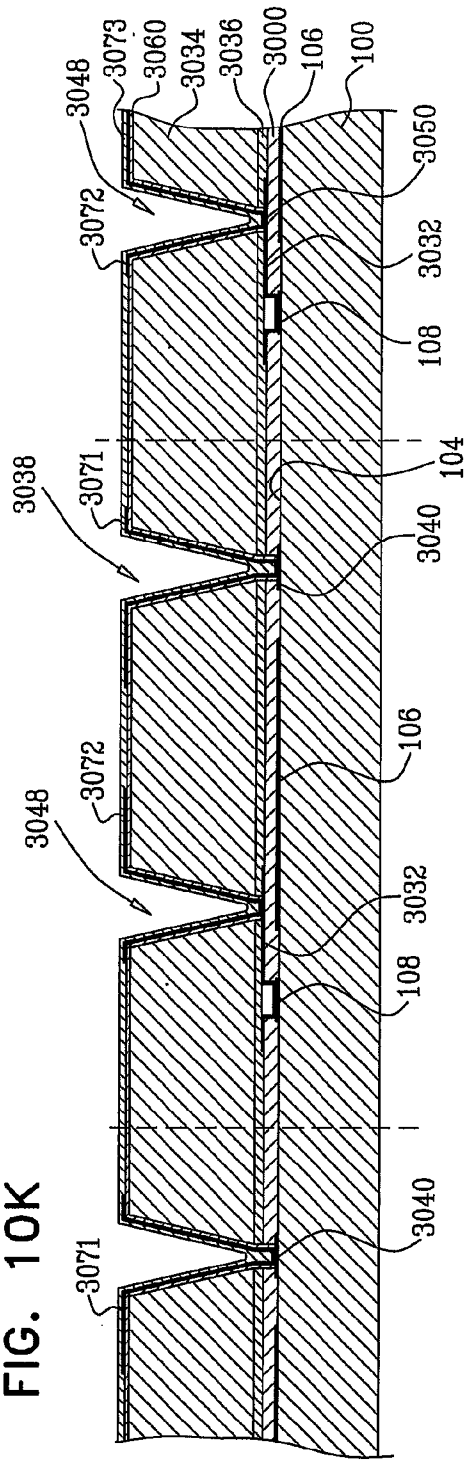
Figure 10L:
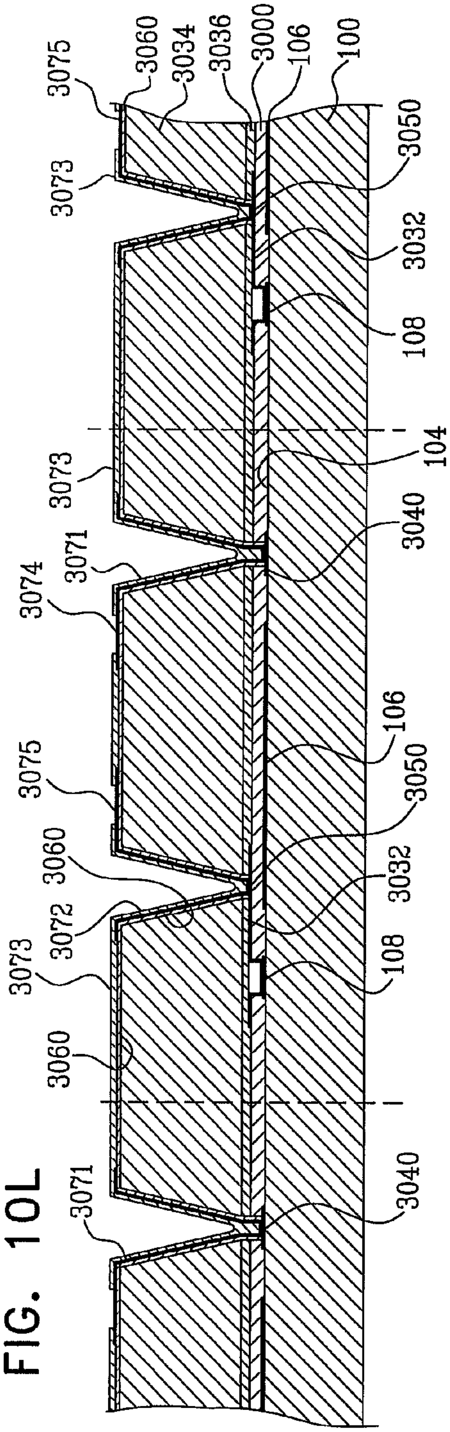

FIG. 10K shows the application, preferably by spray coating, of an additional, electrically insulative, encapsulant passivation layer 3073 over the metal connections 3071 and 3072 and over the compliant layer 3060. Preferably, the encapsulant passivation layer 3073 comprises solder mask. FIG. 10L shows patterning of the encapsulant passivation layer 3073, preferably by photolithography, to define solder bump locations 3074 and 3075 on metal connections 3071 and 3072, respectively.

As seen in FIG. 10L, the semiconductor wafer 100 is thinned, as by machining its non-active surface 114. Preferably, the thickness of the semiconductor wafer 100 at this stage, following thinning thereof, is 300 microns. It is appreciated that the semiconductor wafer 100 may be thinned at any stage prior to the formation of solder bumps on dies 102.

Figure 10M:
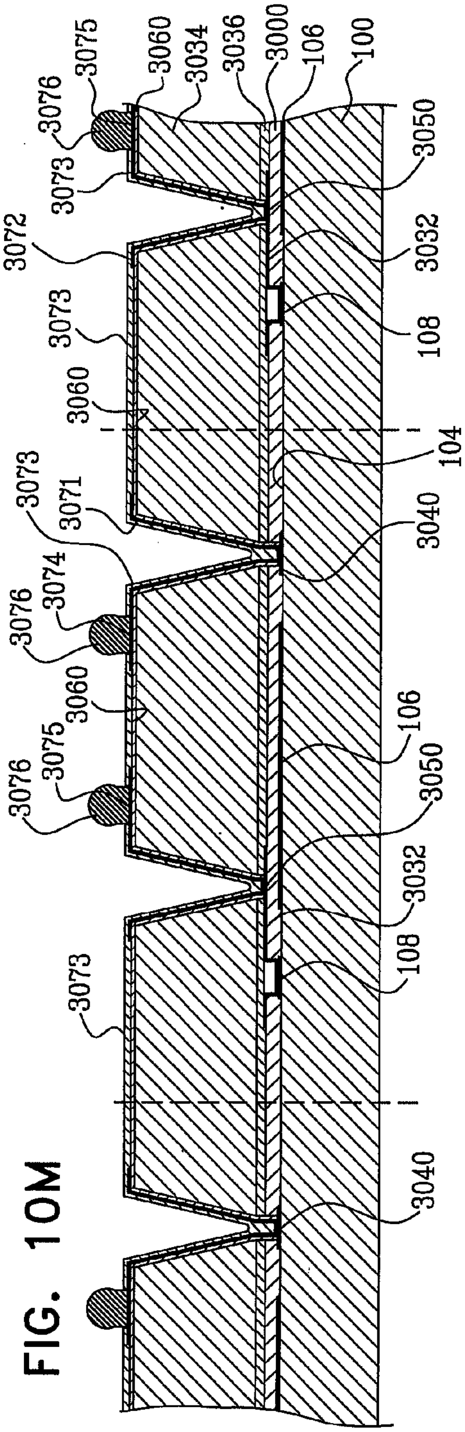

FIG. 10M illustrates the formation of solder bumps 3076 at respective locations 3074 and 3075 on the metal connections 3071 and 3072, at which the encapsulant passivation layer 3073 is not present.

Figure 10N:
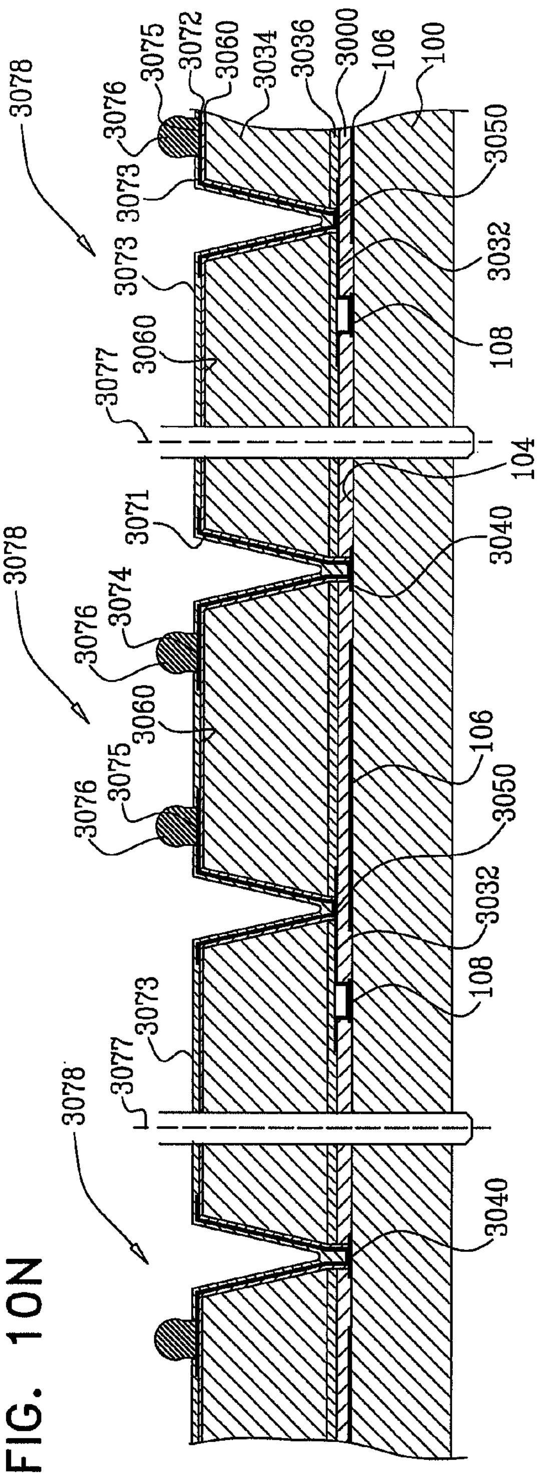
Figure 100:
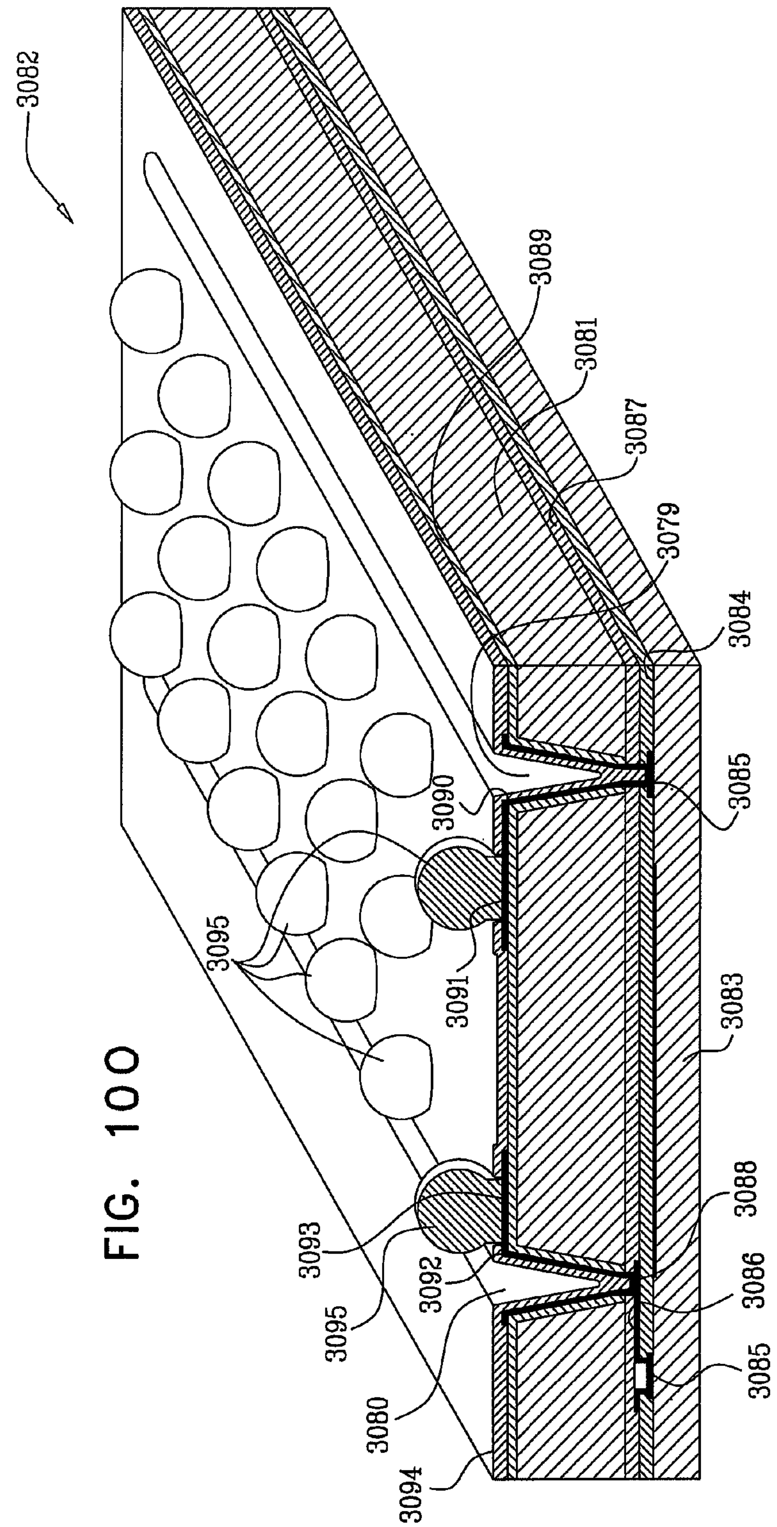

FIG. 10N shows dicing of the wafer and packaging layer of FIG. 10M along scribe lines 3077 to produce a multiplicity of individually packaged dies 3078.

Reference is now made to FIG. 10O, which is a simplified pictorial illustration of part of a packaged semiconductor chip manufactured in accordance with the method of FIGS. 10A-10N. As seen in FIG. 10O, notches 3079 and 3080, respectively corresponding to notches 3038 and 3048 (FIGS. 10F-10N), are formed in a packaging layer 3081, corresponding to packaging layer 3034 (FIGS. 10E-10N), of silicon wafer die 3082, corresponding to die 3078 (FIG. 10N).

A silicon layer 3083, corresponding to semiconductor wafer 100 (FIGS. 10A-10N) is covered by an encapsulant passivation layer 3084, corresponding to encapsulant passivation layer 3000 (FIGS. 10A-10N), other than over some of bond pads 3085, which correspond to bond pads 3040 (FIGS. 10A-10N). Patterned metal connections 3086, corresponding to metal connections 3032 (FIGS. 10D-10N), extend from some of bond pads 3085 over generally planar surfaces of encapsulant passivation layer 3084.

Packaging layer 3081 is bonded over encapsulant passivation layer 3084 and metal connections 3086 by an adhesive layer 3087, corresponding to adhesive 3036 (FIGS. 10E-10N).

Notch 3080 extends through packaging layer 3081 and adhesive layer 3087 to corresponding portions of metal connections 3086 at locations designated by reference numeral 3088, which correspond to locations 3050 (FIGS. 10F-10N).

Notch 3079 extends through packaging layer 3081, adhesive layer 3087 and encapsulant passivation layer 3084 to those of bond pads 3085 which are not connected to metal connections 3086.

An electrophoretic, electrically insulative compliant layer 3089, corresponding to electrophoretic, electrically insulative compliant layer 3060 (FIGS. 10G-10N), covers the packaging layer 3081 and extends along inclined surfaces of notches 3079 and 3080, but does not cover the bond pads 3085.

Patterned metal connections 3090, corresponding to metal connections 3071 (FIGS. 10J-10N), extend from bond pads 3085 which are not connected to metal connections 3086, along the inclined surfaces of notch 3079 and over generally planar surfaces of compliant layer 3089 to solder bump locations 3091, corresponding to solder bump locations 3074 (FIGS. 10L-10N).

Patterned metal connections 3092, corresponding to metal connections 3072 (FIGS. 10J-10N), extend from portions of metal connections 3085 at locations 3088, along the inclined surfaces of notch 3080 and over generally planar surfaces of compliant layer 3089 to solder bump locations 3093, corresponding to solder bump locations 3075 (FIGS. 10L-10N).

An encapsulant passivation layer 3094, corresponding to encapsulant passivation layer 3073 (FIGS. 10K-10N), is formed over compliant layer 3089 and metal connections 3090 and 3092 other than at locations 3091 and 3093. Solder bumps 3095, corresponding to solder bumps 3076 (FIGS. 10M and 10N), are formed onto respective metal connections 3090 and 3092 at respective locations 3091 and 3093.

Reference is now made to FIGS. 11A-11J, which are simplified sectional illustrations of a method for manufacturing packaged stacked semiconductor chips in accordance with a further preferred embodiment of the present invention.

The method of FIGS. 11A-11J employs the steps described hereinabove with reference to FIGS. 10A-10D, which are followed by the steps shown in FIGS. 11A-11J.

Figure 11A:
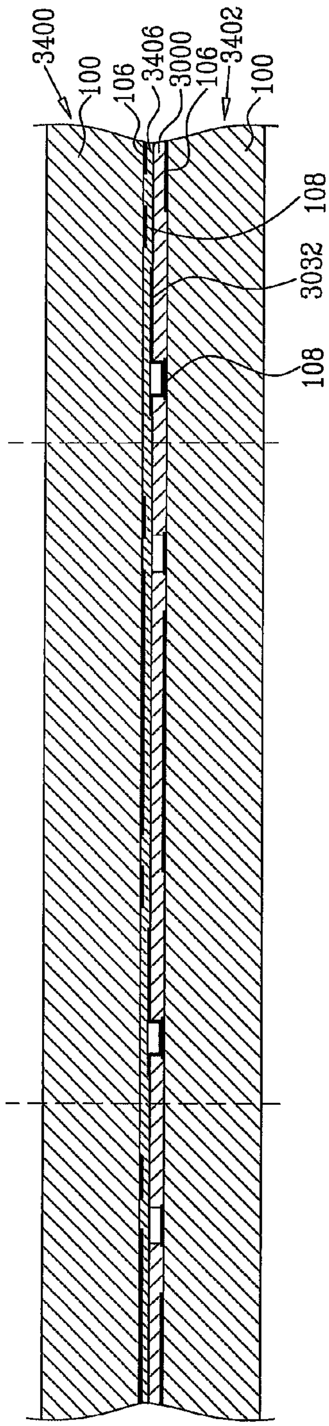
FIGS. 11A-11J are simplified sectional illustrations of a method for manufacturing packaged stacked semiconductor chips in accordance with a further preferred embodiment of the present invention.

Reference is now made to FIG. 11A, which shows face-to-face bonding of the structure of FIG. 1A, turned upside-down, here designated by reference numeral 3400, to the structure of FIG. 10D, here designated by reference numeral 3402, preferably by means of an adhesive 3406 such as epoxy. It is appreciated that the pitch of bond pads on structures 3400 and 3402 is typically different, as shown, and that the bond pads of structures 3400 and 3402 are typically not in registration.

Figure 11B:
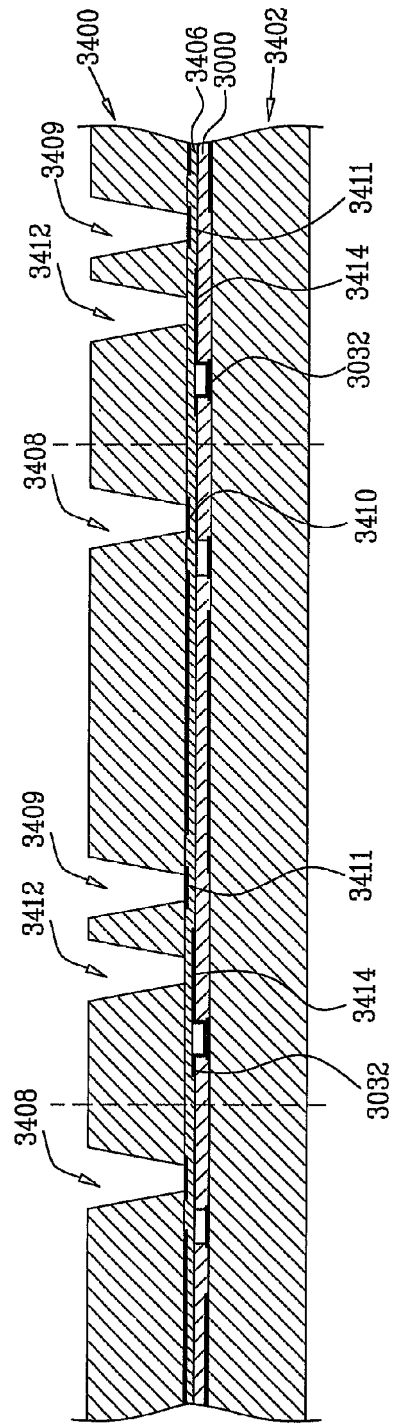

FIG. 11B shows the formation of notches 3408 and 3409, preferably by photolithography employing plasma etching or wet etching techniques, at locations which overlie respective bond pads 3410 and 3411. FIG. 11B also shows notches 3412, preferably formed by photolithography employing plasma etching or wet etching techniques, at locations which overlie corresponding portions of metal connections 3032 at locations designated by reference numeral 3414. The notches 3412 preferably do not extend through adhesive 3406.

Figure 11C:
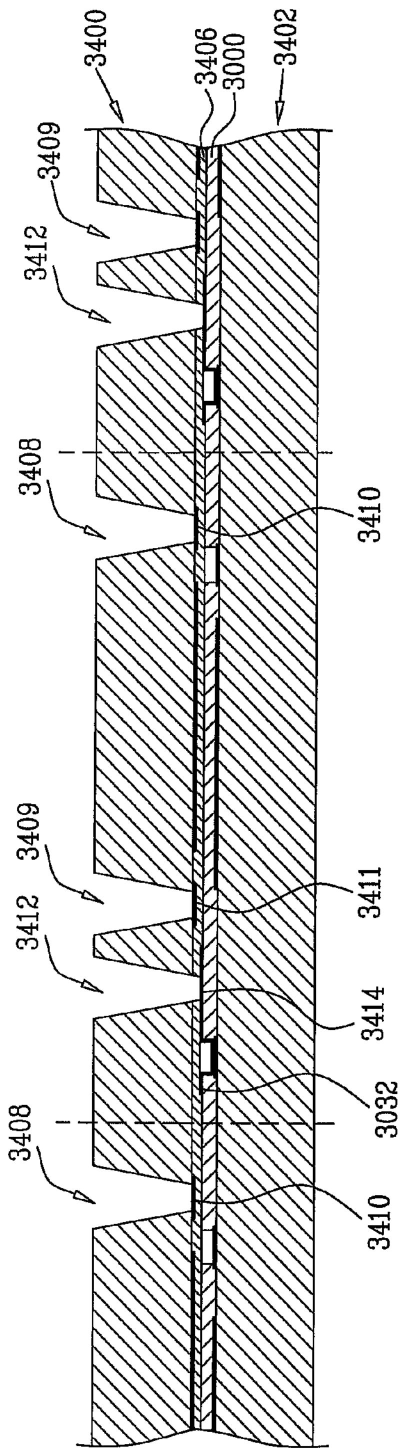

Turning to FIG. 11C, it is seen that the adhesive 3406, overlying metal connections 3032 at locations 3414, is removed, preferably by dry etching.

Figure 11D:
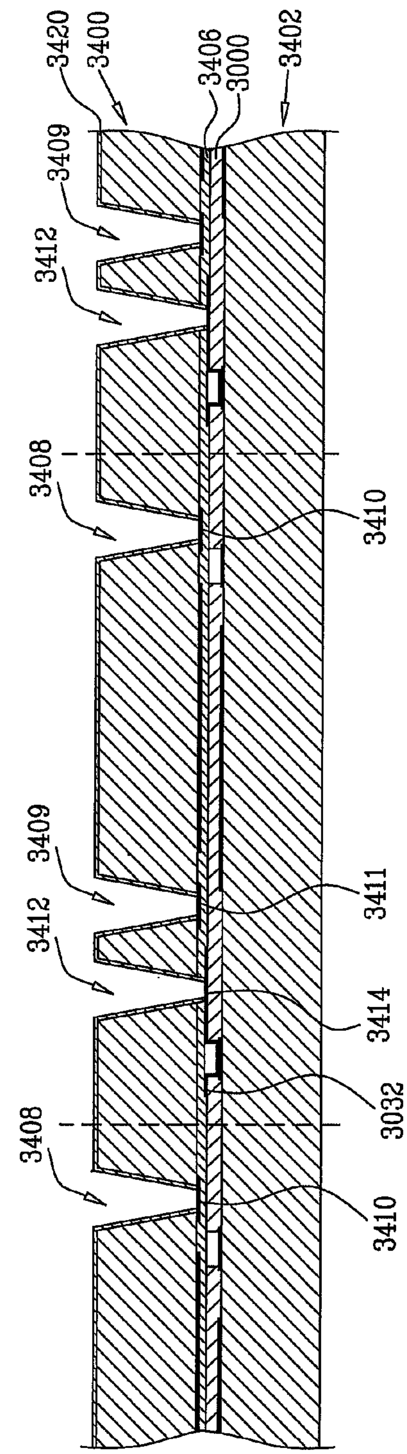

FIG. 11D shows the formation of an electrophoretic, electrically insulative compliant layer 3420 over exposed silicon surfaces of semiconductor wafer 100 of structure 3400. Examples of suitable materials for compliant layer 3420 are those described hereinabove with reference to FIG. 1F. Once cured, compliant layer 3420 encapsulates all exposed surfaces of the semiconductor wafer 100 of structure 3400. Compliant layer 3420 preferably provides protection to the device from alpha particles emitted by BGA solder balls.

Figure 11E:
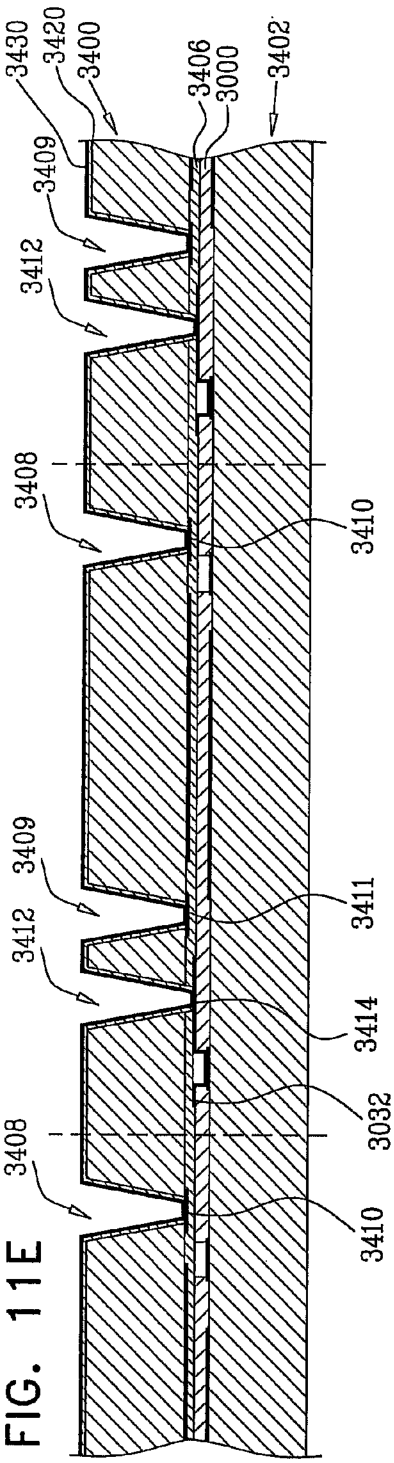

FIG. 11E illustrates the formation of a metal layer 3430 by sputtering chrome, aluminum or copper. Metal layer 3430 extends from the metal connections 3032 at locations 3414 and from bond pads 3410 and 3411 over the compliant layer 3420.

Figure 11F:
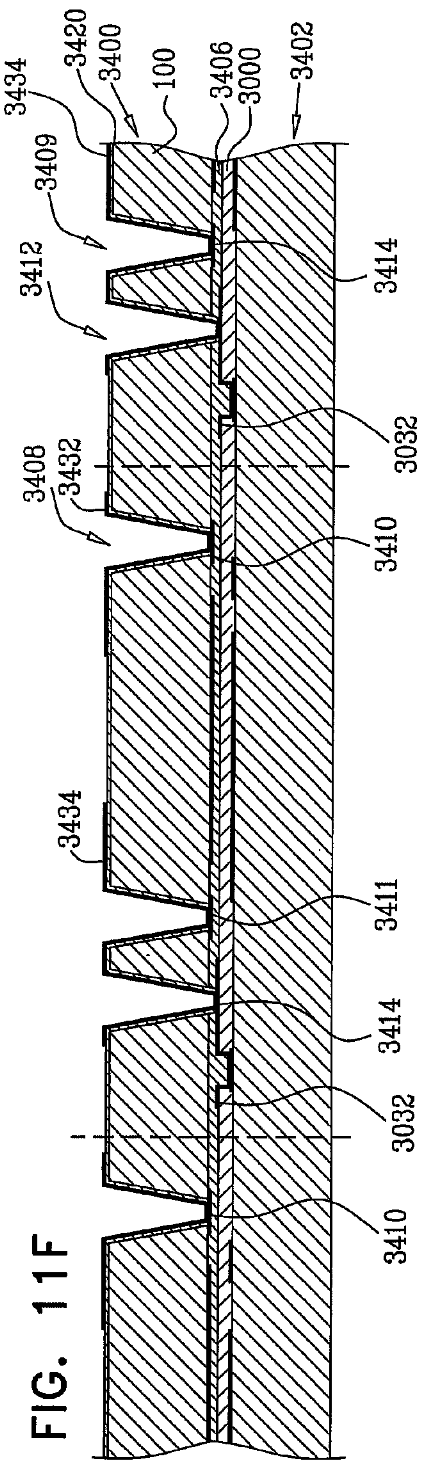

As shown in FIG. 11F, metal connections 3432 and 3434 are preferably formed by patterning metal layer 3430, preferably by 3D photolithography employing a suitable photoresist, preferably Eagle 2100, commercially available from Rohm and Haas Shipley Division of Marlborough, Mass., U.S.A. Optionally, the metal connections 3432 and 3434 may be plated with nickel, as by electroless techniques, in order to provide enhanced corrosion resistance. It is noted that metal connections 3432 extend from bond pads 3410 and metal connections 3434 interconnect metal connections 3032 at locations 3414 with bond pads 3411.

Figure 11G:
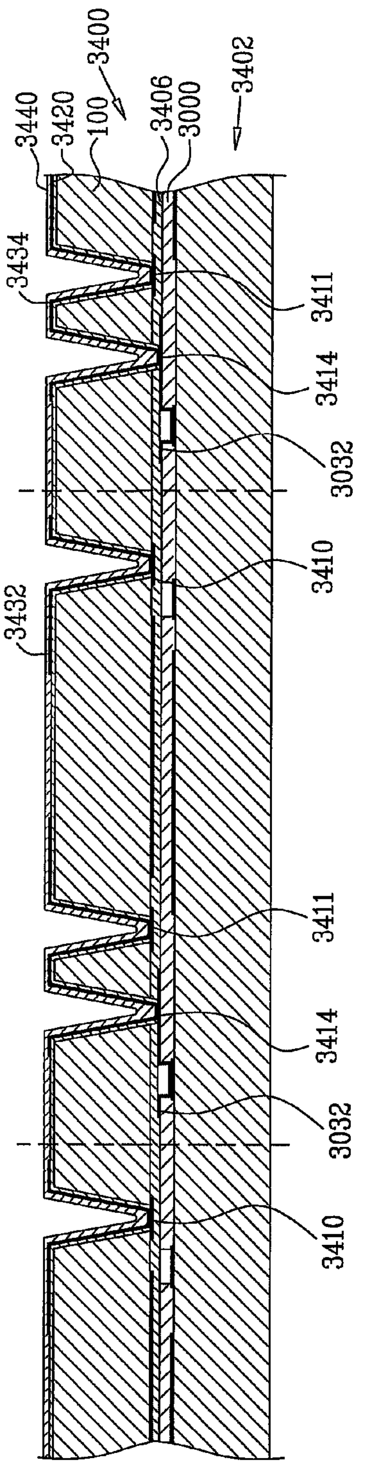
Figure 11H:
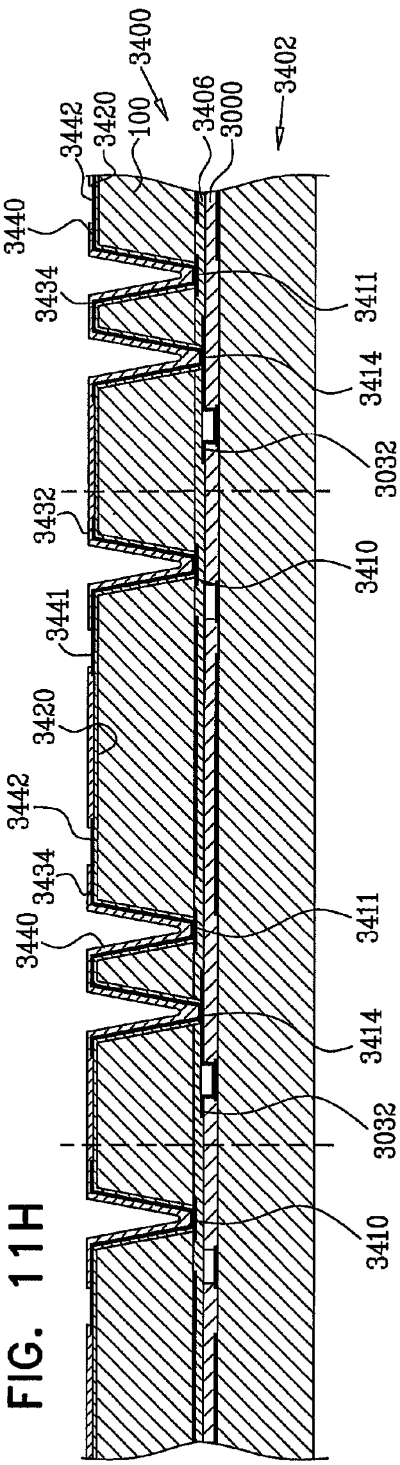

FIG. 11G shows the application, preferably by spray coating, of an electrically insulative, encapsulant passivation layer 3440 over the metal connections 3432 and 3434 and over the compliant layer 3420. Preferably, the encapsulant forming the encapsulant passivation layer 3440 comprises solder mask. FIG. 11H shows patterning of the encapsulant passivation layer 3440, preferably by photolithography, to define solder bump locations 3441 and 3442.

As seen in FIG. 11H, the semiconductor wafer 100 of structure 3402 is thinned, as by machining its non-active surface 114. Preferably, the thickness of the semiconductor wafer 100 at this stage, following thinning thereof, is 300 microns. It is appreciated that the semiconductor wafer 100 of structure 3402 may be thinned at any stage prior to the formation of solder bumps on structure 3400.

Figure 11I:
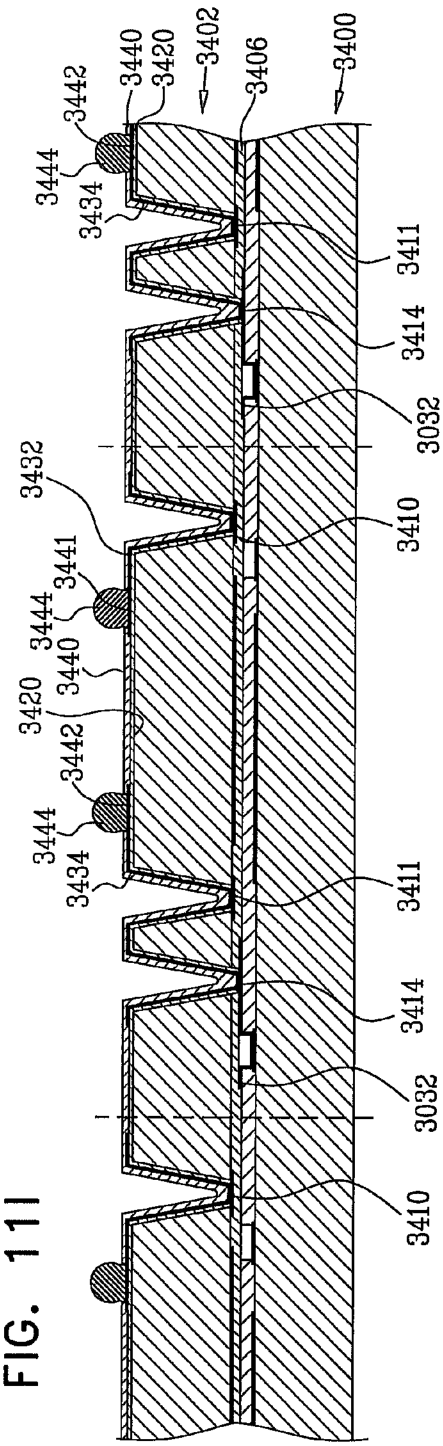

FIG. 11I illustrates the formation of solder bumps 3444 at respective locations 3441 and 3442 on the metal connections 3432 and 3434, at which the encapsulant passivation layer 3440 is not present.

Figure 11J:
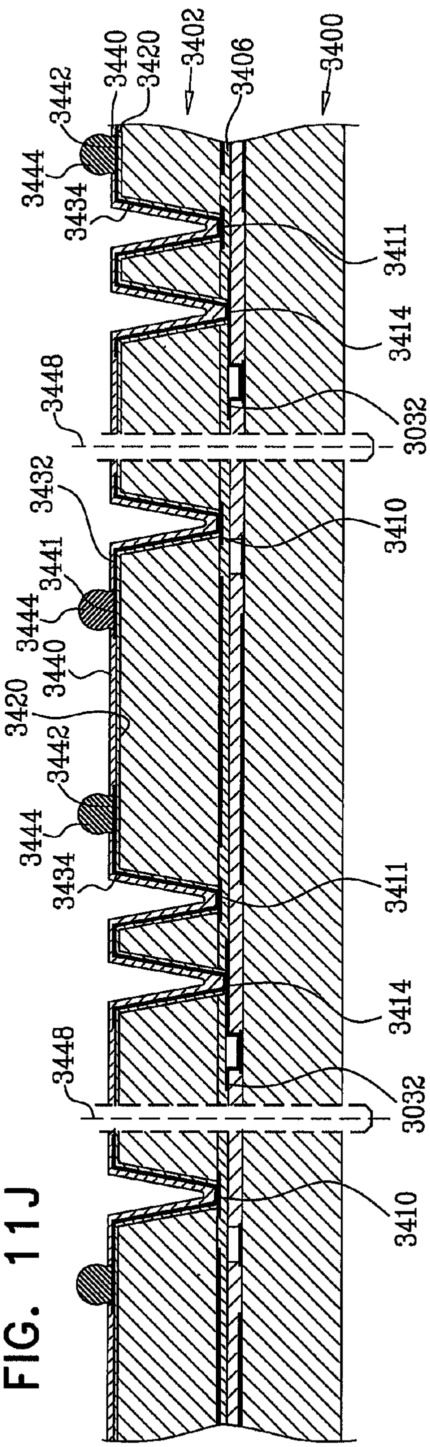

FIG. 11J shows dicing of the wafer and packaging layer of FIG. 11I along scribe lines 3448 to produce a multiplicity of individually packaged dies 3450.

Figure 11K:
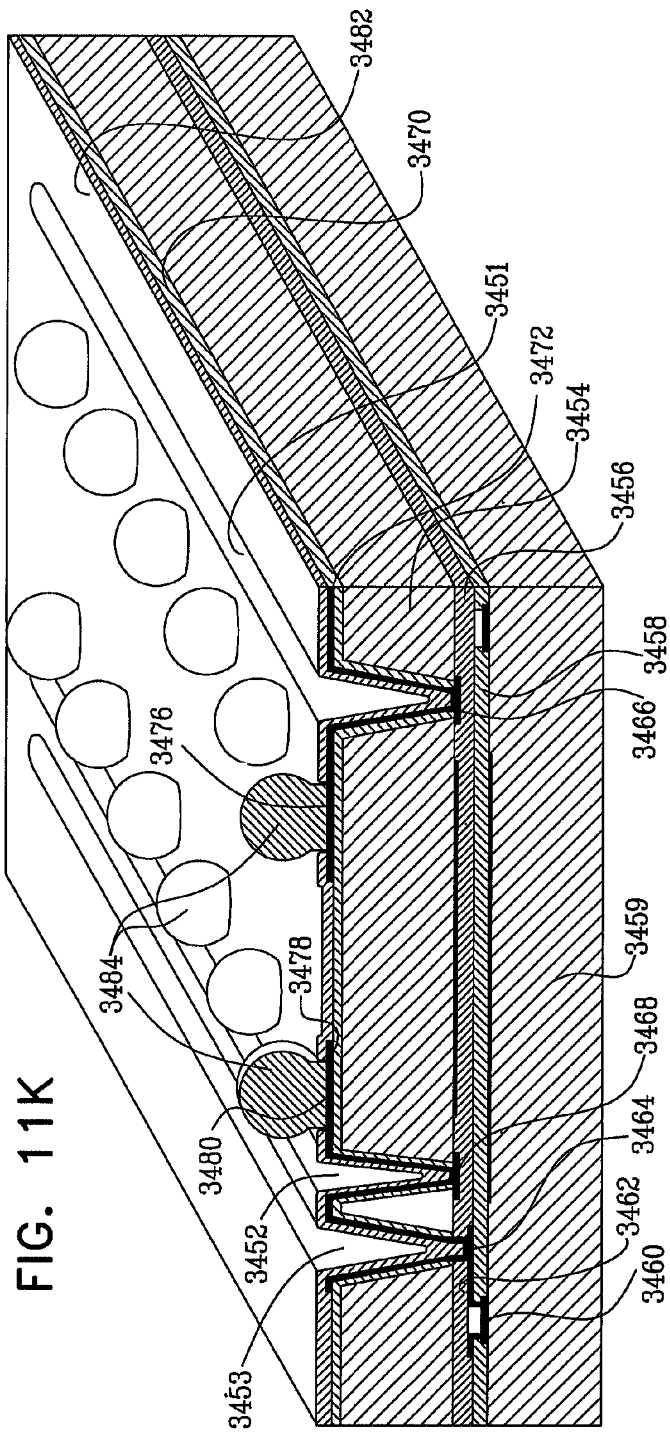
FIG. 11K is a simplified pictorial illustration of part of a packaged stacked semiconductor chip manufactured in accordance with the method of FIGS. 11A-11J.

Reference is now made to FIG. 11K, which is a simplified pictorial illustration of part of a packaged semiconductor chip manufactured in accordance with the method of FIGS. 11A-11J. As seen in FIG. 11K, notches 3451, 3452 and 3453, respectively corresponding to notches 3408, 3409 and 3412 (FIGS. 11B-11J), are formed in a portion of a semiconductor wafer 3454, corresponding to a portion of semiconductor wafer 100 (FIGS. 11A-11J), which forms part of structure 3455, corresponding to structure 3400 (FIGS. 11A-11J).

An adhesive layer 3456, corresponding to adhesive 3406 (FIGS. 11A-11J) joins an active surface of structure 3455 to a passivation layer 3458, corresponding to layer 3000 (FIGS. 10A-10D). Passivation layer 3458 covers an active surface of a portion of a semiconductor wafer 3459, corresponding to a portion of a semiconductor wafer which forms part of structure 3402 (FIGS. 11A-11J) other than over bond pads 3460, which correspond to bond pads 3033 (FIG. 10D). Patterned metal connections 3462, corresponding to metal connections 3032 (FIGS. 10D-10N), extend from bond pads 3460 over generally planar surfaces of passivation layer 3458 and underlying adhesive layer 3456.

Notch 3453 extends through the portion of semiconductor wafer 3454 and adhesive layer 3456 to portions of metal connections 3462 at locations designated by reference numeral 3464, which correspond to locations 3414 (FIGS. 11B-11J).

Notch 3451 extends through the portion of semiconductor wafer 3454 to bond pad 3466, corresponding to bond pad 3410 (FIGS. 11A-11J).

Notch 3452 extends through the portion of semiconductor wafer 3454 to bond pad 3468, corresponding to bond pad 3411 (FIGS. 11A-11J).

An electrophoretic, electrically insulative compliant layer 3470, corresponding to electrophoretic, electrically insulative compliant layer 3420 (FIGS. 11C-11J), covers the exposed surfaces of the portion of semiconductor wafer 3454.

Metal connections 3472, corresponding to metal connections 3432 (FIGS. 11F-11J), extend from bond pads 3466 over generally planar surfaces of coating 3470 to solder bump locations 3476, corresponding to solder bump locations 3441 (FIGS. 11I and 11J).

Metal connections 3478 interconnect metal connections 3462 at locations 3464 with bond pads 3468 and extend over generally planar surfaces of coating 3470 to solder bump locations 3480, corresponding to solder bump locations 3442 (FIGS. 11I and 11J).

A passivation layer 3482, corresponding to encapsulant layer 3440 (FIGS. 11G-11J) is formed over coating 3470 and metal connections 3472 and 3478 other than at locations 3476 and 3480. Solder bumps 3484, corresponding to solder bumps 3444 (FIGS. 11I and 11J), are formed onto respective metal connections 3472 and 3478 at respective locations 3476 and 3480.

Figure 12:
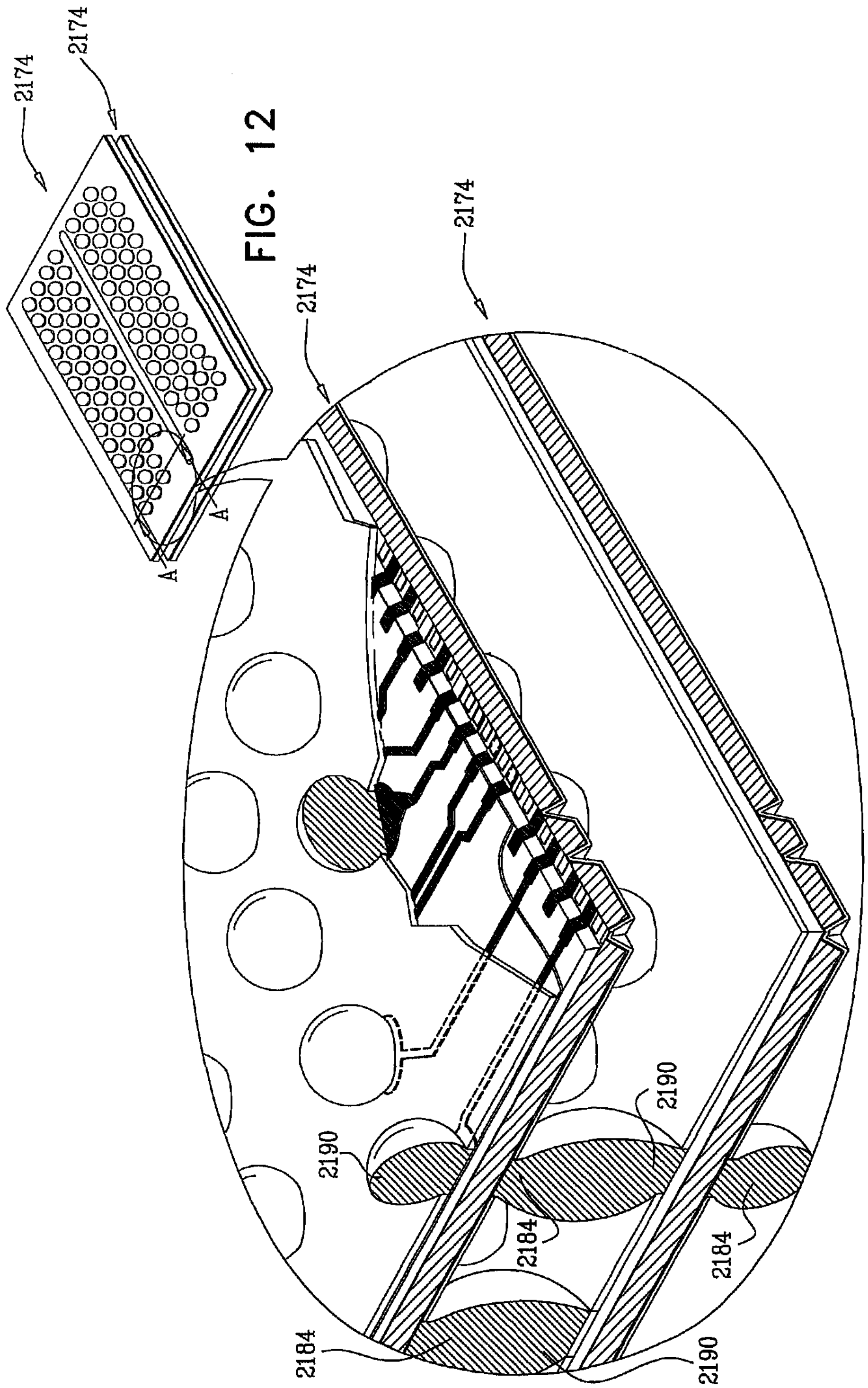
FIG. 12 is a simplified pictorial illustration of a packaged stacked semiconductor chip including semiconductor chips manufactured in accordance with the method of FIGS. 8A-8P.

Reference is now made to FIG. 12, which illustrates a stacked structure formed of two devices of the type shown in FIG. 8Q, which correspond to individually packaged stackable dies 2174, preferably manufactured in accordance with the description hereinabove referencing FIGS. 8A-8P. It is seen that the solder bumps 2184 (FIG. 8Q) of an upper one of the devices are soldered together to corresponding solder bumps 2190 (FIG. 8Q) of a lower one of the devices.

Figure 13:
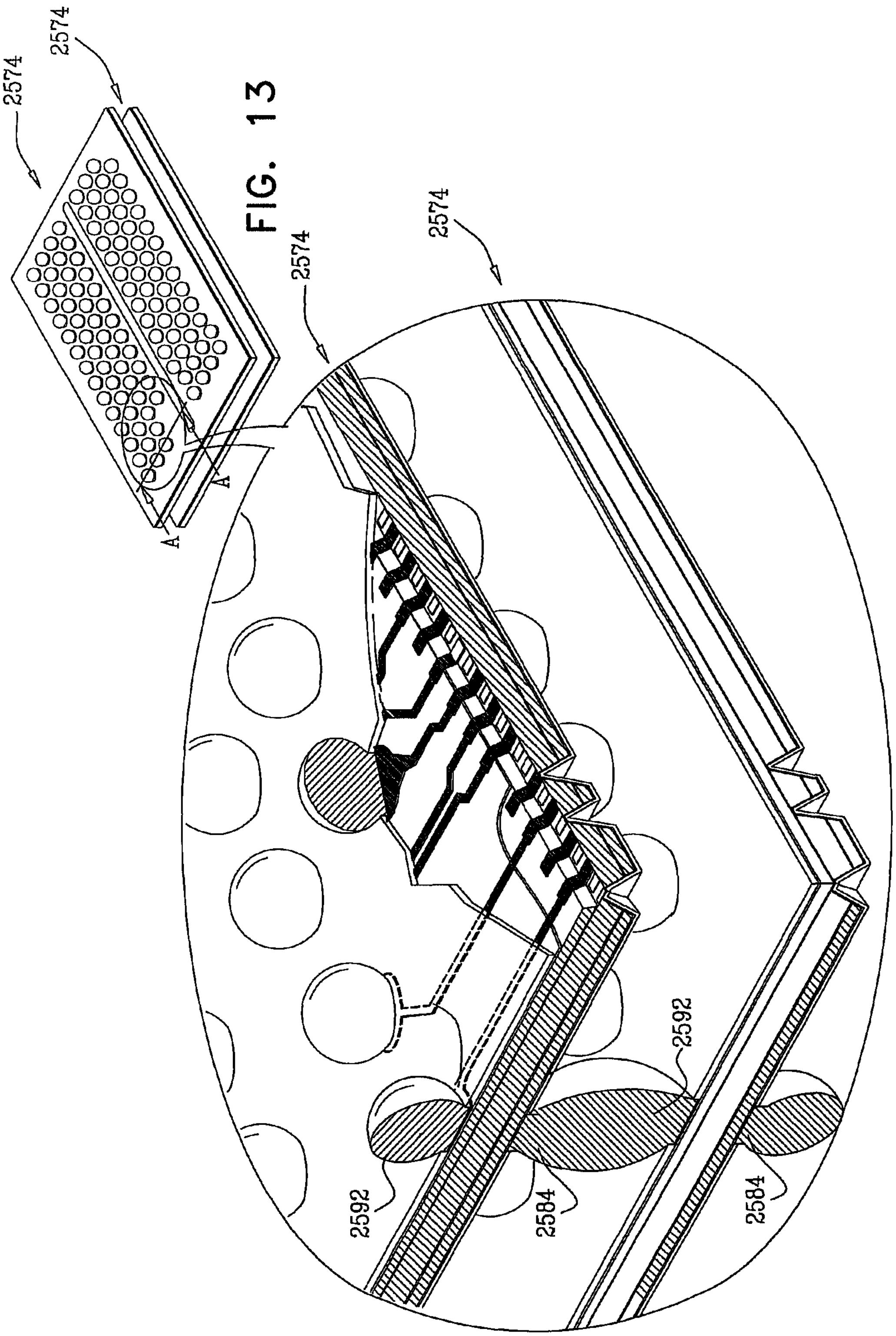
FIG. 13 is a simplified pictorial illustration of a packaged stacked semiconductor chip including semiconductor chips manufactured in accordance with the method of FIGS. 9A-9Q.

Reference is now made to FIG. 13, which illustrates a stacked structure formed of two devices of the type shown in FIG. 9R, which correspond to individually packaged stackable dies 2574, preferably manufactured in accordance with the description hereinabove referencing FIGS. 9A-9Q. It is seen that the solder bumps 2584 (FIG. 9R) of an upper one of the devices are soldered together to corresponding solder bumps 2592 (FIG. 9R) of a lower one of the devices.

Figure 14:
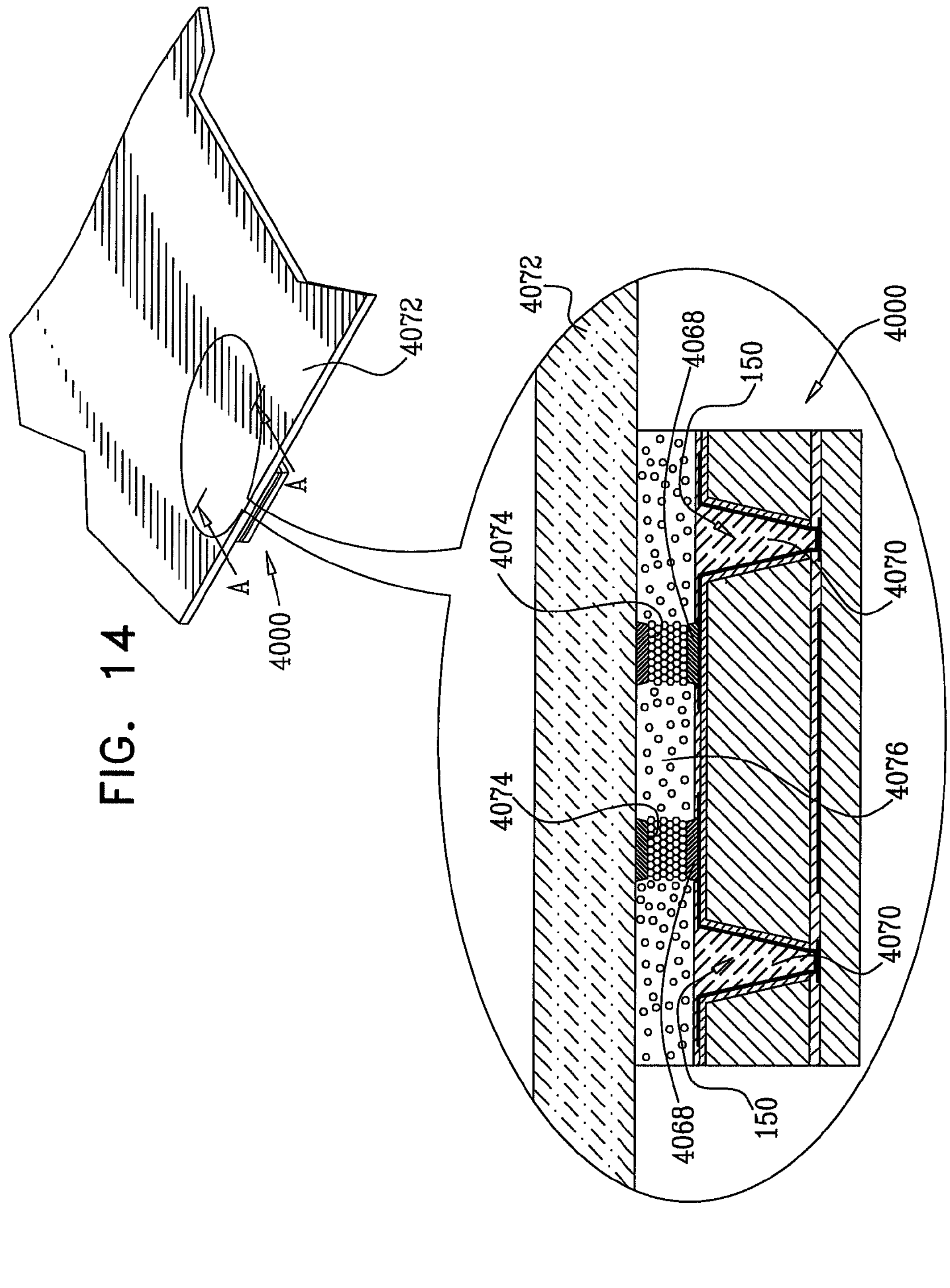
FIG. 14 is a simplified partially sectional illustration of a packaged semiconductor chip constructed and operative in accordance with an additional preferred embodiment of the present invention.

Reference is now made to FIG. 14, which shows a packaged semiconductor DRAM chip 4000, which is similar in all relevant respects to the DRAM of FIG. 1M, but wherein solder bumps 168 are replaced by thickened ACF attachable interconnects 4068, typically having a thickness of 10 microns and being formed of copper. In this embodiment an encapsulant layer 4070 preferably fills the notches 150 (FIG. 1M).

As seen in FIG. 14, a PCB 4072 is formed on an underside thereof with thickened ACF attachable interconnects 4074, typically having a thickness of 10 microns and being formed of copper. An anisotropic conductive film 4076 bonds the PCB 4072 to the DRAM chip 4000, in accordance with conventional ACF attachment techniques.

Reference is now made to FIGS. 15A-15D, which are simplified sectional illustrations of an additional method for manufacturing and mounting packaged semiconductor chips, preferably DRAM chips, in accordance with a further preferred embodiment of the present invention.

The method of FIGS. 15A-15D employs the steps described hereinabove with reference to FIGS. 1A-1I, which are followed by the steps shown in FIGS. 15A-15D.

Figures 15A, 15B:
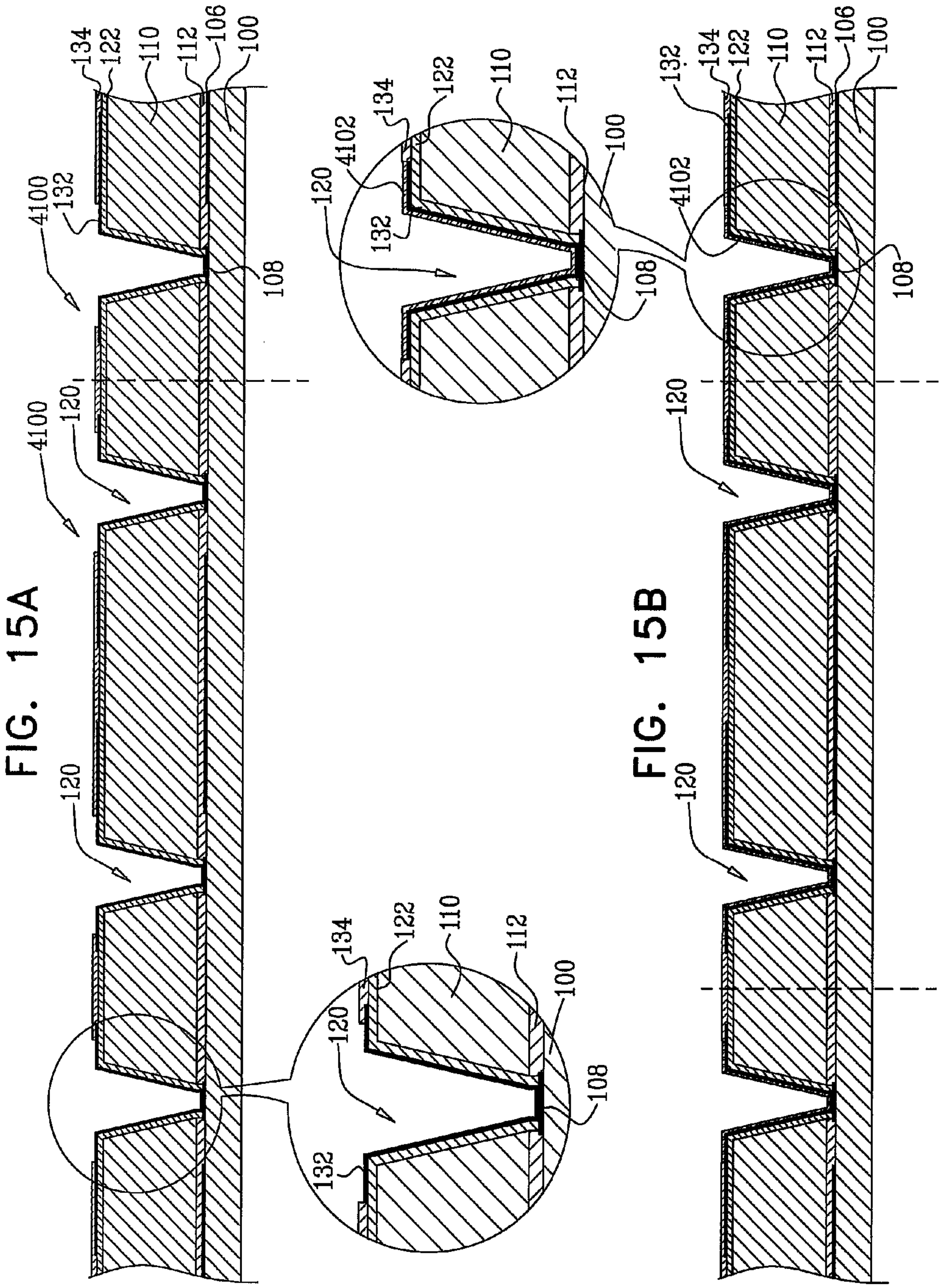
FIGS. 15A-15D are simplified sectional illustrations of an additional method for manufacturing and mounting packaged semiconductor chips in accordance with a further preferred embodiment of the present invention.

Reference is now made to FIG. 15A, which shows patterning of encapsulant layer 134 of the structure of FIG. 1I, preferably by photolithograpy, defining a die 4100.

FIG. 15B shows gold plating of portions of metal connections 132 at locations at notches 120 where the metal connections 132 are not covered by the encapsulant layer 134. The gold plating layer is designated by reference numeral 4102.

Figure 15C:
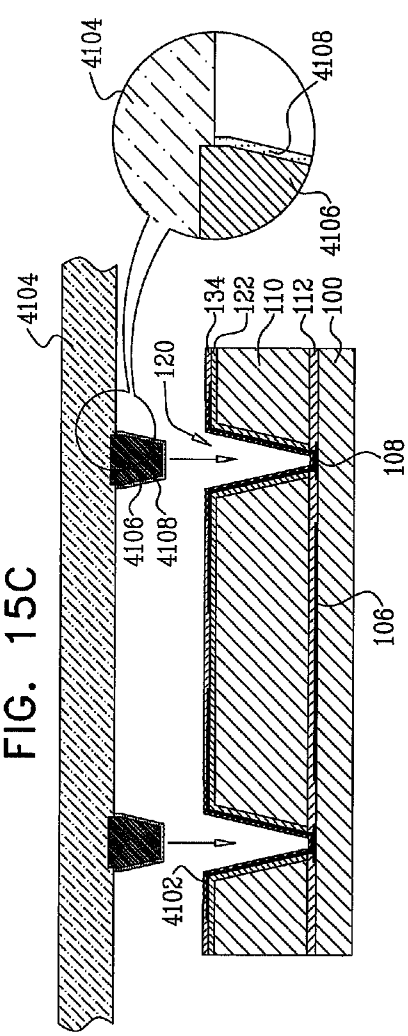

FIG. 15C shows a PCB 4104 having metal pins 4106 coated with an Indium layer 4108 in registration with gold plated surfaces of notches 120.

Figure 15D:
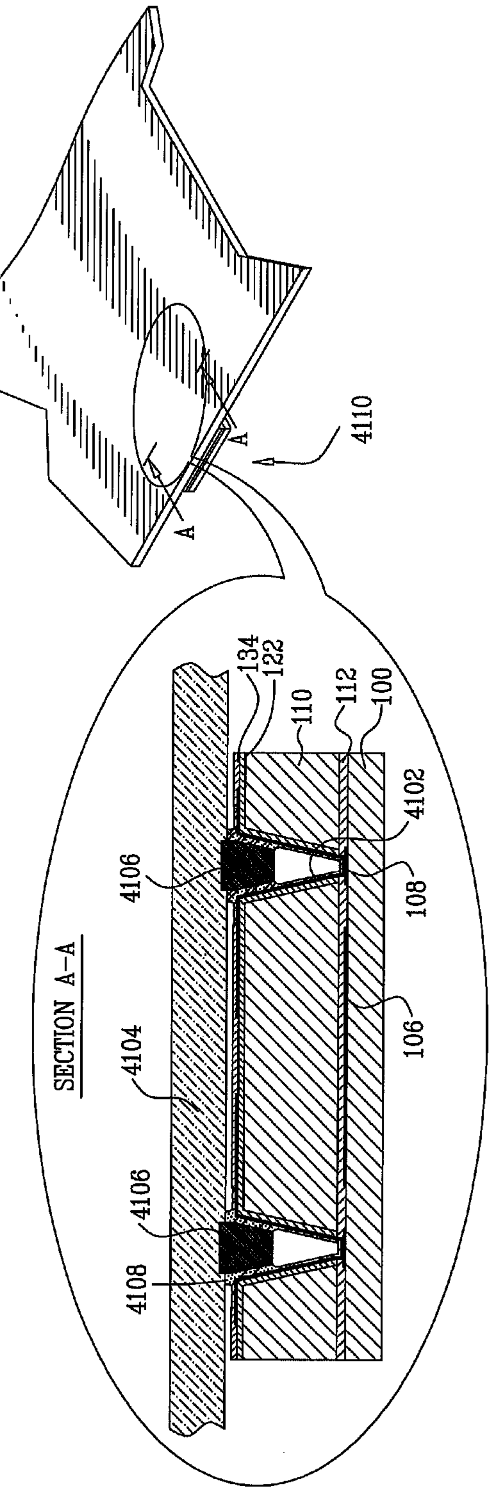

FIG. 15D shows the structure of FIG. 15B mounted onto pins 4106 of PCB 4104 by eutectic Au/In intermetallic bonding. As seen in FIG. 15D, the method of FIGS. 15A-15D can be employed for producing and mounting a DRAM chip 4110, such as onto PCB 4104.

Figure 16A:
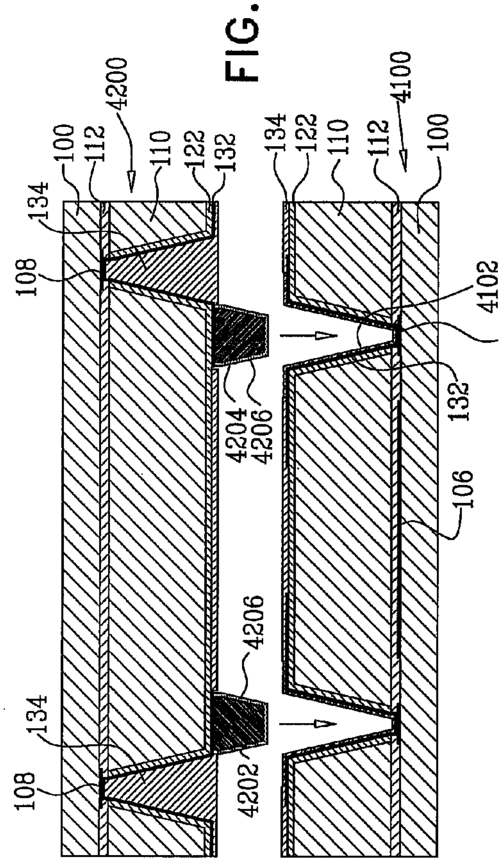
FIGS. 16A and 16B are simplified sectional illustrations of a further method for manufacturing and mounting packaged semiconductor chips in accordance with yet a further preferred embodiment of the present invention.
Figure 16B:
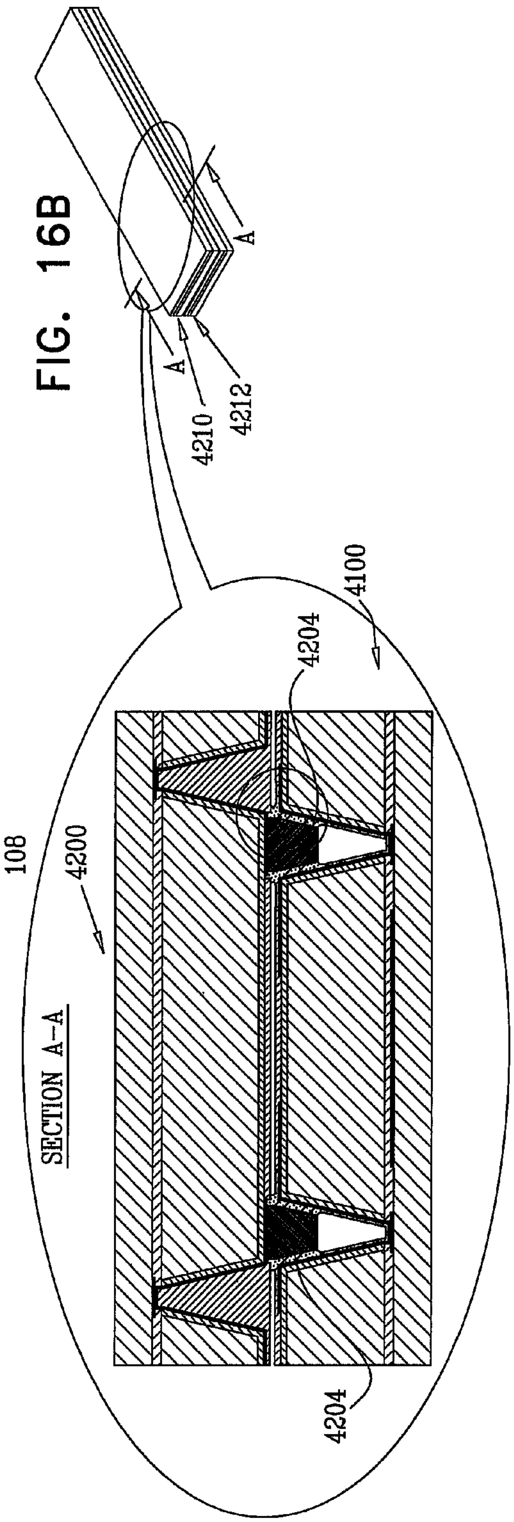

Reference is now made to FIGS. 16A and 16B, which are simplified sectional illustrations of a further method for manufacturing and mounting packaged semiconductor chips in accordance with a further preferred embodiment of the present invention.

The method of FIGS. 16A and 16B employs the steps described hereinabove with reference to FIGS. 15A and 15B, which are followed by the steps shown in FIGS. 16A and 16B.

Reference is now made to FIG. 16A, which shows a die 4200, similar in all relevant respects to die 144 of FIG. 1L, but having metal pins 4204 coated with an Indium layer 4206. In this embodiment the encapsulant layer 134 preferably fills the notches 120.

Die 4200 is shown turned upside-down and having pins 4204 in registration with gold plated surfaces of notches 120 of die 4100 (FIG. 15B).

FIG. 16B shows die 4100 mounted onto pins 4204 of die 4200 by eutectic Au/In intermetallic bonding. As seen in FIG. 16B, the method of FIGS. 16A and 16B can be employed for producing and mounting a DRAM chip 4210 onto another device, such as another DRAM chip 4212.

Figure 17A:
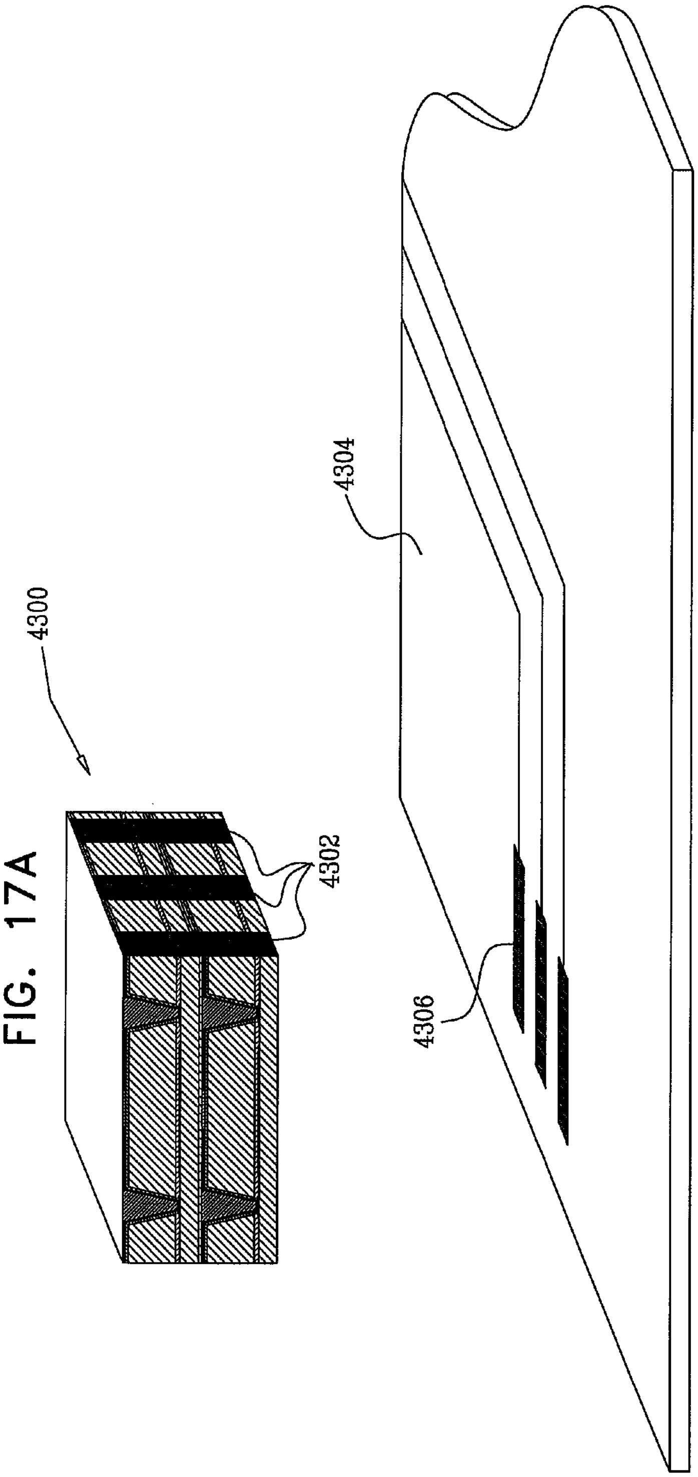
FIGS. 17A and 17B are simplified illustrations of a method for manufacturing and mounting stacked packaged semiconductor chips in accordance with still another preferred embodiment of the present invention.
Figure 17B:
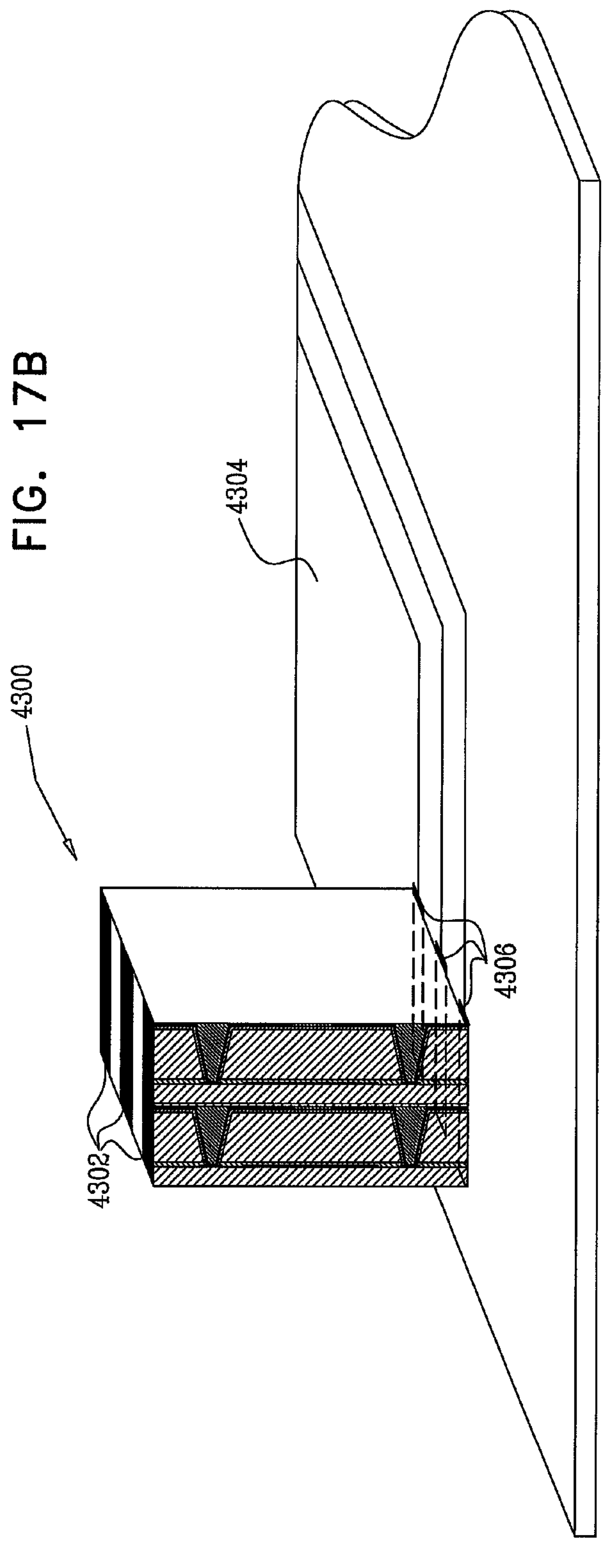

Reference is now made to FIGS. 17A and 17B, which are simplified illustrations of a method for manufacturing and mounting stacked packaged semiconductor chips in accordance with a preferred embodiment of the present invention.

The method of FIGS. 17A and 17B may employ any of the semiconductor devices described hereinabove. In the illustrated embodiment, a device comprising stacked, packaged semiconductor chips, here designated by reference numeral 4300, such as a DRAM device, is formed with side contacts 4302 and is configured to be mounted on a PCB 4304 having similarly configured contracts 4306. FIG. 17B shows the DRAM device 4300 mounted onto PCB 4304.

Reference is now made to FIGS. 18A-18L, which are simplified sectional illustrations of yet a further method for manufacturing packaged semiconductor chips in accordance with yet a further preferred embodiment of the present invention.

The method of FIGS. 18A-18L employs the steps described hereinabove with reference to FIGS. 4A-4D, which are preceded by the steps shown in FIGS. 18A-18C and followed by the steps shown in FIGS. 18D-18L.

Figure 18A:
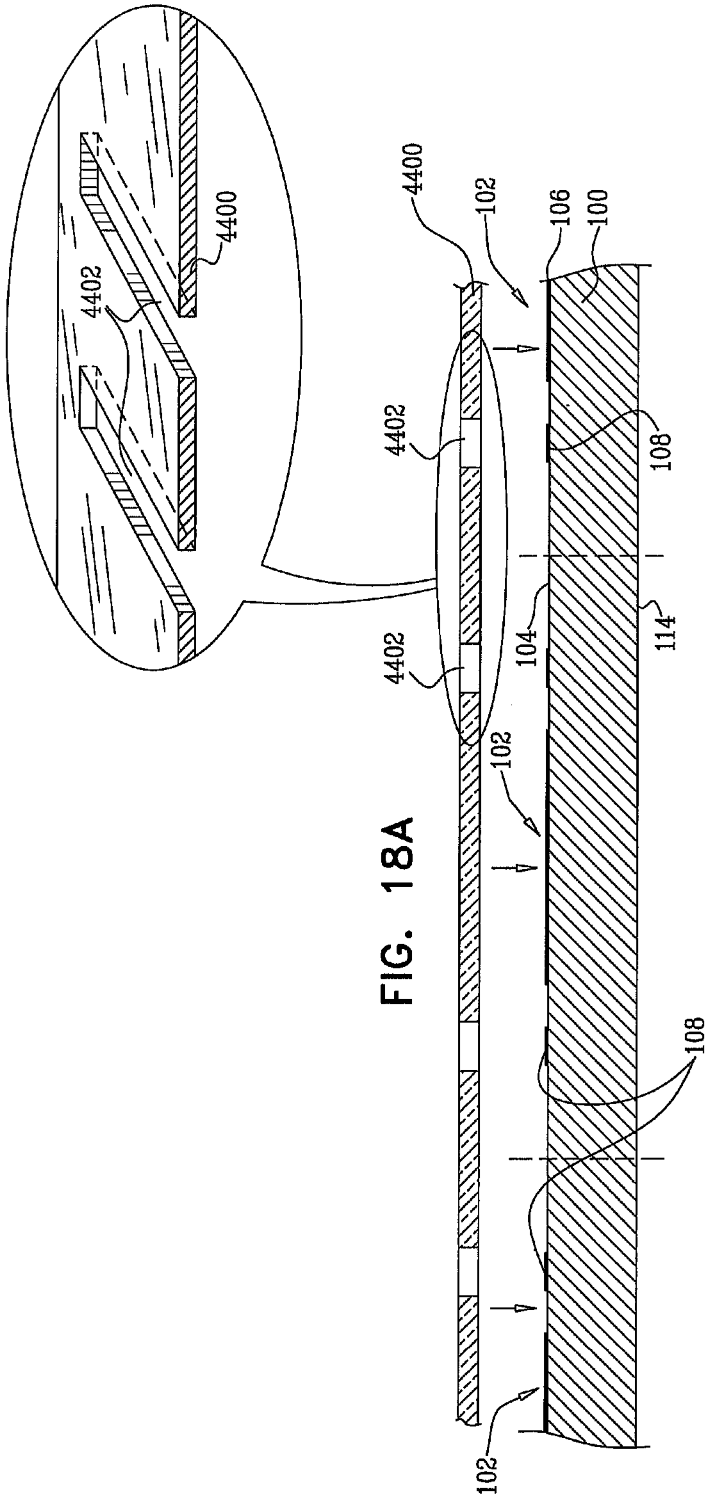
FIGS. 18A-18L are simplified sectional illustrations of yet a further method for manufacturing packaged semiconductor chips in accordance with yet a further preferred embodiment of the present invention.

Reference is now made to FIG. 18A, which shows the structure of FIG. 1A having placed thereon a punched adhesive film 4400, preferably formed of suitable polymers, such as, for example MC-550 or MC-795 commercially available from Mitsui Chemicals Inc. of Tokyo, Japan, which include epoxy, polyimide and inorganic filler. The adhesive film 4400 preferably has relatively high density and a thickness of 50 microns or less, thereby protecting the device from alpha particles emitted by BGA solder balls. As seen clearly in the enlarged portion of FIG. 18A, the adhesive film 4400 has channels 4402 punched therein, which are aligned with bond pads 108 and allow access thereto when the adhesive film 4400 is attached to wafer 100. The adhesive film 4400 preferably is cured following placement thereof on the wafer 100.

Figure 18B:
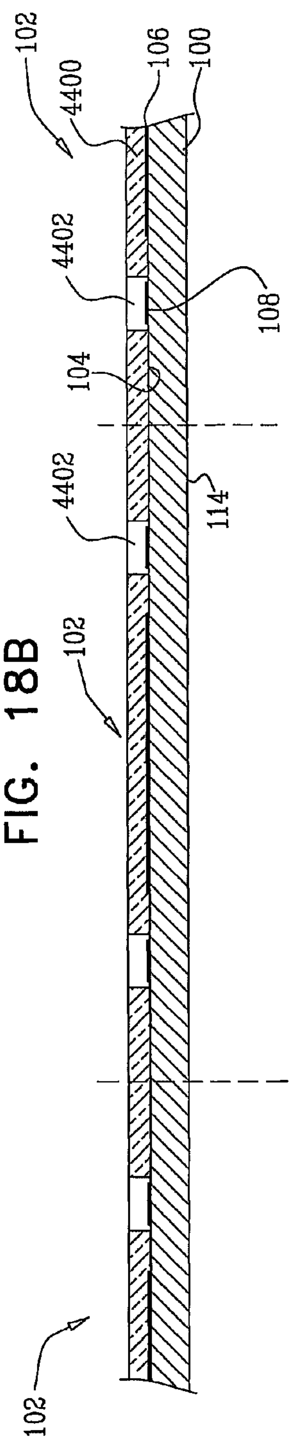

FIG. 18B shows thinning of wafer 100, having adhesive film 4400 attached thereto, preferably by machining its non-active surface 114. Preferably the thickness of the semiconductor wafer 100 at this stage, following thinning thereof, is 300 microns. FIG. 18C shows the structure of FIG. 18B following patterning of the adhesive film 4400, preferably by dicing the adhesive film 4400 with an angled blade following curing of the adhesive.

Figure 18C:
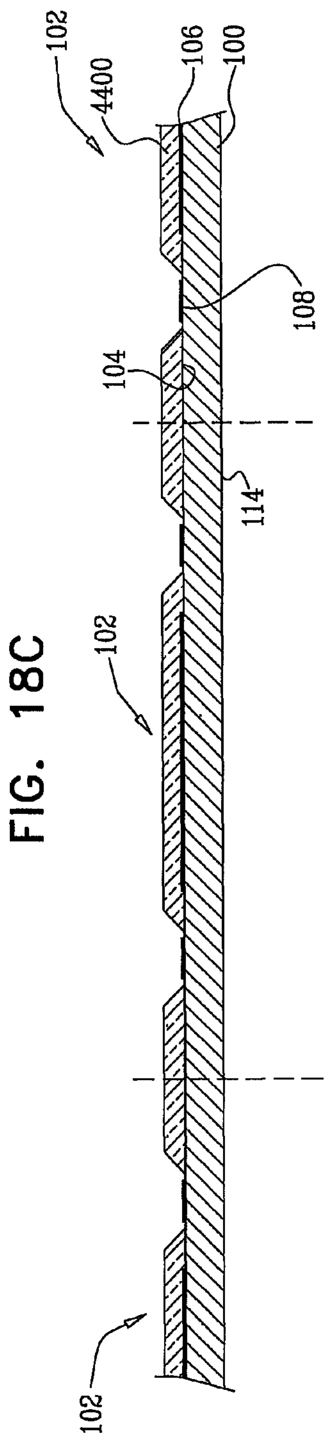
Figure 18D:
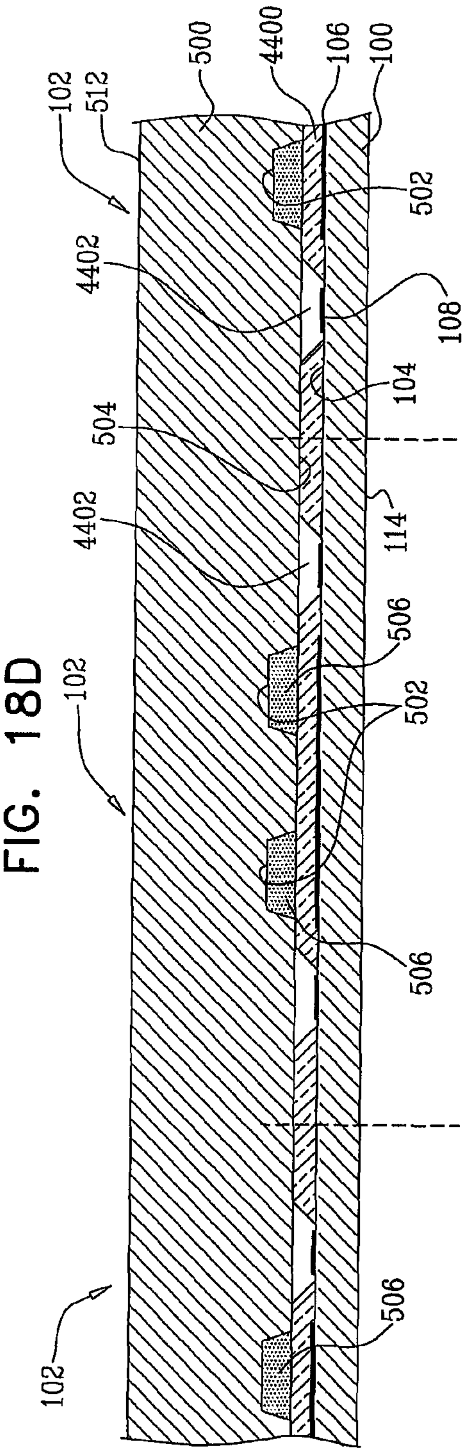

FIG. 18D shows the wafer similar to wafer 500 of FIG. 4D but having deeper recesses, turned upside down and bonded onto the adhesive film 4400 of FIG. 18C, with a surface 512, opposite surface 504 being exposed.

Figure 18E:
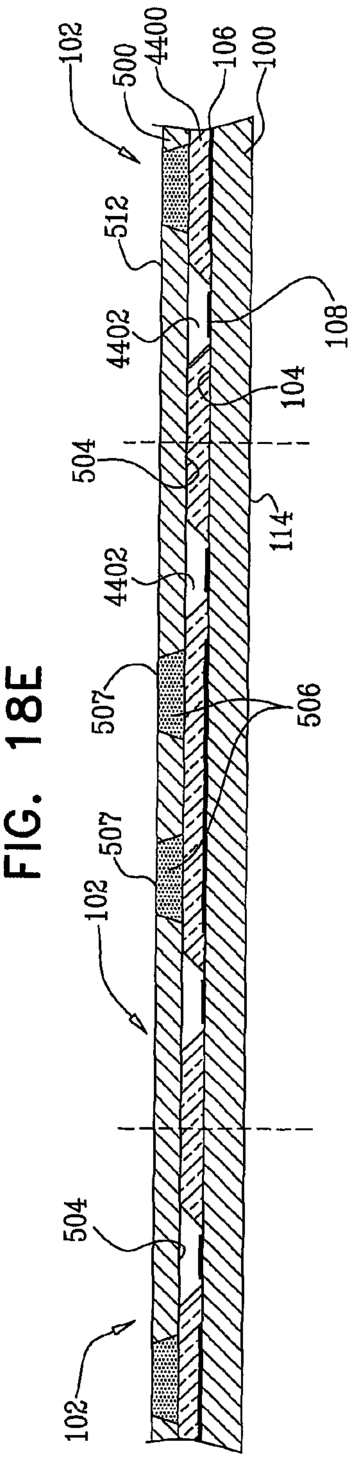

FIG. 18E shows thinning of wafer 500, preferably by grinding surface 512, down to a thickness equal to the depth of recesses 502, typically 100 microns.

Figures 18F, 18G, 18H:
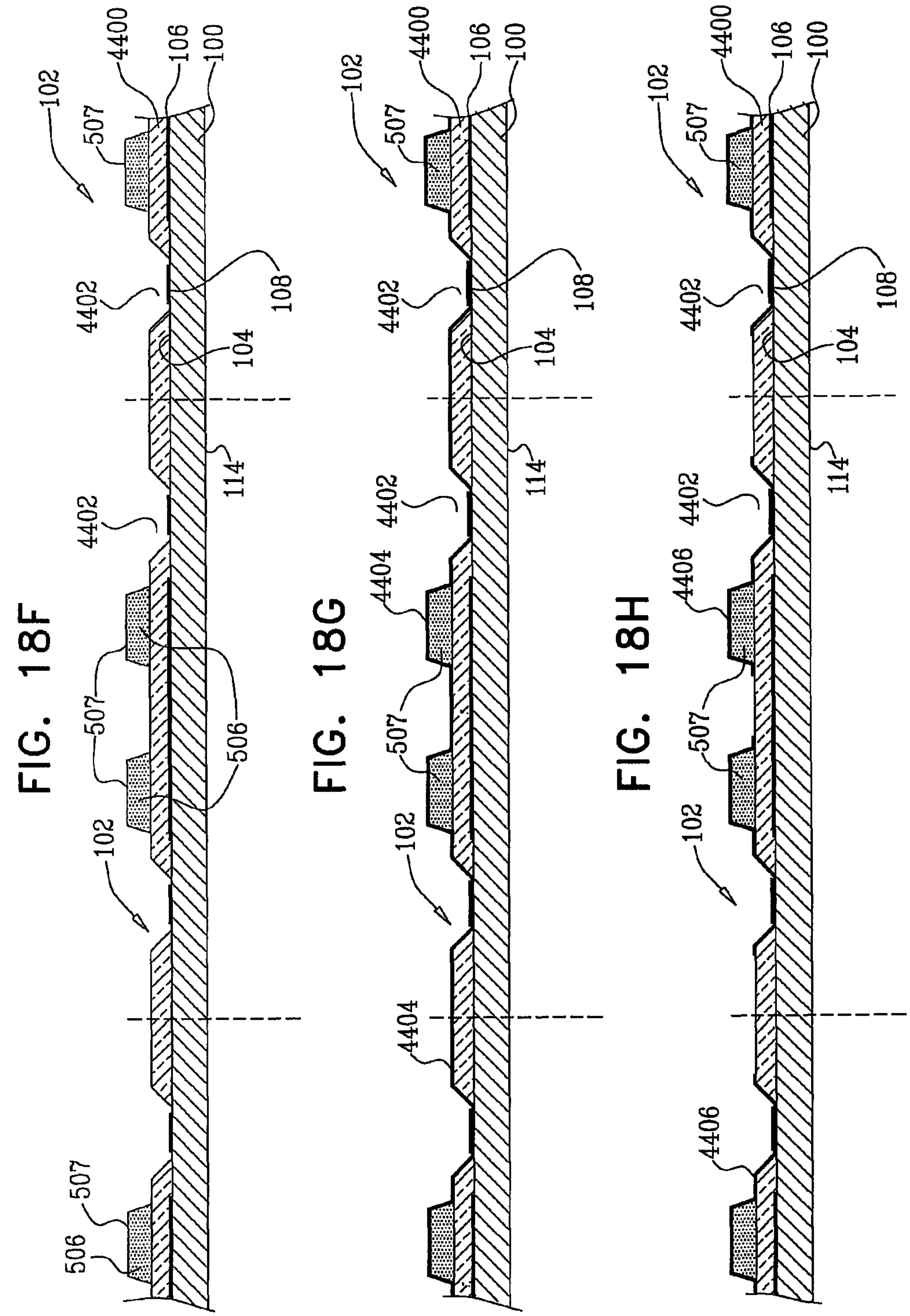

FIG. 18F shows removal of the remainder of wafer 500 surrounding platforms 507 of compliant material 506, as by silicon etching and ultrasonic cleaning.

FIG. 18G illustrates the formation of a metal layer 4404, by sputtering chrome, aluminum or copper. Metal layer 4404 extends from the bond pads 108, along the inclined surfaces of adhesive film 4400, onto outer, generally planar surfaces of the adhesive film 4400 and over platforms 507 at dies 102.

As shown in FIG. 18H, metal connections 4406 are preferably formed by patterning the metal layer 4404, preferably by 3D photolithography employing a suitable photoresist, preferably Eagle 2100, commercially available from Rohm and Haas Shipley Division of Marlborough, Mass., U.S.A. Optionally, the metal connections 4406 may be plated with nickel, as by electroless techniques, in order to provide enhanced corrosion resistance.

Figure 18I:
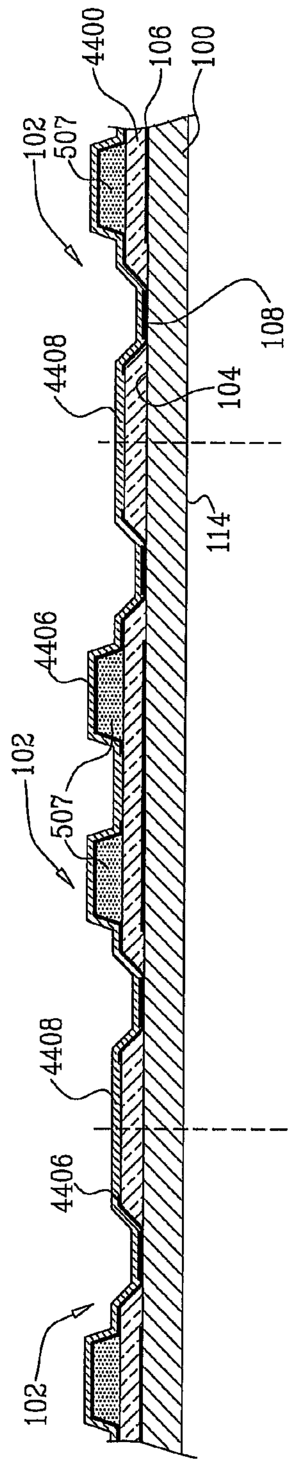
Figure 18J:
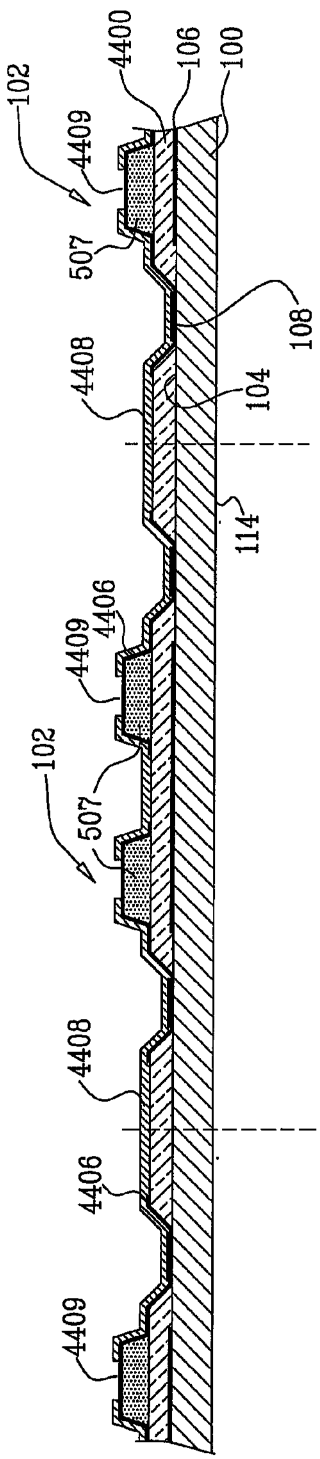

FIG. 18I illustrates the application, preferably by spray coating, of an electrically insulative, encapsulant passivation layer 4408 over the metal connections 4406, over the adhesive film 4400 and over platforms 507. Preferably, the encapsulant passivation layer 4408 comprises solder mask. FIG. 18J shows patterning of the encapsulant passivation layer 4408, preferably by photolithography, to define solder bump locations 4409.

Figure 18K:
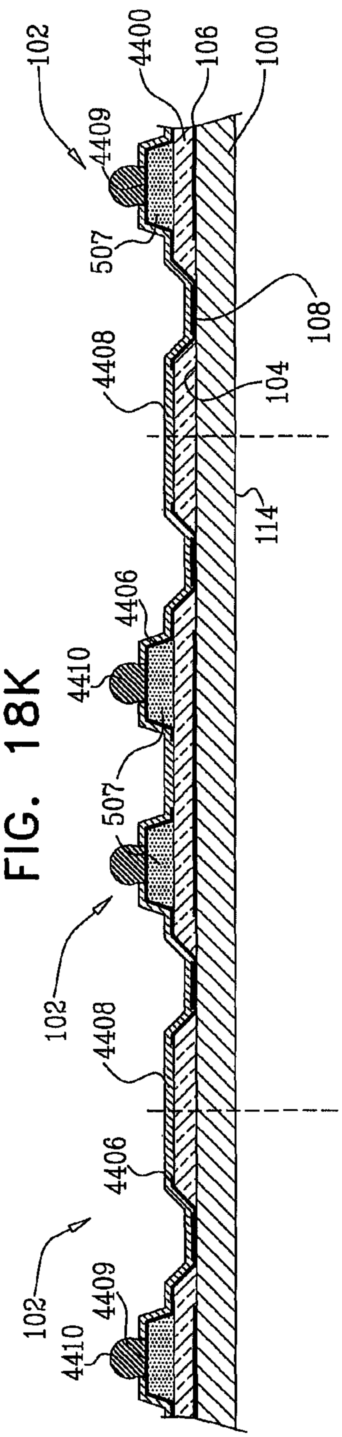

FIG. 18K illustrates the formation of solder bumps 4410 onto platforms 507 at locations 4409 on the metal connections 4406 at which the encapsulant passivation layer 4408 is not present.

Figure 18L:
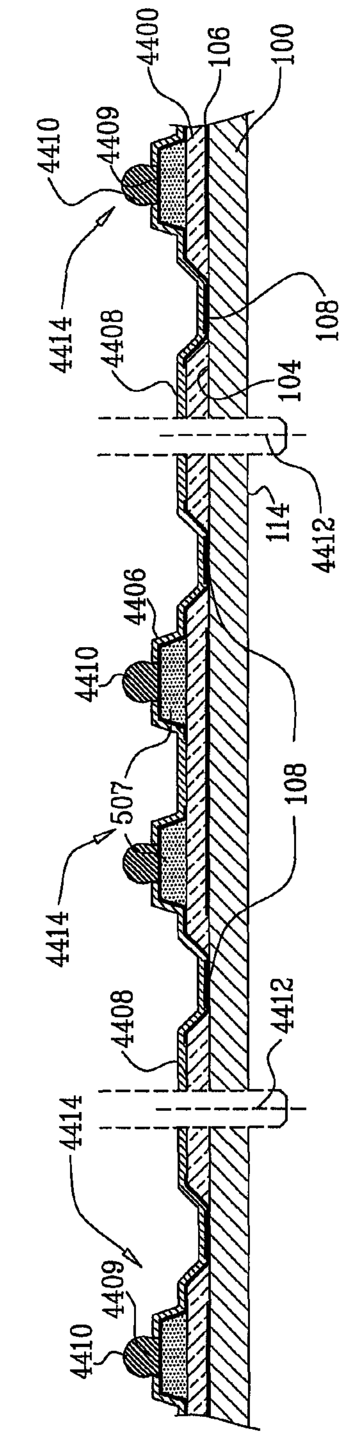

FIG. 18L shows dicing of the wafer 100 and adhesive film 4400 of FIG. 18K along scribe lines 4412 to produce a multiplicity of individually packaged dies 4414.

Figure 18M:
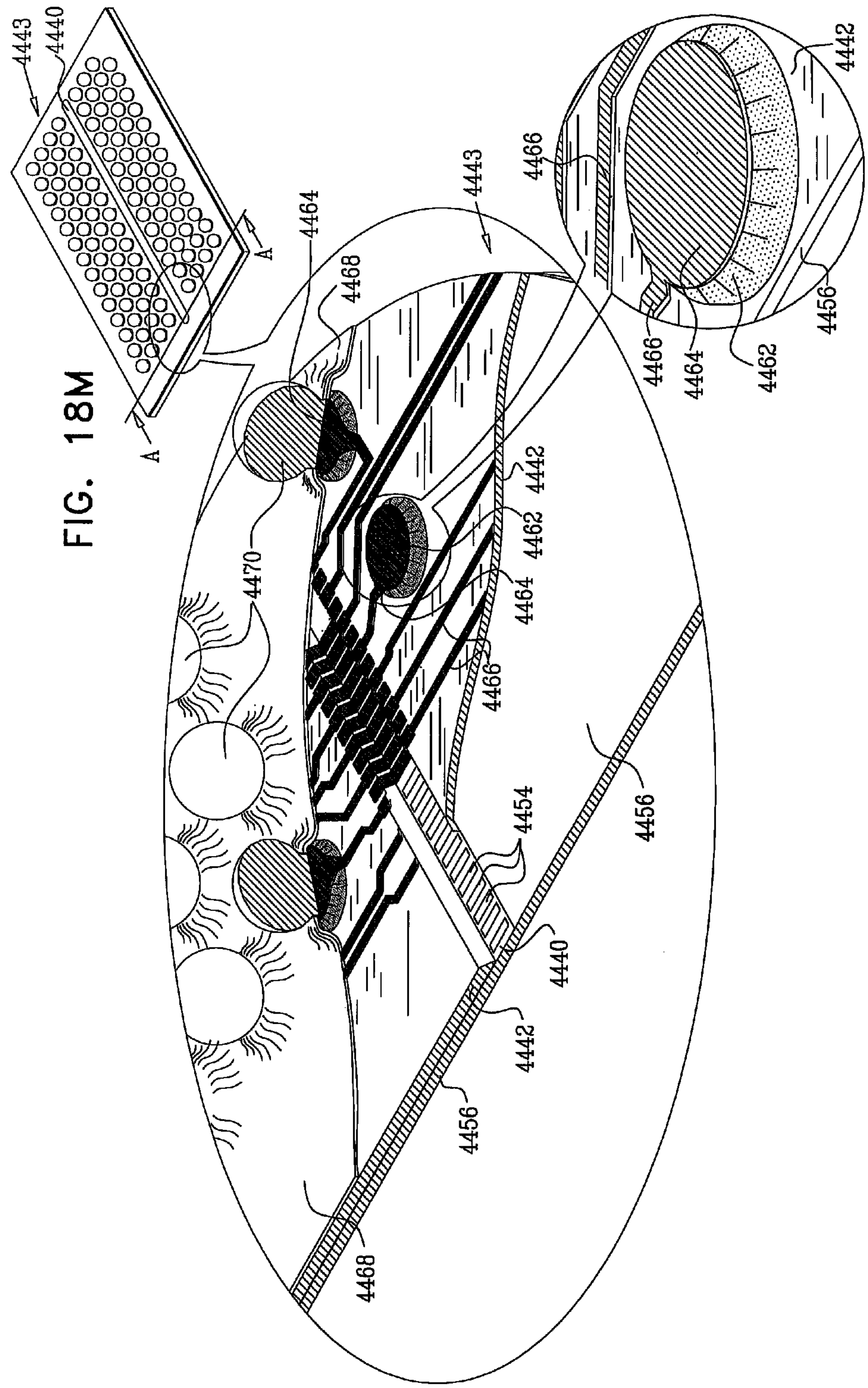
FIG. 18M is a simplified partially cut away pictorial illustration of part of a packaged semiconductor chip manufactured in accordance with the method of FIGS. 18A-18L.

Reference is now made to FIG. 18M, which is a simplified partially cut away pictorial illustration of part of a packaged semiconductor DRAM chip manufactured in accordance with the method of FIGS. 18A-18L. As seen in FIG. 18M, a channel 4440, produced by punching and dicing of an adhesive film 4442, corresponding to adhesive film 4400 (FIG. 18A), of a silicon wafer die 4443, corresponding to silicon wafer die 4414 (FIG. 18L). The channel 4440 exposes a row of bond pads 4454, corresponding to bond pads 108 (FIGS. 18A-18L), which are formed on a substrate 4456, corresponding to substrate 100 (FIGS. 18A-18L). Platforms 4462, corresponding to platforms 507 (FIGS. 18F-18L) are formed over adhesive film 4442 at solder bump locations 4464, corresponding to solder bump locations 4409 (FIGS. 18J-18L).

Patterned metal connections 4466, corresponding to metal connections 4406 (FIGS. 18H-18L), extend from bond pads 4454 along the inclined surfaces of channel 4440 and over generally planar surfaces of adhesive film 4442 and terminate over platforms 4462. An encapsulant passivation layer 4468, corresponding to encapsulant passivation layer 4408 (FIGS. 18I-18L), is formed over adhesive film 4442 and metal connections 4466 other than at locations 4464. Solder bumps 4470, corresponding to solder bumps 4410 (FIGS. 18K and 18L), are formed onto metal connections 4466 at locations 4464.

It will be appreciated by persons skilled in the art that the present invention is not limited by what has been specifically claimed herein. Rather the scope of the present invention includes both combinations and sub-combinations of various features described hereinabove as well as modifications thereof which may occur to persons skilled in the art upon reading the foregoing description and which are not in the prior art.

The invention claimed is:

1. A chip-sized, wafer level packaged device comprising:

a die being a severed portion of a semiconductor wafer, said die having a first surface and a second surface remote from said first surface, said die including at least one device integrally therein, a plurality of first bond pads and a plurality of second bond pads, each of said first and second bond pads being adjacent to said first surface;

at least one packaging layer formed over said first surface and remote from said second surface, said at least one packaging layer overlying the second bond pads and having a surface remote from said first surface, wherein an opening extends through the packaging layer to at least a portion of a first surface of a first bond pad of said plurality of first bond pads;

a monolithic plated conductor formed over said surface of said at least one packaging layer and extending continuously through said opening and formed on said portion of the first surface of said first bond pad;

a second conductor formed over a surface of said packaged device which is disposed at a distance from said first surface of said die greater than a distance from said first surface to said second surface of said die and being electrically connected to a second bond pad of said plurality of second bond pads by a third conductor extending through an opening in said die to at least a portion of a first surface of said second bond pad remote from said at least one packaging layer, wherein said first surface of said second bond pad faces said second surface of the die, wherein said second bond pad has a second surface opposite said first surface of the second bond pad, and said second surface of the second bond pad faces said at least one packaging layer; and a first compliant layer, formed over said packaging layer and underlying said monolithic plated conductor, wherein first conductors are formed over said first compliant layer and are underlying said monolithic plated conductor.

2. A chip-sized wafer level packaged device according to claim 1, wherein said packaging layer includes a material having thermal expansion characteristics similar to those of said die.

3. A chip-sized wafer level packaged device according to claim 2 and wherein at least one of said monolithic plated conductor or said second conductor comprises ACF attachable interconnects.

4. A chip-sized wafer level packaged device according to claim 3 and wherein said ACF attachable interconnects are formed of copper.

5. A chip-sized wafer level packaged device according to claim 2 and also comprising:

a printed circuit board including interconnects; and a conductive film bonding said interconnects of said printed circuit board to at least one of said monolithic plated conductor or said second conductor.

6. A chip-sized wafer level packaged device according to claim 5 and wherein said conductive film comprises an anisotropic conductive film.

7. A chip-sized wafer level packaged device according to claim 2, wherein said semiconductor wafer contains at least one of silicon or Gallium Arsenide.

8. A chip-sized wafer level packaged device according to claim 2, wherein said packaging layer is adhered to said die by an adhesive, said adhesive having thermal expansion characteristics similar to those of said packaging layer.

9. A chip-sized wafer level packaged device according to claim 2 and wherein said packaging layer comprises silicon.

10. A chip-sized wafer level packaged device according to claim 2, wherein said second conductor is a monolithic plated conductor.

11. A chip-sized wafer level packaged device according to claim 10, wherein the second conductor includes the third conductor.

12. A chip-sized, wafer level packaged device according to claim 2, wherein the third conductor is among a plurality of third conductors extending through an opening in said die to first surfaces of said plurality of second bond pads remote from said at least one package layer, said monolithic plated conductor extending through an opening in said at least one packaging layer to surfaces of said first bond pads adjacent said at least one packaging layer, wherein said monolithic plated conductor is electrically insulated from each of said third conductors.

13. Stacked chip-sized, wafer level packaged devices comprising at least first and second chip-sized wafer level packaged devices according to claim 1, wherein said monolithic plated conductor of said first device is coupled to said second conductor of said second device.

14. Stacked chip-sized, wafer level packaged devices according to claim 13 and wherein said at least one packaging layer comprises a plurality of packaging layers.

15. Stacked chip-sized, wafer level packaged devices according to claim 14 and wherein said plurality of packaging layers are disposed on the same side of said portion of said semiconductor wafer.

16. A chip-sized wafer level packaged device according to claim 13 and wherein said device is a DRAM device.

17. Stacked chip-sized, wafer level packaged devices according to claim 13, wherein said second conductor of at least one of the first device or the second device is a monolithic plated conductor.

18. Stacked chip-sized, wafer level packaged devices according to claim 17, wherein the second conductor of the at least one of the first device or the second device includes the third conductor.

19. A chip-sized, wafer level packaged device according to claim 1 and wherein said at least one packaging layer comprises a plurality of packaging layers.

20. A chip-sized, wafer level packaged device according to claim 19 and wherein said plurality of packaging layers are disposed on the same side of said die.

21. A chip-sized wafer level packaged device according to claim 1 and wherein said device is a DRAM device.

22. A chip-sized wafer level packaged device according to claim 1 and wherein said first compliant layer includes at least one of silicone or a polymeric dielectric material.

23. A chip-sized wafer level packaged device according to claim 22 and wherein said polymeric material comprises a polyimide.

24. A chip-sized wafer level packaged device according to claim 1, wherein said second conductor is a monolithic plated conductor.

25. A chip-sized wafer level packaged device according to claim 24, wherein the second conductor includes the third conductor.

26. A chip-sized wafer level packaged device according to claim 1, wherein the at least one packaging layer contains silicon.

27. A chip-sized, wafer level packaged device according to claim 1, wherein the third conductor is among a plurality of third conductors extending through an opening in said die to first surfaces of said plurality of second bond pads remote from said at least one package layer, said monolithic plated conductor extending through an opening in said at least one packaging layer to surfaces of said first bond pads adjacent said at least one packaging layer, wherein said monolithic plated conductor is electrically insulated from each of said third conductors.

28. A chip-sized wafer level packaged device comprising:

a die being a severed portion of a semiconductor wafer, said die having a first surface and a second surface remote from said first surface, said die including at least one device integrally therein, a plurality of first bond pads and a plurality of second bond pads, each of said first and second bond pads being adjacent to said first surface;

at least one packaging layer formed over said first surface and remote from said second surface, said at least one packaging layer overlying the second bond pads and having a surface remote from said first surface, wherein an opening extends through the packaging layer to at least a portion of a first surface of a first bond pad of said plurality of first bond pads;

a monolithic plated conductor formed over said surface of said at least one packaging layer and extending continuously through said opening and formed on said portion of the first surface of said first bond pad;

a second conductor formed over a surface of said packaged device which is disposed at a distance from said first surface of said die greater than a distance from said first surface to said second surface of said die and being electrically connected to a second bond pad of said plurality of second bond pads by a third conductor extending through an opening in said die to at least a portion of a first surface of said second bond pad remote from said at least one packaging layer, wherein said first surface of said second bond pad faces said second surface of the die, wherein said second bond pad has a second surface opposite said first surface of the second bond pad, and said second surface of the second bond pad faces said at least one packaging layer;

a first compliant layer, formed over said packaging layer and underlying said monolithic plated conductor; and a second compliant layer, formed over said first surface of said die and underlying said second conductor.

29. A chip-sized wafer level packaged device according to claim 28, wherein a fourth conductor is formed over said second compliant layer and underlying said second conductor.

30. A chip-sized wafer level packaged device according to claim 28 and wherein said first compliant layer includes at least one of silicone or a polymeric dielectric material.

31. A chip-sized wafer level packaged device according to claim 30 and wherein said polymeric material comprises a polyimide.

32. A chip-sized wafer level packaged device comprising:

a die being a severed portion of a semiconductor wafer, said die having a first surface and a second surface remote from said first surface, said die including at least one device integrally therein, a plurality of first bond pads and a plurality of second bond pads, each of said first and second bond pads being adjacent to said first surface;

at least one packaging layer formed over said first surface and remote from said second surface, said at least one packaging layer overlying the second bond pads and having a surface remote from said first surface, wherein an opening extends through the packaging layer to at least a portion of a first surface of a first bond pad of said plurality of first bond pads;

a monolithic plated conductor formed over said surface of said at least one packaging layer and extending continuously through said opening and formed on said portion of the first surface of said first bond pad;

a second conductor formed over a surface of said packaged device which is disposed at a distance from said first surface of said die greater than a distance from said first surface to said second surface of said die and being electrically connected to a second bond pad of said plurality of second bond pads by a third conductor extending through an opening in said die to at least a portion of a first surface of said second bond pad remote from said at least one packaging layer, wherein said first surface of said second bond pad faces said second surface of the die, wherein said second bond pad has a second surface opposite said first surface of the second bond pad, and said second surface of the second bond pad faces said at least one packaging layer, and wherein alpha-particle shielding is provided between at least one of said monolithic plated conductor or said second conductor and said device.

33. A chip-sized, wafer level packaged device comprising:

a die being a severed portion of a semiconductor wafer, said die having a first surface and a second surface remote from said first surface, said die including at least one device integrally therein, a plurality of first bond pads and a plurality of second bond pads, each of said first and second bond pads being adjacent to said first surface;

at least one packaging layer formed over said first surface and remote from said second surface, said at least one packaging layer overlying the second bond pads and having a surface remote from said first surface, wherein an opening extends through the packaging layer to at least a portion of a first surface of a first bond pad of said plurality of first bond pads;

a monolithic plated conductor formed over said surface of said at least one packaging layer and extending continuously through said opening and formed on said portion of the first surface of said first bond pad; and a second conductor formed over a surface of said packaged device which is disposed at a distance from said first surface of said die greater than a distance from said first surface to said second surface of said die and being electrically connected to a second bond pad of said plurality of second bond pads by a third conductor extending through an opening in said die to at least a portion of a first surface of said second bond pad remote from said at least one packaging layer, wherein said first surface of said second bond pad faces said second surface of the die, wherein said second bond pad has a second surface opposite said first surface of the second bond pad, and said second surface of the second bond pad faces said at least one packaging layer, and wherein said at least one packaging layer includes a first packaging layer, said packaged device further comprising:

a second packaging layer formed over said second surface of said die, wherein said monolithic plated conductor is formed on said first packaging layer and said second conductor formed on said second packaging layer.

34. A chip-sized wafer level packaged device according to claim 33, further comprising:

first compliant layer formed on said first packaging layer and underlying said monolithic plated conductor; and second compliant layer formed on said second packaging layer and underlying said second conductor.

35. A chip-sized wafer level packaged device according to claim 34, wherein at least one of said compliant layers provides alpha-particle shielding between at least one of said monolithic plated conductor or said second conductor and said device.

36. A chip-sized wafer level packaged device according to claim 34, wherein at least one of said compliant layers comprises a layer of an electrophoretic material.

37. A chip-sized, wafer level packaged device comprising:

a die being a severed portion of a semiconductor wafer, said die having a first surface and a second surface remote from said first surface, said die including at least one device integrally therein, a plurality of first bond pads and a plurality of second bond pads, each of said first and second bond pads being adjacent to said first surface;

at least one packaging layer formed over said first surface and remote from said second surface, said at least one packaging layer overlying the second bond pads and having a surface remote from said first surface, wherein an opening extends through the packaging layer to at least a portion of a first surface of a first bond pad of said plurality of first bond pads;

a monolithic plated conductor formed over said surface of said at least one packaging layer and extending continuously through said opening and formed on said portion of the first surface of said first bond pad;

a second conductor formed over a surface of said packaged device which is disposed at a distance from said first surface of said die greater than a distance from said first surface to said second surface of said die and being electrically connected to a second bond pad of said plurality of second bond pads by a third conductor extending through an opening in said die to at least a portion of a first surface of said second bond pad remote from said at least one packaging layer, wherein said first surface of said second bond pad faces said second surface of the die, wherein said second bond pad has a second surface opposite said first surface of the second bond pad, and said second surface of the second bond pad faces said at least one packaging layer; and a compliant electrophoretic coating layer underlying at least one of said monolithic plated conductor or said second conductor.

38. A chip-sized wafer level packaged device according to claim 37, wherein said at least one packaging layer includes a first packaging layer, said packaged device further comprising:

a second packaging layer formed over said second surface of said die, wherein said monolithic plated conductor is formed on said first packaging layer and said second conductor is formed on said second packaging layer.

39. A chip-sized wafer level packaged device according to claim 38, wherein said compliant electrophoretic coating layer comprises:

first compliant electrophoretic coating layer formed on said first packaging layer and underlying said monolithic plated conductor; and second compliant electrophoretic coating layer formed on said second packaging layer and underlying said second conductor.

40. A chip-sized wafer level packaged device according to claim 39, wherein said first and second electrophoretic coating layers provide alpha-particle shielding between said monolithic plated conductor and said second conductor and said device.

41. A chip-sized wafer level packaged device according to claim 37 and wherein said compliant electrophoretic coating layer includes at least one of silicone or a polymeric dielectric material.

42. A chip-sized wafer level packaged device according to claim 41 and wherein said polymeric material comprises a polyimide.

43. A chip-sized wafer level packaged device according to claim 37, wherein said second conductor is a monolithic plated conductor.

44. A chip-sized wafer level packaged device according to claim 43, wherein the second conductor includes the third conductor.

45. A chip-sized, wafer level packaged device according to claim 37, wherein the third conductor is among a plurality of third conductors extending through an opening in said die to first surfaces of said plurality of second bond pads remote from said at least one package layer, said monolithic plated conductor extending through an opening in said at least one packaging layer to surfaces of said first bond pads adjacent said at least one packaging layer, wherein said monolithic plate conductor is electrically insulated from each of said third conductors.

46. A chip-sized wafer level packaged device according to claim 45 and wherein said device includes a memory device.

47. A chip-sized wafer level packaged device according to claim 37 and wherein said at least one packaging layer contains silicon.

48. A chip-sized wafer level packaged device according to claim 37 and wherein said compliant electrophoretic coating layer provides alpha-particle shielding between the at least one of said monolithic plated conductor or said second conductor and said device.

49. A chip-sized wafer level packaged device according to claim 37 and wherein said device is a DRAM device.

50. A chip-sized, wafer level packaged device according to claim 37 and wherein said at least one packaging layer comprises a plurality of packaging layers.

51. A chip-sized, wafer level packaged device according to claim 50 and wherein said plurality of packaging layers are disposed on the same side of said die.

52. A chip-sized wafer level packaged device according to claim 37, and also comprising metal connections formed over said compliant electrophoretic coating layer and underlying the at least one of said monolithic plated conductor or said second conductor, said metal connections providing electrical contact between the at least one of said monolithic plated conductor or said second conductor and said device.

53. A chip-sized wafer level packaged device comprising:

a die being a severed portion of a semiconductor wafer, said die having a first surface and a second surface remote from said first surface, said die including at least one device integrally therein, a plurality of first bond pads and a plurality of second bond pads, each of said first and second bond pads being adjacent to said first surface;

at least one packaging layer formed over said first surface and remote from said second surface, said at least one packaging layer overlying the second bond pads and having a surface remote from said first surface, wherein an opening extends through the packaging layer to at least a portion of a first surface of a first bond pad of said plurality of first bond pads;

a monolithic plated conductor formed over said surface of said at least one packaging layer and extending continuously through said opening and formed on said portion of the first surface of said first bond pad;

a second conductor formed over a surface of said packaged device which is disposed at a distance from said first surface of said die greater than a distance from said first surface to said second surface of said die and being electrically connected to a second bond pad of said plurality of second bond pads by a third conductor extending through an opening in said die to at least a portion of a first surface of said second bond pad remote from said at least one packaging layer, wherein said first surface of said second bond pad faces said second surface of the die, wherein said second bond pad has a second surface opposite said first surface of the second bond pad, and said second surface of the second bond pad faces said at least one packaging layer, wherein said packaging layer includes a material having thermal expansion characteristics similar to those of said die and a first packaging layer;

a first compliant layer provided on said first packaging layer and underlying said monolithic plated conductor;

a second packaging layer formed over said second surface of said die, wherein said second conductor is formed over said second packaging layer; and a second compliant layer provided in said second packaging layer and underlying said second conductor.

54. A chip-sized wafer level packaged device according to claim 53, wherein said compliant layers comprise electrophoretic material for providing alpha-particle shielding between said monolithic plated conductor and said second conductor and said device.

55. Stacked chip-sized, wafer level packaged devices comprising:

at least first and second chip-sized wafer level packaged devices each including:

a die being a severed portion of a semiconductor wafer, said die having a first surface and a second surface remote from said first surface, said die including at least one device integrally therein, a plurality of first bond pads and a plurality of second bond pads, each of said first and second bond pads being adjacent to said first surface;

at least one packaging layer formed over said first surface and remote from said second surface, said at least one packaging layer overlying the second bond pads and having a surface remote from said first surface, wherein an opening extends through the packaging layer to at least a portion of a first surface of a first bond pad of said plurality of first bond pads;

a monolithic plated conductor formed over said surface of said at least one packaging layer and extending continuously through said opening and formed on said portion of the first surface of said first bond pad;

a second conductor formed over a surface of said packaged device which is disposed at a distance from said first surface of said die greater than a distance from said first surface to said second surface of said die and being electrically connected to a second bond pad of said plurality of second bond pads by a third conductor extending through an opening in said die to at least a portion of a first surface of said second bond pad remote from said at least one packaging layer, wherein said first surface of said second bond pad faces said second surface of the die, wherein said second bond pad has a second surface opposite said first surface of the second bond pad, and said second surface of the second bond pad faces said at least one packaging layer, and wherein said monolithic plated conductor of said first device is coupled to said second conductor of said second device; and a compliant electrophoretic coating layer underlying at least one of said monolithic plated conductor or said second conductor.

56. Stacked chip-sized, wafer level packaged devices according to claim 55 and wherein said at least one packaging layer contains silicon.

57. Stacked chip-sized, wafer level packaged devices according to claim 55 and wherein said compliant electrophoretic coating layer provides alpha-particle shielding between the at least one of said monolithic plated conductor or said second conductor and said device.

58. Stacked chip-sized, wafer level packaged devices according to claim 55 and wherein said device is a DRAM device.

59. Stacked chip-sized, wafer level packaged devices according to claim 55, wherein said second conductor of at least one of the first device or the second device is a monolithic plated conductor.

60. Stacked chip-sized, wafer level packaged devices according to claim 55, wherein the second conductor includes the third conductor.

* * * * *